US012457893B2

(12) United States Patent
Kwong et al.

(10) Patent No.: US 12,457,893 B2
(45) **Date of Patent: *Oct. 28, 2025**

(54) ORGANIC ELECTROLUMINESCENT DEVICE

(71) Applicant: BEIJING SUMMER SPROUT TECHNOLOGY CO., LTD., Beijing (CN)

(72) Inventors: Chi Yuen Raymond Kwong, Beijing (CN); Jianfei Yao, Beijing (CN); Zhen Wang, Beijing (CN); Feng Li, Beijing (CN); Yang Wang, Beijing (CN); Junfei Wang, Beijing (CN); Gang Yang, Beijing (CN); Hongbo Li, Beijing (CN); Ming Sang, Beijing (CN); Wei Cai, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 874 days.

This patent is subject to a terminal disclaimer.

(21) Appl. No.: 17/547,737

(22) Filed: Dec. 10, 2021

(65) Prior Publication Data

US 2022/0199916 A1 Jun. 23, 2022

(30) Foreign Application Priority Data

Dec. 11, 2020 (CN) ......................... 202011438482.0
Oct. 27, 2021 (CN) ......................... 202111221350.7

(51) Int. Cl.

| | |
|---|---|
| ***H10K 85/30*** | (2023.01) |
| ***C09K 11/06*** | (2006.01) |
| ***H10K 85/60*** | (2023.01) |
| *H10K 50/11* | (2023.01) |
| *H10K 101/10* | (2023.01) |

(52) U.S. Cl.

CPC ............ *H10K 85/342* (2023.02); *C09K 11/06* (2013.01); *H10K 85/654* (2023.02); *H10K 85/6572* (2023.02); *H10K 85/6574* (2023.02); *C09K 2211/1033* (2013.01); *C09K 2211/185* (2013.01); *H10K 50/11* (2023.02); *H10K 2101/10* (2023.02)

(58) Field of Classification Search

None

See application file for complete search history.

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,844,363 A | 12/1998 | Gu et al. | |
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 2003/0230980 A1 | 12/2003 | Forrest et al. | |
| 2004/0174116 A1 | 9/2004 | Lu et al. | |
| 2014/0158992 A1 | 6/2014 | Xia et al. | |
| 2015/0207082 A1 | 7/2015 | Dyatkin et al. | |
| 2015/0249221 A1 | 9/2015 | Zeng et al. | |
| 2015/0349273 A1 | 12/2015 | Hung et al. | |
| 2016/0028021 A1 | 1/2016 | Zeng et al. | |
| 2016/0093808 A1 | 3/2016 | Adamovich et al. | |
| 2016/0197285 A1 | 7/2016 | Zeng et al. | |
| 2016/0233429 A1 | 8/2016 | Xia et al. | |
| 2016/0233436 A1 | 8/2016 | Zeng et al. | |
| 2016/0359122 A1 | 12/2016 | Boudreault et al. | |
| 2017/0054087 A1 | 2/2017 | Zeng et al. | |
| 2018/0102487 A1 | 4/2018 | Tsai et al. | |
| 2018/0301639 A1 | 10/2018 | Zeng et al. | |
| 2019/0006590 A1 * | 1/2019 | Park | H10K 85/633 |
| 2019/0252613 A1 | 8/2019 | Song et al. | |
| 2019/0363261 A1 | 11/2019 | Lee et al. | |
| 2020/0091442 A1 | 3/2020 | Cai et al. | |
| 2020/0176685 A1 | 6/2020 | Kang et al. | |
| 2020/0203631 A1 | 6/2020 | Gao et al. | |
| 2020/0251666 A1 | 8/2020 | Cai et al. | |

(Continued)

FOREIGN PATENT DOCUMENTS

| | | |
|---|---|---|
| CN | 110054650 A | 7/2019 |
| CN | 110268036 A | 9/2019 |

(Continued)

OTHER PUBLICATIONS

Tang et al., "Organic electroluminescent diodes," Appl. Phys. Lett. 51(12), pp. 913-915, DOI:10.1063/1.98799 (1987).

Joyama et al., "Highly efficient organic light-emitting diodes from delayed fluorescence," Nature 492, pp. 234-240, DOI:10.1038/nature11687 (Dec. 2012).

Chinese Notice of First Review Opinion issued in CN Application No. 202111221350.7 on Jun. 28, 2024 and English translation, 14 pages.

Chinese Search Report issued in CN Application No. 202111221350.7 on Jun. 28, 2024 and English translation, 4 pages.

(Continued)

*Primary Examiner* — Robert S Loewe

(74) *Attorney, Agent, or Firm* — ArentFox Schiff LLP; Joseph M. Maraia; Marlo S. Grolnic

(57) ABSTRACT

Provided is an organic electroluminescent device. The organic electroluminescent device has a first metal complex containing a ligand with a structure of Formula 1 and a first compound with a structure of Formula 2. Compared with the related art, a combination of such two compounds can significantly improve performance of the organic electroluminescent device, such as external quantum efficiency, power efficiency and current efficiency of the device. Further provided are an electronic apparatus including the organic electroluminescent device and a compound composition containing the first metal complex and the first compound.

42 Claims, 2 Drawing Sheets

(56) References Cited

U.S. PATENT DOCUMENTS

| | | | |
|---|---|---|---|
| 2020/0259098 A1 | 8/2020 | Lee et al. | |
| 2021/0257554 A1 | 8/2021 | Zeng et al. | |
| 2021/0273164 A1 | 9/2021 | Song et al. | |
| 2021/0280796 A1* | 9/2021 | Kim | H10K 85/6572 |
| 2021/0363133 A1* | 11/2021 | Jun | C07D 409/04 |
| 2021/0403496 A1 | 12/2021 | Cai et al. | |
| 2022/0002329 A1 | 1/2022 | Cai et al. | |
| 2022/0102647 A1 | 3/2022 | Galan et al. | |
| 2022/0162244 A1 | 5/2022 | Sang et al. | |
| 2022/0165968 A1 | 5/2022 | Sang et al. | |
| 2022/0181560 A1 | 6/2022 | Wang et al. | |
| 2022/0194956 A1 | 6/2022 | Li et al. | |
| 2022/0213116 A1 | 7/2022 | Li et al. | |
| 2022/0320442 A1 | 10/2022 | Kim et al. | |
| 2022/0340550 A1 | 10/2022 | Yang et al. | |
| 2022/0396568 A1 | 12/2022 | Yang et al. | |
| 2023/0172065 A1 | 6/2023 | Park et al. | |
| 2023/0232717 A1 | 7/2023 | Lee et al. | |
| 2023/0263054 A1 | 8/2023 | Hwang et al. | |
| 2023/0301183 A1 | 9/2023 | Lee et al. | |
| 2024/0172560 A1 | 5/2024 | Lee et al. | |

FOREIGN PATENT DOCUMENTS

| | | | |
|---|---|---|---|
| CN | 110294703 | A | 10/2019 |
| CN | 110540536 | A | 12/2019 |
| CN | 110903321 | A | 3/2020 |
| CN | 111354853 | A | 6/2020 |
| CN | 111518139 | A | 8/2020 |
| CN | 111527083 | A | 8/2020 |
| CN | 111808087 | A | 10/2020 |
| CN | 112759578 | A | 5/2021 |
| CN | 114163424 | A | 3/2022 |
| EP | 3689867 | A1 | 8/2020 |
| JP | 2017107992 | A | 6/2017 |
| JP | 2020066622 | A | 4/2020 |
| JP | 2020125289 | A | 8/2020 |
| JP | 2022121388 | A | 8/2022 |
| KR | 20180068869 | A | 6/2018 |
| KR | 1020200072211 | A | 6/2020 |
| KR | 1020220021799 | A | 2/2022 |
| WO | 2019151682 | A1 | 8/2019 |
| WO | 2020122460 | A1 | 6/2020 |
| WO | 2020138944 | A1 | 7/2020 |

OTHER PUBLICATIONS

Chinese Notification of Grant of Invention Patent Rights issued in CN Application No. 202111221350.7 on Jul. 31, 2024 and English translation, 2 pages.

* cited by examiner

ORGANIC ELECTROLUMINESCENT DEVICE

CROSS-REFERENCE TO RELATED APPLICATION(S)

This application claims priority to Chinese Patent Application No. CN202011438482.0 filed on Dec. 11, 2020 and Chinese Patent Application No. CN202111221350.7 filed on Oct. 27, 2021, the disclosure of which are incorporated herein by reference in their entireties.

TECHNICAL FIELD

The present disclosure relates to an organic electroluminescent device and, in particular, to an organic electroluminescent device having a first metal complex containing a ligand with a structure of Formula 1 and a first compound with a structure of Formula 2 and an electronic apparatus including the organic electroluminescent device.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

JP2017107992A has disclosed an organic compound having the following general structural formula:

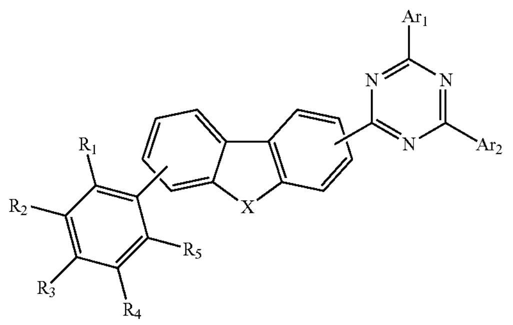

and an organic light-emitting device containing the compound, wherein X is oxygen or sulfur, and $R_1$ to $R_5$ are each independently hydrogen, alkyl, cyano or fluorine. A dopant material used in this application comprises metal complexes containing no particular cyano or fluorine substitution such as

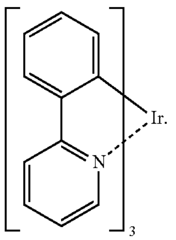

This application has not disclosed the use of a combination of such compounds with a metal complex containing a particular cyano or fluorine substitution.

KR20180068869A has disclosed an organic optoelectronic device whose light-emitting layer contains two hosts. One host has a general structural formula of

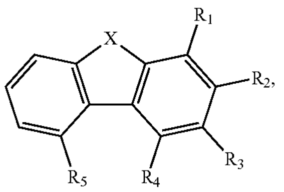

wherein $R_1$ to $R_4$ are each independently hydrogen, $C_{6\text{-}60}$ aryl or a $C_{2\text{-}60}$ heterocyclic group or have a structure of Formula

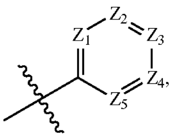

where $Z_1$ to $Z_5$ are each independently N or $CR_6$, and $R_6$ is selected from hydrogen, substituted or unsubstituted $C_{6\text{-}60}$ aryl or substituted or unsubstituted $C_{2\text{-}60}$ heteroaryl; $R_5$ is a $C_{2\text{-}60}$ heterocyclic group or has a structure of Formula

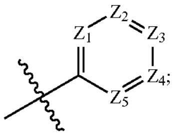

and at least one of $R_1$ to $R_5$ has a structure of Formula

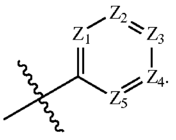

This application has disclosed the following compound among specific structures:

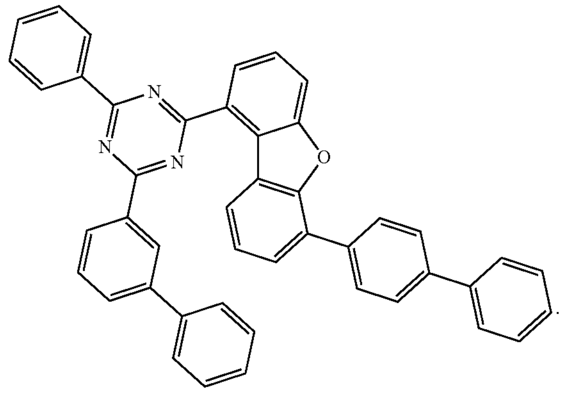 [SMILES: c1ccc(-c2ccc(-c3cccc4c3oc3cccc(-c5nc(-c6ccccc6)nc(-c6cccc(-c7ccccc7)c6)n5)c34)cc2)cc1]

A dopant material used in this application is

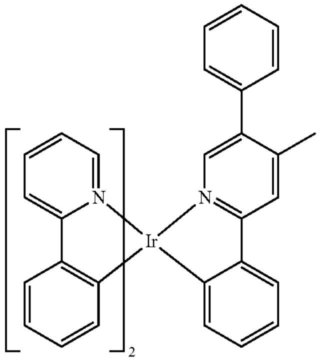

This application has not disclosed the use of a combination of such compounds with a metal complex containing a particular cyano or fluorine substitution.

WO2020122460 has disclosed an organic compound having the following general structural formula:

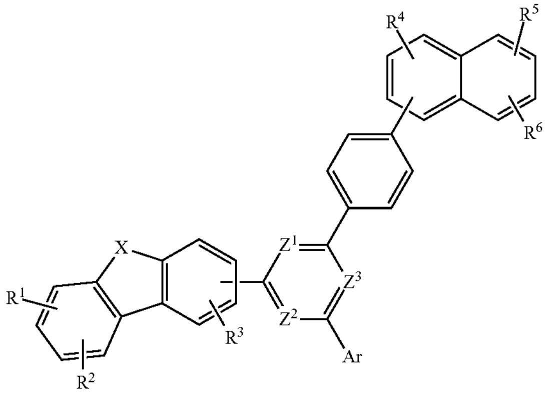

and an organic light-emitting device containing

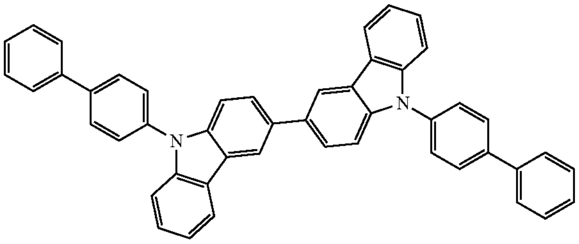

and

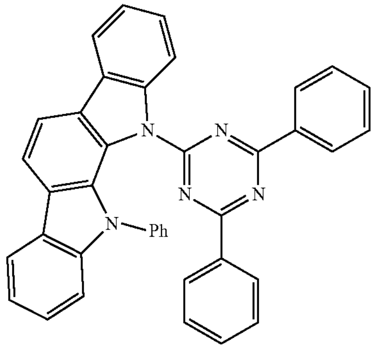

and has not studied the device performance of the metal complex with the fluorine-substituted ligand in other host materials.

SUMMARY

The present disclosure provides a series of organic electroluminescent devices each having a first metal complex containing a ligand with a structure of Formula 1 and a first compound with a structure of Formula 2, so as to solve at least part of the preceding problems.

An embodiment of the present disclosure provides an organic electroluminescent device, which includes:

an anode, a cathode, and an organic layer disposed between the anode and the cathode, wherein the organic layer at least contains a first metal complex and a first compound;

wherein the first metal complex contains a metal M and a ligand $L_a$ coordinated to the metal M, wherein the ligand $L_a$ has a structure represented by Formula 1:

Formula 1

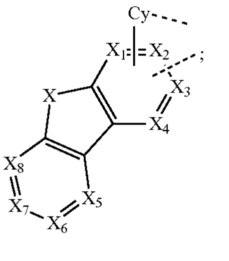

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

X is, at each occurrence identically or differently, selected from the group consisting of O, S, Se, $NR_1$, $CR_1R_1$ and $SiR_1R_1$; when there are two $R_1$ at the same time, the two $R_1$ are identical or different; the compound. This application has disclosed the following compound among specific structures:

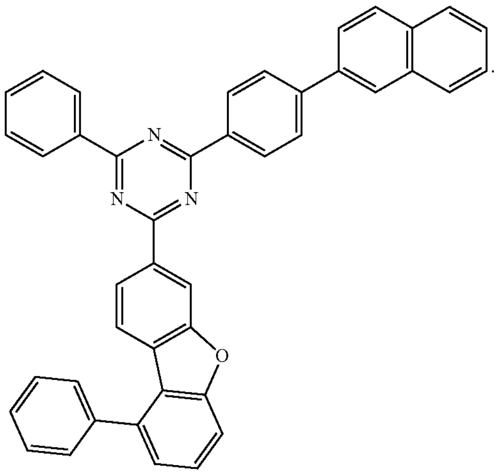 [SMILES: c1ccc(-c2nc(-c3ccc(-c4ccc5ccccc5c4)cc3)nc(-c3ccc4c(c3)oc3cccc(-c5ccccc5)c34)n2)cc1]

This application has not studied an effect of triazine having a biphenyl substitution on device performance. A dopant material used in this application is $[Ir(piq)_2acac]$. This application has not disclosed a dopant material that combines such compounds with a metal complex containing a particular cyano or fluorine substitution.

US20200251666A1 has disclosed a metal complex containing a cyano-substituted ligand. The cyano-substituted ligand has the following structure:

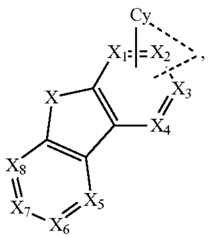

wherein $X_1$ to $X_4$ are selected from C, $CR_{x1}$ or N, $X_5$ to $X_8$ are selected from $CR_{x2}$ or N, and at least one of $R_{x1}$ and $CR_{x2}$ is cyano. This application has disclosed only devices in which such metal complexes with cyano-substituted ligands are used in host materials

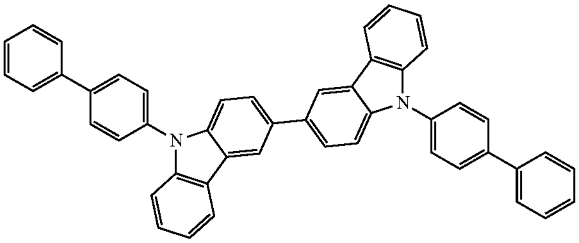

and

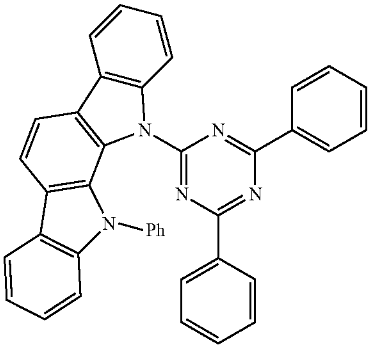

and has not studied the device performance of such metal complexes with cyano-substituted ligands in other host materials.

US20200091442A1 has disclosed a metal complex containing a fluorine-substituted ligand. The fluorine-substituted ligand has the following structure:

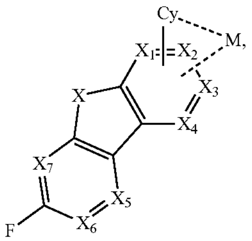

wherein $X_1$ to $X_7$ are selected from C, CR or N. This application has disclosed only devices in which a metal complex with a fluorine substitution at a fixed position is used in host materials $X_1$ to $X_8$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

$R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_1$ to $X_8$ is $CR_x$, and the $R_x$ is cyano or fluorine;

adjacent substituents $R_1$, $R_x$ can be optionally joined to form a ring;

wherein the first compound has a structure represented by Formula 2:

Formula 2

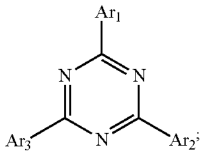

wherein $Ar_1$ has a structure represented by Formula A:

Formula A

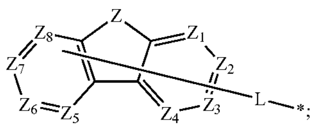

wherein

Z is, at each occurrence identically or differently, selected from the group consisting of O, S and Se;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Z_1$ to $Z_8$ are, at each occurrence identically or differently, selected from C, $CR_z$ or N, and at least one of $Z_1$ to $Z_8$ is C and joined to the L;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $Z_1$ to $Z_8$ is $CR_z$, and the $R_z$ is substituted or unsubstituted aryl having 6 to 30 carbon atoms;

$Ar_2$ and $Ar_3$ are, at each occurrence identically or differently, selected from substituted or unsubstituted aryl having 6 to 30 carbon atoms, substituted or unsubstituted heteroaryl having 3 to 30 carbon atoms or a combination thereof;

"*" represents a position where Formula A is joined to Formula 2; and adjacent substituents $R_z$ can be optionally joined to form a ring.

An embodiment of the present disclosure provides an electronic apparatus comprising the organic electroluminescent device in the preceding embodiment.

The present disclosure provides an organic electroluminescent device having a first metal complex containing a ligand with a structure of Formula 1 and a first compound with a structure of Formula 2. Compared with the related art, a combination of such two compounds can significantly improve the performance of the organic electroluminescent device, such as the external quantum efficiency, power efficiency and current efficiency of the device.

DETAILED DESCRIPTION

Figure 1:
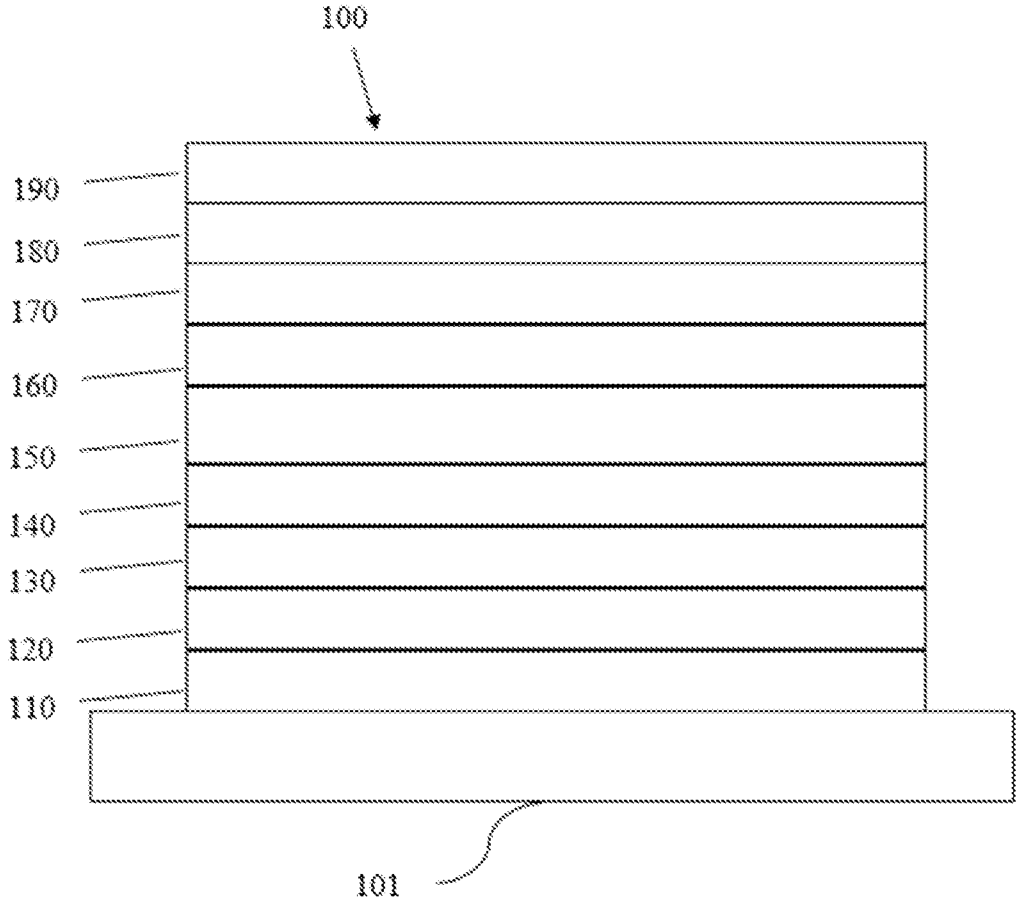
FIG. 1 is a schematic diagram of an organic light-emitting device disclosed herein.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with F4-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
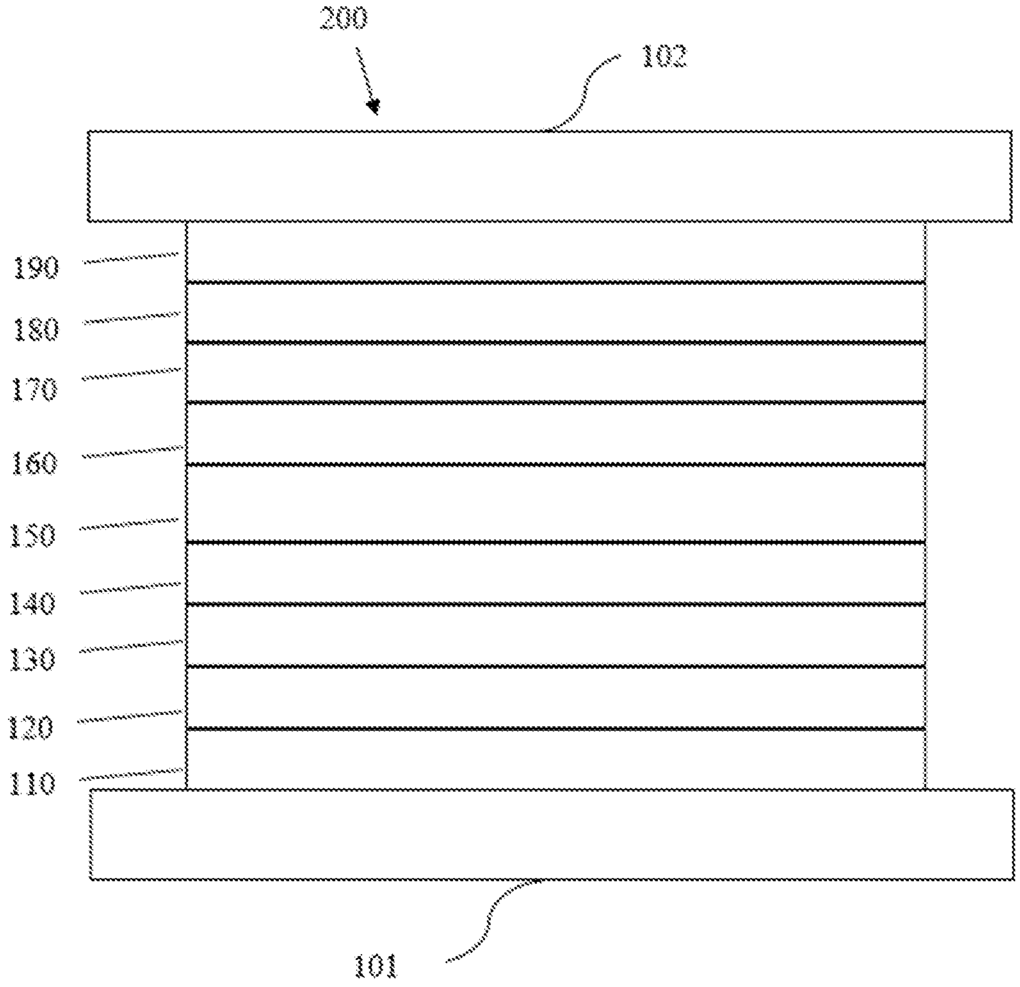
FIG. 2 is a schematic diagram of another organic light-emitting device disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap ($\Delta$ES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small $\Delta$ES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylsilyl, dimethylethylsilyl, dimethylisopropylsilyl, t-butyldimethylsilyl, triethylsilyl, triisopropylsilyl, trimethylsilylmethyl, trimethylsilylethyl, and trimethylsilylisopropyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic, as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

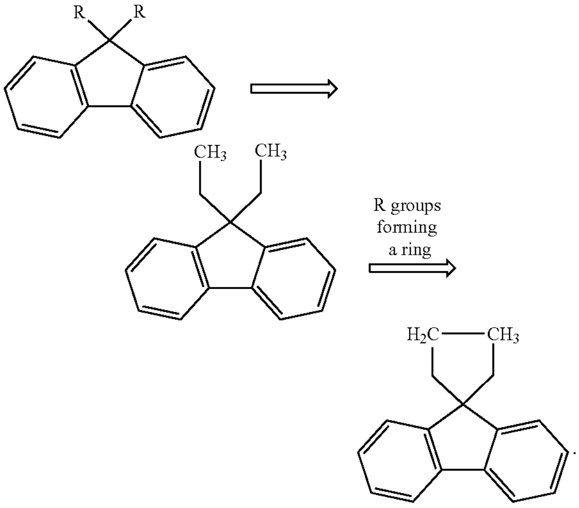

The expression that adjacent substituents can be optionally joined to form a ring is also intended to mean that two substituents bonded to carbon atoms which are directly bonded to each other are joined to each other via a chemical bond to form a ring, which can be exemplified by the following formula:

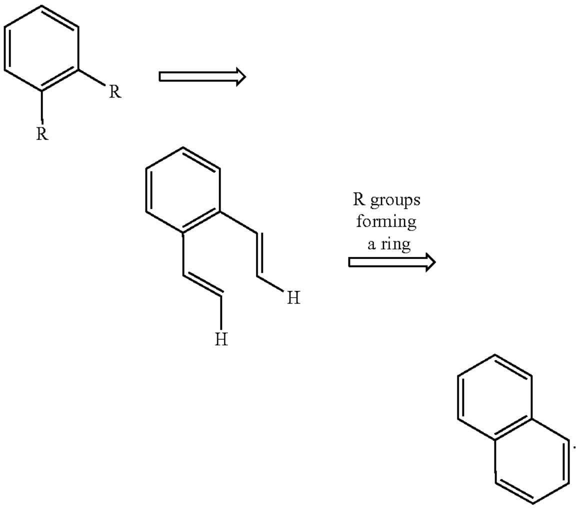

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

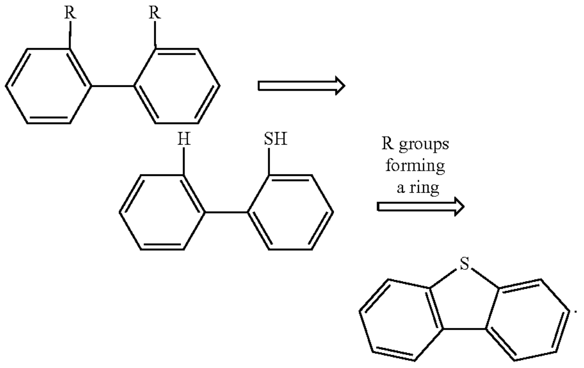

An embodiment of the present disclosure provides an organic electroluminescent device, which includes:

an anode, a cathode, and an organic layer disposed between the anode and the cathode, wherein the organic layer at least contains a first metal complex and a first compound;

wherein the first metal complex contains a metal M and a ligand $L_a$ coordinated to the metal M, wherein the ligand $L_a$ has a structure represented by Formula 1:

Formula 1

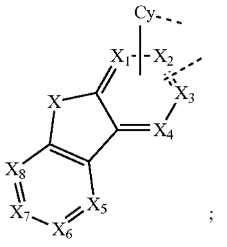

;

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

X is, at each occurrence identically or differently, selected from the group consisting of O, S, Se, $NR_1$, $CR_1R_1$ and $SiR_1R_1$; when there are two $R_1$ at the same time, the two $R_1$ are identical or different;

$X_1$ to $X_8$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

$R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_1$ to $X_8$ is $CR_x$, and the $R_x$ is cyano or fluorine;

adjacent substituents $R_1$, $R_x$ can be optionally joined to form a ring;

wherein the first compound has a structure represented by Formula 2:

Formula 2

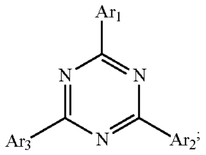

wherein $Ar_1$ has a structure represented by Formula A:

Formula A

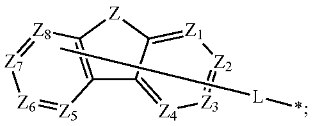

wherein

Z is, at each occurrence identically or differently, selected from the group consisting of O, S and Se;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Z_1$ to $Z_8$ are, at each occurrence identically or differently, selected from C, $CR_z$ or N, and at least one of $Z_1$ to $Z_8$ is C and joined to the L;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $Z_1$ to $Z_8$ is $CR_z$, and the $R_z$ is substituted or unsubstituted aryl having 6 to 30 carbon atoms;

$Ar_2$ and $Ar_3$ are, at each occurrence identically or differently, selected from substituted or unsubstituted aryl having 6 to 30 carbon atoms, substituted or unsubstituted heteroaryl having 3 to 30 carbon atoms or a combination thereof;

"*" represents a position where Formula A is joined to Formula 2; and adjacent substituents $R_z$ can be optionally joined to form a ring.

In this embodiment, the expression that "adjacent substituents $R_1$, $R_x$ can be optionally joined to form a ring" is intended to mean that any one or more of groups of adjacent substituents, such as two substituents $R_1$, two substituents $R_x$, and substituents $R_1$ and $R_x$, can be joined to form a ring. Obviously, it is possible that none of these substituents are joined to form a ring.

In this embodiment, the expression that "adjacent substituents $R_z$ can be optionally joined to form a ring" is intended to mean that any one or more of groups of any two adjacent substituents $R_z$ can be joined to form a ring. Obviously, it is possible that none of these substituents are joined to form a ring.

According to an embodiment of the present disclosure, wherein, $Ar_2$ and $Ar_3$ are, at each occurrence identically or differently, selected from the group consisting of: phenyl, naphthyl, biphenyl, terphenyl, tetraphenyl, phenanthryl, fluorenyl, dibenzofuranyl, dibenzothienyl, pyridyl, pyrimidinyl, pyrazinyl, azafluorenyl, azadibenzofuranyl, azadibenzothienyl, diazafluorenyl, diazadibenzofuranyl, diazadibenzothienyl and combinations thereof; optionally, the above groups may be substituted with one or more of the group consisting of: deuterium, halogen, alkyl having 1 to 20 carbon atoms, cycloalkyl having 3 to 20 ring carbon atoms, heteroalkyl having 1 to 20 carbon atoms, a heterocyclic group having 3 to 20 ring atoms, arylalkyl having 7 to 30 carbon atoms, alkoxy having 1 to 20 carbon atoms, aryloxy having 6 to 30 carbon atoms, alkenyl having 2 to 20 carbon atoms, alkylsilyl having 3 to 20 carbon atoms, arylsilyl having 6 to 20 carbon atoms, amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, $Ar_2$ and $Ar_3$ are, at each occurrence identically or differently, selected from the group consisting of: phenyl, naphthyl, biphenyl, terphenyl, tetraphenyl, phenanthryl, fluorenyl, dibenzofuranyl, dibenzothienyl, pyridyl, pyrimidinyl, pyrazinyl, azafluorenyl, azadibenzofuranyl, azadibenzothienyl, diazafluorenyl, diazadibenzofuranyl, diazadibenzothienyl and combinations thereof; optionally, the above groups may be substituted with one or more of the group consisting of: deuterium, halogen, alkyl having 1 to 20 carbon atoms, cycloalkyl having 3 to 20 ring carbon atoms and combinations thereof.

According to an embodiment of the present disclosure, wherein, $Ar_2$ and $Ar_3$ are, at each occurrence identically or differently, selected from the group consisting of: phenyl, naphthyl, biphenyl, terphenyl, tetraphenyl, phenanthryl, fluorenyl, dibenzofuranyl, dibenzothienyl, pyridyl, pyrimidinyl, pyrazinyl, azafluorenyl, azadibenzofuranyl, azadibenzothienyl, diazafluorenyl, diazadibenzofuranyl, diazadibenzothienyl and combinations thereof; optionally, the above groups may be substituted with one or more of deuterium, halogen or cyano.

According to an embodiment of the present disclosure, wherein, L is, at each occurrence identically or differently, selected from a single bond, substituted or unsubstituted arylene having 6 to 20 carbon atoms, substituted or unsubstituted heteroarylene having 3 to 20 carbon atoms or a combination thereof.

According to an embodiment of the present disclosure, L is, at each occurrence identically or differently, selected from a single bond, substituted or unsubstituted phenylene, substituted or unsubstituted naphthylene or a combination thereof.

According to an embodiment of the present disclosure, L is selected from a single bond, phenylene or naphthylene.

According to an embodiment of the present disclosure, wherein, $Z_1$ to $Z_8$ are, at each occurrence identically or differently, selected from C or $CR_z$.

According to an embodiment of the present disclosure, wherein, at least one of $Z_1$ to $Z_8$ is N.

According to an embodiment of the present disclosure, wherein, at least two of $Z_1$ to $Z_8$ are $CR_z$, and the at least one of the $R_z$ is selected from substituted or unsubstituted aryl having 6 to 30 carbon atoms; and at least another one of the $R_z$ is selected from hydrogen, deuterium, halogen, cyano, substituted or unsubstituted aryl having 6 to 30 carbon atoms or a combination thereof.

According to an embodiment of the present disclosure, wherein, at least one, at least two or at least three of $Z_1$ to $Z_8$ are selected from $CR_z$, and the $R_z$ is selected from substituted or unsubstituted aryl having 6 to 30 carbon atoms.

According to an embodiment of the present disclosure, wherein, at least one, at least two or at least three of $Z_1$ to $Z_8$ are selected from $CR_z$, and the $R_z$ is selected from phenyl, naphthyl, biphenyl, terphenyl or a combination thereof; optionally, phenyl, naphthyl, biphenyl and terphenyl may be substituted with one or more of deuterium, halogen or cyano.

According to an embodiment of the present disclosure, wherein, at least one of $Z_1$ to $Z_4$ is selected from C and joined to the L; and at least one of $Z_5$ or $Z_8$ is selected from $CR_z$, and the $R_z$ is substituted or unsubstituted aryl having 6 to 30 carbon atoms.

According to an embodiment of the present disclosure, wherein, $Z_2$ is selected from C and joined to the L; and at the same time $Z_5$ is $CR_z$, and the $R_z$ is substituted or unsubstituted aryl having 6 to 30 carbon atoms.

According to an embodiment of the present disclosure, wherein, $Z_4$ is selected from C and joined to the L; and at the same time $Z_8$ is $CR_z$, and the $R_z$ is substituted or unsubstituted aryl having 6 to 30 carbon atoms.

According to an embodiment of the present disclosure, wherein, at least one of $Z_1$ to $Z_4$ is selected from C and joined to the L; and at the same time at least one of $Z_1$ to $Z_4$ is selected from $CR_z$, and the $R_z$ is substituted or unsubstituted aryl having 6 to 30 carbon atoms.

According to an embodiment of the present disclosure, wherein, $Ar_2$ and $Ar_3$ are, at each occurrence identically or differently, selected from the group consisting of: phenyl, naphthyl, biphenyl, terphenyl, phenanthryl, fluorenyl, dibenzofuranyl, dibenzothienyl and combinations thereof; optionally, the above groups may be substituted with one or more of deuterium, halogen or cyano.

According to an embodiment of the present disclosure, wherein, $Ar_2$ and $Ar_3$ are, at each occurrence identically or differently, selected from the group consisting of: phenyl, naphthyl, phenanthryl, biphenyl, terphenyl and combinations thereof; optionally, the above groups may be substituted with one or more of deuterium, halogen or cyano.

According to an embodiment of the present disclosure, wherein, the first compound is selected from the group consisting of Compound G-1 to Compound G-172, wherein the specific structures of Compound G-1 to Compound G-172 are referred to claim 10.

According to an embodiment of the present disclosure, wherein, the first compound is selected from the group consisting of Compound G-1 to Compound G-180, wherein the specific structures of Compound G-1 to Compound G-180 are referred to claim 10.

According to an embodiment of the present disclosure, wherein, X is, at each occurrence identically or differently, selected from O or S.

According to an embodiment of the present disclosure, wherein, X is selected from O.

According to an embodiment of the present disclosure, wherein, Cy is, at each occurrence identically or differently, selected from any one of the group consisting of the following structures:

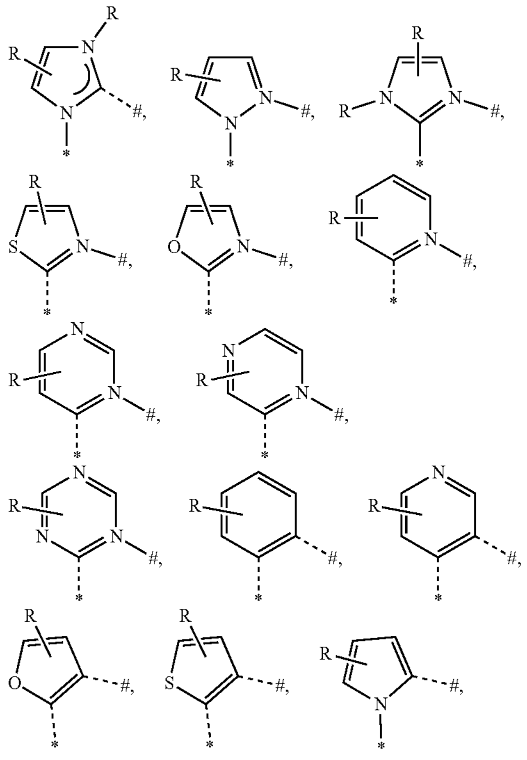

-continued

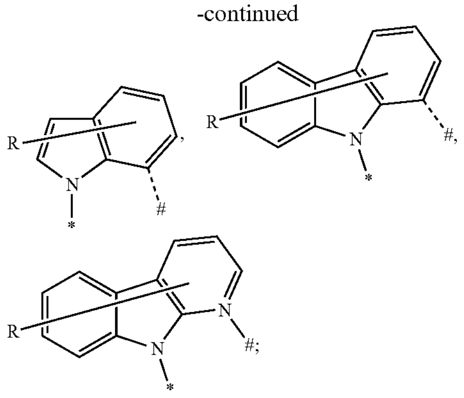

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof; and adjacent substituents R can be optionally joined to form a ring;

wherein "#" represents a position where Cy is joined to the metal M; and

"*" represents a position where Cy is joined to $X_1$, $X_2$, $X_3$ or $X_4$ in Formula 1.

In the present disclosure, the expression that "adjacent substituents R can be optionally joined to form a ring" is intended to mean that any one or more of groups of any two adjacent substituents R can be joined to form a ring. Obviously, it is possible that none of these substituents are joined to form a ring.

According to an embodiment of the present disclosure, wherein, in Formula 1, Cy is selected from

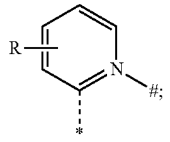

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof; and adjacent substituents R can be optionally joined to form a ring;

wherein "#" represents a position where Cy is joined to the metal M; and

"*" represents a position where Cy is joined to $X_1$, $X_2$, $X_3$ or $X_4$ in Formula 1.

According to an embodiment of the present disclosure, wherein, at least one of $X_1$ to $X_8$ is selected from N.

According to an embodiment of the present disclosure, wherein, $X_8$ is N.

According to an embodiment of the present disclosure, wherein, $X_1$ to $X_8$ are, at each occurrence identically or differently, selected from C or $CR_x$.

According to an embodiment of the present disclosure, wherein, the ligand $L_a$ has a structure represented by Formula 1a:

Formula 1a

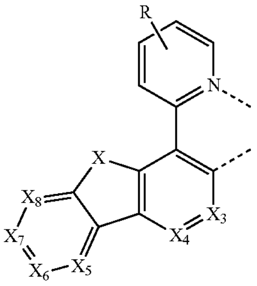

;

wherein

X is, at each occurrence identically or differently, selected from the group consisting of O, S, Se, $NR_1$, $CR_1R_1$ and $SiR_1R_1$; when there are two $R_1$ at the same time, the two $R_1$ are identical or different;

$X_3$ to $X_8$ are, at each occurrence identically or differently, selected from $CR_x$ or N;

R represents, at each occurrence identically or differently, mono-substitution, multiple substitutions or non-substitution;

$R_x$, R and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_3$ to $X_8$ is $CR_x$, and the $R_x$ is cyano or fluorine; and adjacent substituents $R_x$, $R_1$, R can be optionally joined to form a ring.

In the present disclosure, the expression that "adjacent substituents $R_x$, $R_1$, R can be optionally joined to form a ring" is intended to mean that any one or more of groups of adjacent substituents, such as two substituents $R_1$, two substituents $R_x$, two substituents R, and substituents $R_1$ and $R_x$, can be joined to form a ring. Obviously, it is possible that none of these substituents are joined to form a ring.

According to an embodiment of the present disclosure, wherein, the ligand $L_a$ is, at each occurrence identically or differently, selected from any one of the group consisting of the following:

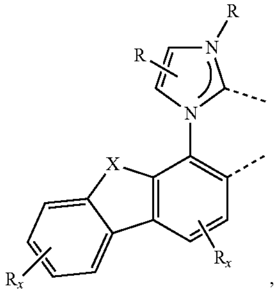

,

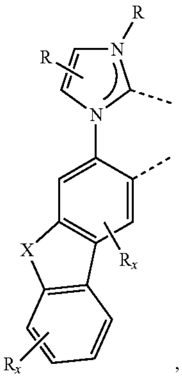

,

-continued
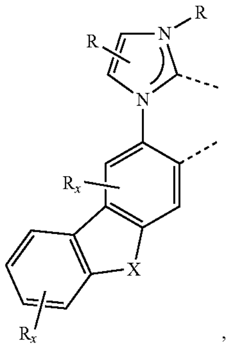
,
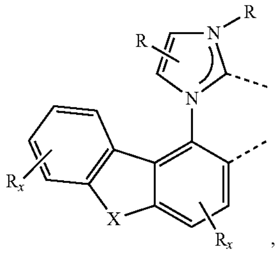
,
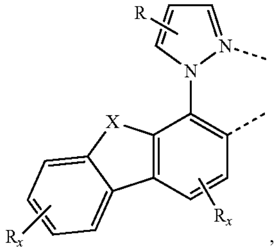
,
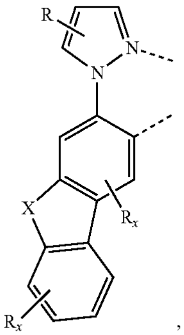
,
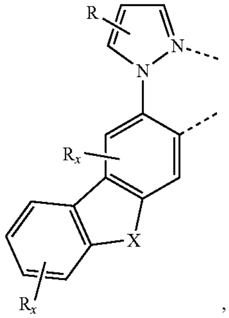
,
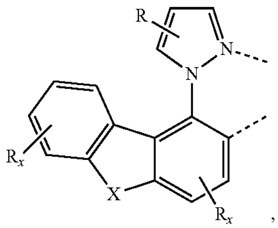
,
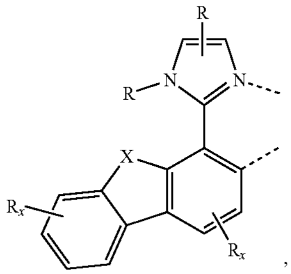
,
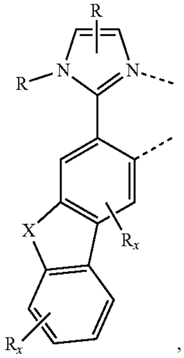
,
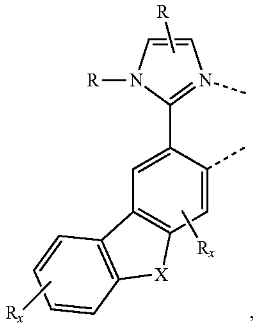
,
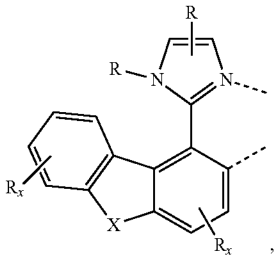
,
-continued
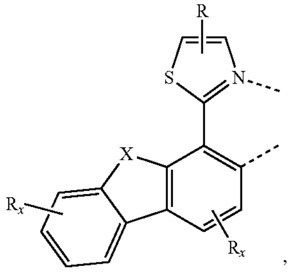
,
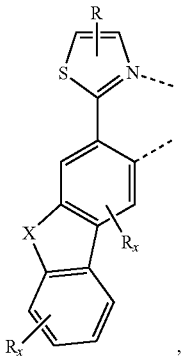
,
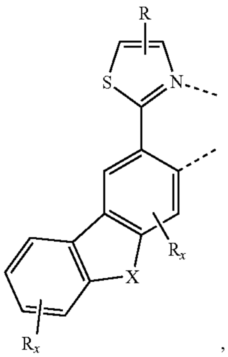
,
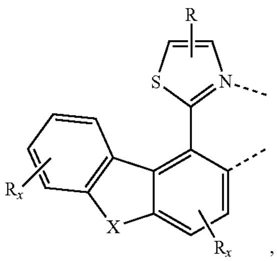
,
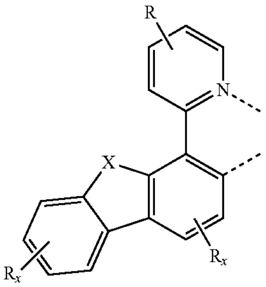
,
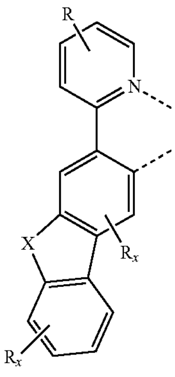
,
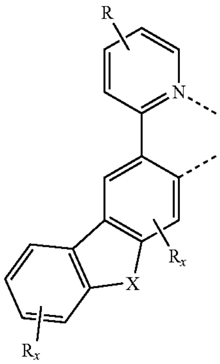
,
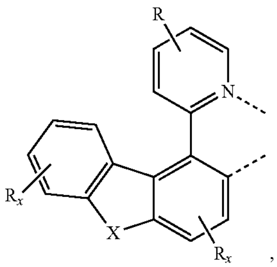
, -continued
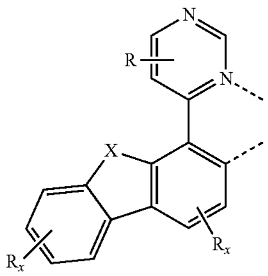
,
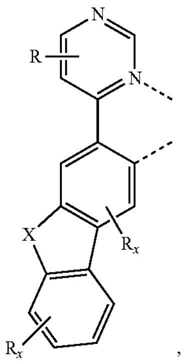
,
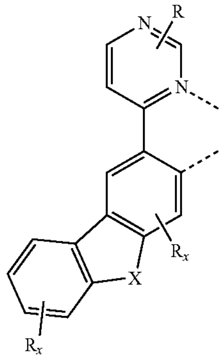
,
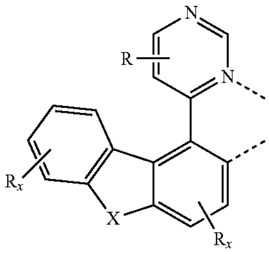
,
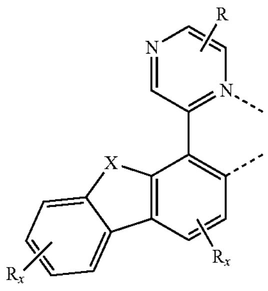
,
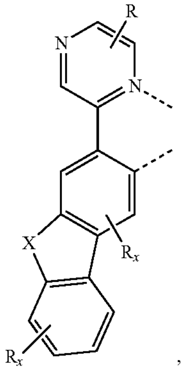
,
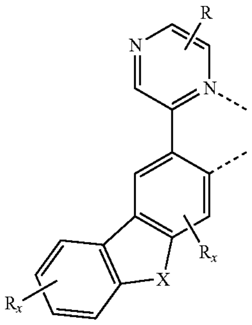
,
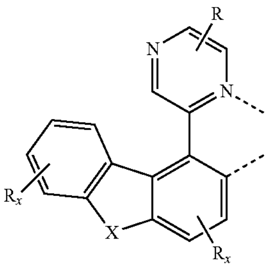
,
-continued
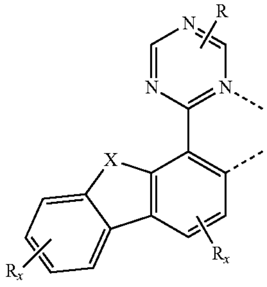
,
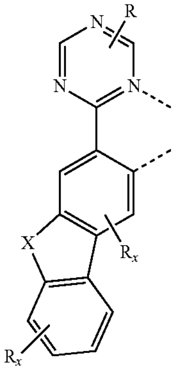
,
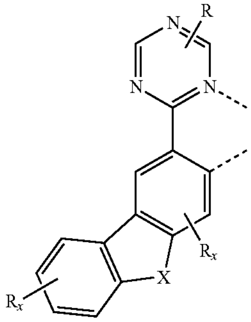
,
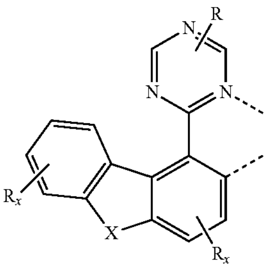
,
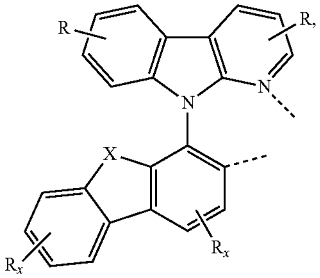
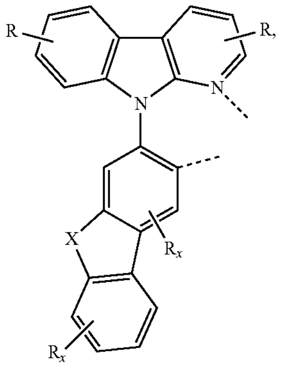
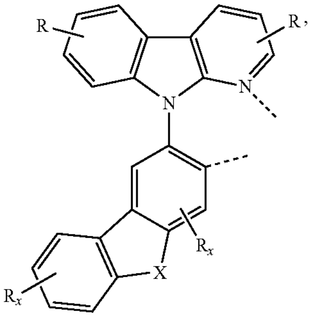

-continued
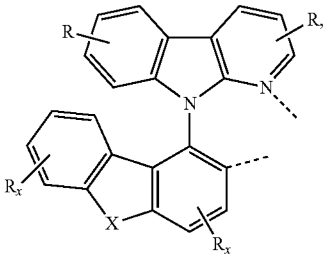
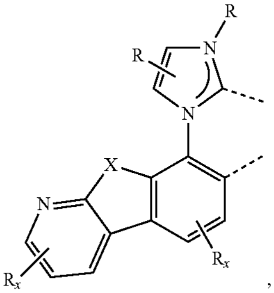,
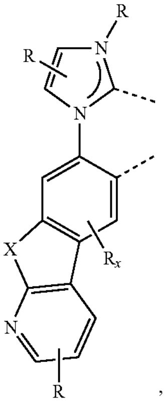,
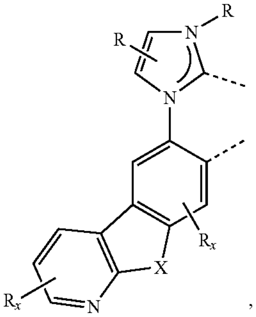,
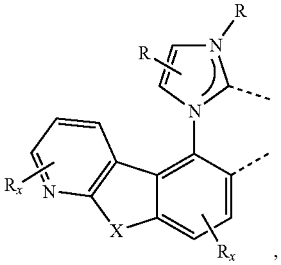,
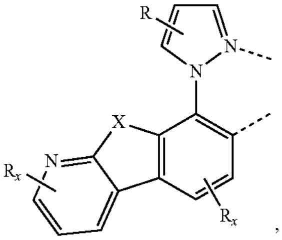,
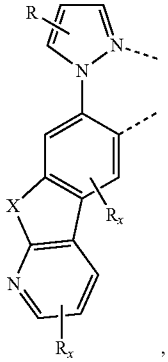,
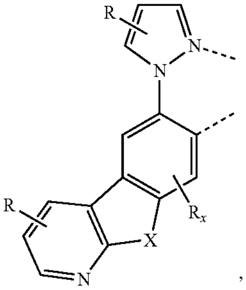,
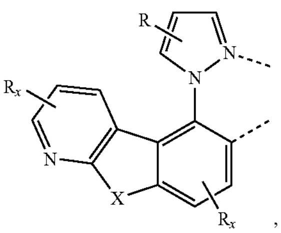,
-continued
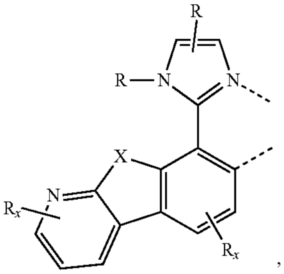,
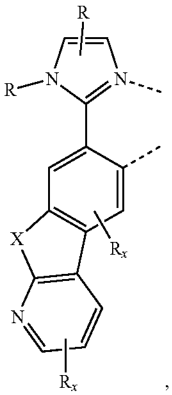,
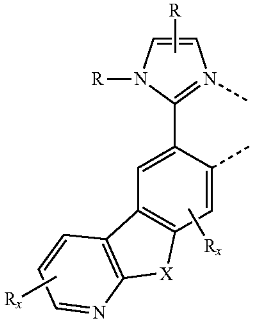,
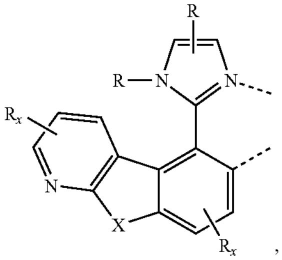,
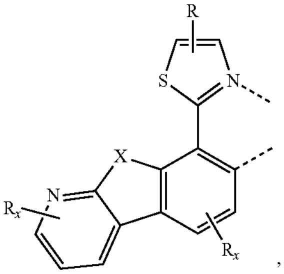,
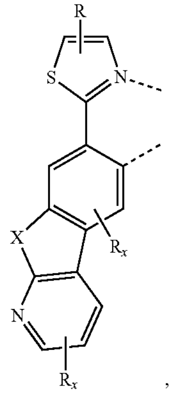,
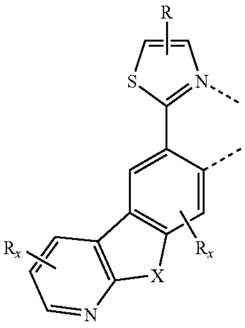,
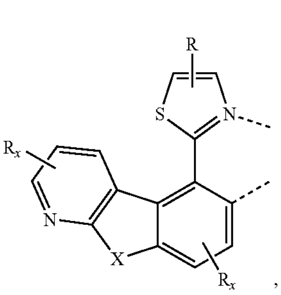, -continued
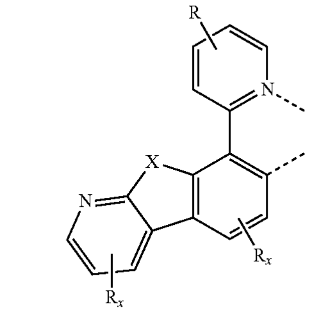
,
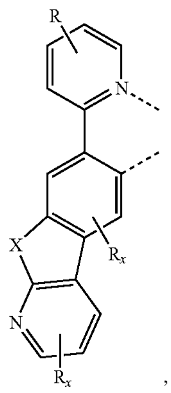
,
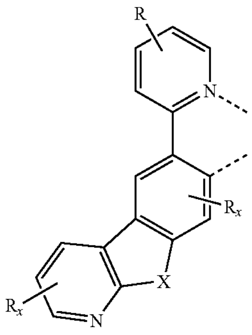
,
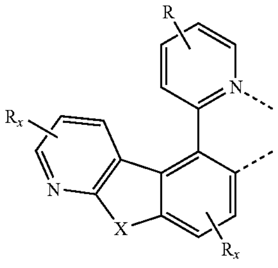
,
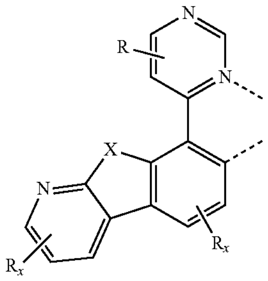
,
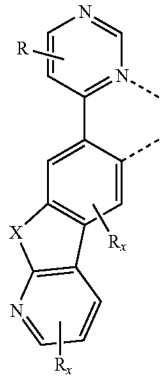
,
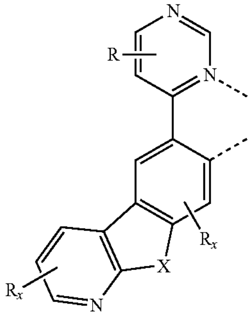
,
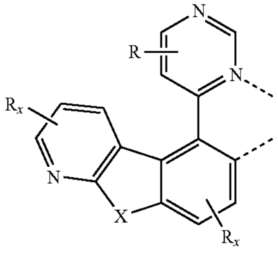
,
-continued
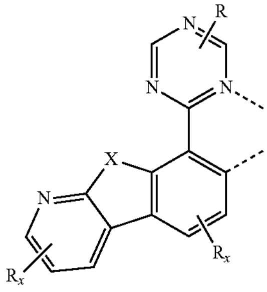
,
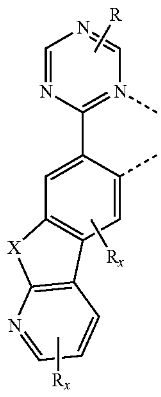
,
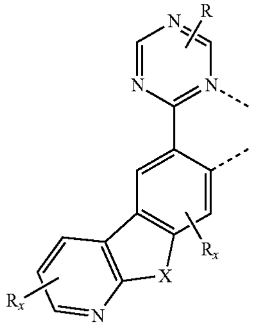
,
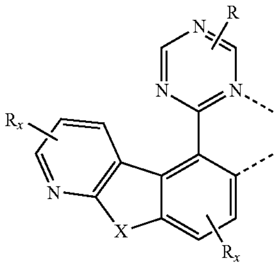
,
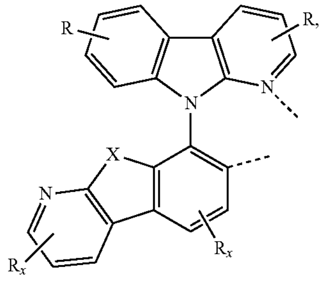
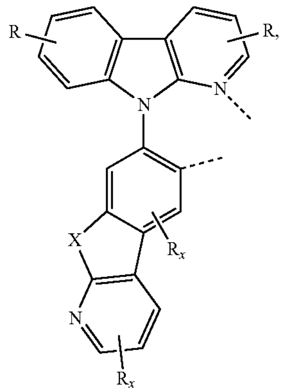
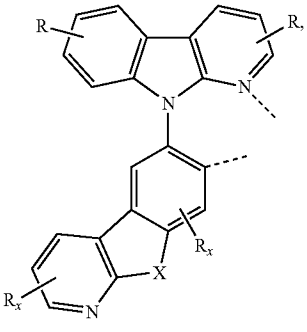

-continued
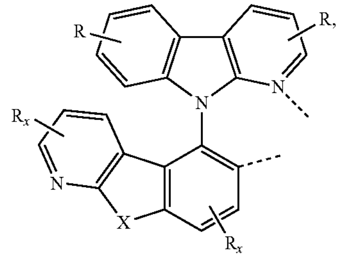
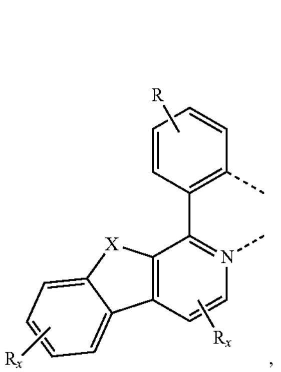
,
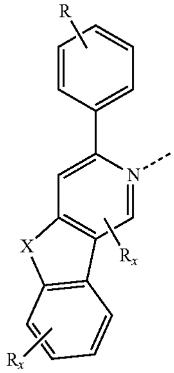
,
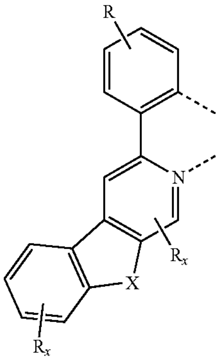
,
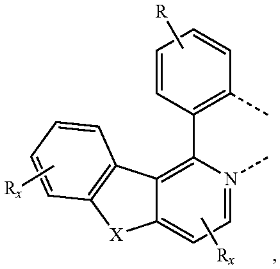
,
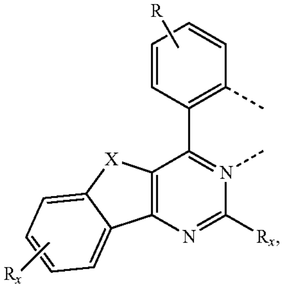
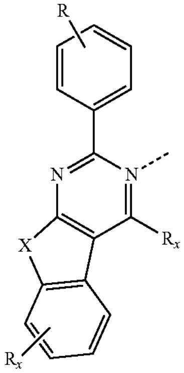
,
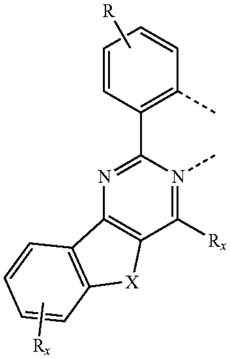
,
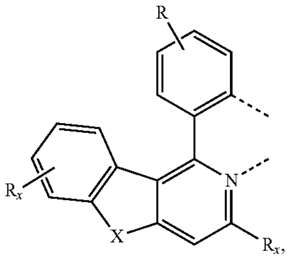
-continued
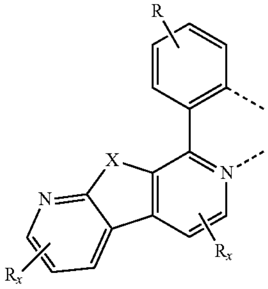
,
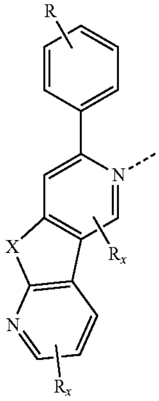
,
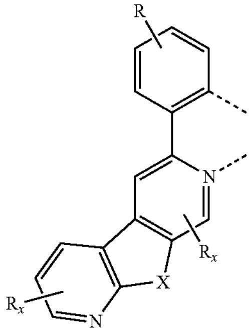
,
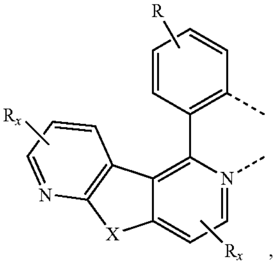
,
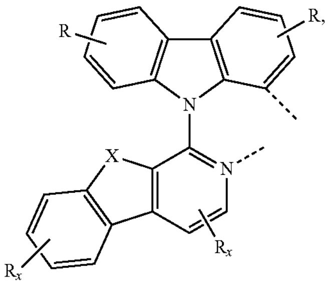
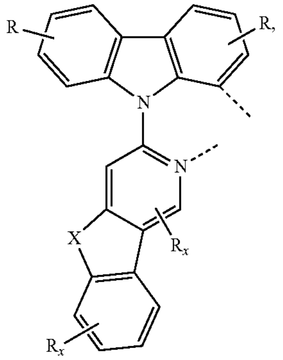
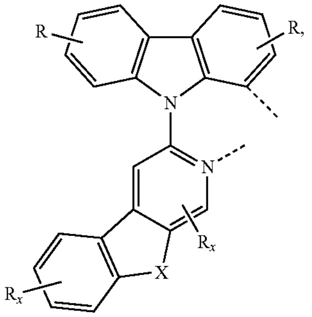

-continued

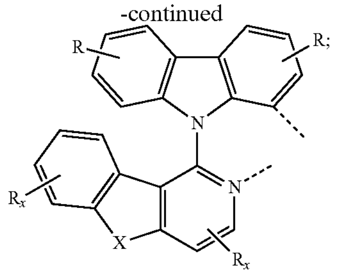

wherein

X is, at each occurrence identically or differently, selected from the group consisting of O, S, Se, $NR_1$, $CR_1R_1$ and $SiR_1R_1$, preferably selected from the group consisting of O and S; when there are two $R_1$ at the same time, the two $R_1$ may be identical or different;

R represents, at each occurrence identically or differently, mono-substitution, multiple substitutions or non-substitution;

$R_x$ represents, at each occurrence identically or differently, mono-substitution or multiple substitutions;

R, $R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one $R_x$ is cyano or fluorine; and adjacent substituents R, $R_x$ and $R_1$ can be optionally joined to form a ring;

preferably, there exist at least another one $R_x$ in the above structure, and the $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

According to an embodiment of the present disclosure, wherein, the ligand $L_a$ is, at each occurrence identically or differently, selected from any one of the following structures:

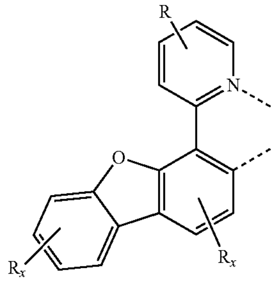

,

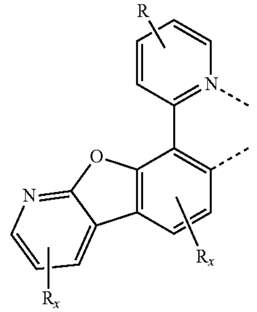

;

wherein

X is, at each occurrence identically or differently, selected from O, S or Se;

R represents, at each occurrence identically or differently, mono-substitution, multiple substitutions or non-substitution;

$R_x$ represents, at each occurrence identically or differently, mono-substitution or multiple substitutions;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_x$ is cyano or fluorine; and adjacent substituents R, $R_x$ can be optionally joined to form a ring;

preferably, there exist at least another one $R_x$ in the above structure, and the $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

In this embodiment, the expression that "adjacent substituents R, $R_x$ can be optionally joined to form a ring" is intended to mean that any one or more of groups of adjacent substituents, such as two substituents R, two substituents $R_x$, and substituents R and $R_x$, can be joined to form a ring. Obviously, it is possible that none of these substituents are joined to form a ring.

According to an embodiment of the present disclosure, wherein, there exist at least two $R_x$ in the ligand $L_a$, and wherein one of the $R_x$ is fluorine or cyano and the other one of the $R_x$ is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms or a combination thereof.

According to an embodiment of the present disclosure, wherein, the ligand $L_a$ is selected from the following structure:

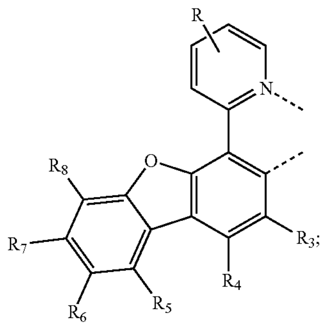

wherein

R represents, at each occurrence identically or differently, mono-substitution, multiple substitutions or non-substitution;

$R_3$ to $R_8$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof;

at least one of $R_3$ to $R_8$ is cyano or fluorine;

adjacent substituents $R_3$ to $R_8$ and R can be optionally joined to form a ring;

preferably, at least one of $R_5$ to $R_8$ is cyano or fluorine;

more preferably, $R_7$ or $R_8$ is cyano, or $R_7$ is fluorine.

In this embodiment, the expression that "adjacent substituents $R_3$ to $R_8$ and R can be optionally joined to form a ring" is intended to mean that any one or more of groups of adjacent substituents, such as two substituents R and any two adjacent substituents of $R_3$ to $R_8$, can be joined to form a ring. Obviously, it is possible that none of these substituents are joined to form a ring.

According to an embodiment of the present disclosure, wherein, the first metal complex has a general formula of $M(L_a)_m(L_b)_n(L_c)_q$;

wherein the metal M is, at each occurrence identically or differently, selected from the group consisting of Cu, Ag, Au, Ru, Rh, Pd, Os, Ir and Pt; preferably, M is, at each occurrence identically or differently, selected from Pt or Ir;

$L_a$, $L_b$ and $L_c$ are a first ligand, a second ligand and a third ligand coordinated to the metal M, respectively; $L_a$, $L_b$ and $L_c$ can be optionally joined to form a multidentate ligand; for example, any two of $L_a$, $L_b$ and $L_c$ may be joined to form a tetradentate ligand; in another example, $L_a$, $L_b$ and $L_c$ may be joined to each other to form a hexadentate ligand; in another example, none of $L_a$, $L_b$ and $L_c$ are joined so that the multidentate ligand is not formed;

$L_b$ and $L_c$ are identically or differently a monoanionic bidentate ligand;

m is selected from 1, 2 or 3, n is selected from 0, 1 or 2, q is selected from 0, 1 or 2, and m+n+q equals an oxidation state of the metal M; wherein when m is greater than or equal to 2, a plurality of $L_a$ are identical or different; when n is equal to 2, two $L_b$ are identical or different; when q is equal to 2, two $L_c$ are identical or different;

preferably, the ligands $L_b$ and $L_c$ are, at each occurrence identically or differently, selected from a structure represented by any one of the group consisting of the following:

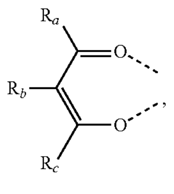

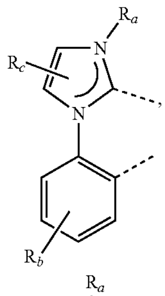

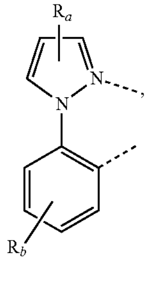

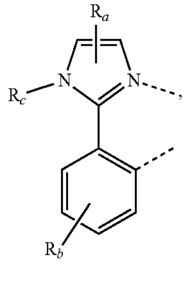

-continued

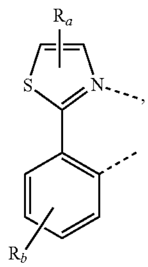

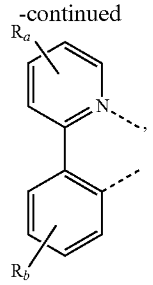

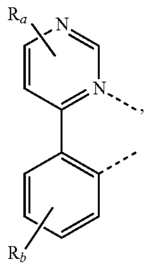

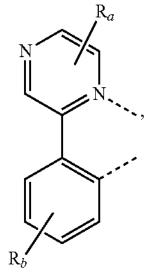

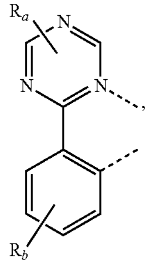

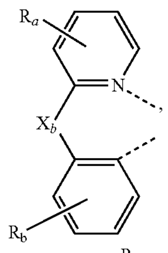

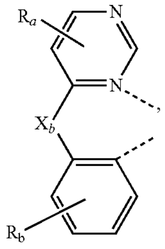

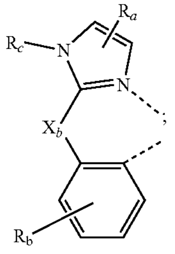

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

In this embodiment, the expression that "adjacent substituents $R_a$, $R_b$, $R_c$, $R_{N1}$, $R_{C1}$ and $R_{C2}$ can be optionally joined to form a ring" is intended to mean that any one or more of groups of adjacent substituents, such as two substituents $R_a$, two substituents $R_b$, two substituents $R_c$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_a$ and $R_{C2}$, substituents $R_b$ and $R_{C1}$, substituents $R_b$ and $R_{C2}$, and substituents $R_{C1}$ and $R_{C2}$, can be joined to form a ring. Obviously, it is possible that none of these substituents are joined to form a ring.

According to an embodiment of the present disclosure, wherein, the ligand $L_a$ is, at each occurrence identically or differently, selected from the group consisting of $L_{a1}$ to $L_{a124}$, wherein the specific structures of $L_{a1}$ to $L_{a124}$ are referred to claim 20.

According to an embodiment of the present disclosure, wherein, the ligands $L_b$ and $L_c$ are, at each occurrence identically or differently, selected from the group consisting of $L_{b1}$ to $L_{b197}$, wherein the specific structures of $L_{b1}$ to $L_{b197}$ are referred to claim 21.

According to an embodiment of the present disclosure, wherein, the ligands $L_b$ and $L_c$ are, at each occurrence identically or differently, selected from the group consisting of $L_{b1}$ to $L_{b203}$, wherein the specific structures of $L_{b1}$ to $L_{b203}$ are referred to claim 21.

According to an embodiment of the present disclosure, wherein, the first metal complex has a structure represented by Formula 1b:

Formula 1b

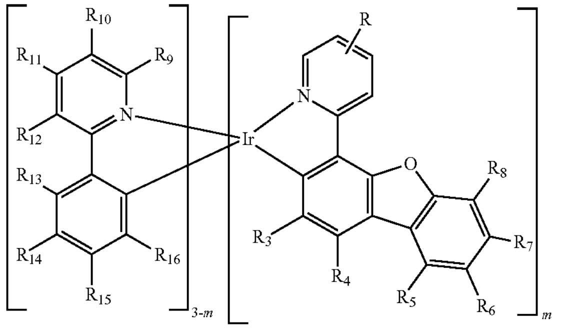

;

wherein m is 1, 2 or 3; when m is 2 or 3, a plurality of $L_a$ are identical or different; when m is 1, two $L_b$ are identical or different;

R represents, at each occurrence identically or differently, mono-substitution, multiple substitutions or non-substitution;

$R_3$ to $R_{16}$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_3$ to $R_8$ is cyano or fluorine;

adjacent substituents $R_3$ to $R_{16}$ and R can be optionally joined to form a ring;

preferably, $R_7$ or $R_8$ is cyano, or $R_7$ is fluorine.

In this embodiment, the expression that "adjacent substituents $R_3$ to $R_{16}$ and R can be optionally joined to form a ring" is intended to mean that any one or more of groups of adjacent substituents, such as two substituents R, any two adjacent substituents of $R_3$ to $R_8$, and any two adjacent substituents of $R_9$ to $R_{16}$, can be joined to form a ring. Obviously, it is possible that none of these substituents are joined to form a ring.

According to an embodiment of the present disclosure, wherein, one of $R_3$ to $R_8$ is cyano.

According to an embodiment of the present disclosure, wherein, one of $R_5$ to $R_8$ is cyano.

According to an embodiment of the present disclosure, wherein, one of $R_7$ or $R_8$ is cyano.

According to an embodiment of the present disclosure, wherein, one of $R_5$ to $R_8$ is cyano; and at the same time another one of $R_5$ to $R_8$ is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms or substituted or unsubstituted heteroaryl having 3 to 30 carbon atoms.

According to an embodiment of the present disclosure, wherein, $R_8$ is substituted or unsubstituted phenyl, and at the same time $R_7$ is cyano.

According to an embodiment of the present disclosure, wherein, $R_7$ is substituted or unsubstituted phenyl, and at the same time $R_8$ is cyano.

According to an embodiment of the present disclosure, wherein, $R_7$ is substituted or unsubstituted alkyl having 1 to 10 carbon atoms, and at the same time $R_8$ is cyano.

According to an embodiment of the present disclosure, wherein, one of $R_3$ to $R_8$ is fluorine.

According to an embodiment of the present disclosure, wherein, one of $R_5$ to $R_8$ is fluorine.

According to an embodiment of the present disclosure, wherein, $R_7$ is fluorine, and at the same time $R_8$ is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms or a combination thereof.

According to an embodiment of the present disclosure, wherein, $R_7$ is fluorine, and at the same time $R_8$ is selected from substituted or unsubstituted aryl having 6 to 30 carbon atoms, substituted or unsubstituted heteroaryl having 3 to 30 carbon atoms or a combination thereof.

According to an embodiment of the present disclosure, wherein, $R_7$ is fluorine, and at the same time $R_8$ is selected from substituted or unsubstituted phenyl.

According to an embodiment of the present disclosure, wherein, at least one of $R_3$ to $R_8$ is cyano or fluorine, and at least one of the rest of $R_3$ to $R_8$ and at least one of $R_9$ to $R_{16}$ are selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, wherein, at least one of $R_3$ to $R_8$ is cyano or fluorine, and at least one of the rest of $R_3$ to $R_8$ and at least one of $R_9$ to $R_{16}$ are selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

According to an embodiment of the present disclosure, wherein, at least one or two of $R_{10}$, $R_{11}$ and $R_{15}$ are selected from the group consisting of: deuterium, fluorine, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, wherein, at least one or two of $R_{10}$, $R_{11}$ and $R_{15}$ are selected from the group consisting of: substituted or unsubstituted alkyl having 1 to 20 carbon atoms, substituted or unsubstituted cycloalkyl having 3 to 20 ring carbon atoms and combinations thereof.

According to an embodiment of the present disclosure, wherein, the first metal complex is selected from the group consisting of GD1 to GD130, wherein the specific structures of GD1 to GD130 are referred to claim 25.

According to an embodiment of the present disclosure, wherein, the first metal complex is selected from the group consisting of GD1 to GD132, wherein the specific structures of GD1 to GD132 are referred to claim 25.

According to an embodiment of the present disclosure, wherein, the organic layer further contains a second compound, wherein the second compound comprises at least one chemical group selected from the group consisting of:

benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to an embodiment of the present disclosure, wherein, the second compound comprises at least one chemical group selected from the group consisting of: benzene, carbazole, indolocarbazole, fluorene, silafluorene and combinations thereof.

According to an embodiment of the present disclosure, wherein, the second compound has a structure represented by Formula X:

Formula X

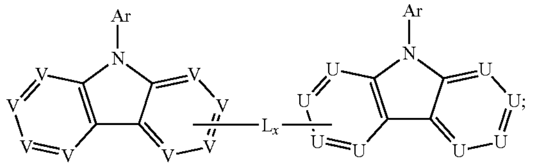

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from C, $CR_v$ or N, and at least one of V is C and joined to the $L_x$;

U is, at each occurrence identically or differently, selected from C, $CR_u$ or N, and at least one of U is C and joined to the $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

Ar is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

In the present disclosure, the expression that "adjacent substituents $R_v$ and $R_u$ can be optionally joined to form a ring" is intended to mean that any one or more of groups of adjacent substituents, such as two substituents $R_v$, two substituents $R_u$, and substituents $R_v$ and $R_u$, can be joined to form a ring. Obviously, it is possible that none of these substituents are joined to form a ring.

According to an embodiment of the present disclosure, wherein, the second compound has a structure represented by one of Formulas X-a to X-j:

X-a

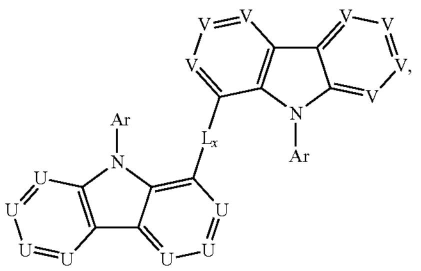

X-b

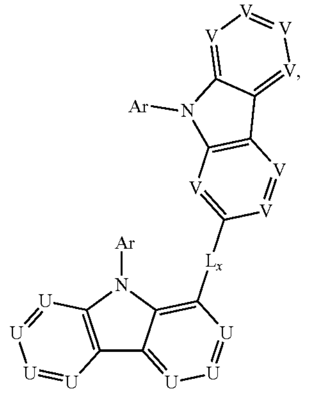

X-c

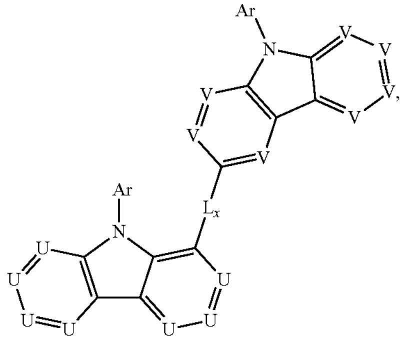

-continued

X-d

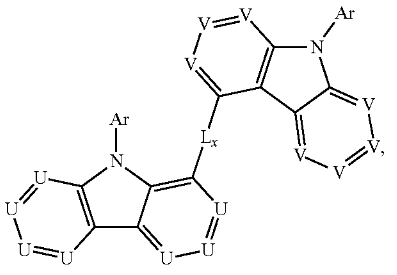

X-e

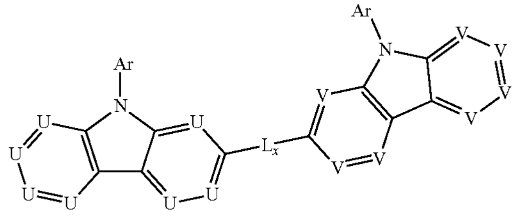

X-f

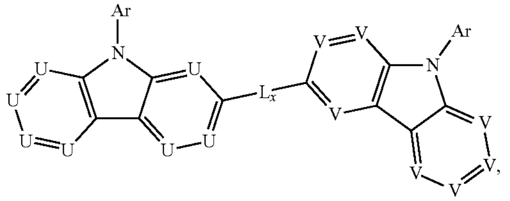

X-g

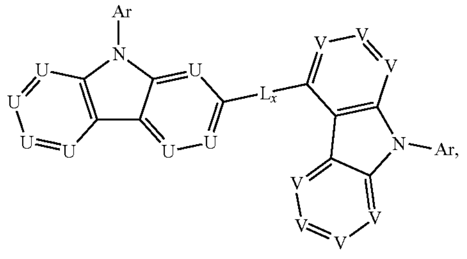

X-h

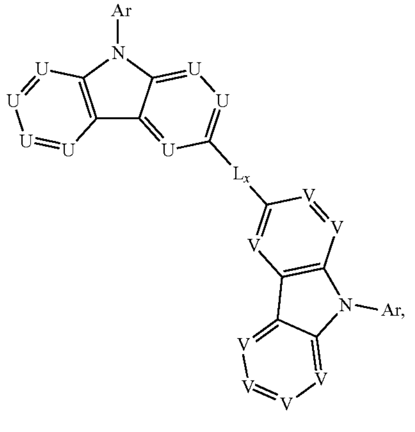

-continued

X-i

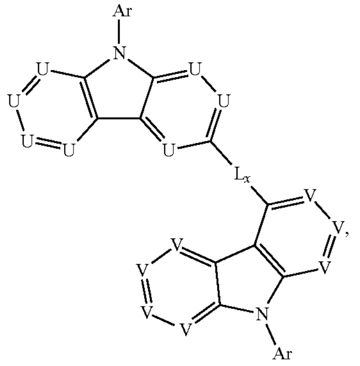

X-j

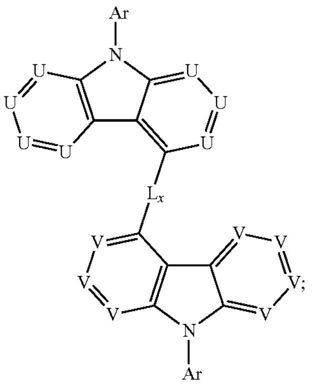

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from $CR_v$ or N;

U is, at each occurrence identically or differently, selected from $CR_u$ or N;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

Ar is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

According to an embodiment of the present disclosure, wherein, V is, at each occurrence identically or differently, selected from C or $CR_v$, and U is, at each occurrence identically or differently, selected from C or $CR_u$, wherein $R_u$ and $R_v$ are, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, $R_u$ and $R_v$ are, at each occurrence identically or differently, selected from hydrogen, deuterium, substituted or unsubstituted alkyl having 1 to 10 carbon atoms, substituted or unsubstituted aryl having 6 to 18 carbon atoms, substituted or unsubstituted heteroaryl having 3 to 18 carbon atoms or a combination thereof.

According to an embodiment of the present disclosure, wherein, $R_u$ and $R_v$ are, at each occurrence identically or differently, selected from hydrogen, deuterium, phenyl, biphenyl, naphthyl, phenanthryl, triphenylene, terphenyl, fluorenyl, pyridyl, dibenzofuranyl, dibenzothienyl or a combination thereof.

According to an embodiment of the present disclosure, wherein, the Ar is, at each occurrence identically or differently, selected from substituted or unsubstituted aryl having 6 to 24 carbon atoms, substituted or unsubstituted heteroaryl having 3 to 24 carbon atoms or a combination thereof.

According to an embodiment of the present disclosure, wherein, the Ar is, at each occurrence identically or differently, selected from the group consisting of: phenyl, biphenyl, naphthyl, phenanthryl, triphenylene, terphenyl, fluorenyl, dibenzofuranyl, dibenzothienyl and combinations thereof.

According to an embodiment of the present disclosure, wherein, the $L_x$ is, at each occurrence identically or differently, selected from a single bond, substituted or unsubstituted arylene having 6 to 20 carbon atoms, substituted or unsubstituted heteroarylene having 3 to 20 carbon atoms or a combination thereof.

According to an embodiment of the present disclosure, wherein, the $L_x$ is, at each occurrence identically or differently, selected from a single bond, substituted or unsubstituted phenylene, substituted or unsubstituted biphenylene, substituted or unsubstituted carbazolylene, substituted or unsubstituted dibenzofuranylene or substituted or unsubstituted dibenzothienylene.

According to an embodiment of the present disclosure, wherein, the $L_x$ is a single bond, phenylene or biphenylene.

According to an embodiment of the present disclosure, wherein, the second compound is selected from the group consisting of Compound X-1 to Compound X-126, wherein the specific structures of Compound X-1 to Compound X-126 are referred to claim 31.

According to an embodiment of the present disclosure, wherein, the organic layer is a light-emitting layer, wherein the light-emitting layer contains the first metal complex, the first compound and the second compound, and the weight of the first metal complex accounts for 1% to 30% of the total weight of the light-emitting layer.

According to an embodiment of the present disclosure, wherein, the organic layer is the light-emitting layer, wherein the light-emitting layer contains the first metal complex, the first compound and the second compound, and the weight of the first metal complex accounts for 3% to 13% of the total weight of the light-emitting layer.

An embodiment of the present disclosure further provides an electronic apparatus comprising the organic electroluminescent device according to any one of the embodiments described above.

An embodiment of the present disclosure further provides a compound composition containing a first metal complex and a first compound;

wherein the first metal complex contains a metal M and a ligand $L_a$ coordinated to the metal M, wherein the ligand $L_a$ has a structure represented by Formula 1:

Formula 1

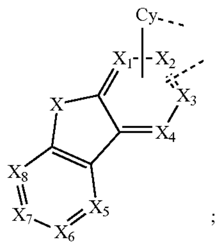

;

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

X is, at each occurrence identically or differently, selected from the group consisting of O, S, Se, $NR_1$, $CR_1R_1$ and $SiR_1R_1$; when there are two $R_1$ at the same time, the two $R_1$ are identical or different;

$X_1$ to $X_8$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

$R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_1$ to $X_8$ is $CR_x$, and the $R_x$ is cyano or fluorine;

adjacent substituents $R_1$, $R_x$ can be optionally joined to form a ring;

wherein the first compound has a structure represented by Formula 2:

Formula 2

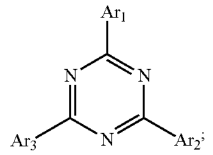

wherein $Ar_1$ has a structure represented by Formula A:

Formula A

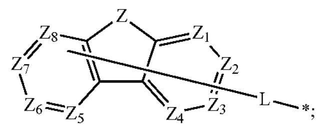

wherein

Z is, at each occurrence identically or differently, selected from the group consisting of O, S and Se;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Z_1$ to $Z_8$ are, at each occurrence identically or differently, selected from C, $CR_z$ or N, and at least one of $Z_1$ to $Z_8$ is C and joined to the L;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $Z_1$ to $Z_8$ is $CR_z$, and the $R_z$ is substituted or unsubstituted aryl having 6 to 30 carbon atoms;

$Ar_2$ and $Ar_3$ are, at each occurrence identically or differently, selected from substituted or unsubstituted aryl having 6 to 30 carbon atoms, substituted or unsubstituted heteroaryl having 3 to 30 carbon atoms or a combination thereof;

"*" represents a position where Formula A is joined to Formula 2; and adjacent substituents $R_z$ can be optionally joined to form a ring.

According to an embodiment of the present disclosure, wherein, the compound composition further contains a second compound as described above.

According to an embodiment of the present disclosure, the compound composition contains the first compound, the second compound and the first metal complex, wherein the first compound, the second compound and the first metal complex may be further selected from the groups as described in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

Device Example

The method for preparing an electroluminescent device is not limited. The preparation method in the following example is merely an example and not to be construed as a limitation. Those skilled in the art can make reasonable improvements on the preparation method in the following example based on the related art. Exemplarily, the proportions of various materials in a light-emitting layer are not particularly limited. Those skilled in the art can reasonably select the proportions within a certain range based on the related art. For example, taking the total weight of the materials in the light-emitting layer as reference, a host material may account for 80% to 99% and a light-emitting material may account for 1% to 20%; or the host material may account for 90% to 98% and the light-emitting material may account for 2% to 10%. Further, the host material may include one material or two materials, where a ratio of two host materials may be 100:0 to 1:99; or the ratio may be 80:20 to 20:80; or the ratio may be 60:40 to 40:60. Characteristics of light-emitting devices prepared in examples are tested using conventional devices in the art by a method well-known to those skilled in the art. As the persons skilled in the art are aware of the above-mentioned equipment use, test methods and other related contents, the inherent data of the sample can be obtained with certainty and without influence, so the above related contents are not further described in this patent. Compounds used in the present disclosure, such as a first metal complex, a first compound and a second compound, are easily obtained by those skilled in the art. For example, the compounds are commercially available or may be obtained with reference to the preparation method in the related art or may be obtained with reference to the preparation methods in Chinese Patent Publication Nos. CN110903321A, CN111518139A and CN110268036A or Japanese Patent Publication No. JP2017107992A, which are not repeated here.

Device Example

Device Example 1

First, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and at a vacuum degree of about $10^{-8}$ torr. Compound HI was used as a hole injection layer (HIL). Compound HT was used as a hole transporting layer (HTL). Compound X-4 was used as an electron blocking layer (EBL). Metal Complex GD43 was doped in X-4 and G-19, which were co-deposited for use as an emissive layer (EML). Compound H1 was used as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited as an electron injection layer with a thickness of 1 nm and Al was deposited as a cathode with a thickness of 120 nm. The device was transferred back to the glovebox and encapsulated with a glass lid and a moisture getter to complete the device.

Device Example 2

Device Example 2 was prepared by the same method as Device Example 1, except that in the EML, Compound G-19 was replaced with Compound G-98.

Device Comparative Example 1

Device Comparative Example 1 was prepared by the same method as Device Example 1, except that in the EML, Metal Complex GD43 was replaced with Metal Complex a and Compound G-19 was replaced with Compound H1.

Device Comparative Example 2

Device Comparative Example 2 was prepared by the same method as Device Example 1, except that in the EML, Compound G-19 was replaced with Compound H1.

Device Comparative Example 3

Device Comparative Example 3 was prepared by the same method as Device Example 1, except that in the EML, Metal Complex GD43 was replaced with Metal Complex a.

Device Comparative Example 4

Device Comparative Example 4 was prepared by the same method as Device Example 1, except that in the EML, Metal Complex GD43 was replaced with Metal Complex a and Compound G-19 was replaced with Compound G-98.

Detailed structures and thicknesses of part of layers of the devices are shown in the following table. Layers using more than one material were obtained by doping different compounds at their weight ratio as recorded.

TABLE 1

Device structure in device examples 1-2 and comparative examples 1-4

| Device ID | HIL | HTL | EBL | EML | HBL | ETL |
|---|---|---|---|---|---|---|
| Example 1 | Compound HI (100 Å) | Compound HT (350 Å) | Compound X-4 (50 Å) | Compound X-4:Compound G-19:Metal Complex GD43 (69:23:8) (400 Å) | Compound H1 (50 Å) | Compound ET:Liq (40:60) (350 Å) |
| Example 2 | Compound HI (100 Å) | Compound HT (350 Å) | Compound X-4 (50 Å) | Compound X-4:Compound | Compound H1 (50 Å) | Compound ET:Liq (40:60) |

TABLE 1-continued

| Device structure in device examples 1-2 and comparative examples 1-4 | | | | | | |
|---|---|---|---|---|---|---|
| Device ID | HIL | HTL | EBL | EML | HBL | ETL |
| | | | | G-98:Metal Complex GD43 (69:23:8) (400 Å) | | (350 Å) |
| Comparative Example 1 | Compound HI (100 Å) | Compound HT (350 Å) | Compound X-4 (50 Å) | Compound X-4:Compound H1:Metal Complex a (69:23:8) (400 Å) | Compound H1 (50 Å) | Compound ET:Liq (40:60) (350 Å) |
| Comparative Example 2 | Compound HI (100 Å) | Compound HT (350 Å) | Compound X-4 (50 Å) | Compound X-4:Compound H1:Metal Complex GD43 (69:23:8) (400 Å) | Compound H1 (50 Å) | Compound ET:Liq (40:60) (350 Å) |
| Comparative Example 3 | Compound HI (100 Å) | Compound HT (350 Å) | Compound X-4 (50 Å) | Compound X-4:Compound G-19:Metal Complex a (69:23:8) (400 Å) | Compound H1 (50 Å) | Compound ET:Liq (40:60) (350 Å) |
| Comparative Example 4 | Compound HI (100 Å) | Compound HT (350 Å) | Compound X-4 (50 Å) | Compound X-4:Compound G-98:Metal Complex a (69:23:8) (400 Å) | Compound H1 (50 Å) | Compound ET:Liq (40:60) (350 Å) |

The structures of the materials used in the devices are shown as follows:

Compound HI

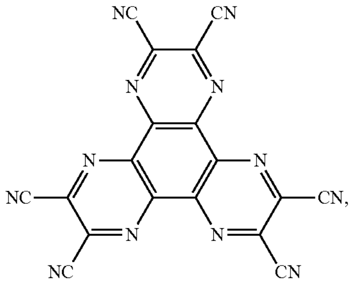

Compound HT

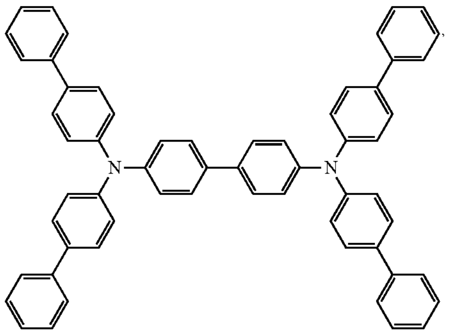

-continued

X-4

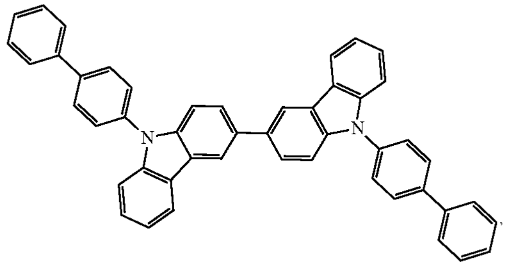

H1

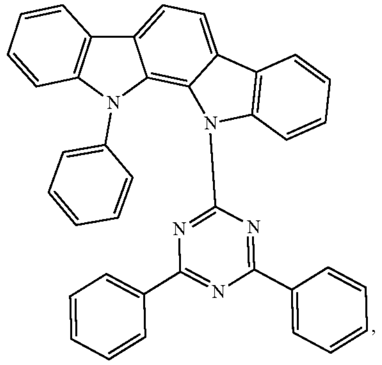

-continued

G-19

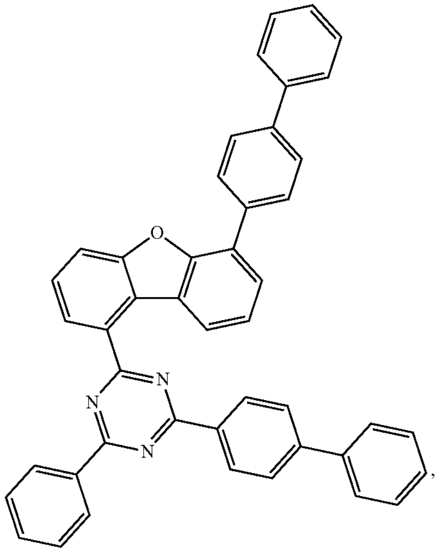

G-98

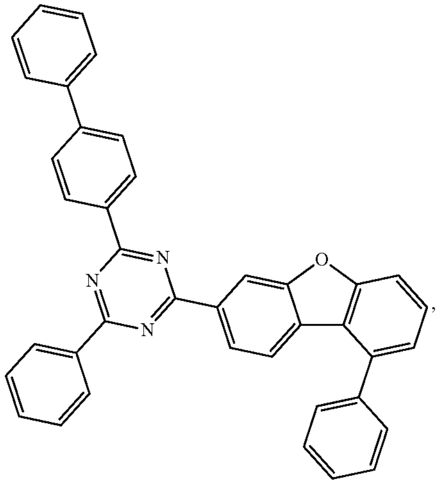

Metal Complex GD43

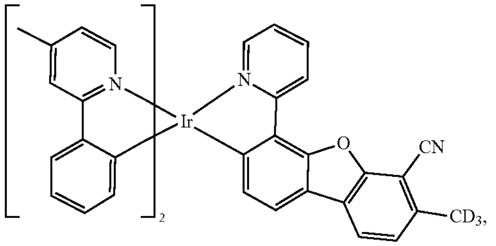

Metal Complex a

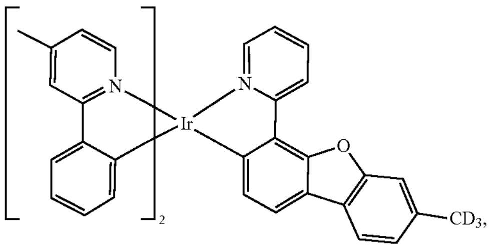

-continued

Compound ET

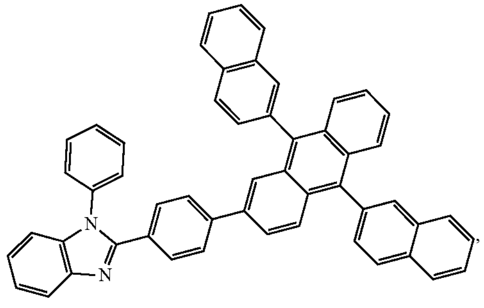

Liq

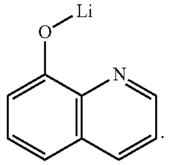

Table 2 shows the CIE data, external quantum efficiency (EQE), driving voltage, current efficiency (CE) and power efficiency (PE) measured at a constant current of 15 mA/$cm^2$.

TABLE 2

| Device data I | | | | | | |
|---|---|---|---|---|---|---|
| Device ID | EML | CIE (x, y) | Voltage (V) | CE (cd/A) | PE (lm/W) | EQE (%) |
| Example 1 | X-4:G-19:GD43 (69:23:8) | 0.343, 0.629 | 4.22 | 86 | 64 | 22.38 |
| Example 2 | X-4:G-98:GD43 (69:23:8) | 0.345, 0.628 | 4.08 | 87 | 67 | 22.53 |
| Comparative Example 1 | X-4:H1:a (69:23:8) | 0.365, 0.614 | 4.94 | 79 | 50 | 20.55 |
| Comparative Example 2 | X-4:H1:GD43 (69:23:8) | 0.338, 0.633 | 4.29 | 78 | 57 | 20.12 |
| Comparative Example 3 | X-4:G-19:a (69:23:8) | 0.371, 0.609 | 4.73 | 78 | 52 | 20.44 |
| Comparative Example 4 | X-4:G-98:a (69:23:8) | 0.370, 0.609 | 4.43 | 79 | 56 | 20.66 |

Discussion

As can be seen from the data shown in Table 2, the EQE of Comparative Example 2 is 2.1% lower than that of Comparative Example 1, which indicates that in combination with the host material H1, the metal complex containing a cyano-substituted ligand of the present disclosure has a lower EQE than the metal complex without the cyano-substituted ligand. However, in combination with the host material of the present disclosure, Example 1 has a 9.5% higher EQE, a higher PE and CE and a lower driving voltage than Comparative Example 3, and Example 2 has a 9% higher EQE, a higher PE and CE and a lower device voltage than Comparative Example 4. This indicates that in combination with the host material of the present disclosure, the metal complex containing the cyano-substituted ligand of the present disclosure has improved device performance compared with the metal complex without the cyano-substituted ligand in various aspects.

Example 1 and Example 2 have about 11.2% and 12.0% higher EQE respectively, a higher PE and CE and a lower device voltage than Comparative Example 2. This indicates that in combination with the metal complex containing a cyano-substituted ligand of the present disclosure, the host material of the present disclosure has improved device performance compared with the host material that is not provided by the present disclosure in various aspects. Moreover, Comparative Example 3 and Comparative Example 4 compared with Comparative Example 1, that is, when Complex a without the cyano-substituted ligand is used in the host material of the present disclosure and the host material that is not provided by the present disclosure, the EQE of which are slightly improved or reduced. This shows that a combination of the host material and the complex containing the cyano-substituted ligand of the present disclosure can improve device performance, especially the EQE.

Device Comparative Example 7

Device Comparative Example 7 was prepared by the same method as Device Example 1, except that in the EML, Metal Complex GD43 was replaced with Metal Complex b.

Device Comparative Example 8

Device Comparative Example 8 was prepared by the same method as Device Example 1, except that in the EML, Metal Complex GD43 was replaced with Metal Complex b and Compound G-19 was replaced with Compound G-98.

Detailed structures and thicknesses of part of layers of the devices are shown in the following table. Layers using more than one material were obtained by doping different compounds at their weight ratio as recorded.

TABLE 3

Device structure in device examples 3-4 and comparative examples 5-8

| Device ID | HIL | HTL | EBL | EML | HBL | ETL |
|---|---|---|---|---|---|---|
| Example 3 | Compound HI (100 Å) | Compound HT (350 Å) | Compound X-4 (50 Å) | Compound X-4:Compound G-19:Metal Complex GD83 (69:23:8) (400 Å) | Compound H1 (50 Å) | Compound ET:Liq (40:60) (350 Å) |
| Example 4 | Compound HI (100 Å) | Compound HT (350 Å) | Compound X-4 (50 Å) | Compound X-4:Compound G-98:Metal Complex GD83 (69:23:8) (400 Å) | Compound H1 (50 Å) | Compound ET:Liq (40:60) (350 Å) |
| Comparative Example 5 | Compound HI (100 Å) | Compound HT (350 Å) | Compound X-4 (50 Å) | Compound X-4:Compound H1 Metal Complex b (69:23:8) (400 Å) | Compound H1 (50 Å) | Compound ET:Liq (40:60) (350 Å) |
| Comparative Example 6 | Compound HI (100 Å) | Compound HT (350 Å) | Compound X-4 (50 Å) | Compound X-4:Compound H1 Metal Complex GD83 (69:23:8) (400 Å) | Compound H1 (50 Å) | Compound ET:Liq (40:60) (350 Å) |
| Comparative Example 7 | Compound HI (100 Å) | Compound HT (350 Å) | Compound X-4 (50 Å) | Compound X-4:Compound G-19:Metal Complex b (69:23:8) (400 Å) | Compound H1 (50 Å) | Compound ET:Liq (40:60) (350 Å) |
| Comparative Example 8 | Compound HI (100 Å) | Compound HT (350 Å) | Compound X-4 (50 Å) | Compound X-4:Compound G-98:Metal Complex b (69:23:8) (400 Å) | Compound H1 (50 Å) | Compound ET:Liq (40:60) (350 Å) |

It can be seen that the metal complex containing the cyano-substituted ligand of the present disclosure better match the host system of the present disclosure in terms of device structure, and the combination thereof can effectively improve the device performance including EQE, PE and CE.

Device Example 3

Device Example 3 was prepared by the same method as Device Example 1, except that in the EML, Metal Complex GD43 was replaced with Metal Complex GD83.

Device Example 4

Device Example 4 was prepared by the same method as Device Example 1, except that in the EML, Metal Complex GD43 was replaced with Metal Complex GD83 and Compound G-19 was replaced with Compound G-98.

Device Comparative Example 5

Device Comparative Example 5 was prepared by the same method as Device Example 1, except that in the EML, Metal Complex GD43 was replaced with Metal Complex b and Compound G-19 was replaced with Compound H1.

Device Comparative Example 6

Device Comparative Example 6 was prepared by the same method as Device Example 1, except that in the EML, Metal Complex GD43 was replaced with Metal Complex GD83 and Compound G-19 was replaced with Compound H1.

The structures of the new materials used in the devices are shown as follows:

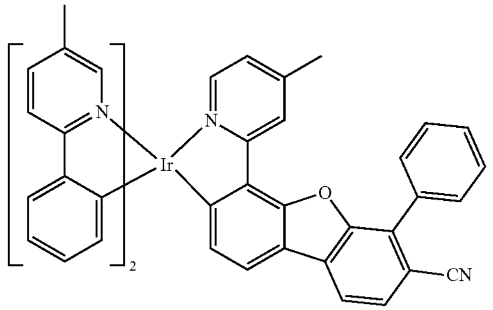

,

Metal Complex GD83

-continued

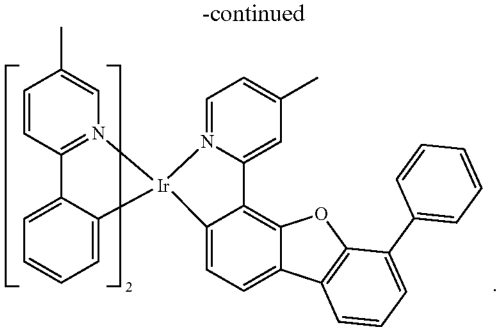

Metal Complex b

Table 4 shows the CIE data, external quantum efficiency (EQE), driving voltage, current efficiency (CE) and power efficiency (PE) measured at a constant current of 15 $mA/cm^2$.

TABLE 4

| Device data II | | | | | | |
|---|---|---|---|---|---|---|
| Device ID | EML | CIE (x, y) | Voltage (V) | CE (cd/A) | PE (lm/W) | EQE (%) |
| Example 3 | X-4:G-19:GD83 (69:23:8) | 0.317, 0.649 | 4.06 | 88 | 68 | 22.51 |
| Example 4 | X-4:G-98:GD83 (69:23:8) | 0.317, 0.650 | 4.04 | 91 | 71 | 23.26 |
| Comparative Example 5 | X-4:H1:b (69:23:8) | 0.317, 0.641 | 4.79 | 79 | 52 | 21.09 |
| Comparative Example 6 | X-4:H1:GD83 (69:23:8) | 0.313, 0.652 | 3.92 | 78 | 63 | 19.94 |
| Comparative Example 7 | X-4:G-19:b (69:23:8) | 0.327, 0.634 | 4.93 | 77 | 49 | 20.53 |
| Comparative Example 8 | X-4:G-98:b (69:23:8) | 0.327, 0.634 | 4.72 | 79 | 53 | 21.18 |

Discussion

As can be seen from the data shown in Table 4, the EQE of Comparative Example 6 is 5.4% lower than that of Comparative Example 5, which indicates that in combination with the host material H1, the metal complex containing the cyano-substituted ligand of the present disclosure has a lower EQE than the metal complex without the cyano-substituted ligand. However, in combination with the host material of the present disclosure, Example 3 has a 9.6% higher EQE, a much higher PE and CE and a lower device voltage than Comparative Example 7, and Example 4 has a 9.8% higher EQE, a much higher PE and CE and a lower device voltage than Comparative Example 8. This indicates that in combination with the host material of the present disclosure, the metal complex containing the cyano-substituted ligand of the present disclosure has improved device performance compared with the metal complex without the cyano-substituted ligand in various aspects.

Example 3 and Example 4 have about 12.9% and 16.6% higher EQE and a much higher PE and CE than Comparative Example 6. This indicates that in combination with the metal complex containing the cyano-substituted ligand of the present disclosure, the host material of the present disclosure has improved device performance compared with the host material that is not provided by the present disclosure in various aspects. Moreover, Comparative Example 7 and Comparative Example 8 compared with Comparative Example 5, that is, when Complex b without the cyano-substituted ligand is used in the host material of the present disclosure and the host material that is not provided by the present disclosure, the EQE of which are slightly improved or reduced. This shows that the combination of the host material and the complex containing the cyano-substituted ligand of the present disclosure can improve the device performance, especially the EQE.

It can be seen that the metal complex containing the cyano-substituted ligand of the present disclosure better match the host system of the present disclosure in terms of device structure, and the combination thereof can effectively improve the device performance including EQE, PE and CE and can effectively reduce the device voltage.

Device Example 5

Device Example 5 was prepared by the same method as Device Example 1, except that in the EML, Metal Complex GD43 was replaced with Metal Complex GD88.

Device Example 6

Device Example 6 was prepared by the same method as Device Example 1, except that in the EML, Metal Complex GD43 was replaced with Metal Complex GD88 and Compound G-19 was replaced with Compound G-98.

Device Comparative Example 9

Device Comparative Example 9 was prepared by the same method as Device Example 1, except that in the EML, Metal Complex GD43 was replaced with Metal Complex c and Compound G-19 was replaced with Compound H1.

Device Comparative Example 10

Device Comparative Example 10 was prepared by the same method as Device Example 1, except that in the EML, Metal Complex GD43 was replaced with Metal Complex GD88 and Compound G-19 was replaced with Compound H1.

Device Comparative Example 11

Device Comparative Example 11 was prepared by the same method as Device Example 1, except that in the EML, Metal Complex GD43 was replaced with Metal Complex c.

Device Comparative Example 12

Device Comparative Example 12 was prepared by the same method as Device

Example 1, except that in the EML, Metal Complex GD43 was replaced with Metal Complex c and Compound G-19 was replaced with Compound G-98.

Detailed structures and thicknesses of part of layers of the devices are shown in the following table. Layers using more than one material were obtained by doping different compounds at their weight ratio as recorded.

TABLE 5

| Device structure in device examples 5-6 and comparative examples 9-12 | | | | | | |
|---|---|---|---|---|---|---|
| Device ID | HIL | HTL | EBL | EML | HBL | ETL |
| Example 5 | Compound HI (100 Å) | Compound HT (350 Å) | Compound X-4 (50 Å) | Compound X-4:Compound G-19:Metal Complex GD88 (69:23:8) (400 Å) | Compound H1 (50 Å) | Compound ET:Liq (40:60) (350 Å) |

TABLE 5-continued

Device structure in device examples 5-6 and comparative examples 9-12

| Device ID | HIL | HTL | EBL | EML | HBL | ETL |
|---|---|---|---|---|---|---|
| Example 6 | Compound HI (100 Å) | Compound HT (350 Å) | Compound X-4 (50 Å) | Compound X-4:Compound G-98:Metal Complex GD88 (69:23:8) (400 Å) | Compound H1 (50 Å) | Compound ET:Liq (40:60) (350 Å) |
| Comparative Example 9 | Compound HI (100 Å) | Compound HT (350 Å) | Compound X-4 (50 Å) | Compound X-4:Compound H1:Metal Complex c (69:23:8) (400 Å) | Compound H1 (50 Å) | Compound ET:Liq (40:60) (350 Å) |
| Comparative Example 10 | Compound HI (100 Å) | Compound HT (350 Å) | Compound X-4 (50 Å) | Compound X-4:Compound H1:Metal Complex GD88 (69:23:8) (400 Å) | Compound H1 (50 Å) | Compound ET:Liq (40:60) (350 Å) |
| Comparative Example 11 | Compound HI (100 Å) | Compound HT (350 Å) | Compound X-4 (50 Å) | Compound X-4:Compound G-19:Metal Complex c (69:23:8) (400 Å) | Compound H1 (50 Å) | Compound ET:Liq (40:60) (350 Å) |
| Comparative Example 12 | Compound HI (100 Å) | Compound HT (350 Å) | Compound X-4 (50 Å) | Compound X-4:Compound G-98:Metal Complex c (69:23:8) (400 Å) | Compound H1 (50 Å) | Compound ET:Liq (40:60) (350 Å) |

The structures of the new materials used in the devices are shown as follows:

Metal Complex GD88

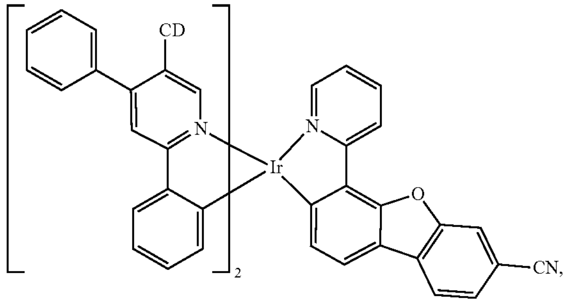

Metal Complex c

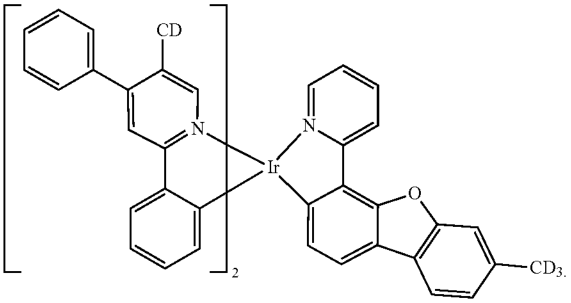

Table 6 shows the CIE data, external quantum efficiency (EQE), driving voltage, current efficiency (CE) and power efficiency (PE) measured at a constant current of 15 $mA/cm^2$.

TABLE 6

Device data III

| Device ID | EML | CIE (x, y) | Voltage (V) | CE (cd/A) | PE (lm/W) | EQE (%) |
|---|---|---|---|---|---|---|
| Example 5 | X-4:G-19:GD88 (69:23:8) | 0.337, 0.636 | 3.62 | 87. | 76 | 22.30 |
| Example 6 | X-4:G-98:GD88 (69:23:8) | 0.338, 0.635 | 3.54 | 91 | 81 | 23.33 |

TABLE 6-continued

Device data III

| Device ID | EML | CIE (x, y) | Voltage (V) | CE (cd/A) | PE (lm/W) | EQE (%) |
|---|---|---|---|---|---|---|
| Comparative Example 9 | X-4:H1:c (69:23:8) | 0.363, 0.614 | 4.67 | 74 | 50 | 19.50 |
| Comparative Example 10 | X-4:H1:GD88 (69:23:8) | 0.334, 0.639 | 3.72 | 72 | 61 | 18.34 |
| Comparative Example 11 | X-4:G-19:c (69:23:8) | 0.366, 0.611 | 4.76 | 76 | 50 | 20.03 |
| Comparative Example 12 | X-4:G-98:c (69:23:8) | 0.366, 0.611 | 4.41 | 74 | 53 | 19.64 |

Discussion

As can be seen from the data shown in Table 6, the EQE of Comparative Example 10 is 5.9% lower than that of Comparative Example 9, which indicates that in combination with the host material H1, the metal complex containing the cyano-substituted ligand of the present disclosure has a lower EQE than the metal complex without the cyano-substituted ligand. However, in combination with the host material of the present disclosure, Example 5 has a 11.3% higher EQE, a much higher PE and CE and a lower device voltage than Comparative Example 11, and Example 6 has a 18.8% higher EQE, a much higher PE and CE and a lower device voltage than Comparative Example 12. This indicates that in combination with the host material of the present disclosure, the metal complex containing the cyano-substituted ligand of the present disclosure has improved device performance compared with the metal complex without the cyano-substituted ligand in various aspects.

Example 5 and Example 6 have about 21.6% and 27.2% higher EQE and a much higher PE and CE than Comparative Example 10. This indicates that in combination with the metal complex containing the cyano-substituted ligand of the present disclosure, the host material of the present disclosure has improved device performance compared with the host material that is not provided by the present disclosure in various aspects. Moreover, Comparative Example 11 and Comparative Example 12 compared with Comparative Example 9, that is, when Complex c without the cyano-substituted ligand is used in the host material of the present disclosure and the host material that is not provided by the present disclosure, the EQE of which are slightly improved. This shows that the combination of the host material and the complex containing the cyano-substituted ligand of the present disclosure can improve the device performance, especially the EQE.

It can be seen that the metal complex containing the cyano-substituted ligand of the present disclosure better match the host system of the present disclosure in terms of device structure, and the combination thereof can effectively improve the device performance including EQE, PE and CE and can effectively reduce the device voltage.

Device Example 7

Device Example 7 was prepared by the same method as Device Example 1, except that in the EML, Metal Complex GD43 was replaced with Metal Complex GD129.

Device Example 8

Device Example 8 was prepared by the same method as Device Example 1, except that in the EML, Metal Complex GD43 was replaced with Metal Complex GD129 and Compound G-19 was replaced with Compound G-98.

Device Comparative Example 13

Device Comparative Example 13 was prepared by the same method as Device Example 1, except that in the EML, Metal Complex GD43 was replaced with Metal Complex GD129 and Compound G-19 was replaced with Compound H1.

Detailed structures and thicknesses of part of layers of the devices are shown in the following table. Layers using more than one material were obtained by doping different compounds at their weight ratio as recorded.

TABLE 7

Device structure in device examples 7-8 and comparative examples 13

| Device ID | HIL | HTL | EBL | EML | HBL | ETL |
|---|---|---|---|---|---|---|
| Example 7 | Compound HI (100 Å) | Compound HT (350 Å) | Compound X-4 (50 Å) | Compound X-4:Compound G-19:Metal Complex GD129 (69:23:8) (400 Å) | Compound H1 (50 Å) | Compound ET:Liq (40:60) (350 Å) |
| Example 8 | Compound HI (100 Å) | Compound HT (350 Å) | Compound X-4 (50 Å) | Compound X-4:Compound G-98:Metal Complex GD129 (69:23:8) (400 Å) | Compound H1 (50 Å) | Compound ET:Liq (40:60) (350 Å) |
| Comparative Example 13 | Compound HI (100 Å) | Compound HT (350 Å) | Compound X-4 (50 Å) | Compound X-4:Compound H1:Metal Complex GD129(69:23:8) (400 Å) | Compound H1 (50 Å) | Compound ET:Liq (40:60) (350 Å) |

The structure of the new material used in the devices is shown as follows:

Metal Complex GD129

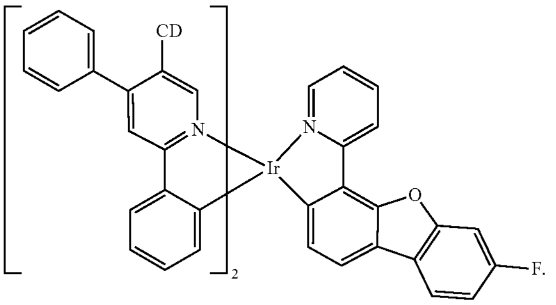

Table 8 shows the CIE data, external quantum efficiency (EQE), driving voltage, current efficiency (CE) and power efficiency (PE) measured at a constant current of 15 mA/cm$^2$.

TABLE 8

Device data IV

| Device ID | EML | CIE (x, y) | Voltage (V) | CE (cd/A) | PE (lm/W) | EQE (%) |
|---|---|---|---|---|---|---|
| Example 7 | X-4:G-19: GD129 (69:23:8) | 0.350, 0.623 | 4.05 | 79 | 62 | 20.77 |
| Example 8 | X-4:G-98: GD129 (69:23:8) | 0.350, 0.623 | 3.88 | 80 | 65 | 20.89 |
| Comparative Example 9 | X-4:H1:c (69:23:8) | 0.363, 0.614 | 4.67 | 74 | 50 | 19.50 |
| Comparative Example 13 | X-4:H1:GD129 (69:23:8) | 0.346, 0.626 | 4.25 | 68 | 50 | 17.78 |
| Comparative Example 11 | X-4:G-19:c (69:23:8) | 0.366, 0.611 | 4.76 | 76 | 50 | 20.03 |
| Comparative Example 12 | X-4:G-98:c (69:23:8) | 0.366, 0.611 | 4.41 | 74 | 53 | 19.64 |

Discussion

As can be seen from the data shown in Table 8, the EQE of Comparative Example 13 is 8.8% lower than that of Comparative Example 9, which indicates that in combination with the host material H1, the metal complex containing a fluorine-substituted ligand of the present disclosure has a lower EQE than the metal complex without the fluorine-substituted ligand. However, in combination with the host material of the present disclosure, Example 7 has a 2.3% higher EQE, a higher PE and CE and a lower device voltage than Comparative Example 11, and Example 8 has a 6.4% higher EQE, a higher PE and CE and a lower device voltage than Comparative Example 12. This indicates that in combination with the host material of the present disclosure, the metal complex containing the fluorine-substituted ligand of the present disclosure has improved device performance compared with the metal complex without the fluorine-substituted ligand in various aspects.

Example 7 and Example 8 have about 16.8% and 17.5% higher EQE respectively, a higher PE and CE and a lower device voltage than Comparative Example 13. This indicates that in combination with the metal complex containing the fluorine-substituted ligand of the present disclosure, the host material of the present disclosure has improved device performance compared with the host material that is not provided by the present disclosure in various aspects. Moreover, Comparative Example 11 and Comparative Example 12 compared with Comparative Example 9, that is, when Complex c without the fluorine-substituted ligand is used in the host material of the present disclosure and the host material that is not provided by the present disclosure, the EQE of which are only slightly improved. This shows that the combination of the host material and the complex containing the fluorine-substituted ligand of the present disclosure can improve the device performance, especially the EQE.

It can be seen that the metal complex containing the cyano- or fluorine-substituted ligand of the present disclosure better match the host system of the present disclosure in terms of device structure, and the combination thereof can effectively improve the device performance including EQE, PE and CE and can effectively reduce the device voltage.

Device Example 9

Device Example 9 was prepared by the same method as Device Example 1, except that in the EML, Metal Complex GD43 was replaced with Metal Complex GD24 and Compound X-4:Compound G-19:Metal Complex GD24=66:28:6.

Device Example 10

Device Example 10 was prepared by the same method as Device Example 1, except that in the EML, Metal Complex GD43 was replaced with Metal Complex GD34 and Compound X-4:Compound G-19:Metal Complex GD34=66:28:6.

Device Example 11

Device Example 11 was prepared by the same method as Device Example 1, except that in the EML, Metal Complex GD43 was replaced with Metal Complex GD101 and Compound X-4:Compound G-19:Metal Complex GD101=66:28:6.

Device Example 12

Device Example 12 was prepared by the same method as Device Example 1, except that in the EML, Metal Complex GD43 was replaced with Metal Complex GD131 and Compound X-4:Compound G-19:Metal Complex GD131=66:28:6.

Device Example 13

Device Example 13 was prepared by the same method as Device Example 1, except that in the EML, Metal Complex GD43 was replaced with Metal Complex GD30, Compound G-19 was replaced with Compound G-98, and Compound X-4:Compound G-98:Metal Complex GD30=71:23:6.

Device Example 14

Device Example 14 was prepared by the same method as Device Example 1, except that in the EML, Metal Complex GD43 was replaced with Metal Complex GD30, Compound G-19 was replaced with Compound G-102, and Compound X-4:Compound G-102:Metal Complex GD30=66:28:6.

Detailed structures and thicknesses of part of layers of the devices are shown in the following table. Layers using more than one material were obtained by doping different compounds at their weight ratio as recorded.

TABLE 9

Device structure V in device examples

| Device ID | HIL | HTL | EBL | EML | HBL | ETL |
|---|---|---|---|---|---|---|
| Example 9 | Compound HI (100 Å) | Compound HT (350 Å) | Compound X-4 (50 Å) | Compound X-4:Compound G-19:Metal Complex GD24 (66:28:6) (400 Å) | Compound H1 (50 Å) | Compound ET:Liq (40:60) (350 Å) |
| Example 10 | Compound HI (100 Å) | Compound HT (350 Å) | Compound X-4 (50 Å) | Compound X-4:Compound G-19:Metal Complex GD34 (66:28:6) (400 Å) | Compound H1 (50 Å) | Compound ET:Liq (40:60) (350 Å) |
| Example 11 | Compound HI (100 Å) | Compound HT (350 Å) | Compound X-4 (50 Å) | Compound X-4:Compound G-19:Metal Complex GD101 (66:28:6) (400 Å) | Compound H1 (50 Å) | Compound ET:Liq (40:60) (350 Å) |
| Example 12 | Compound HI (100 Å) | Compound HT (350 Å) | Compound X-4 (50 Å) | Compound X-4:Compound G-19:Metal Complex GD131 (66:28:6) (400 Å) | Compound H1 (50 Å) | Compound ET:Liq (40:60) (350 Å) |
| Example 13 | Compound HI (100 Å) | Compound HT (350 Å) | Compound X-4 (50 Å) | Compound X-4:Compound G-98:Metal Complex GD30 (71:23:6) (400 Å) | Compound H1 (50 Å) | Compound ET:Liq (40:60) (350 Å) |
| Example 14 | Compound HI (100 Å) | Compound HT (350 Å) | Compound X-4 (50 Å) | Compound X-4:Compound G-102:Metal Complex GD30 (66:28:6) (400 Å) | Compound H1 (50 Å) | Compound ET:Liq (40:60) (350 Å) |

The structures of the new materials used in the devices are shown as follows:

Metal Complex GD30

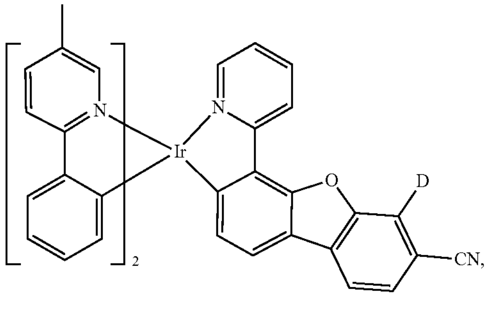

Metal Complex GD24

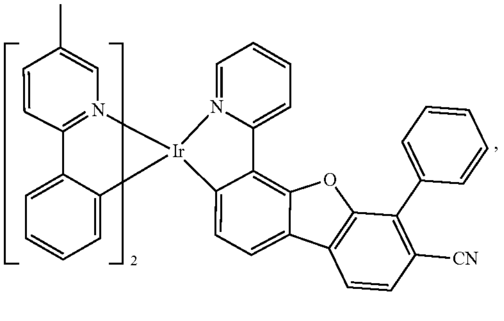

-continued

Metal Complex GD34

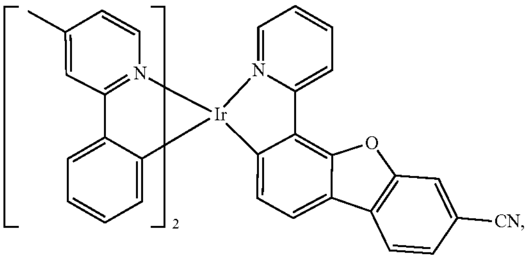

Metal Complex GD101

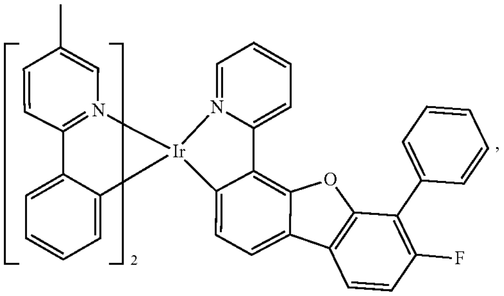

Metal Complex GD131

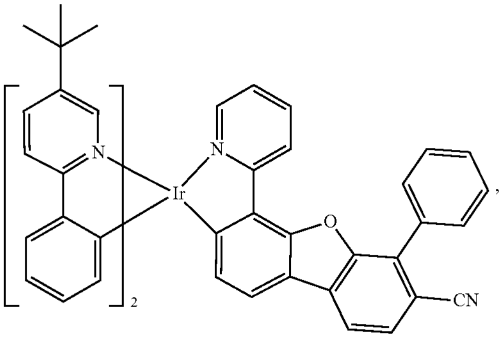

G-102

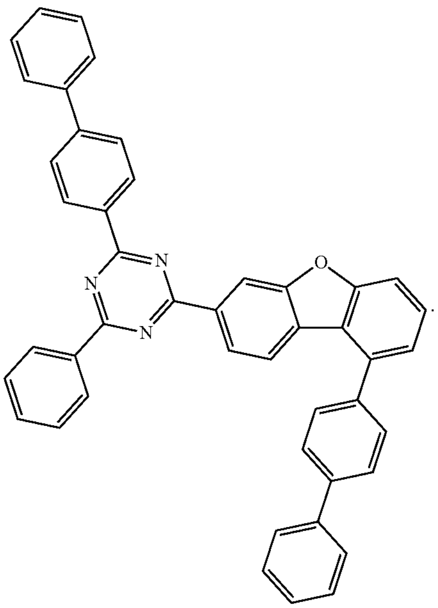

Table 10 shows the CIE data, external quantum efficiency (EQE), driving voltage, current efficiency (CE) and power efficiency (PE) measured at a constant current of 15 mA/cm$^2$.

TABLE 10

| Device data V | | | | | | |
|---|---|---|---|---|---|---|
| Device ID | EML | CIE (x, y) | Voltage (V) | CE (cd/A) | PE (lm/W) | EQE (%) |
| Example 9 | X-4:G-19:GD24 (66:28:6) | 0.346, 0.631 | 3.76 | 95 | 80 | 24.32 |
| Example 10 | X-4:G-19:GD34 (66:28:6) | 0.350, 0.627 | 3.99 | 92 | 72 | 23.47 |
| Example 11 | X-4:G-19:GD101 (66:28:6) | 0.351, 0.623 | 3.98 | 86 | 68 | 22.52 |
| Example 12 | X-4:G-19:GD131 (66:28:6) | 0.342, 0.635 | 3.78 | 93 | 77 | 23.59 |
| Example 13 | X-4:G-98:GD30 (71:23:6) | 0.340, 0.635 | 3.83 | 93 | 76 | 23.74 |
| Example 14 | X-4:G-102:GD30 (66:28:6) | 0.347, 0.629 | 3.59 | 92 | 81 | 23.72 |

Discussion

The data shown in Table 10 shows that when a series of metal complexes containing fluorine- or cyano-substituted ligands of the present disclosure are used in combination with a series of host materials of the present disclosure, the devices can all obtain excellent performance. As can be seen from the comparison of Examples 9 to 12 with Comparative Example 11 all of which use X-4 and G-19 as the host materials in the light-emitting layer, when Metal Complexes GD24, GD34, GD101 and GD131 of the present disclosure are used in the light-emitting layer, the devices can all obtain high device efficiency and low driving voltage. As can be seen from the comparison of Example 13 with Comparative Example 12 both of which use X-4 and G-98 as the host materials in the light-emitting layer, when Metal Complex GD30 of the present disclosure is used in the light-emitting layer, the device can also obtain high device efficiency and low driving voltage. Compared with Example 13, Example 14 where one host compound in the light-emitting layer was replaced with G-102 can also obtain high device efficiency and low driving voltage.

Device Example 15

Device Example 15 was prepared by the same method as Device Example 1, except that in the EML, Compound G-19 was replaced with Compound G-117 and Metal Complex GD43 was replaced with Metal Complex GD121.

Device Example 16

Device Example 16 was prepared by the same method as Device Example 15, except that in the EML, Compound G-117 was replaced with Compound G-119.

Device Example 17

Device Example 17 was prepared by the same method as Device Example 15, except that in the EML, Compound G-117 was replaced with Compound G-174.

Device Example 18

Device Example 18 was prepared by the same method as Device Example 15, except that in the EML, Compound G-117 was replaced with Compound G-175.

Device Example 19

Device Example 19 was prepared by the same method as Device Example 15, except that in the EML, Compound G-117 was replaced with Compound G-176.

Device Example 20

Device Example 20 was prepared by the same method as Device Example 15, except that in the EML, Compound G-117 was replaced with Compound G-177.

Device Example 21

Device Example 21 was prepared by the same method as Device Example 15, except that in the EML, Compound G-117 was replaced with Compound G-178.

Device Example 22

Device Example 22 was prepared by the same method as Device Example 15, except that in the EML, Compound G-117 was replaced with Compound G-179.

Device Example 23

Device Example 23 was prepared by the same method as Device Example 15, except that in the EML, Compound G-117 was replaced with Compound G-180.

Detailed structures and thicknesses of part of layers of the devices are shown in the following table. Layers using more than one material were obtained by doping different compounds at their weight ratio as recorded.

-continued

G-117

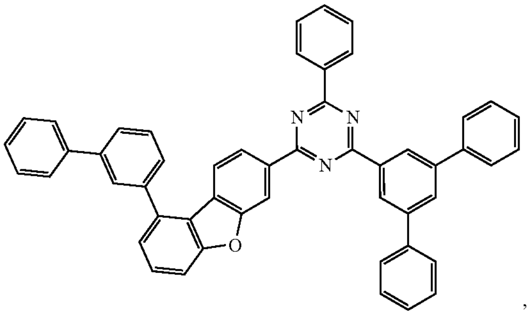

,

TABLE 11

Device structure VI in device examples

| Device ID | HIL | HTL | EBL | EML | HBL | ETL |
|---|---|---|---|---|---|---|
| Example 15 | Compound HI (100 Å) | Compound HT (350 Å) | Compound X-4 (50 Å) | Compound X-4:Compound G-117:Metal Complex GD121 (69:23:8) (400 Å) | Compound H1 (50 Å) | Compound ET:Liq (40:60) (350 Å) |
| Example 16 | Compound HI (100 Å) | Compound HT (350 Å) | Compound X-4 (50 Å) | Compound X-4:Compound G-119:Metal Complex GD121 (69:23:8) (400 Å) | Compound H1 (50 Å) | Compound ET:Liq (40:60) (350 Å) |
| Example 17 | Compound HI (100 Å) | Compound HT (350 Å) | Compound X-4 (50 Å) | Compound X-4:Compound G-174:Metal Complex GD121 (69:23:8) (400 Å) | Compound H1 (50 Å) | Compound ET:Liq (40:60) (350 Å) |
| Example 18 | Compound HI (100 Å) | Compound HT (350 Å) | Compound X-4 (50 Å) | Compound X-4:Compound G-175:Metal Complex GD121 (69:23:8) (400 Å) | Compound H1 (50 Å) | Compound ET:Liq (40:60) (350 Å) |
| Example 19 | Compound HI (100 Å) | Compound HT (350 Å) | Compound X-4 (50 Å) | Compound X-4:Compound G-176:Metal Complex GD121 (69:23:8) (400 Å) | Compound H1 (50 Å) | Compound ET:Liq (40:60) (350 Å) |
| Example 20 | Compound HI (100 Å) | Compound HT (350 Å) | Compound X-4 (50 Å) | Compound X-4:Compound G-177:Metal Complex GD121 (69:23:8) (400 Å) | Compound H1 (50 Å) | Compound ET:Liq (40:60) (350 Å) |
| Example 21 | Compound HI (100 Å) | Compound HT (350 Å) | Compound X-4 (50 Å) | Compound X-4:Compound G-178:Metal Complex GD121 (69:23:8) (400 Å) | Compound H1 (50 Å) | Compound ET:Liq (40:60) (350 Å) |
| Example 22 | Compound HI (100 Å) | Compound HT (350 Å) | Compound X-4 (50 Å) | Compound X-4:Compound G-179:Metal Complex GD121 (69:23:8) (400 Å) | Compound H1 (50 Å) | Compound ET:Liq (40:60) (350 Å) |
| Example 23 | Compound HI (100 Å) | Compound HT (350 Å) | Compound X-4 (50 Å) | Compound X-4:Compound G-180:Metal Complex GD121 (69:23:8) (400 Å) | Compound H1 (50 Å) | Compound ET:Liq (40:60) (350 Å) |

The structures of the new materials used in the devices are shown as follows:

GC121

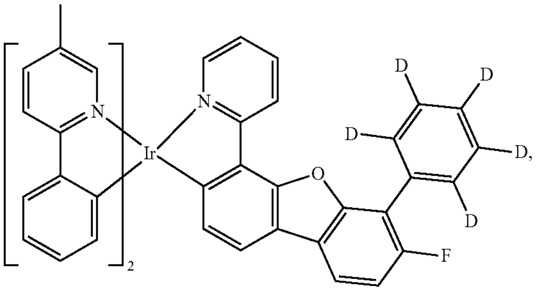

-continued

G-119

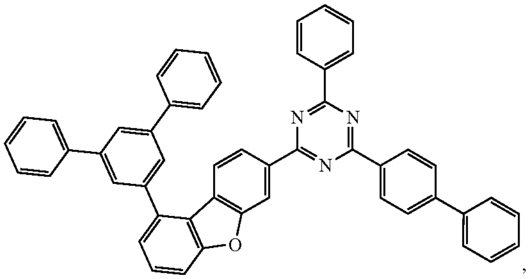

,

-continued
G-174
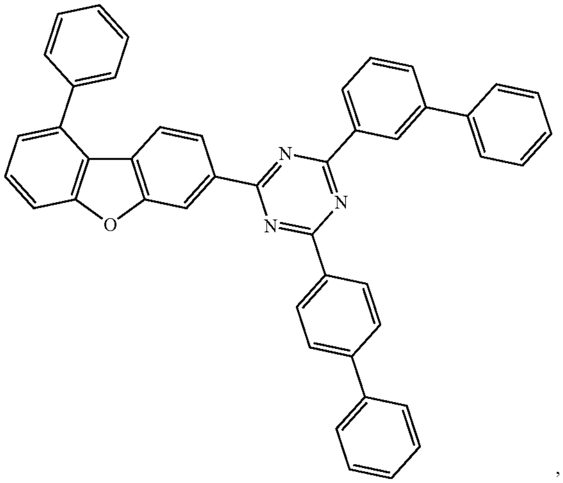
,
G-175
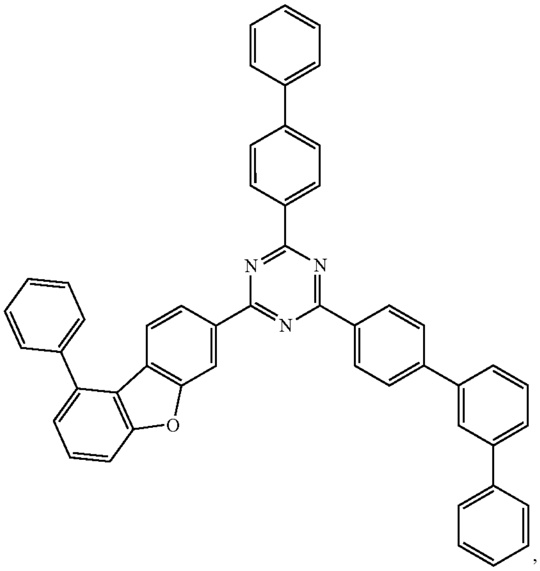
,
G-176
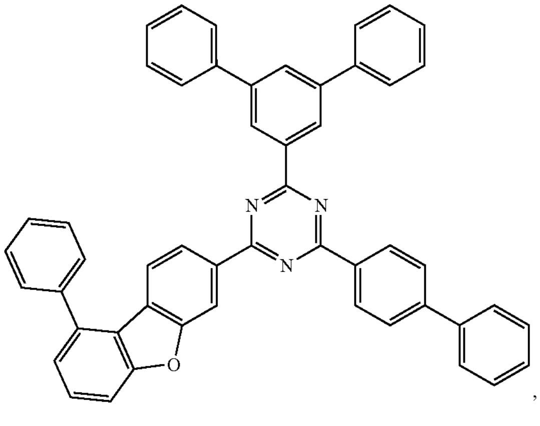
,
-continued
G-177
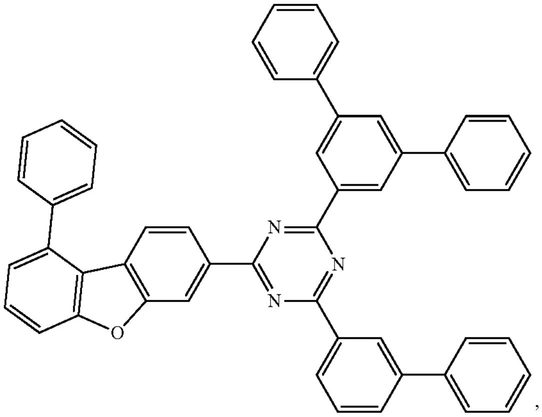
,
G-178
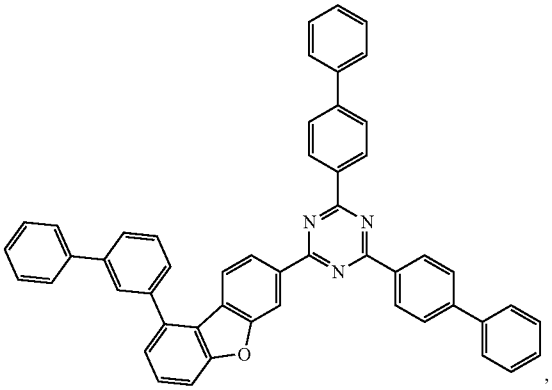
,
G-179
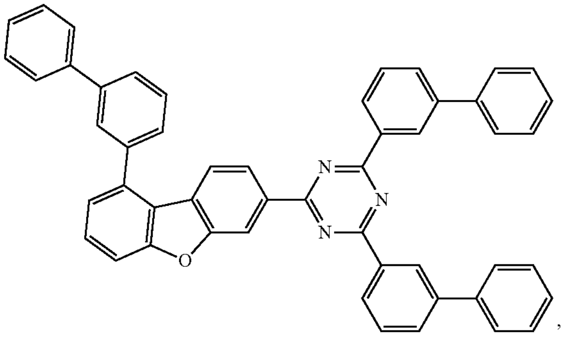
, -continued

G-180

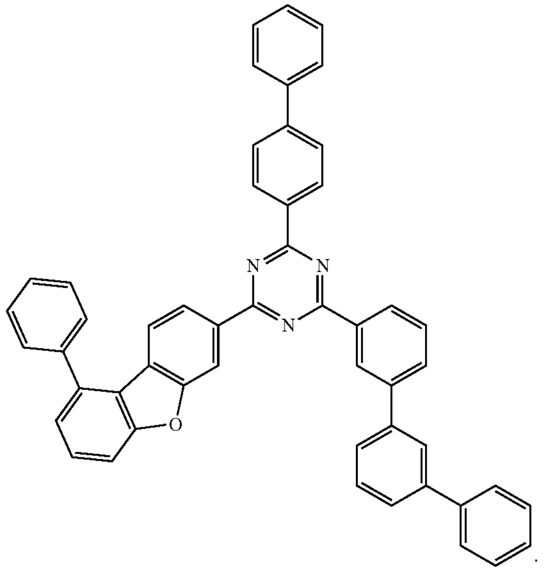

Table 12 shows the CIE data, external quantum efficiency (EQE), driving voltage, current efficiency (CE) and power efficiency (PE) measured at a constant current of 15 $mA/cm^2$.

TABLE 12

| Device data VI | | | | | | |
|---|---|---|---|---|---|---|
| Device ID | EML | CIE (x, y) | Voltage (V) | CE (cd/A) | PE (lm/W) | EQE (%) |
| Example 15 | X-4:G-117:GD121 (69:23:8) | 0.354, 0.621 | 4.04 | 86 | 67 | 22.37 |
| Example 16 | X-4:G-119:GD121 (69:23:8) | 0.351, 0.623 | 4.07 | 86 | 66 | 22.4 |
| Example 17 | X-4:G-174:GD121 (69:23:8) | 0.351, 0.623 | 3.89 | 86 | 69 | 22.31 |
| Example 18 | X-4:G-175:GD121 (69:23:8) | 0.360, 0.616 | 3.86 | 84 | 68 | 22.18 |
| Example 19 | X-4:G-176:GD121 (69:23:8) | 0.355, 0.620 | 3.91 | 84 | 68 | 22.19 |
| Example 20 | X-4:G-177:GD121 (69:23:8) | 0.356, 0.619 | 4.12 | 87 | 66 | 22.46 |
| Example 21 | X-4:G-178:GD121 (69:23:8) | 0.352, 0.623 | 3.86 | 85 | 69 | 22.23 |
| Example 22 | X-4:G-179:GD121 (69:23:8) | 0.352, 0.622 | 3.94 | 87 | 69 | 22.49 |
| Example 23 | X-4:G-180:GD121 (69:23:8) | 0.358, 0.618 | 3.96 | 87 | 69 | 22.52 |

Discussion

The data shown in Table 12 shows that in Examples 16 to 23 which use the series of host materials of the present disclosure in combination with the metal complex containing the fluorine-substituted ligand of the present disclosure, which are compared with Examples 7 and 8 which also use the metal complex containing the fluorine-substituted ligand of the present disclosure, though different host materials of the present disclosure are used, the devices obtain more excellent performance. This further indicates that the combination of the host material and the complex containing the fluorine-substituted ligand of the present disclosure can obtain excellent device performance.

In summary, through the comparison of all the preceding examples and comparative examples, it can be seen that the combination of the host material with a particular structure and the metal complex containing the cyano- or fluorine-substituted ligand of the present disclosure can effectively improve device performance, especially EQE, PE and CE and is a material combination with the prospect for commercial applications.

It should be understood that various embodiments described herein are merely examples and not intended to limit the scope of the present disclosure. Therefore, it is apparent to those skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. An organic electroluminescent device, comprising:

an anode, a cathode, and an organic layer disposed between the anode and the cathode, wherein the organic layer at least comprises a first metal complex and a first compound;

wherein the first metal complex contains a metal M and a ligand $L_a$ coordinated to the metal M, wherein the ligand $L_a$ has a structure represented by Formula 1:

Formula 1

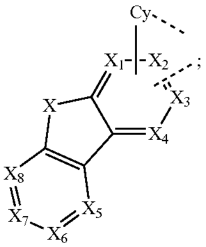

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

X is, at each occurrence identically or differently, selected from the group consisting of O, S, Se, $NR_1$, $CR_1R_1$ and $SiR_1R_1$; when two $R_1$ are present at the same time, the two $R_1$ are identical or different;

$X_1$ to $X_8$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

$R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_1$ to $X_8$ is $CR_x$, and the $R_x$ is cyano or fluorine;

adjacent substituents $R_1$, and/or $R_x$ can be optionally joined to form a ring;

wherein the first compound has a structure represented by Formula 2:

Formula 2

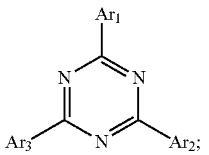

wherein $Ar_1$ has a structure represented by Formula A:

Formula A

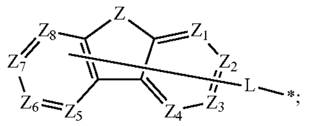

wherein

Z is, at each occurrence identically or differently, selected from the group consisting of O, S and Se;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Z_1$ to $Z_8$ are, at each occurrence identically or differently, selected from C, $CR_z$ or N, and at least one of $Z_1$ to $Z_8$ is C and joined to the L;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one, at least two or at least three of $Z_1$ to $Z_8$ are selected from $CR_z$, and the $R_z$ is selected from substituted or unsubstituted aryl having 6 to 30 carbon atom;

$Ar_2$ and $Ar_3$ are, at each occurrence identically or differently, selected from substituted or unsubstituted aryl having 6 to 30 carbon atoms, substituted or unsubstituted heteroaryl having 3 to 30 carbon atoms or a combination thereof;

"*" represents a position where Formula A is joined to Formula 2; and adjacent substituents $R_z$ can be optionally joined to form a ring.

2. The organic electroluminescent device of claim 1, wherein $Ar_2$ and $Ar_3$ are, at each occurrence identically or differently, selected from the group consisting of: phenyl, naphthyl, biphenyl, terphenyl, tetraphenyl, phenanthryl, fluorenyl, dibenzofuranyl, dibenzothienyl, pyridyl, pyrimidinyl, pyrazinyl, azafluorenyl, azadibenzofuranyl, azadibenzothienyl, diazafluorenyl, diazadibenzofuranyl, diazadibenzothienyl and combinations thereof; optionally, the above groups may be substituted with one or more of the group consisting of: deuterium, halogen, alkyl having 1 to 20 carbon atoms, cycloalkyl having 3 to 20 ring carbon atoms, heteroalkyl having 1 to 20 carbon atoms, a heterocyclic group having 3 to 20 ring atoms, arylalkyl having 7 to 30 carbon atoms, alkoxy having 1 to 20 carbon atoms, aryloxy having 6 to 30 carbon atoms, alkenyl having 2 to 20 carbon atoms, alkylsilyl having 3 to 20 carbon atoms, arylsilyl having 6 to 20 carbon atoms, amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

3. The organic electroluminescent device of claim 2, wherein $Ar_2$ and $Ar_3$ are, at each occurrence identically or differently, selected from the group consisting of: phenyl, naphthyl, biphenyl, terphenyl, tetraphenyl, phenanthryl, fluorenyl, dibenzofuranyl, dibenzothienyl, pyridyl, pyrimidinyl, pyrazinyl, azafluorenyl, azadibenzofuranyl, azadibenzothienyl, diazafluorenyl, diazadibenzofuranyl, diazadibenzothienyl and combinations thereof; optionally, the above groups may be substituted with one or more of deuterium, halogen or cyano.

4. The organic electroluminescent device of claim 1, wherein L is, at each occurrence identically or differently, selected from a single bond, substituted or unsubstituted arylene having 6 to 20 carbon atoms, substituted or unsubstituted heteroarylene having 3 to 20 carbon atoms or a combination thereof.

5. The organic electroluminescent device of claim 4, wherein L is selected from a single bond, phenylene or naphthylene.

6. The organic electroluminescent device of claim 1, wherein $Z_1$ to $Z_8$ are, at each occurrence identically or differently, selected from C or $CR_z$.

7. The organic electroluminescent device of claim 1, wherein at least one of $Z_1$ to $Z_8$ is N.

8. The organic electroluminescent device of claim 1, wherein at least two of $Z_1$ to $Z_8$ are $CR_z$, and the at least one of the $R_z$ is selected from substituted or unsubstituted aryl having 6 to 30 carbon atoms; and at least another one of the $R_z$ is selected from hydrogen, deuterium, halogen, cyano, substituted or unsubstituted aryl having 6 to 30 carbon atoms or a combination thereof.

9. The organic electroluminescent device of claim 1, wherein at least one of $Z_1$ to $Z_4$ is selected from C and joined to the L; and at least one of $Z_5$ and $Z_8$ is selected from $CR_z$, and the $R_z$ is substituted or unsubstituted aryl having 6 to 30 carbon atoms.

10. The organic electroluminescent device of claim 9, wherein $Z_2$ is selected from C and joined to the L; and at the same time, $Z_5$ is $CR_z$, and the $R_z$ is substituted or unsubstituted aryl having 6 to 30 carbon atoms;

or, wherein $Z_4$ is selected from C and joined to the L; and at the same time $Z_8$ is $CR_z$, and the $R_z$ is substituted or unsubstituted aryl having 6 to 30 carbon atoms.

11. The organic electroluminescent device of claim 1, wherein at least one of $Z_1$ to $Z_4$ is selected from C and joined to the L; and at the same time at least one of $Z_1$ to $Z_4$ is selected from $CR_z$, and the $R_z$ is substituted or unsubstituted aryl having 6 to 30 carbon atoms.

12. The organic electroluminescent device of claim 1, wherein the first compound is selected from the group consisting of the following:

G-1

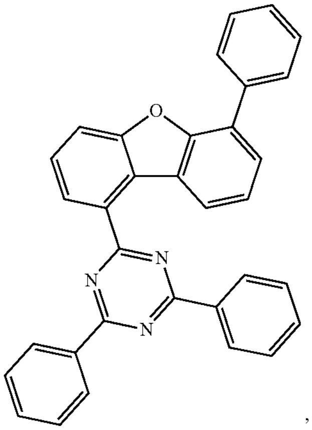

,

G-2

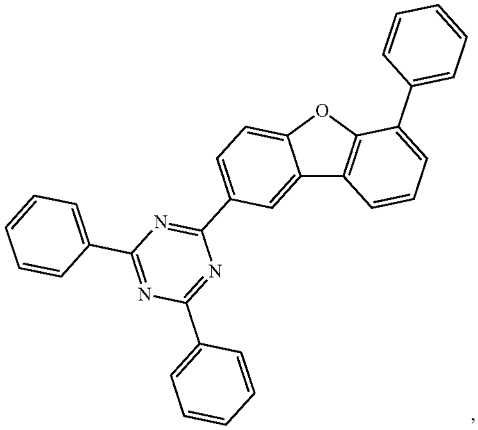

,

G-3

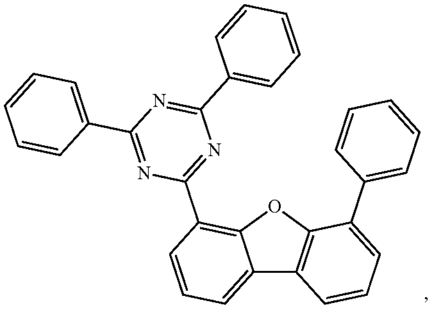

,

G-4

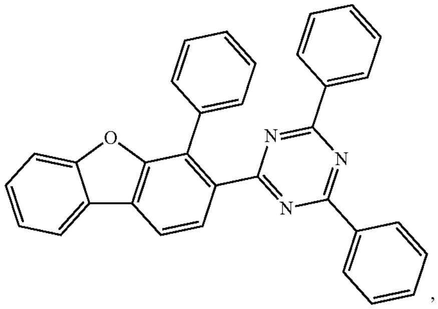

,

-continued
G-5
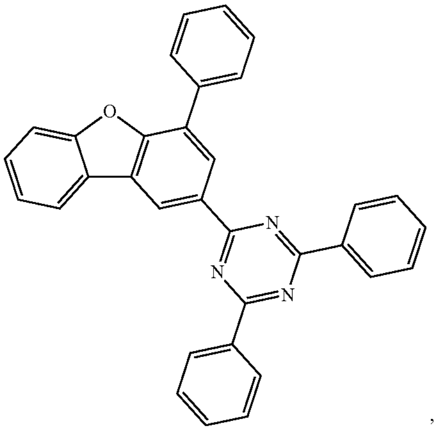
,
G-6
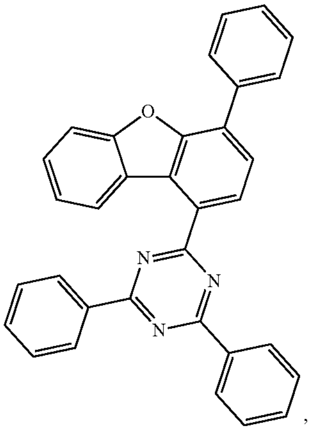
,
G-7
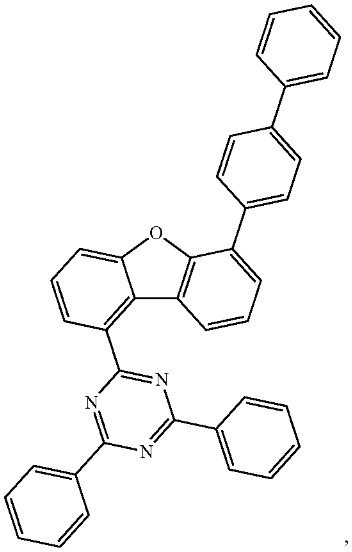
,
G-8
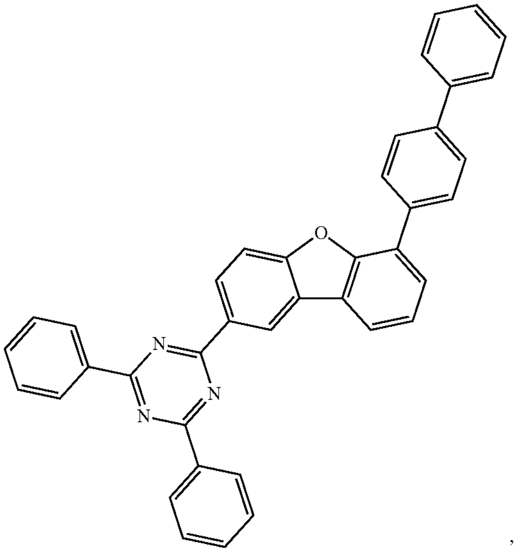
,
G-9
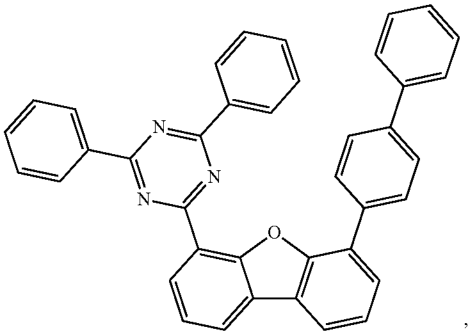
,
G-10
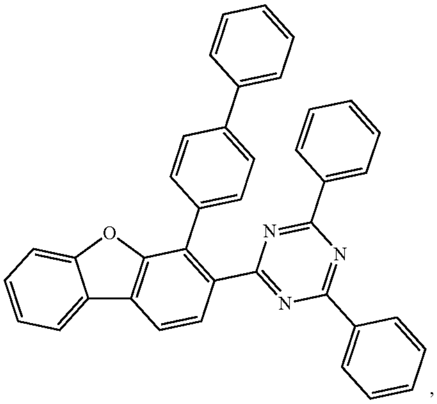
, -continued
G-11
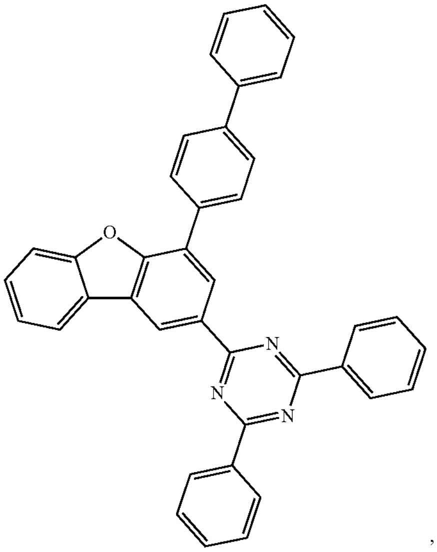
,
G-12
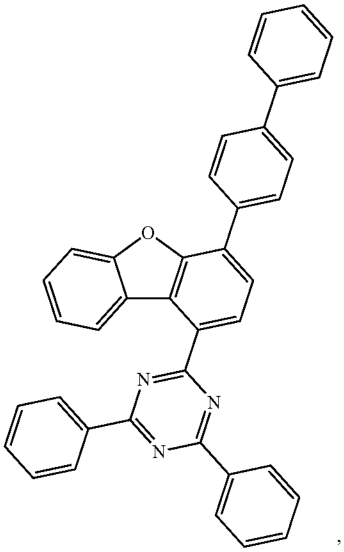
,
G-13
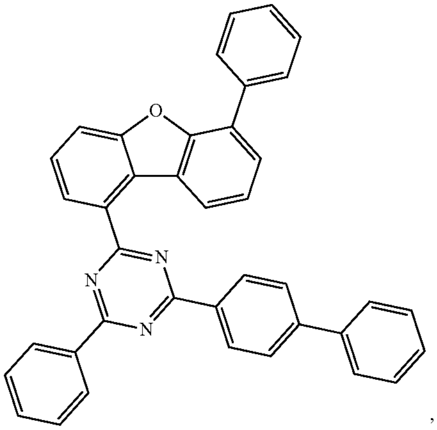
,
G-14
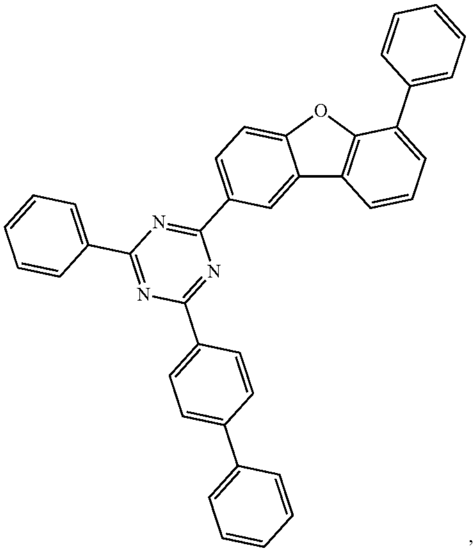
,
G-15
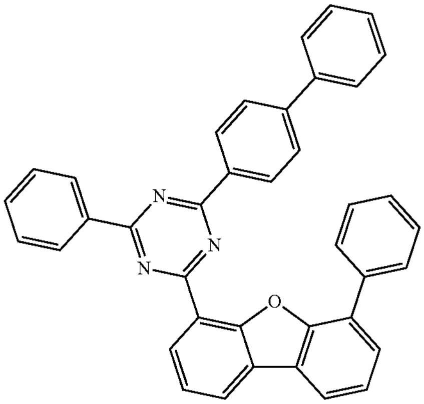
,
G-16
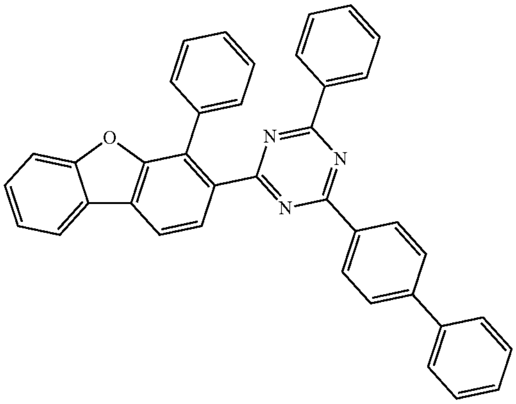
, -continued
G-17
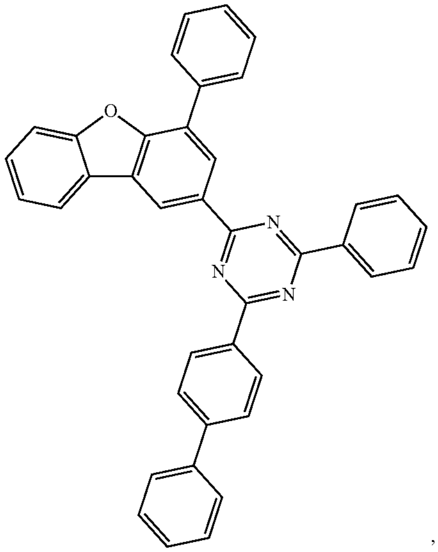
,
G-18
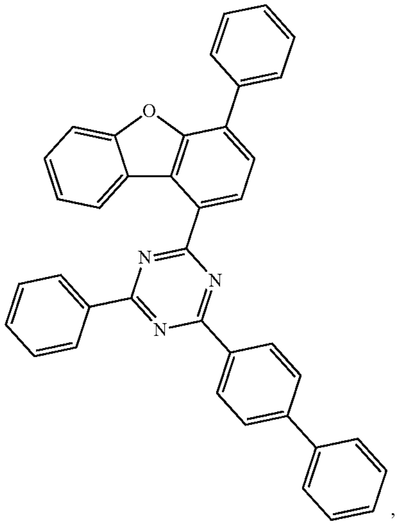
,
G-19
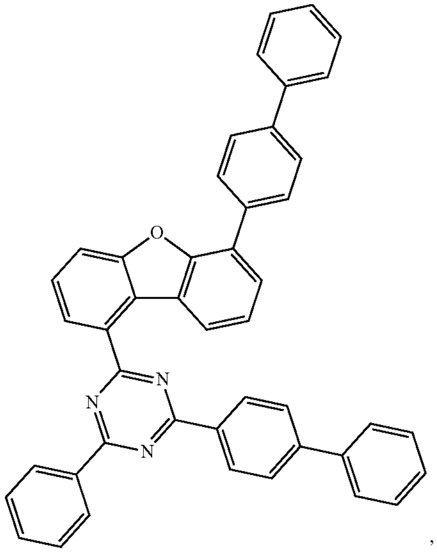
,
G-20
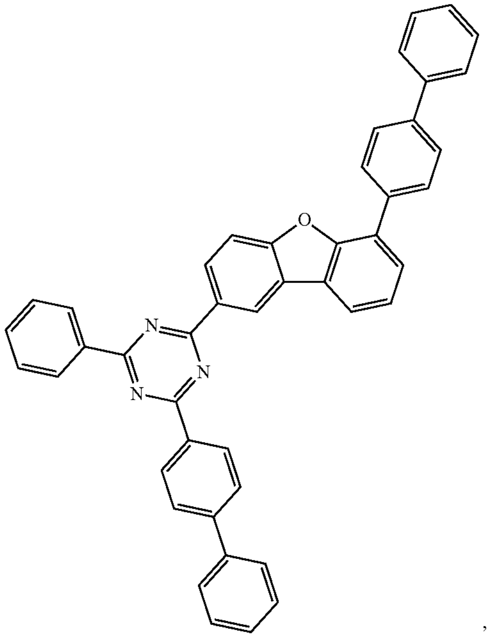
, -continued
G-21
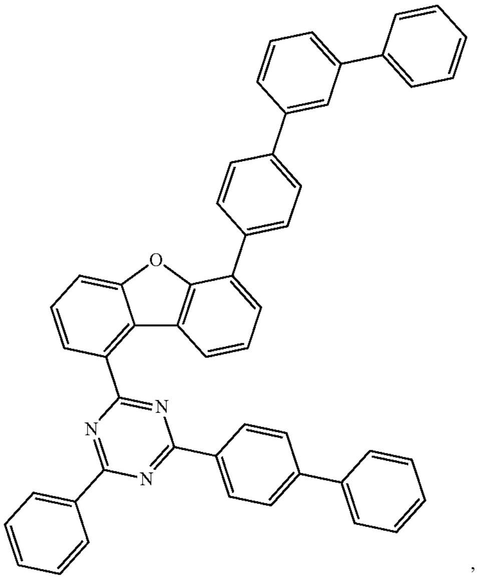
,
G-22
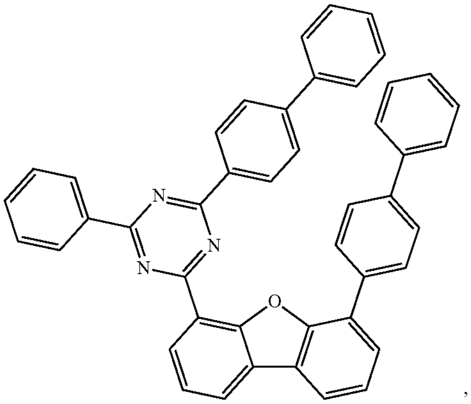
,
G-23
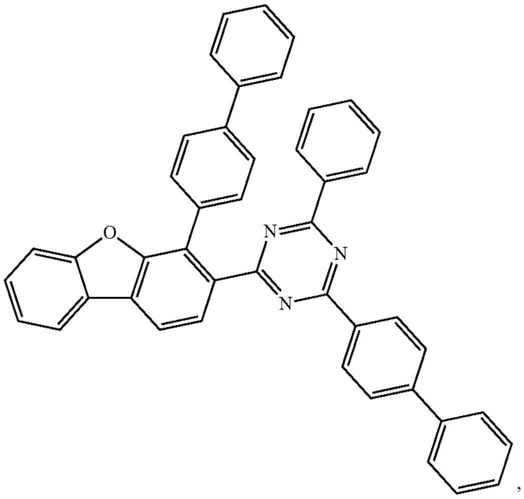
,
G-24
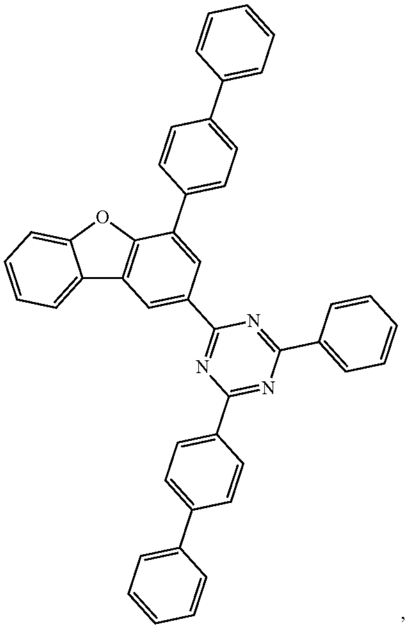
, -continued
G-25
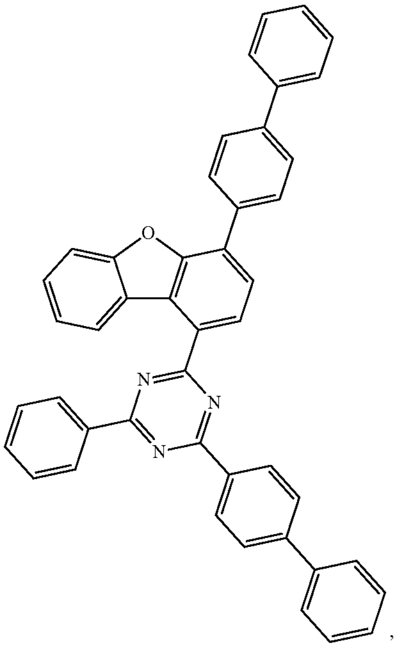
G-26
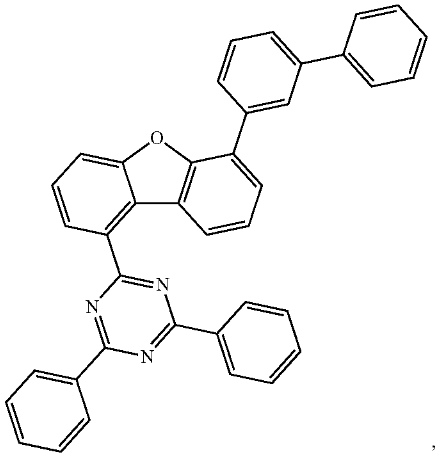
,
G-27
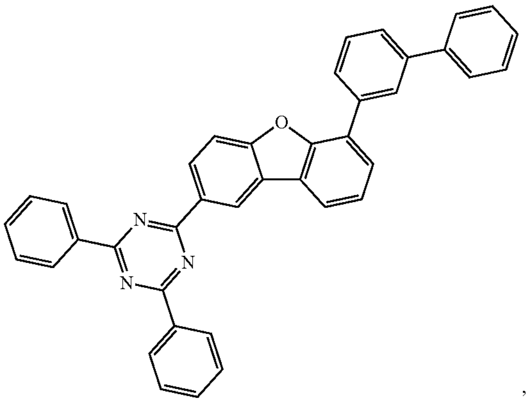
,
G-28
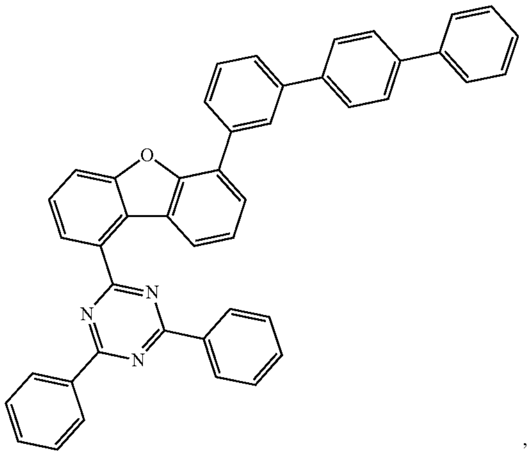
,
G-29
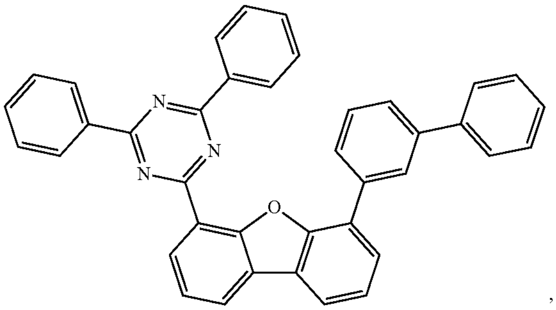
,
G-30
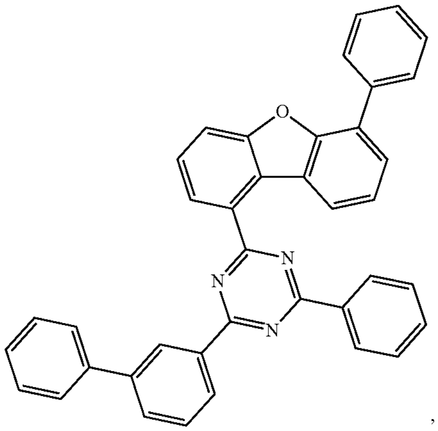
, -continued
G-31
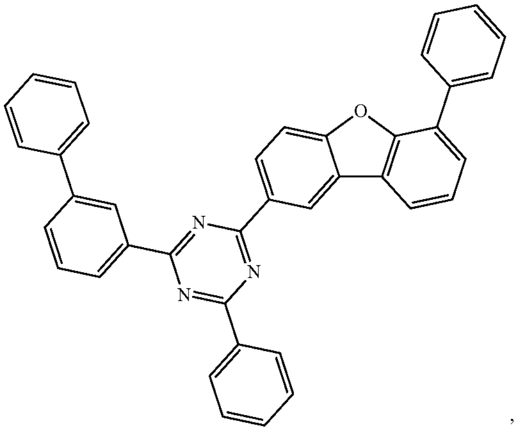
,
G-32
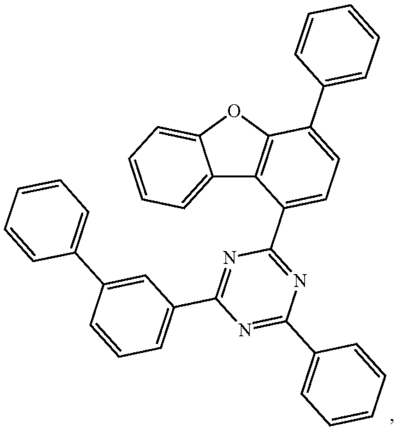
,
G-33
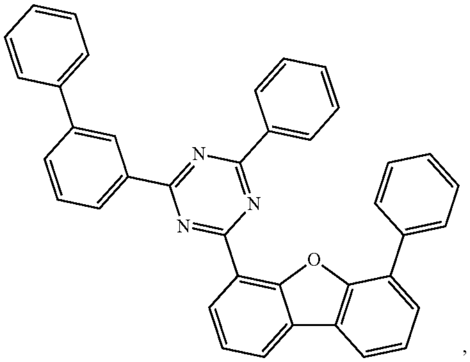
,
G-34
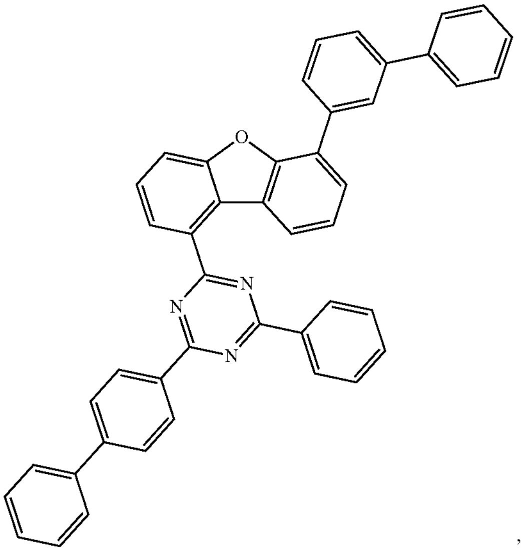
,
G-35
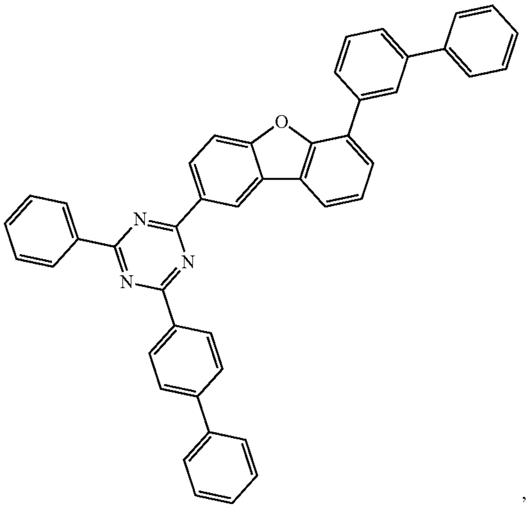
,
G-36
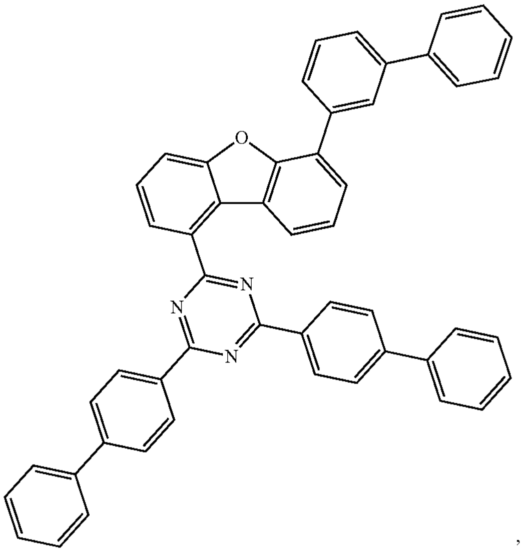
, -continued
G-37
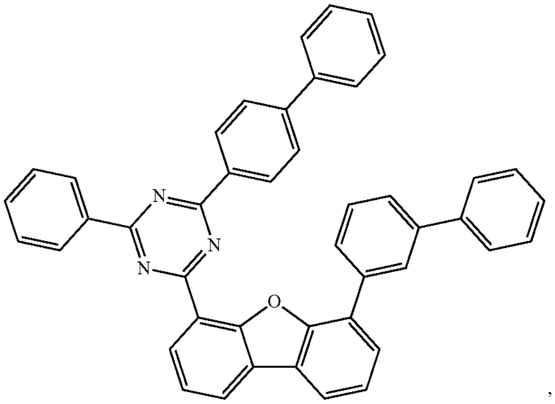
,
G-38
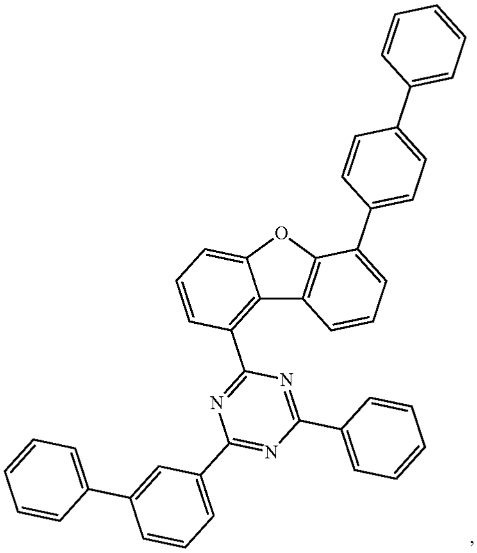
,
G-39
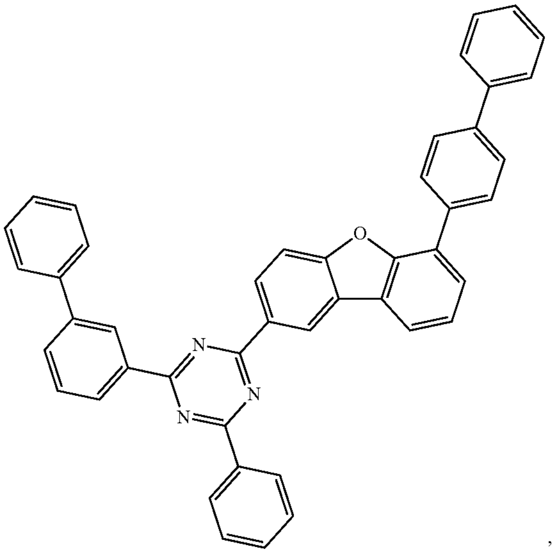
,
G-40
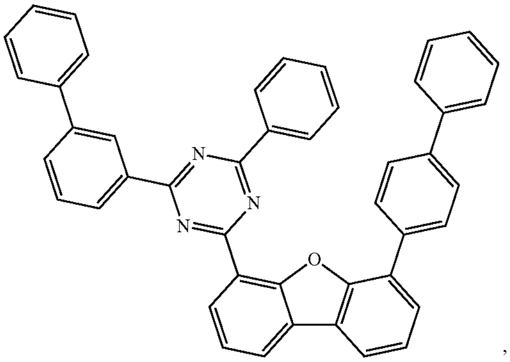
,
G-41
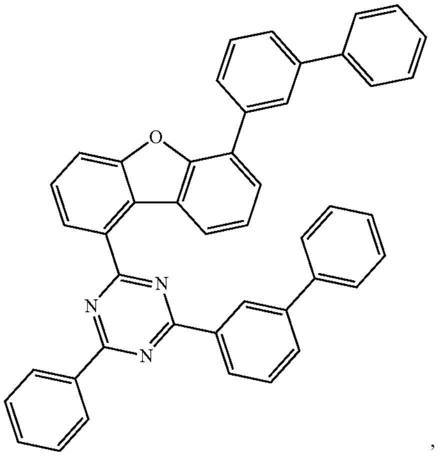
,
G-42
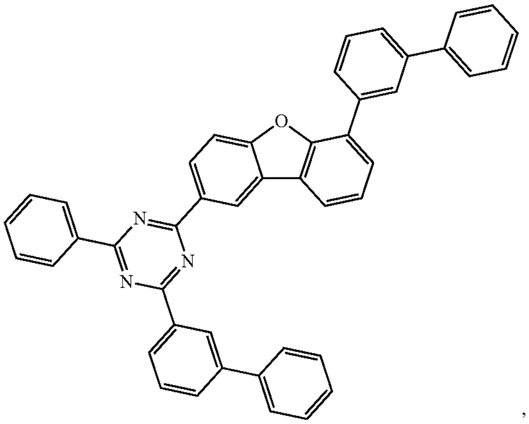
, -continued
G-43
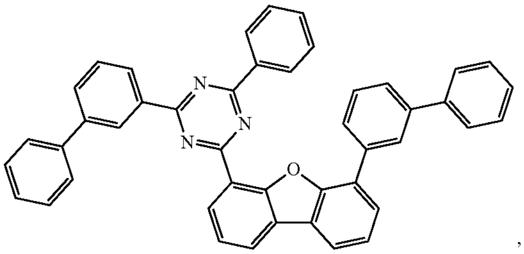
,
G-44
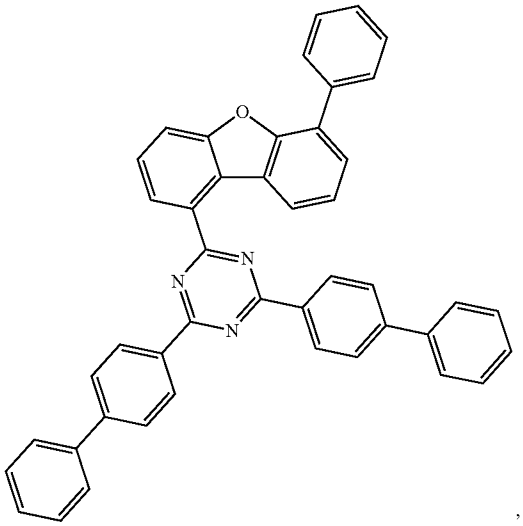
,
G-45
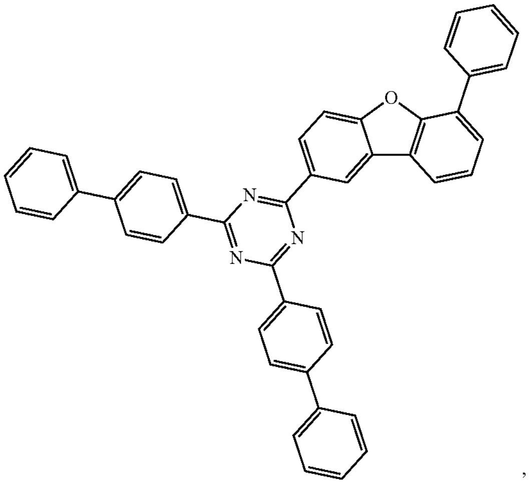
,
G-46
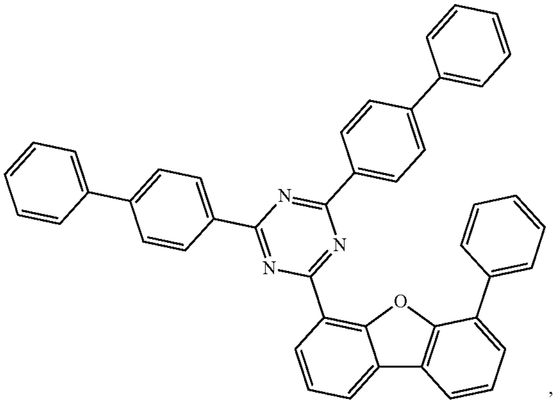
, -continued
G-47
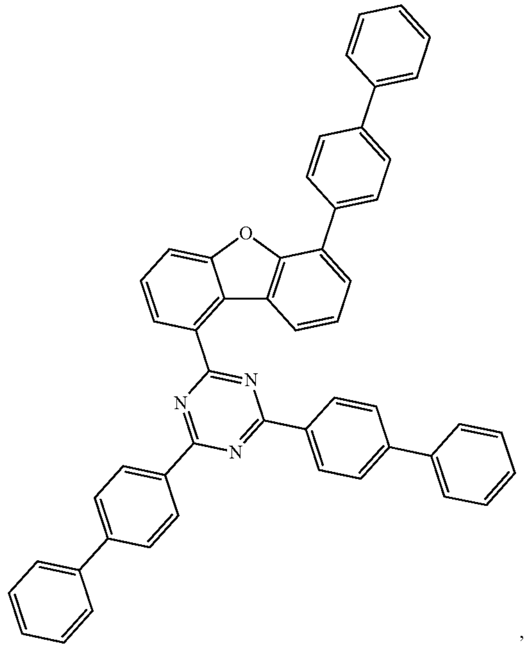
,
G-48
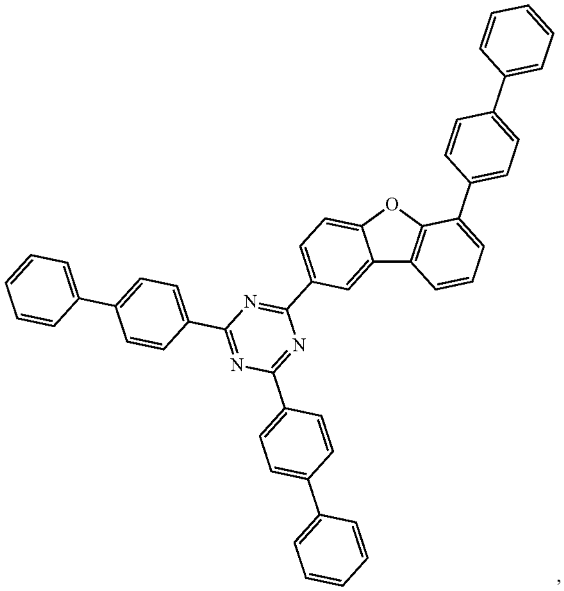
,
G-49
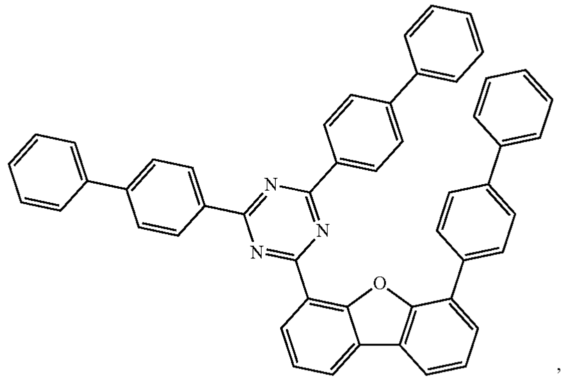
,
G-50
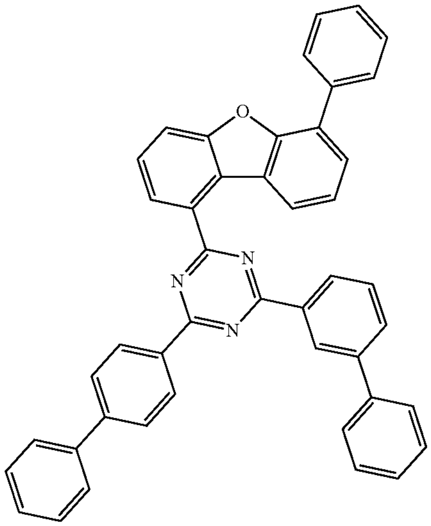
, -continued
G-51
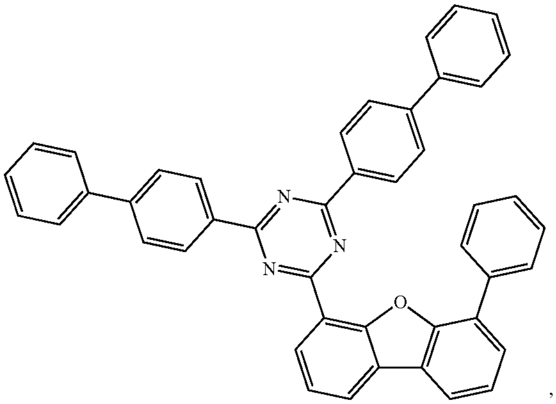
,
G-52
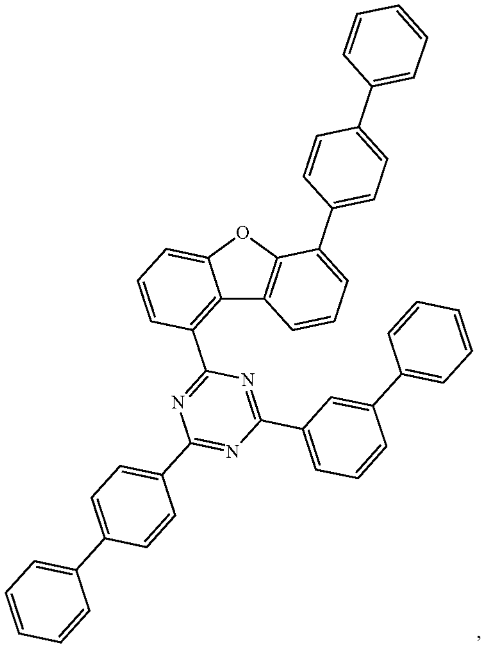
,
G-53
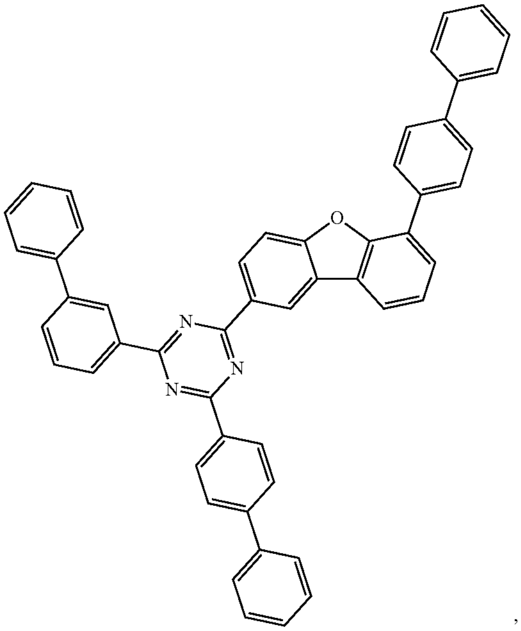
,
G-54
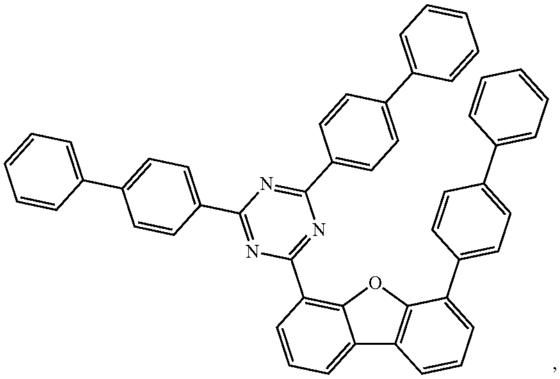
, -continued
G-55
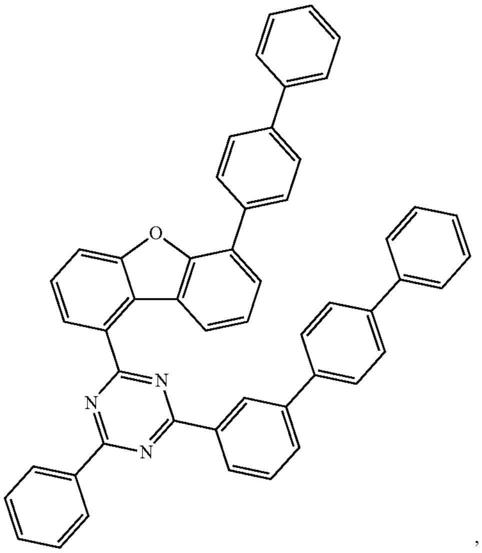
,
G-56
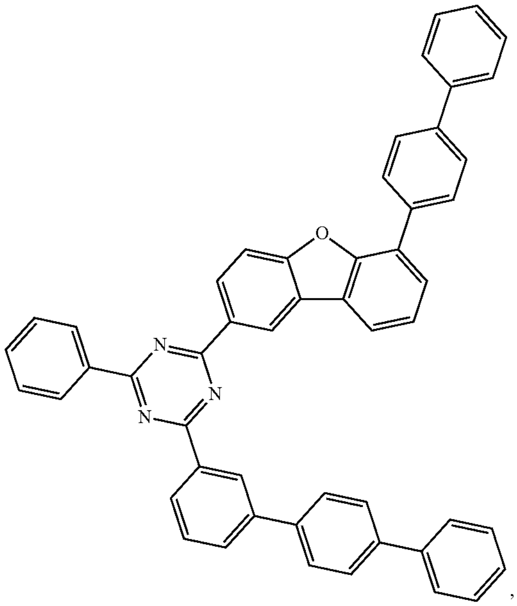
,
G-57
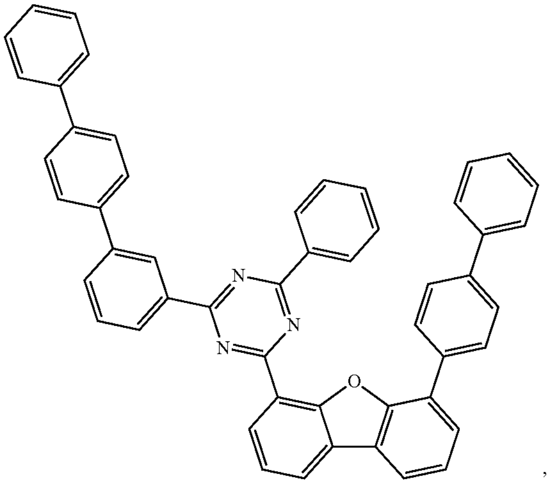
,
G-58
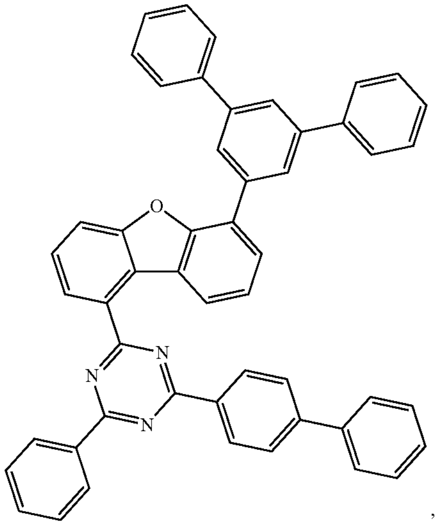
,
G-59
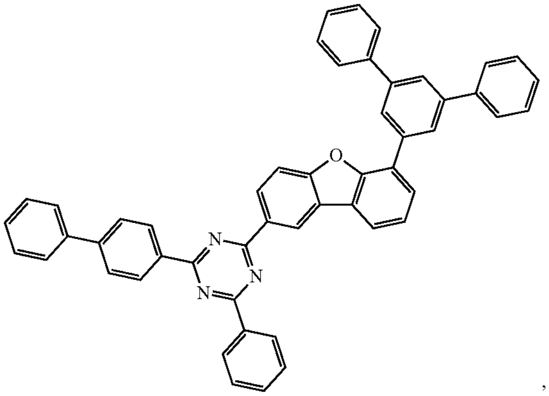
,
G-60
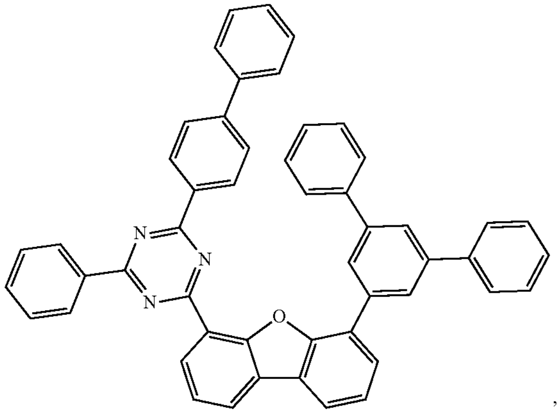
, -continued
G-61
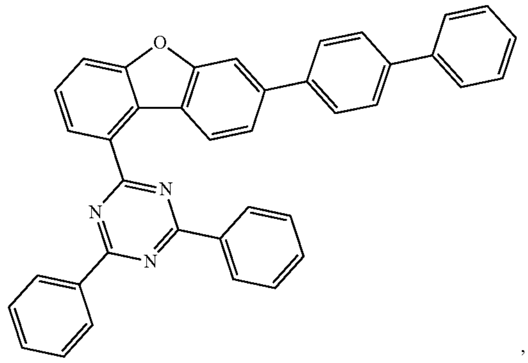
,
G-62
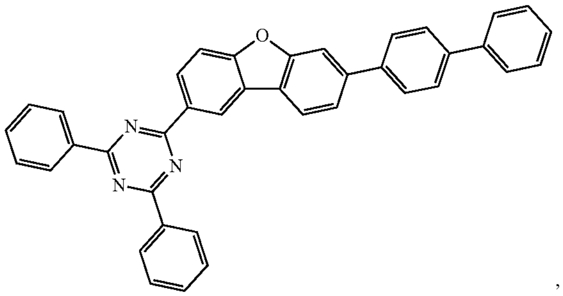
,
G-63
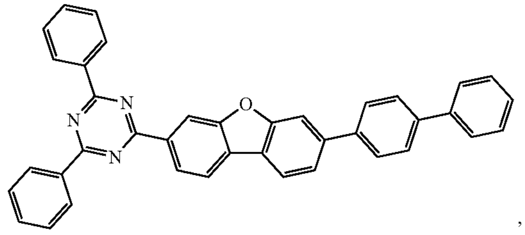
,
G-64
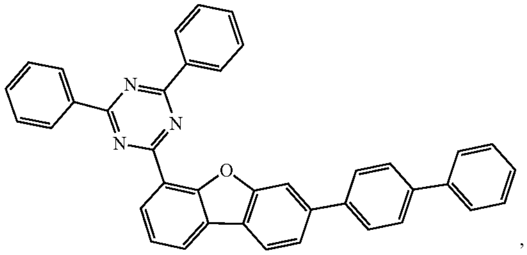
,
G-65
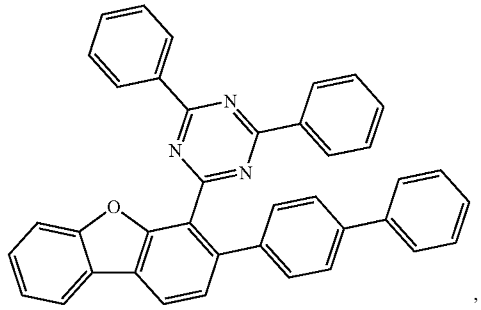
,
G-66
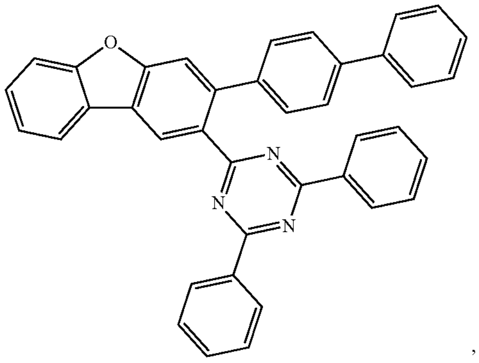
,
G-67
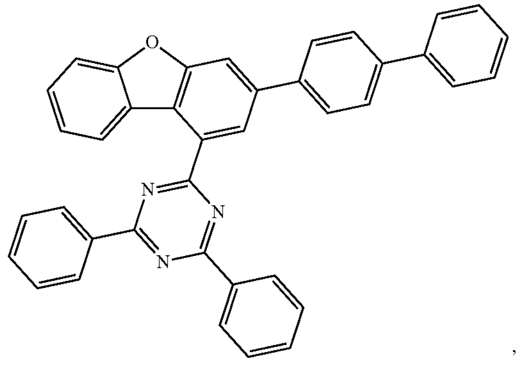
,
G-68
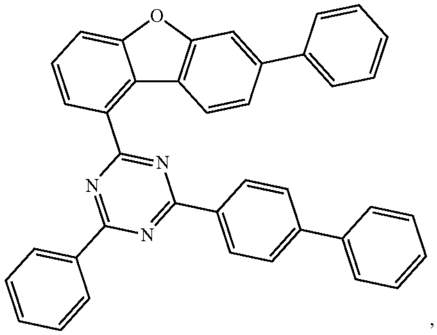
, -continued
G-69
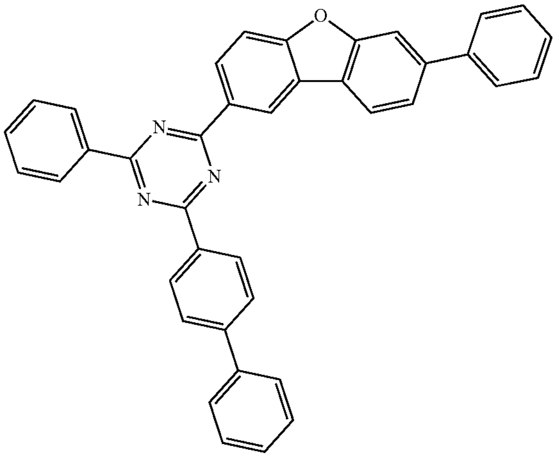
,
G-70
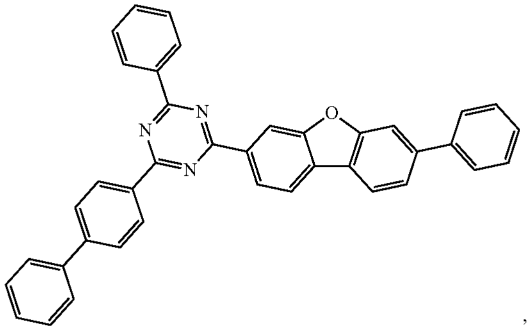
,
G-71
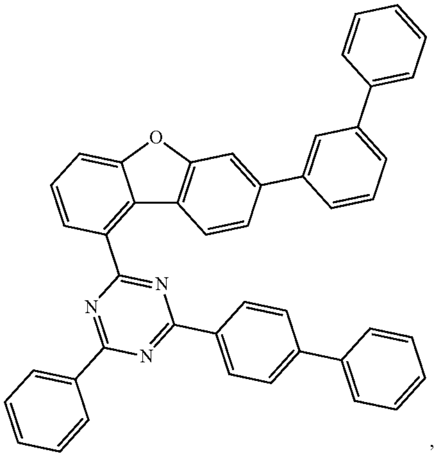
,
G-72
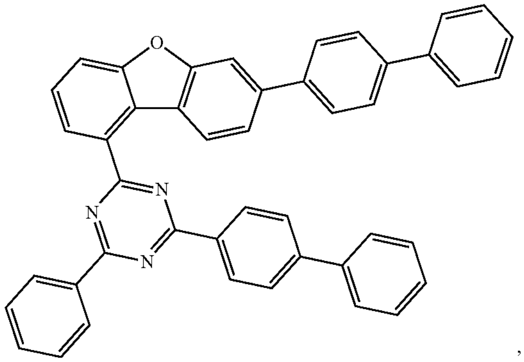
,
G-73
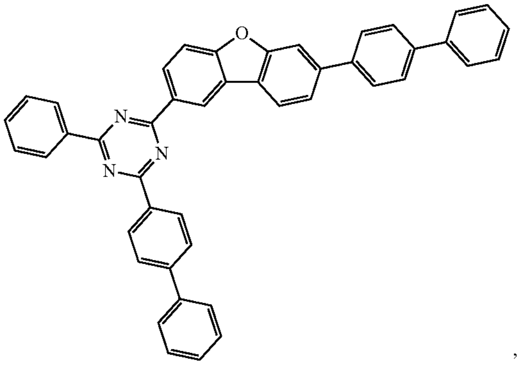
,
G-74
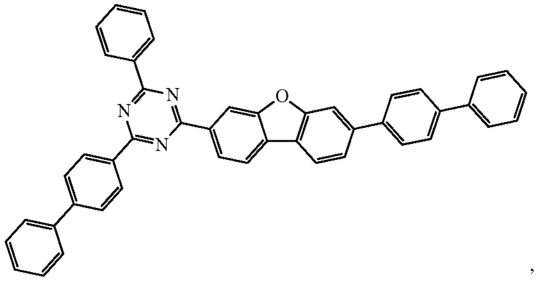
, -continued
G-75
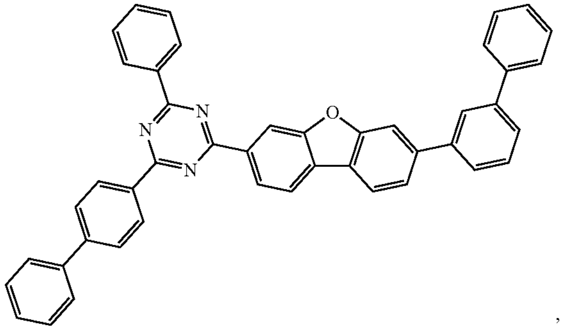
,
G-76
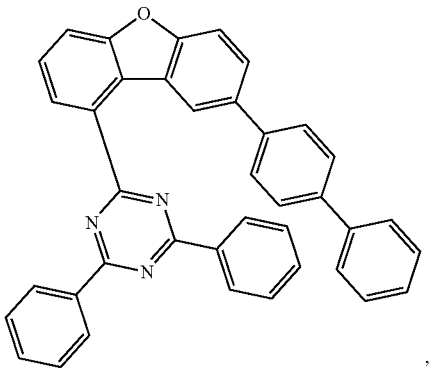
,
G-77
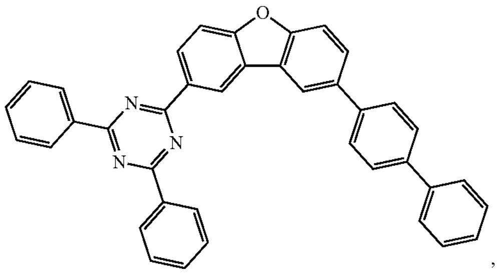
,
G-78
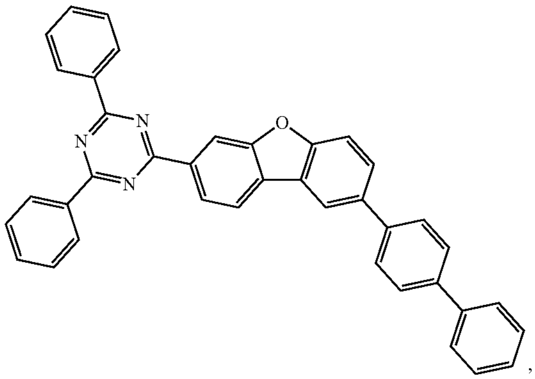
,
G-79
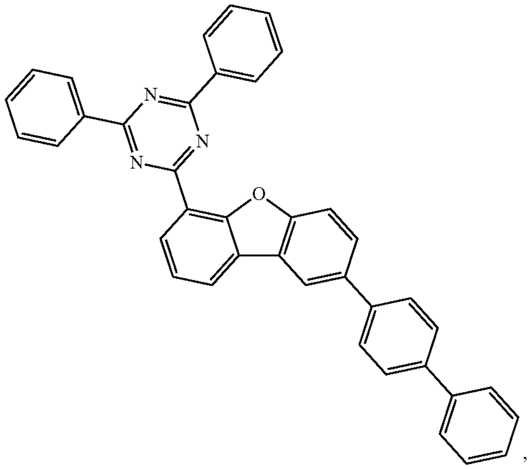
,
G-80
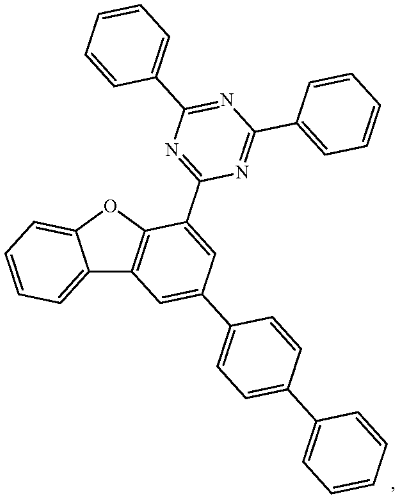
, -continued
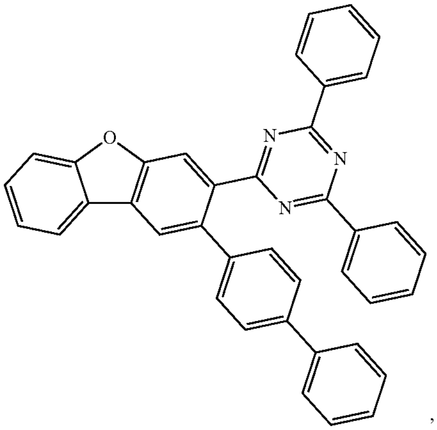
G-81
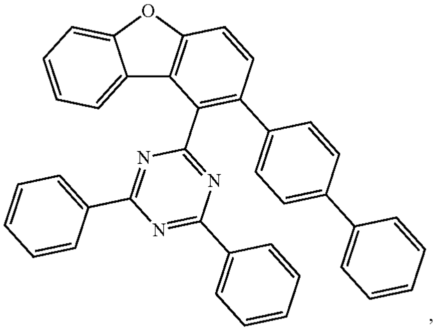
G-82
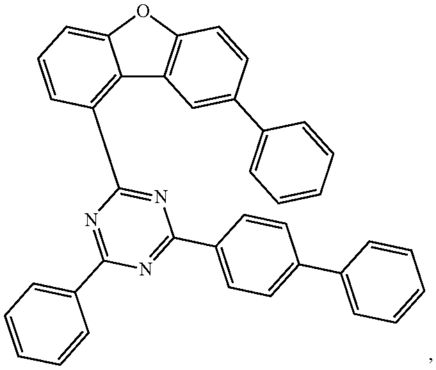
G-83
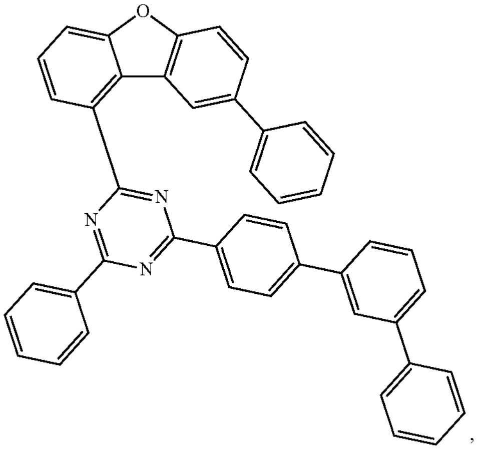
G-84
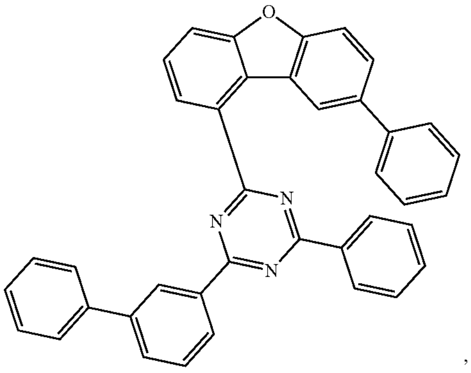
G-85
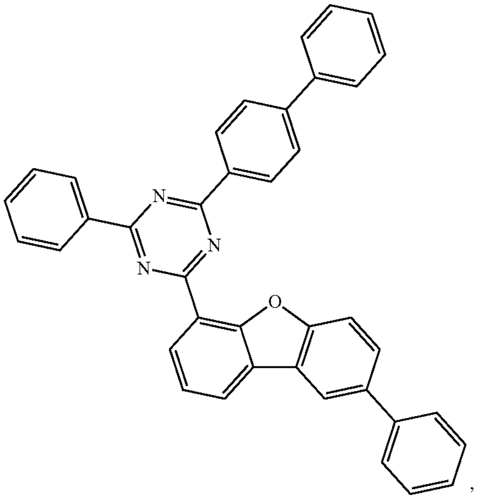
G-86

-continued
G-87
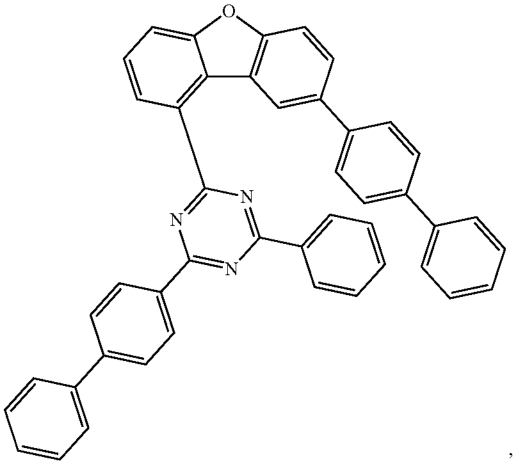
,
G-88
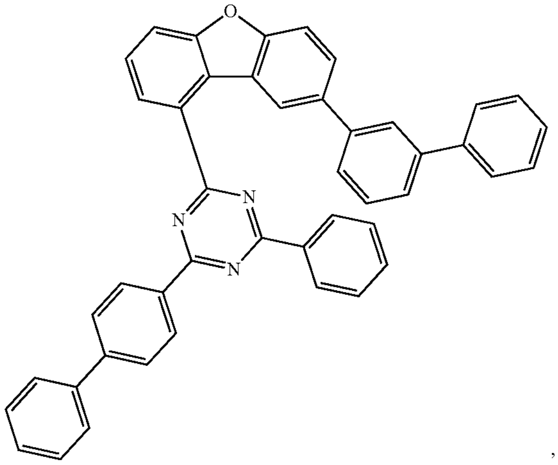
,
G-89
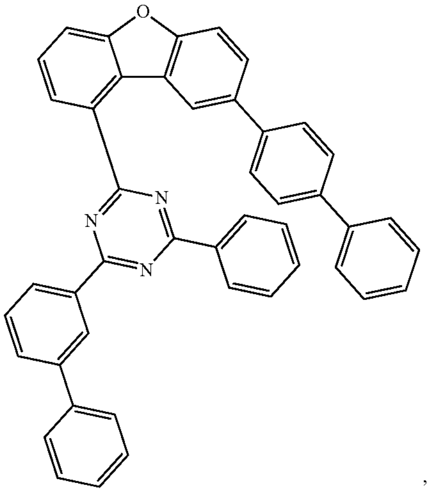
,
G-90
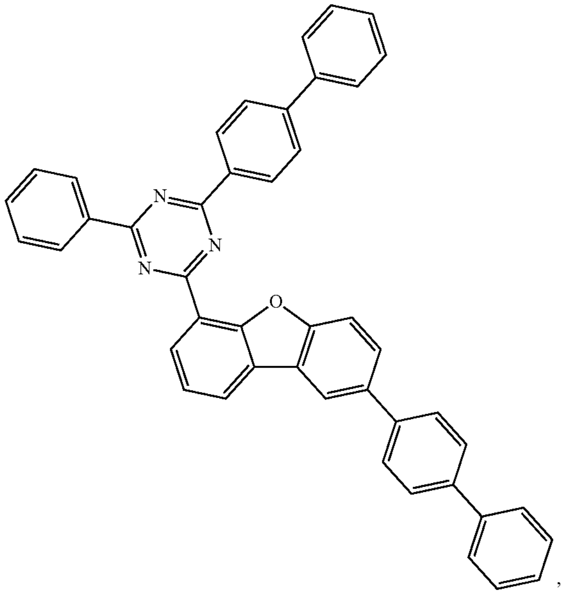
,
G-91
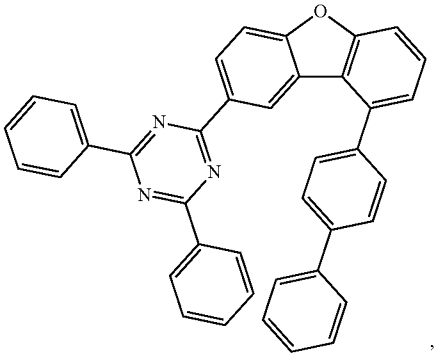
,
G-92
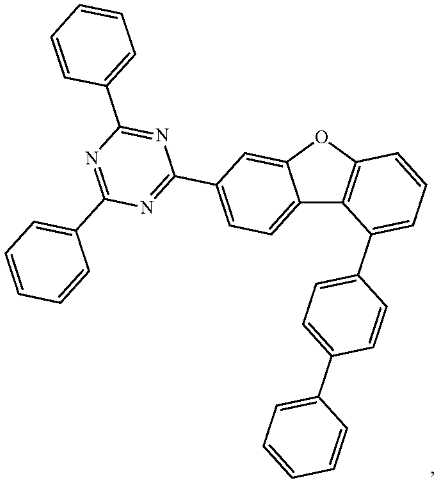
, -continued
G-93
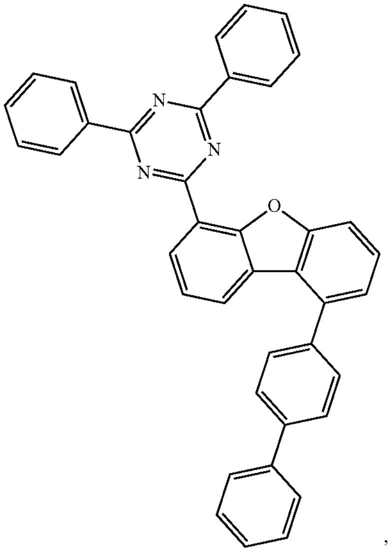
,
G-94
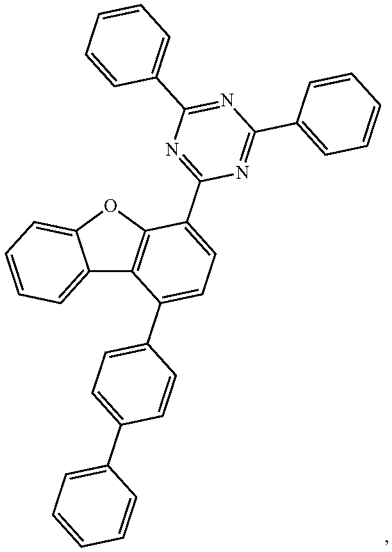
,
G-95
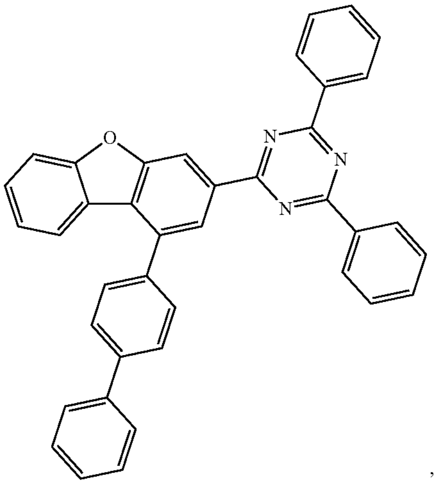
,
G-96
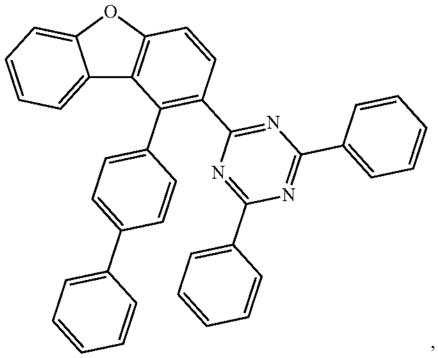
,
G-97
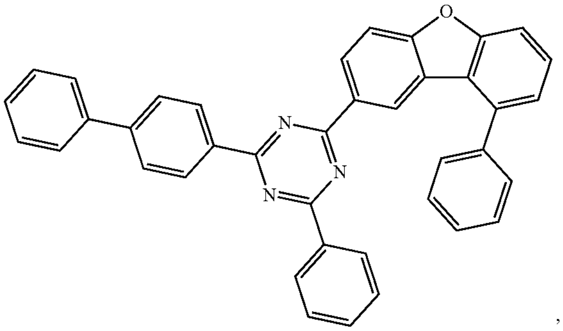
,
G-98
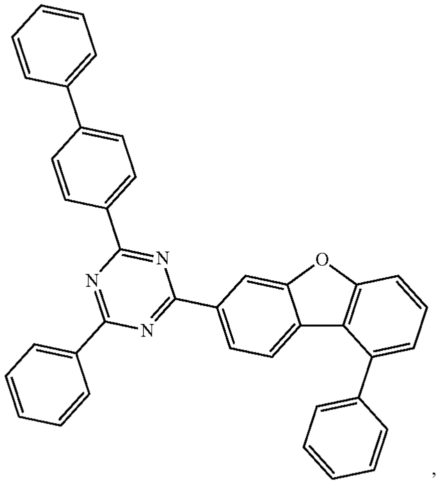
, -continued
G-99
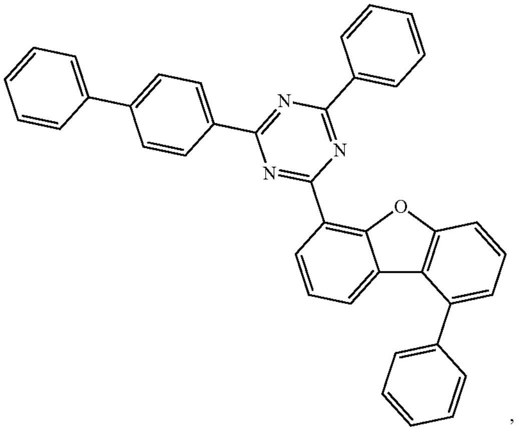
,
G-100
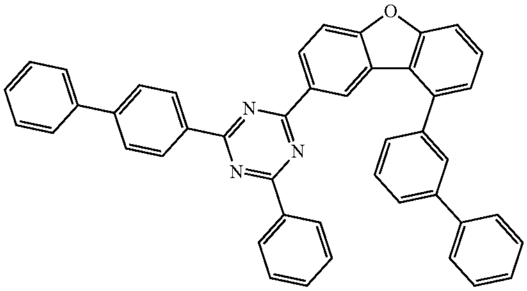
,
G-101
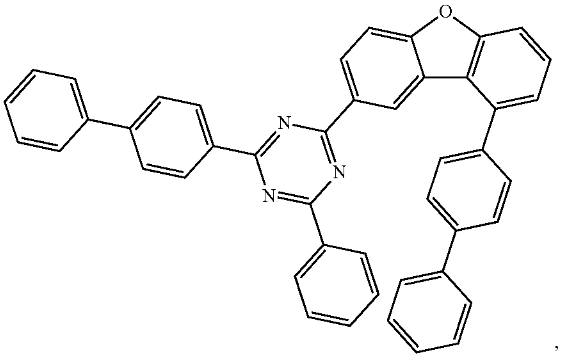
,
G-102
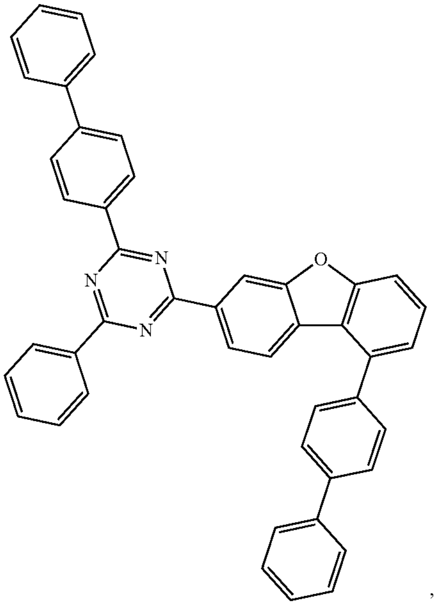
, -continued
G-103
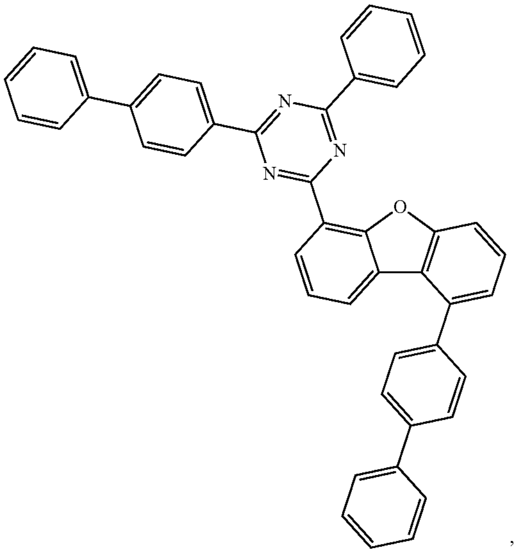
,
G-104
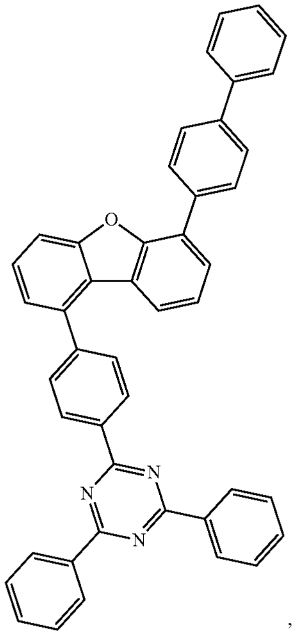
,
G-105
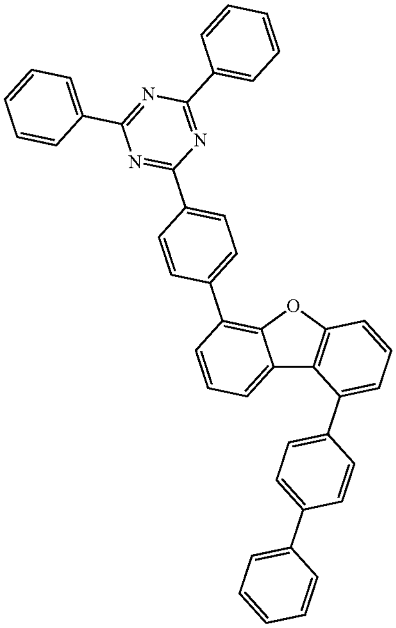
,
G-106
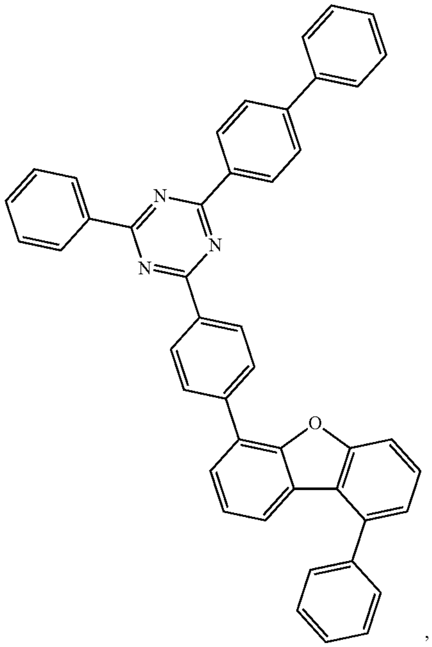
,
G-107
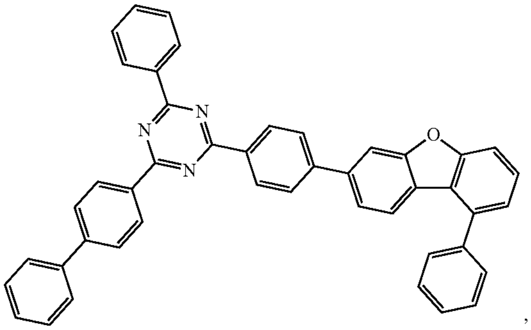
,
G-108
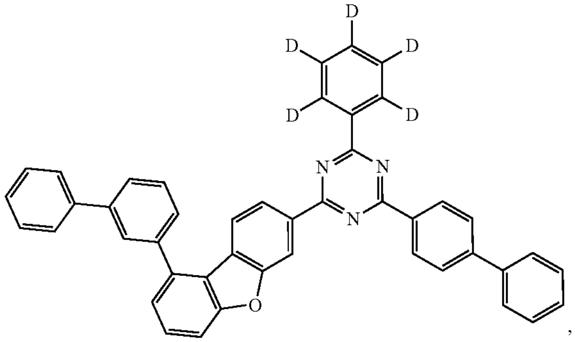
, -continued
G-109
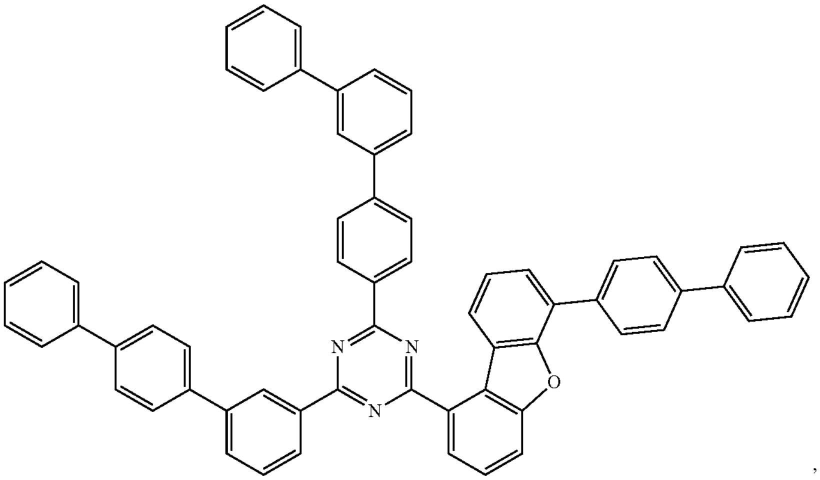
,
G-110
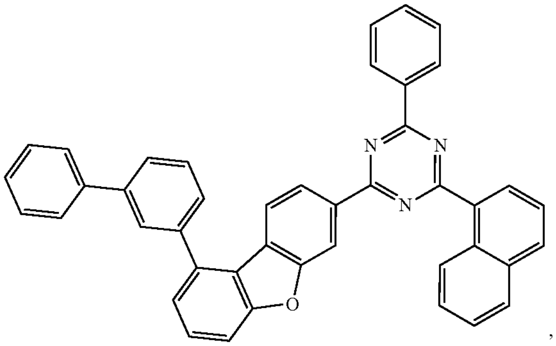
,
G-111
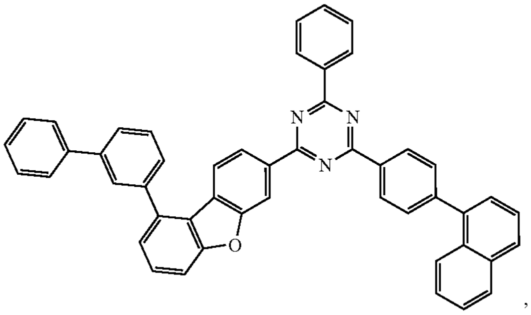
,
G-112
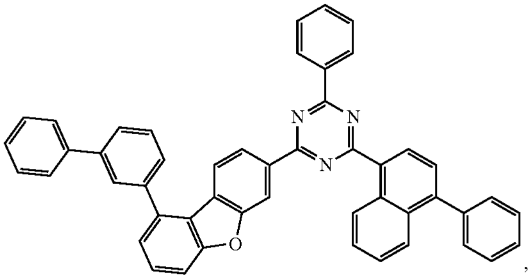
,
G-113
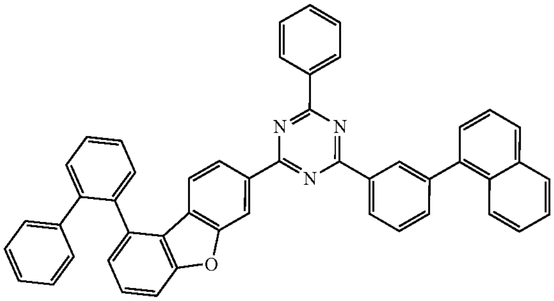
, -continued
G-114
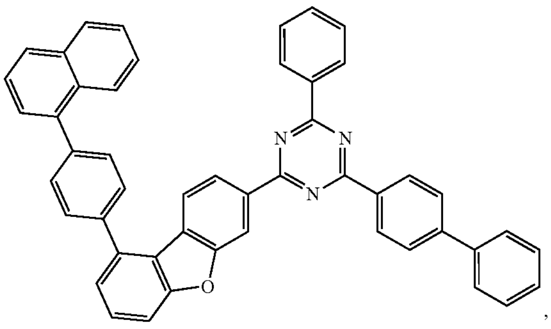
,
G-115
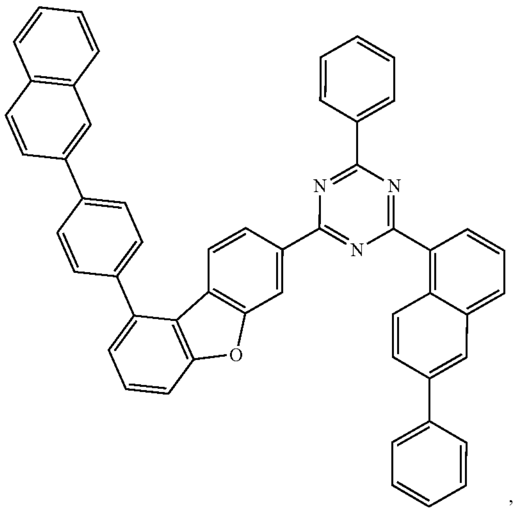
,
G-116
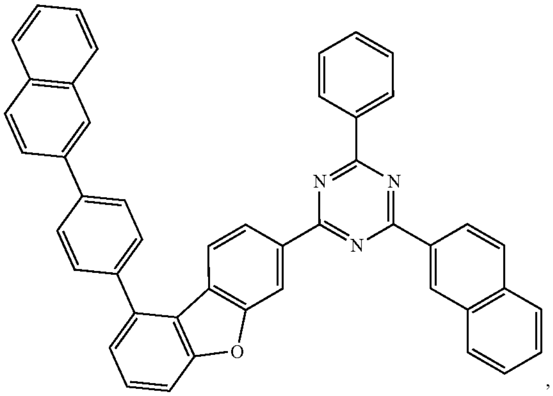
,
G-117
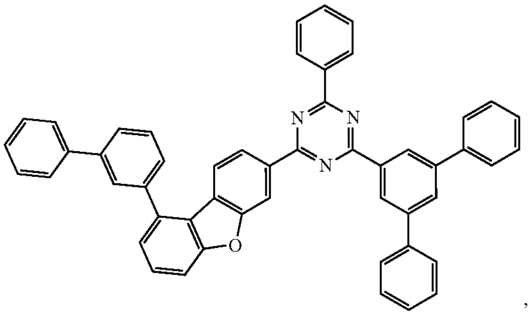
,
G-118
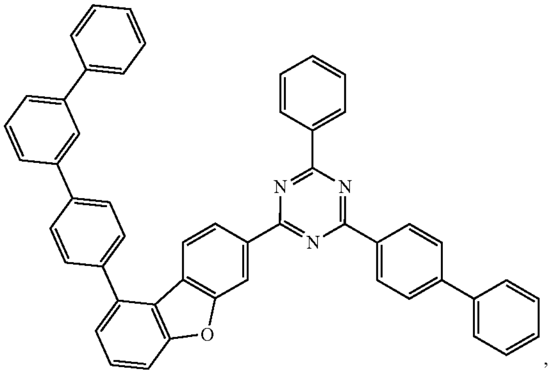
,
G-119
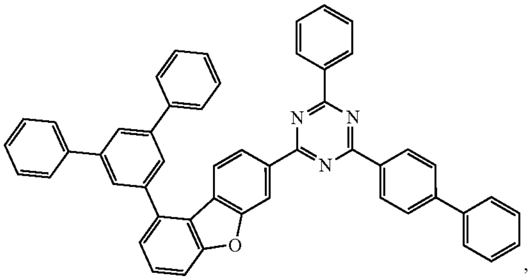
, -continued
G-120
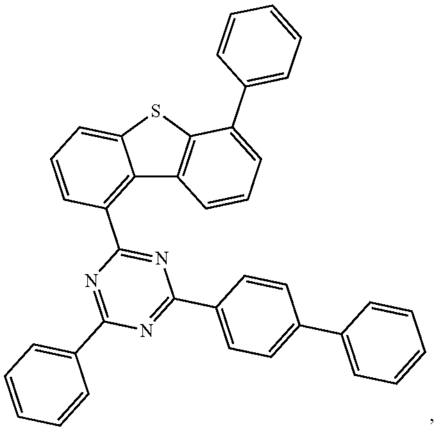
,
G-121
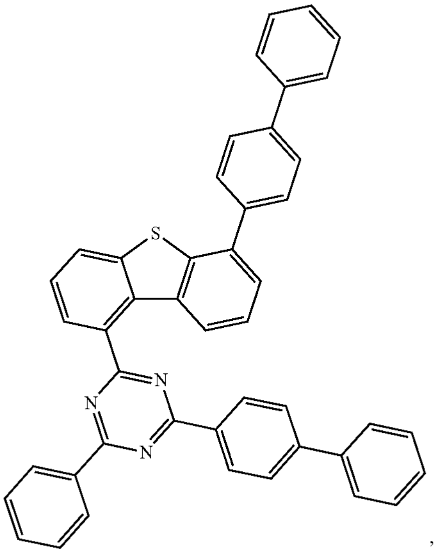
,
G-122
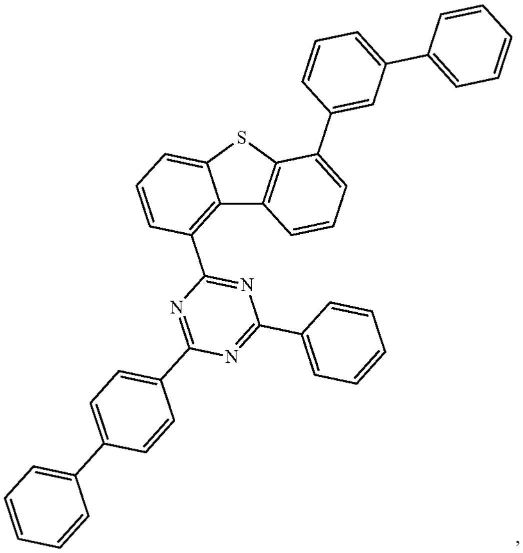
,
G-123
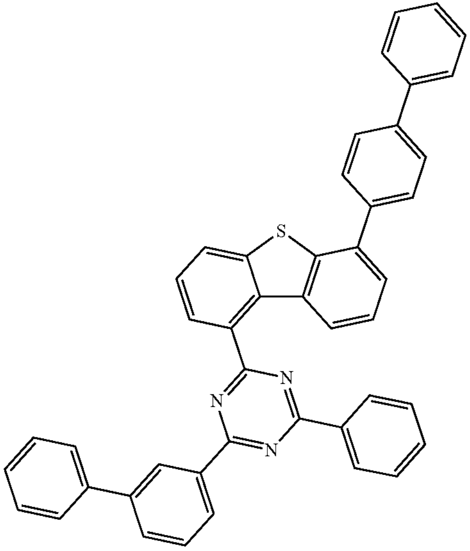
,
G-124
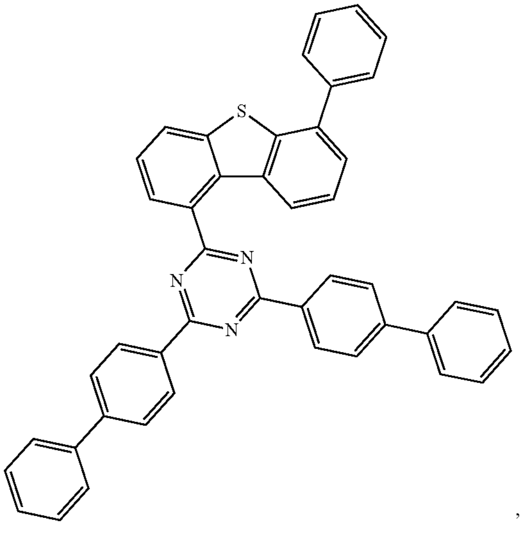
,
G-125
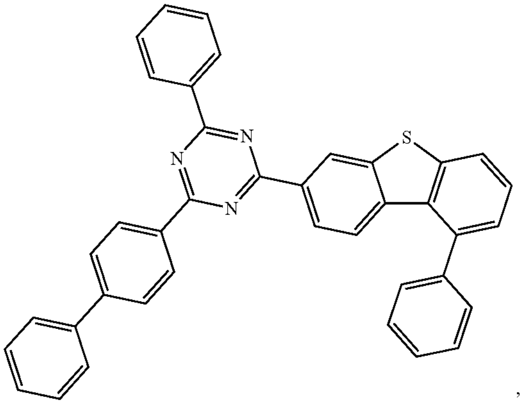
, -continued
G-126
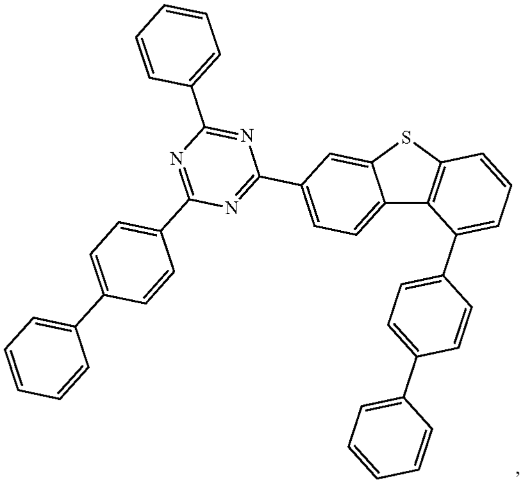
,
G-127
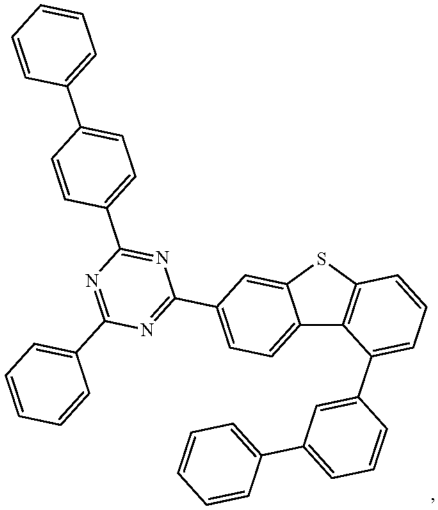
,
G-128
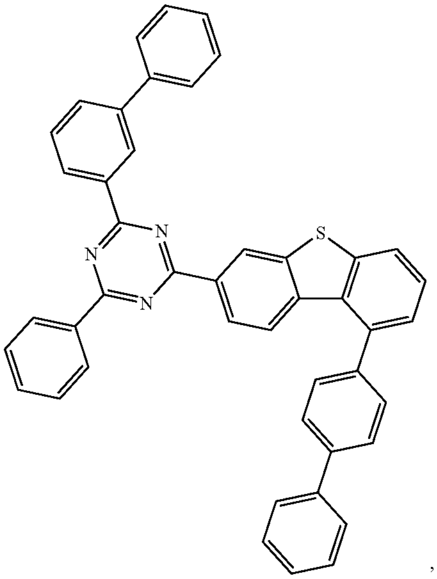
,
G-129
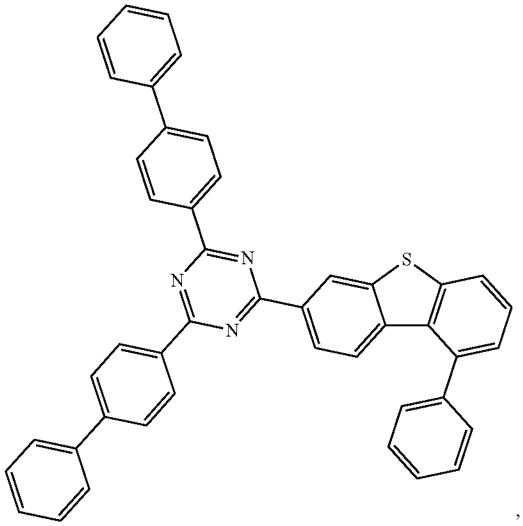
,
G-130
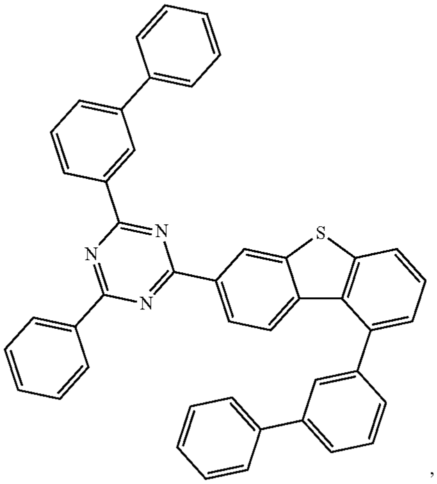
,
G-131
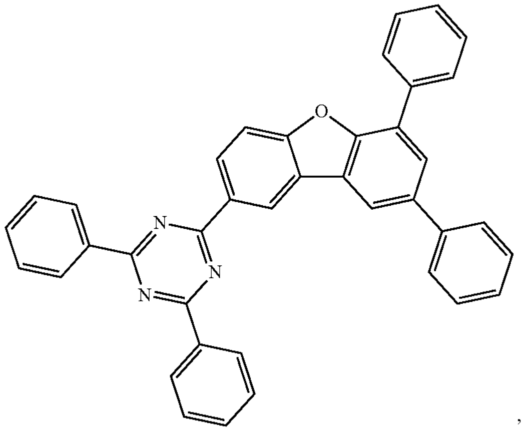
, -continued
G-132
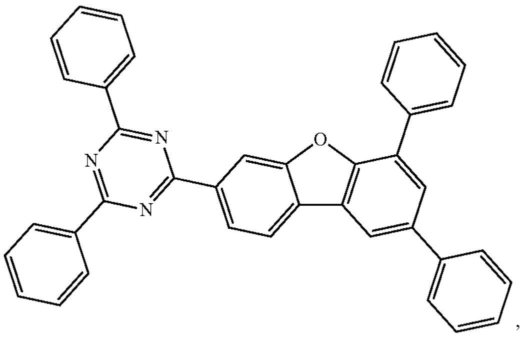
,
G-133
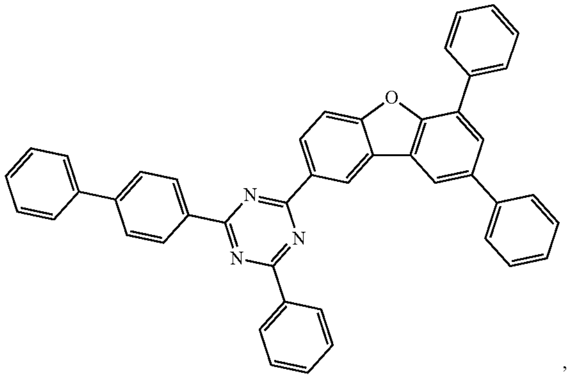
,
G-134
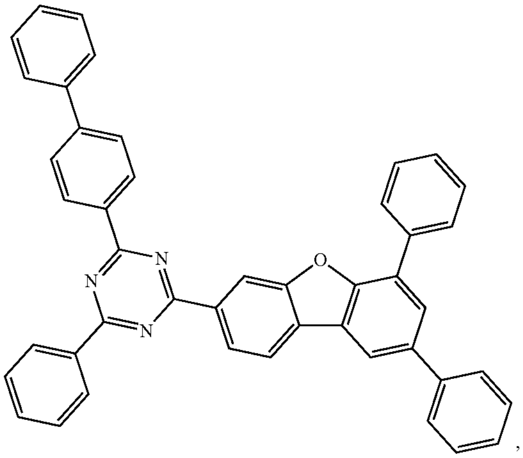
,
G-135
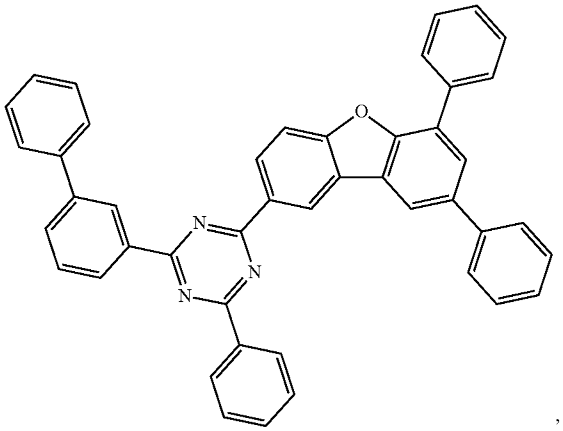
,
G-136
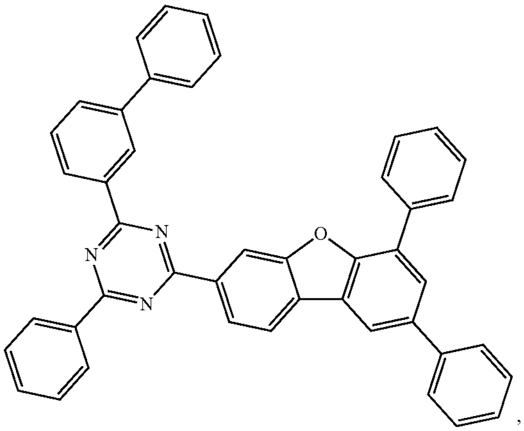
,
G-137
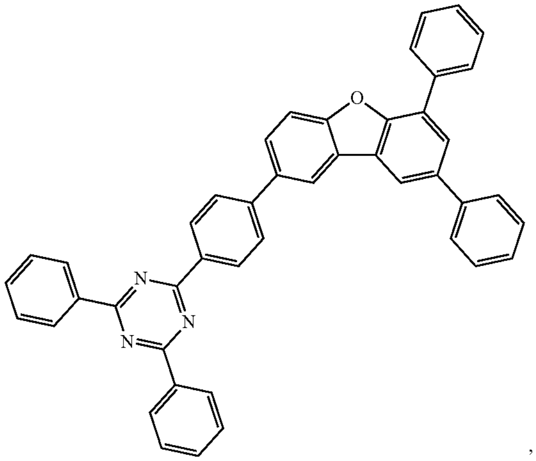
, -continued
G-138
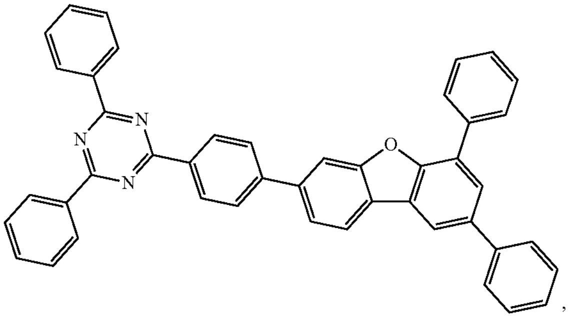
,
G-139
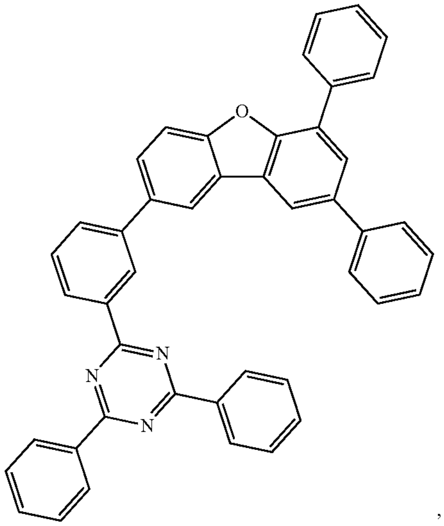
,
G-140
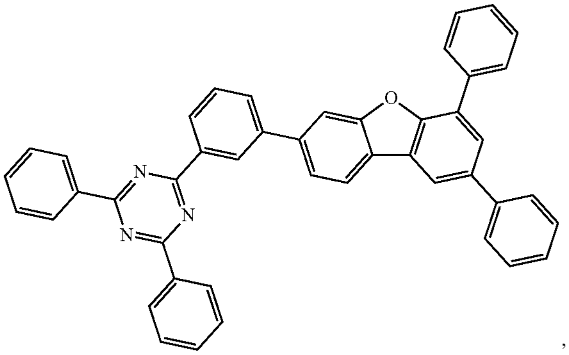
,
G-141
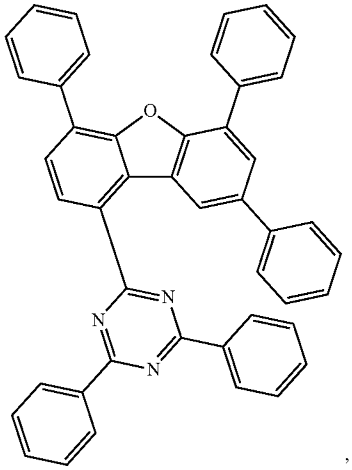
,
G-142
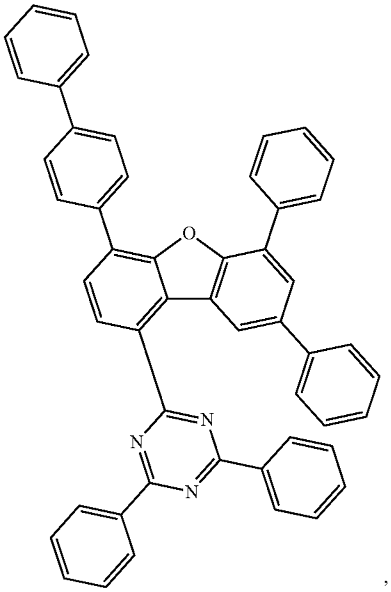
,
G-143
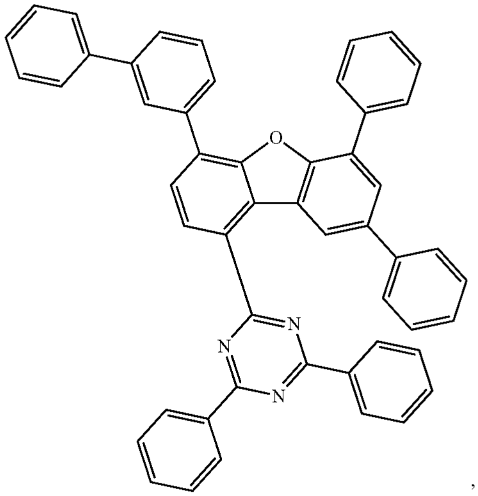
, -continued
G-144
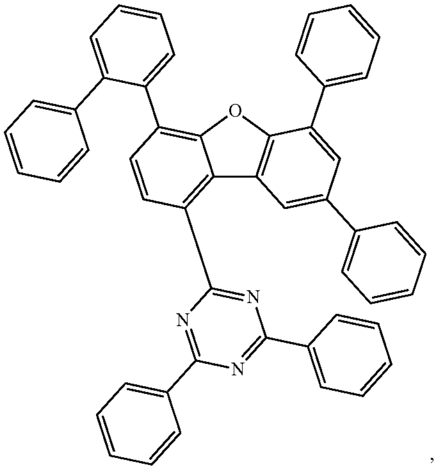
,
G-145
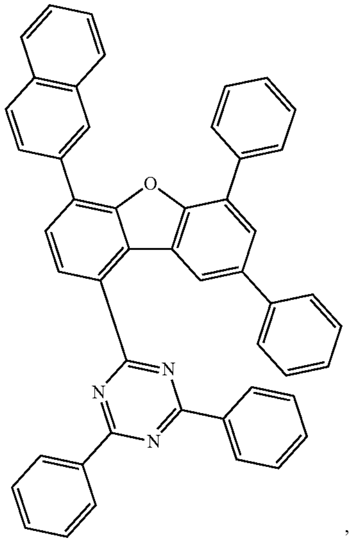
,
G-146
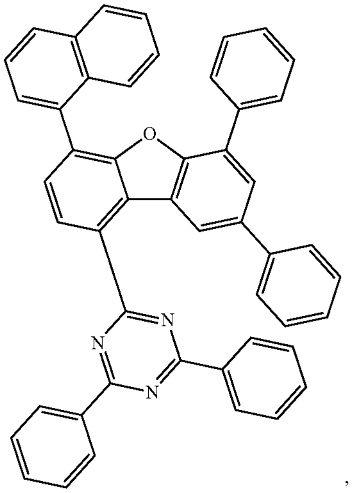
,
G-147
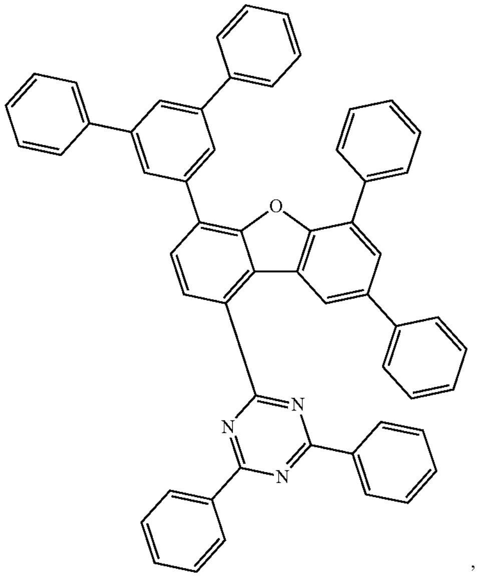
,
G-148
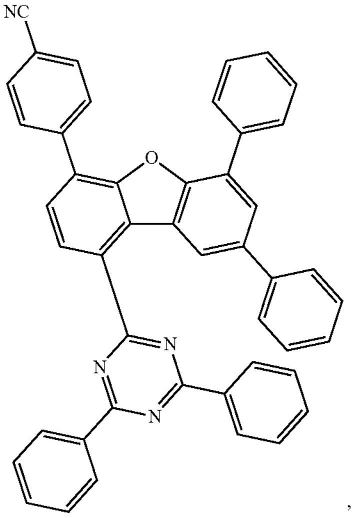
,
G-149
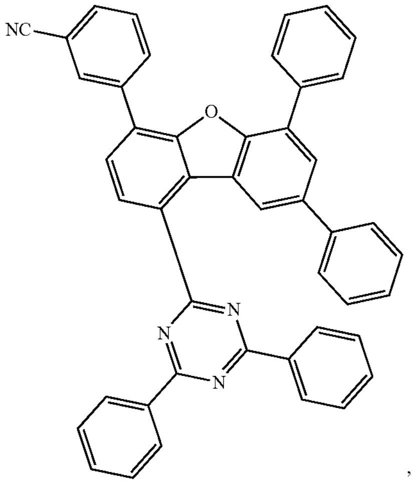
, -continued
G-150
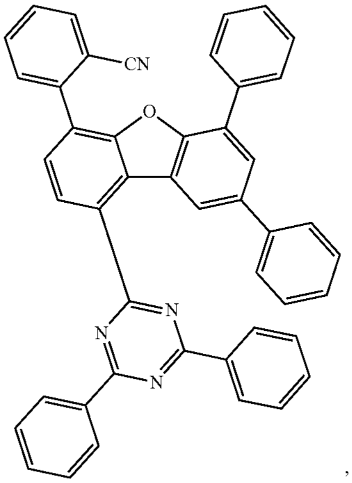
,
G-151
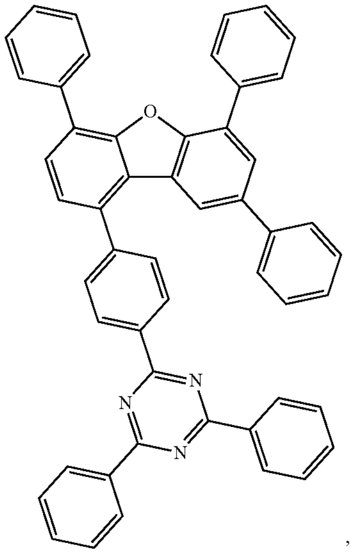
,
G-152
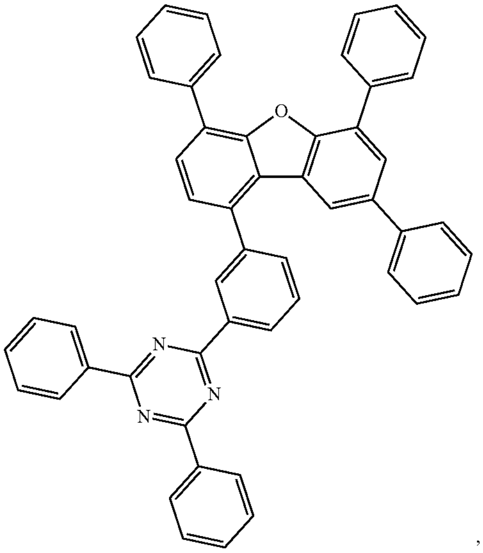
,
G-153
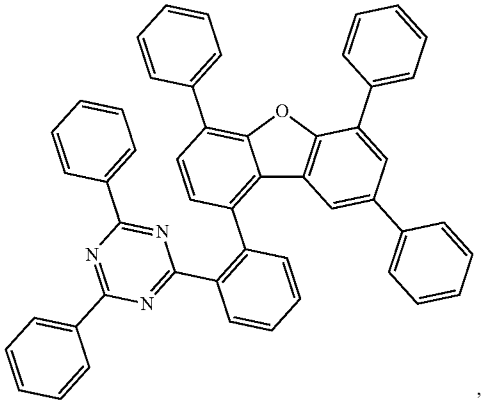
, -continued
G-154
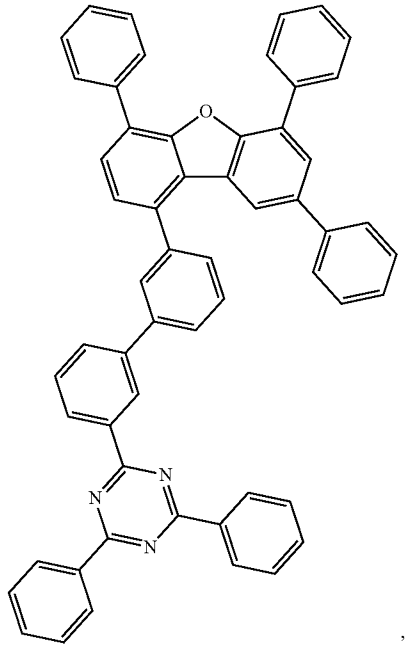
,
G-155
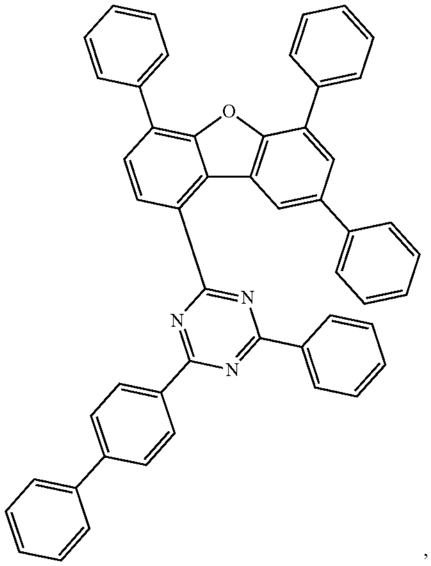
,
G-156
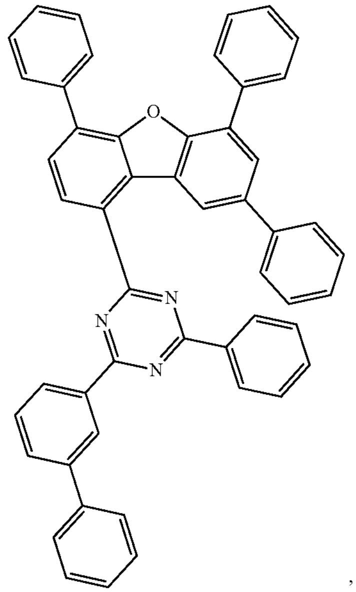
,
G-157
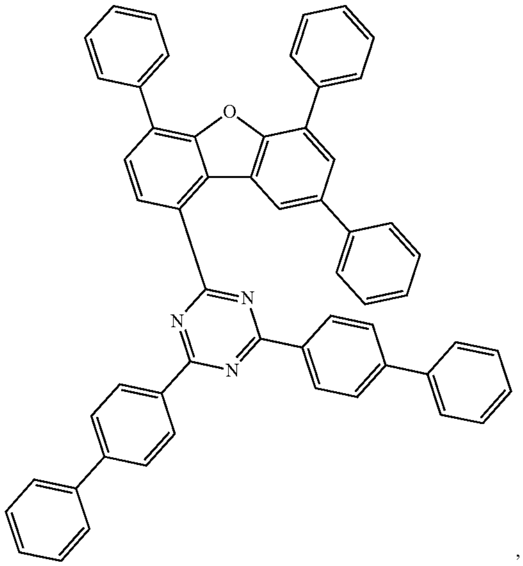
, -continued
G-158
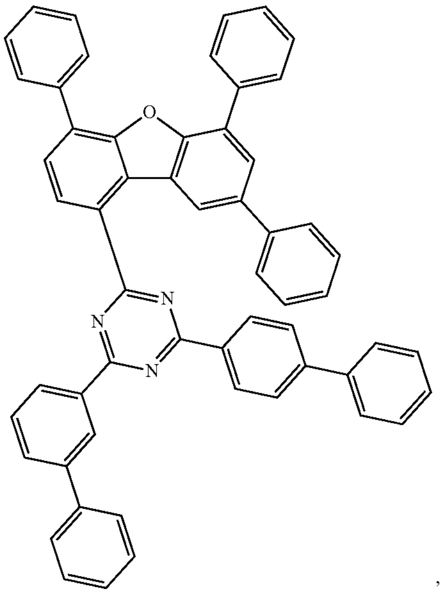
,
G-159
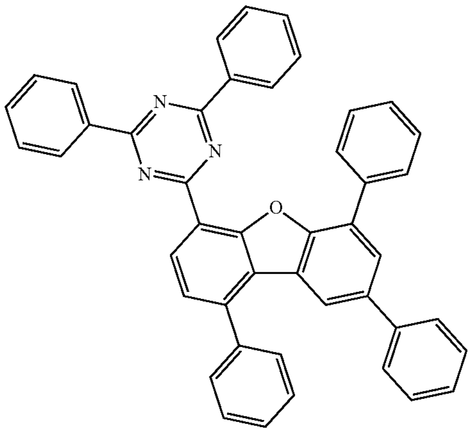
,
G-160
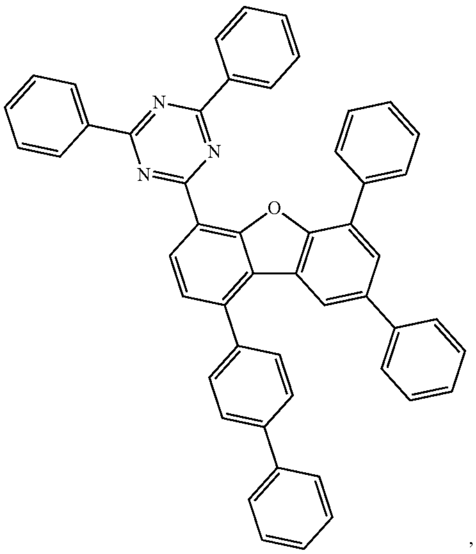
,
G-161
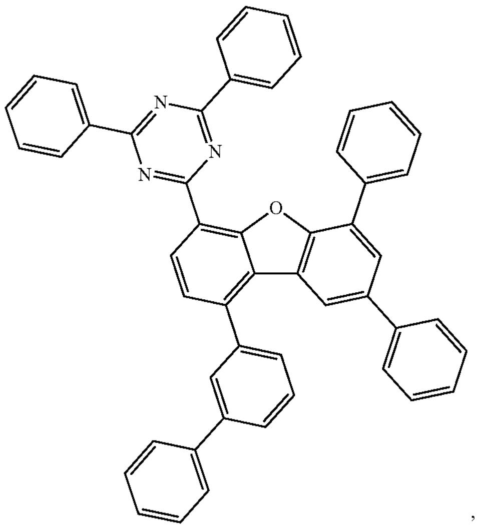
,
G-162
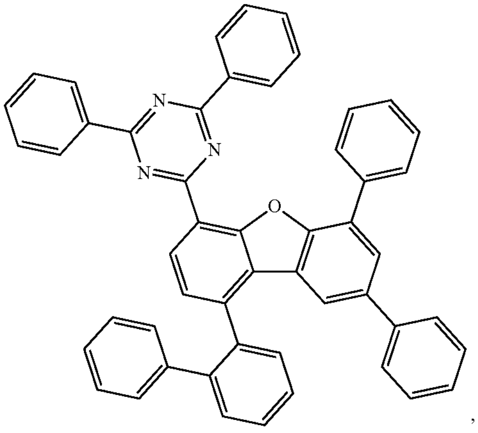
,
G-163
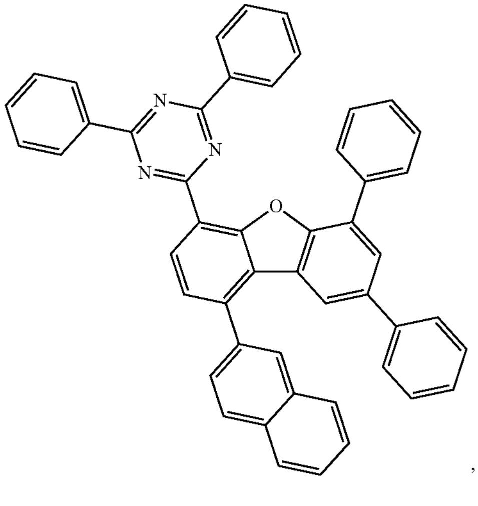
, -continued
G-164
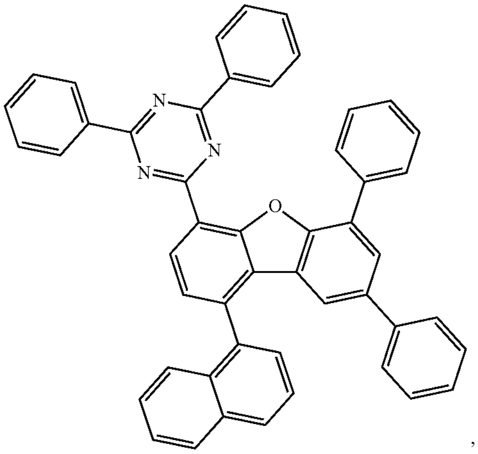
,
G-165
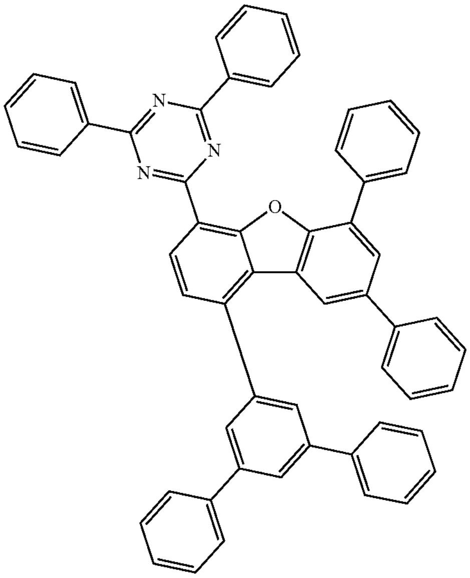
,
G-166
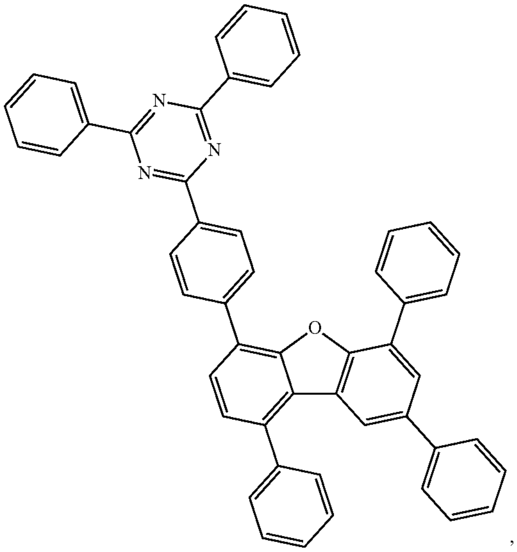
,
G-167
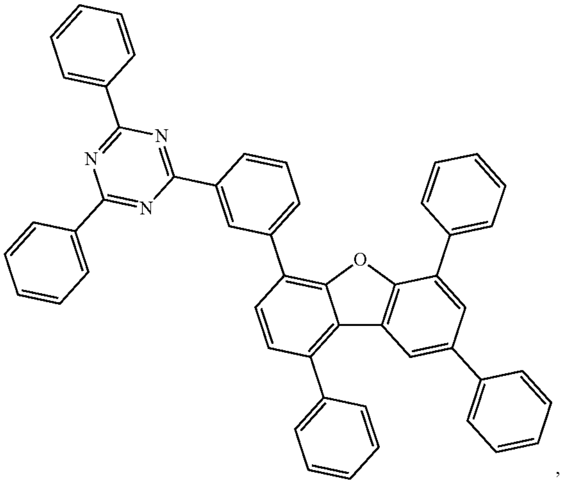
, -continued
G-168
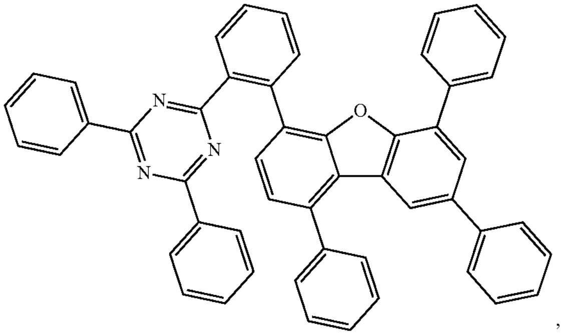
,
G-169
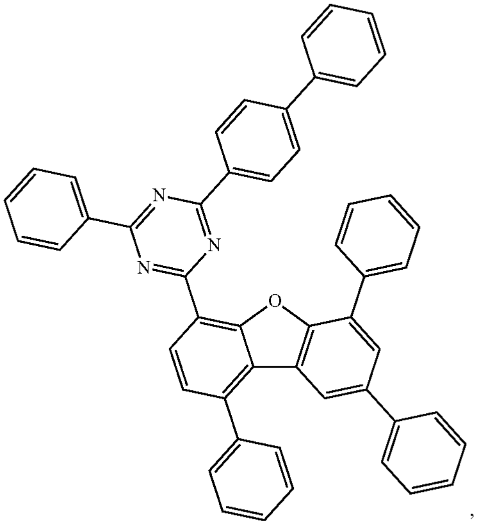
,
G-170
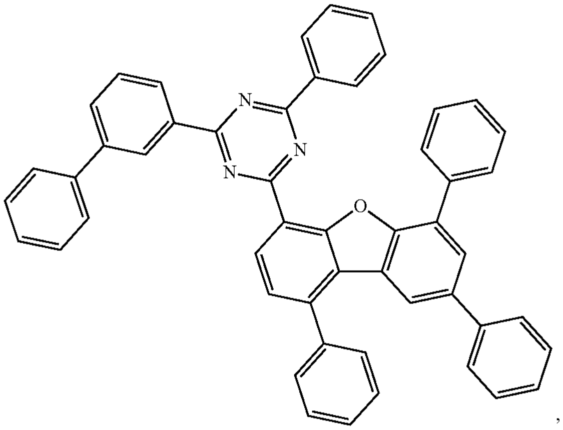
,
G-171
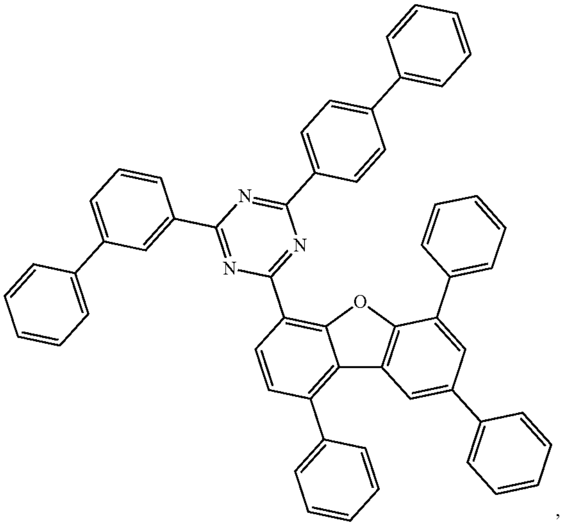
,
G-172
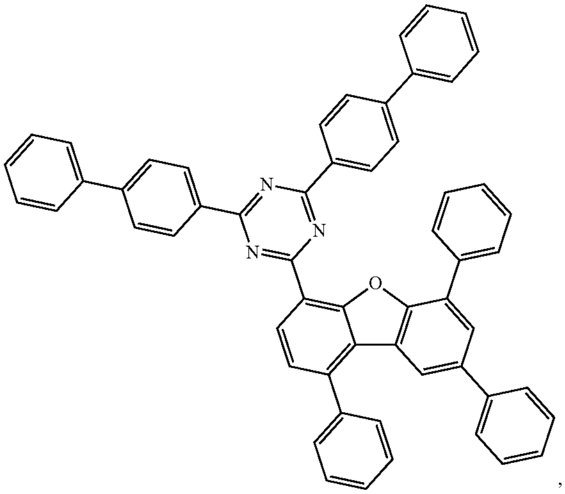
,
G-173
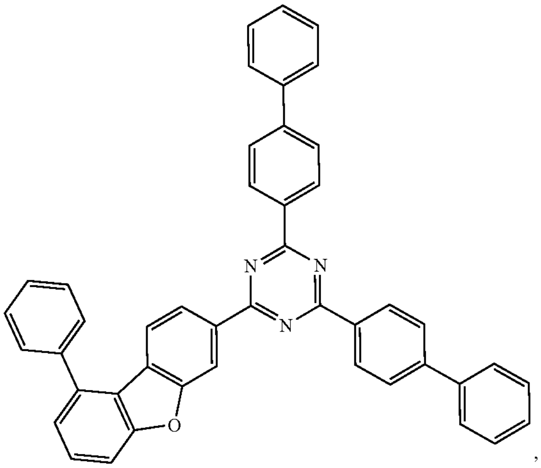
, -continued
G-174
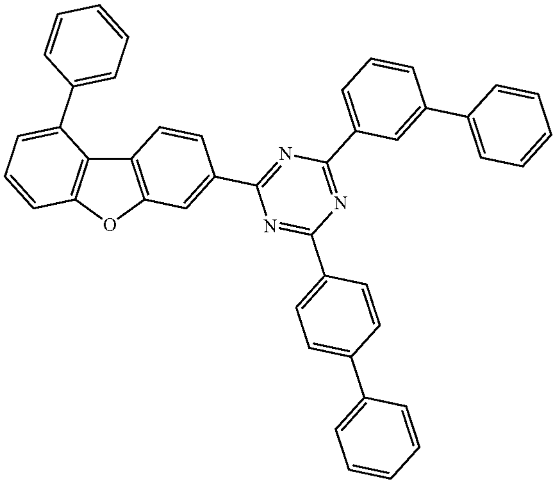
,
G-175
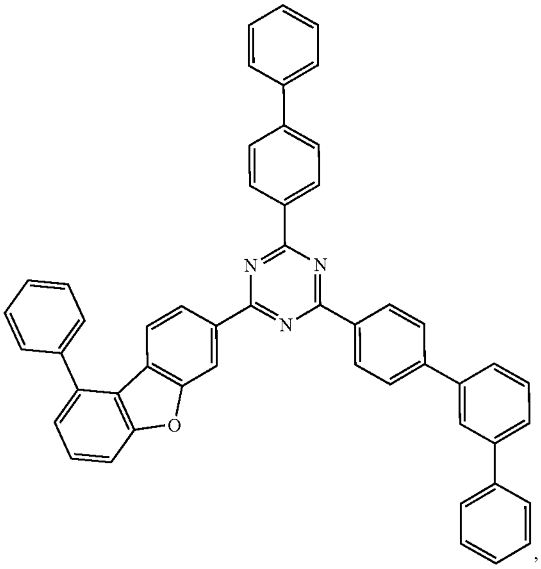
,
G-176
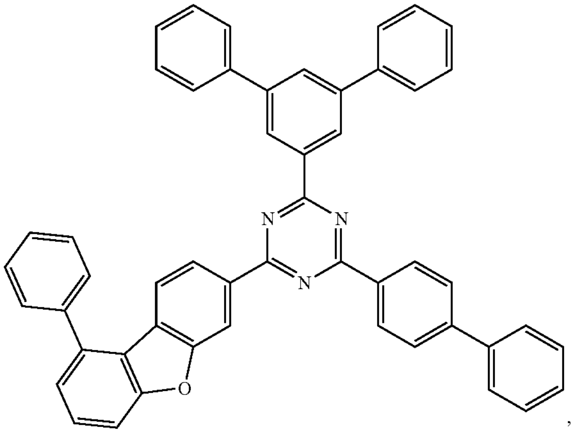
,
G-177
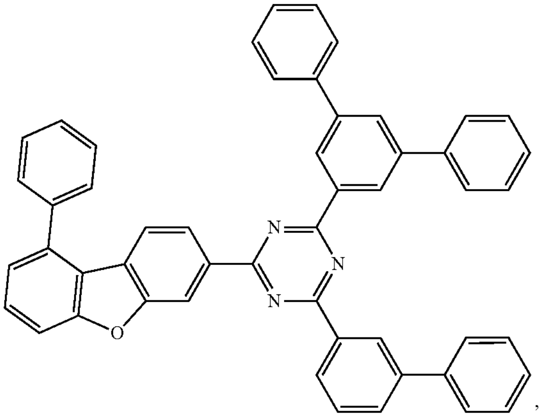
,
G-178
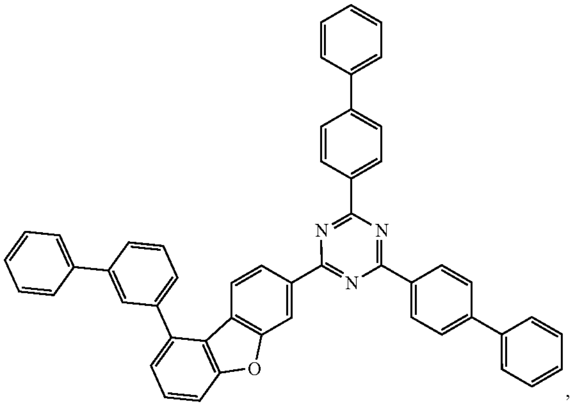
,
G-179
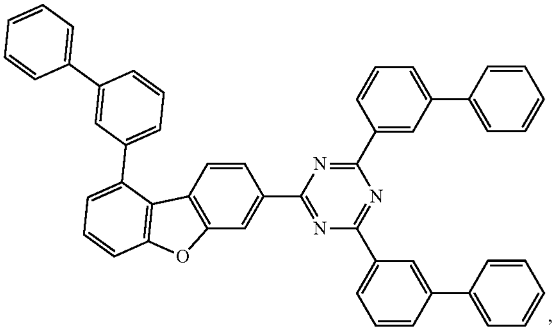
, -continued

G-180

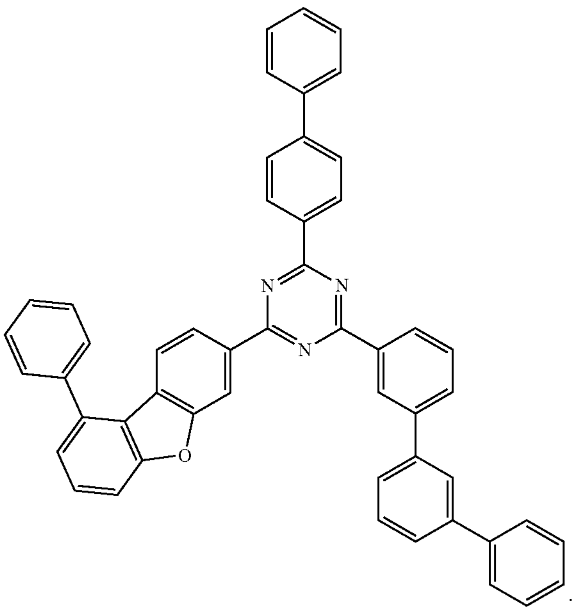

13. The organic electroluminescent device of claim 1, wherein X is, at each occurrence identically or differently, selected from O or S.

14. The organic electroluminescent device of claim 1, wherein Cy is, at each occurrence identically or differently, selected from any one of the group consisting of the following structures:

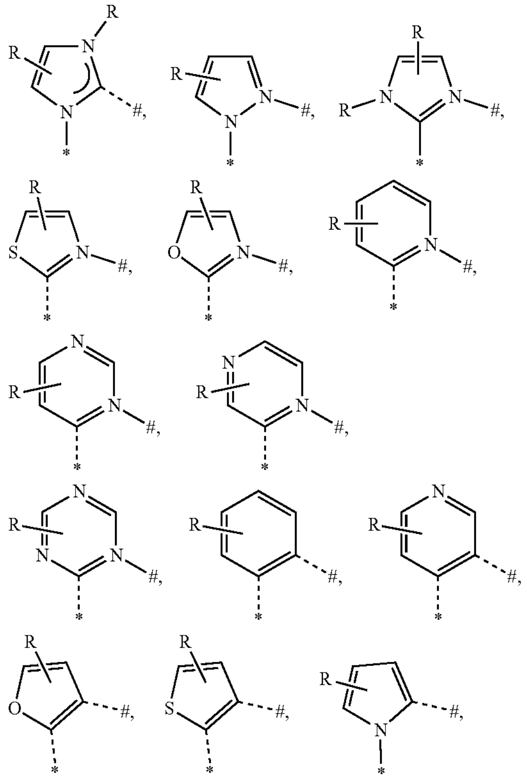

-continued

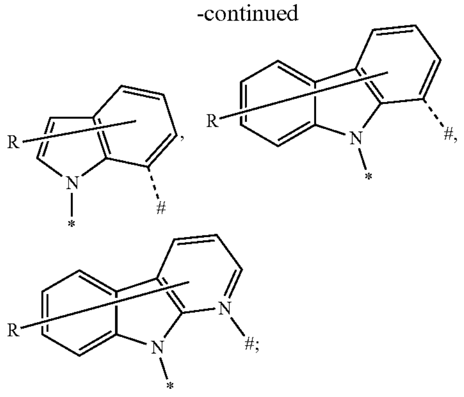

wherein

R represents, at each occurrence identically or differently, mono-substitution, multiple substitutions or non-substitution;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof; and adjacent substituents R can be optionally joined to form a ring;

wherein "#" represents a position where Cy is joined to the metal M; and

"*" represents a position where Cy is joined to $X_1$, $X_2$, $X_3$ or $X_4$ in Formula 1.

15. The organic electroluminescent device of claim 1, wherein at least one of $X_1$ to $X_8$ is selected from N.

16. The organic electroluminescent device of claim 1, wherein $X_1$ to $X_8$ are, at each occurrence identically or differently, selected from C or $CR_x$.

17. The organic electroluminescent device of claim 1, wherein the ligand $L_a$ has a structure represented by Formula 1a:

Formula 1a

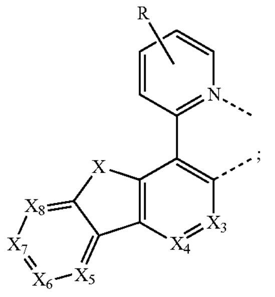

wherein

X is, at each occurrence identically or differently, selected from the group consisting of O, S, Se, $NR_1$, $CR_1R_1$ and $SiR_1R_1$; when there are two $R_1$ at the same time, the two $R_1$ are identical or different;

$X_3$ to $X_8$ are, at each occurrence identically or differently, selected from $CR_x$ or N;

R represents, at each occurrence identically or differently, mono-substitution, multiple substitutions or non-substitution;

$R_x$, R and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_3$ to $X_8$ is $CR_x$, and the $R_x$ is cyano or fluorine; and adjacent substituents $R_x$, $R_1$, R can be optionally joined to form a ring.

18. The organic electroluminescent device of claim 1, wherein the ligand $L_a$ is, at each occurrence identically or differently, selected from any one of the following structures:

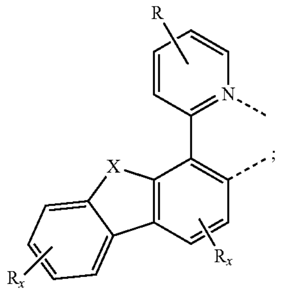

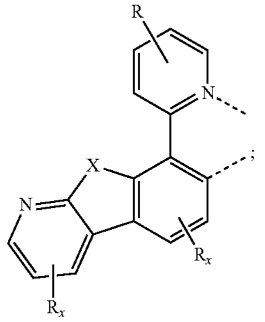

wherein

X is, at each occurrence identically or differently, selected from O, S or Se;

R represents, at each occurrence identically or differently, mono-substitution, multiple substitutions or non-substitution;

$R_x$ represents, at each occurrence identically or differently, mono-substitution or multiple substitutions;

R and $R_x$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_x$ is cyano or fluorine; and adjacent substituents R, and/or $R_x$ can be optionally joined to form a ring.

19. The organic electroluminescent device of claim 18, wherein there exist at least another one $R_x$ in the above structure, and the $R_x$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, cyano and combinations thereof.

20. The organic electroluminescent device of claim 1, wherein there exist at least two $R_x$ in the ligand $L_a$, and wherein one of the $R_x$ is fluorine or cyano and the other one of the $R_x$ is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms or a combination thereof.

21. The organic electroluminescent device of claim 1, wherein the ligand $L_a$ is selected from the following structure:

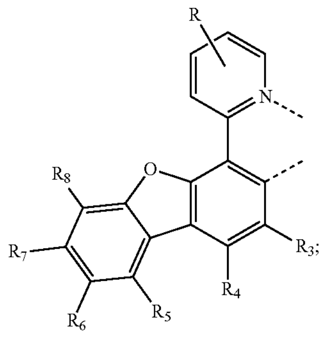

wherein

R represents, at each occurrence identically or differently, mono-substitution, multiple substitutions or non-substitution;

$R_3$ to $R_8$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a hydroxyl group, a sulfinyl group, a sulfonyl group, a phosphino group and combinations thereof;

at least one of $R_3$ to $R_8$ is cyano or fluorine; and adjacent substituents $R_3$ to $R_8$ and R can be optionally joined to form a ring.

22. The organic electroluminescent device of claim 21, $R_7$ or $R_8$ is cyano, or $R_7$ is fluorine.

23. The organic electroluminescent device of claim 1, wherein the first metal complex has a general formula of $M(L_a)_m(L_b)_n(L_c)_q$;

wherein the metal M is, at each occurrence identically or differently, selected from the group consisting of Cu, Ag, Au, Ru, Rh, Pd, Os, Ir and Pt;

$L_a$, $L_b$ and $L_c$ are a first ligand, a second ligand and a third ligand coordinated to the metal M, respectively; and $L_a$, $L_b$ and $L_c$ can be optionally joined to form a multidentate ligand;

$L_b$ and $L_c$ are identically or differently a monoanionic bidentate ligand;

m is selected from 1, 2 or 3, n is selected from 0, 1 or 2, q is selected from 0, 1 or 2, and m+n+q equals an oxidation state of the metal M; wherein when m is greater than or equal to 2, a plurality of $L_a$ are identical or different; when n is equal to 2, two $L_b$ are identical or different;

when q is equal to 2, two $L_c$ are identical or different.

24. The organic electroluminescent device of claim 23, wherein the ligand $L_a$ is, at each occurrence identically or differently, selected from any one of the group consisting of the following:

$L_{a1}$

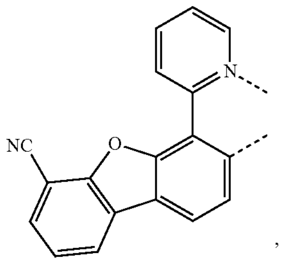

, $L_{a2}$

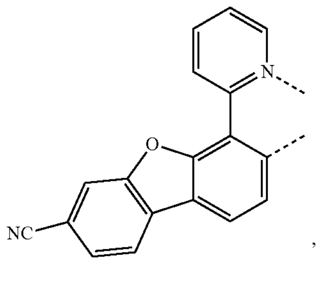

, $L_{a3}$
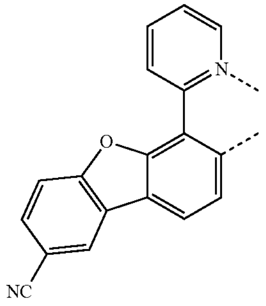
,
$L_{a4}$
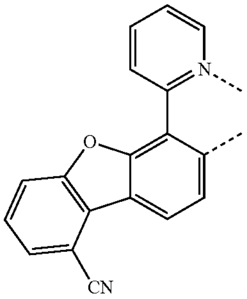
,
$L_{a5}$
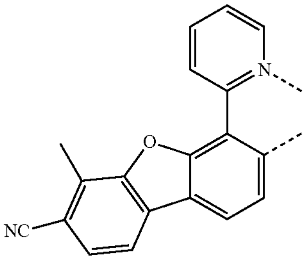
,
$L_{a6}$
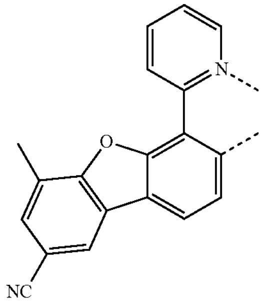
,
$L_{a7}$
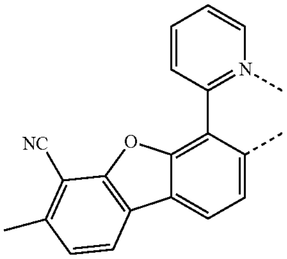
,
$L_{a8}$
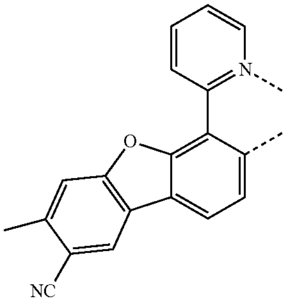
,
$L_{a9}$
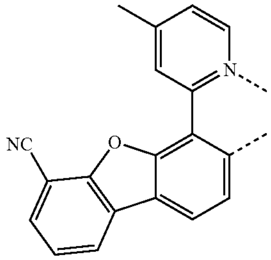
,
$L_{a10}$
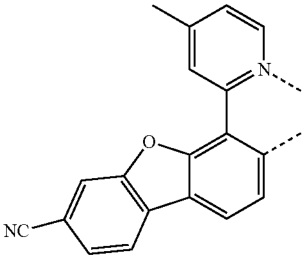
,
$L_{a11}$
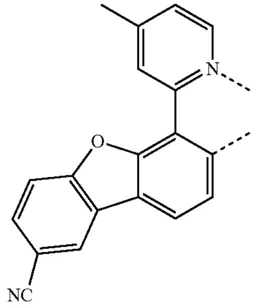
,
$L_{a12}$
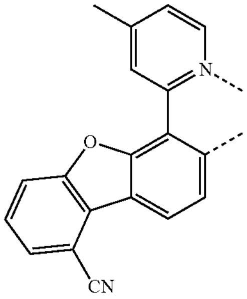
, -continued
$L_{a13}$
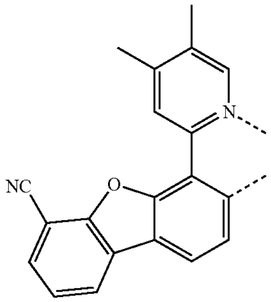
,
$L_{a14}$
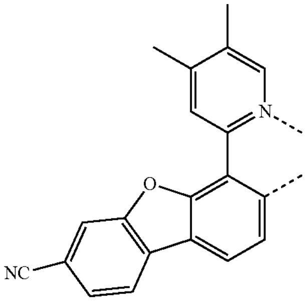
,
$L_{a15}$
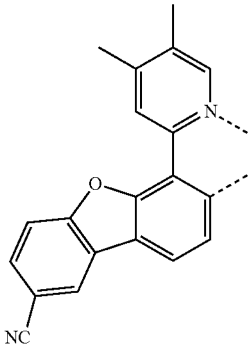
,
$L_{a16}$
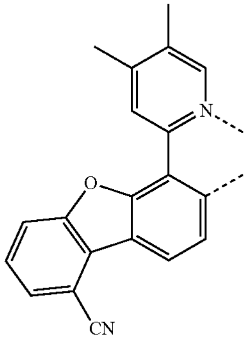
,
$L_{a17}$
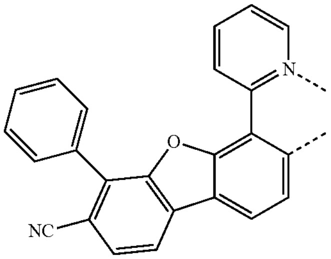
,
-continued
$L_{a1}$
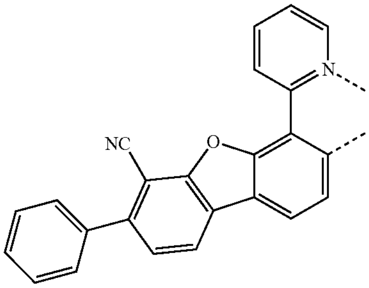
,
$L_{a19}$
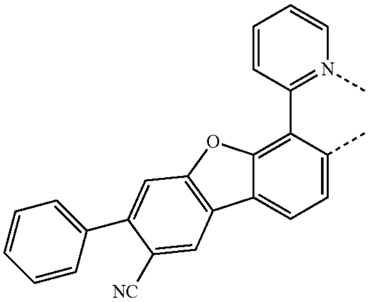
,
$L_{a20}$
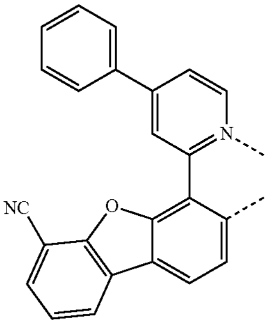
,
$L_{a21}$
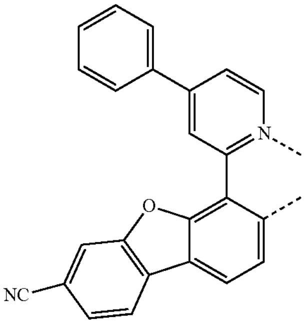
,
$L_{a22}$
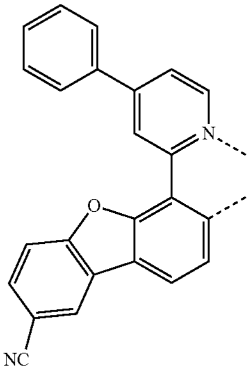
, -continued
$L_{a23}$
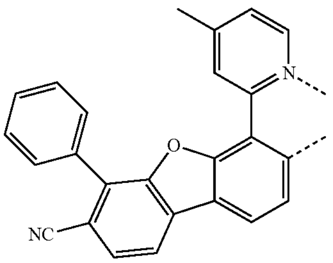
,
$L_{a24}$
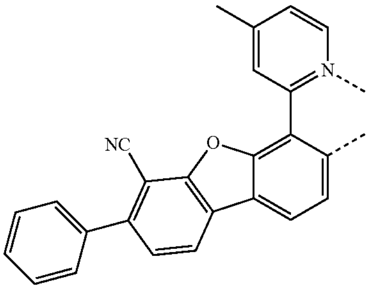
,
$L_{a25}$
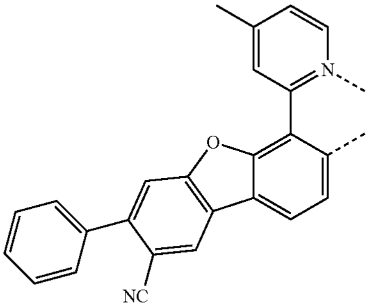
,
$L_{a26}$
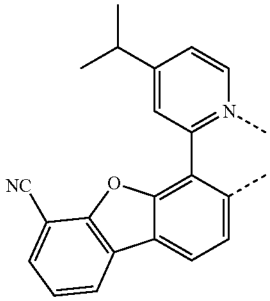
,
$L_{a27}$
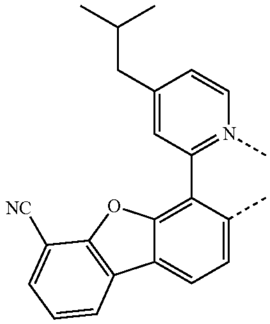
,
-continued
$L_{a28}$
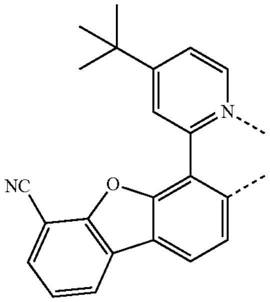
,
$L_{a29}$
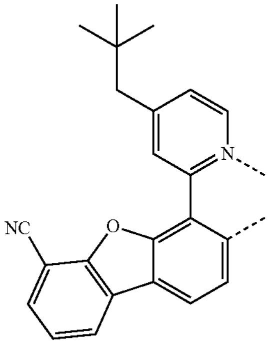
,
$L_{a30}$
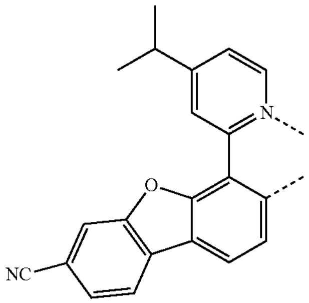
,
$L_{a31}$
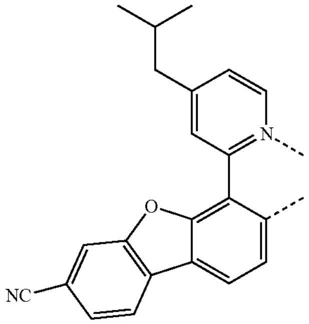
,
$L_{a32}$
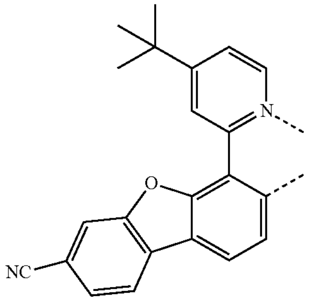
, $L_{a33}$
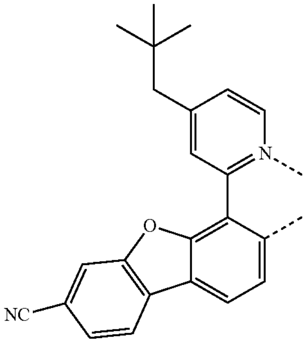
,
$L_{a34}$
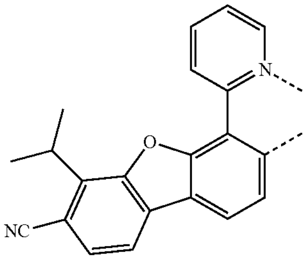
,
$L_{a35}$
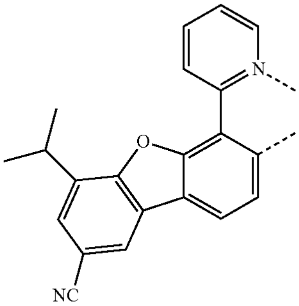
,
$L_{a36}$
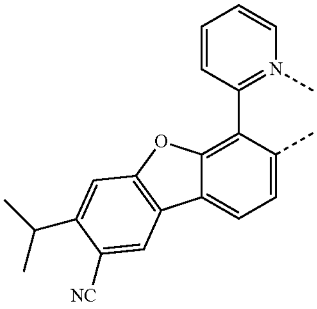
,
$L_{a37}$
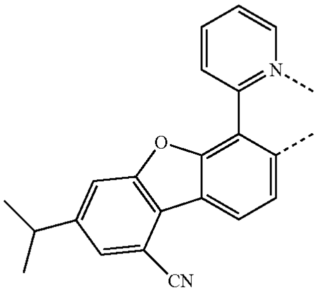
,
$L_{a38}$
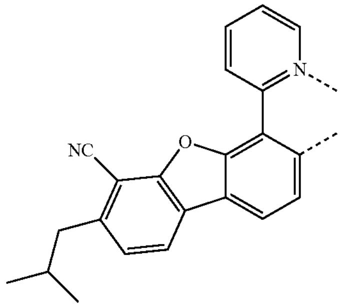
,
$L_{a39}$
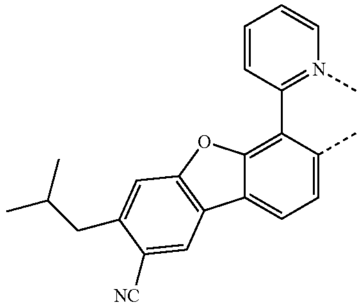
,
$L_{a40}$
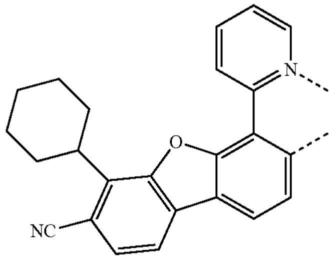
,
$L_{a41}$
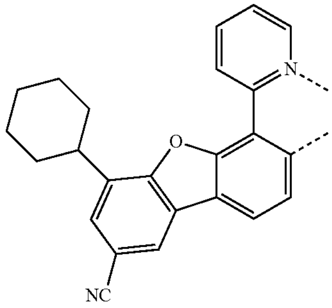
,
$L_{a42}$
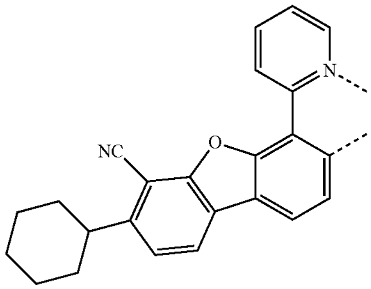
, -continued
$L_{a43}$
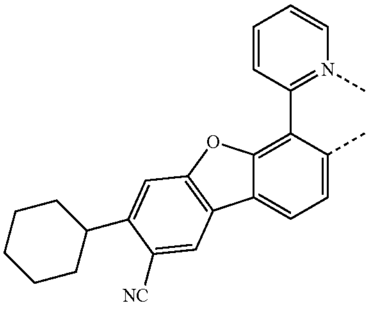
,
$L_{a44}$
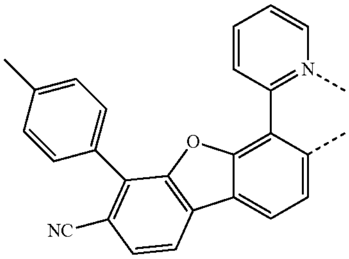
,
$L_{a45}$
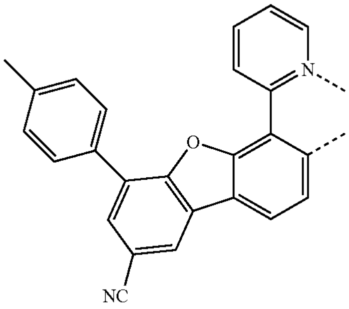
,
$L_{a46}$
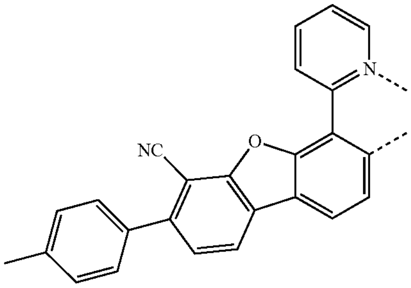
,
$L_{a47}$
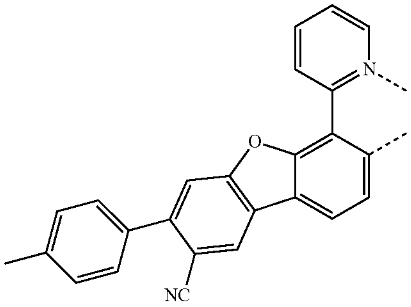
,
-continued
$L_{a48}$
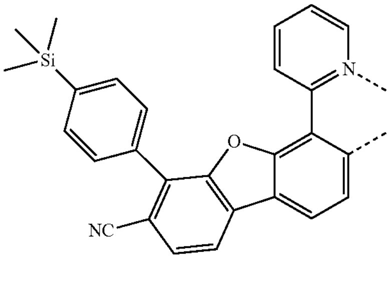
,
$L_{a49}$
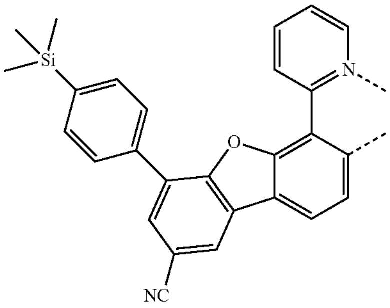
,
$L_{a50}$
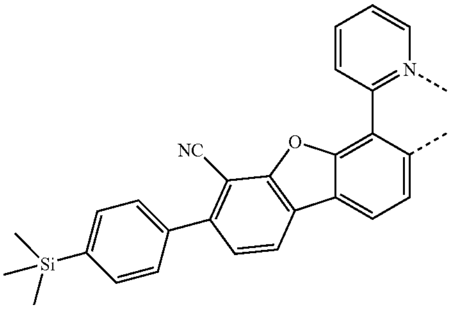
,
$L_{a51}$
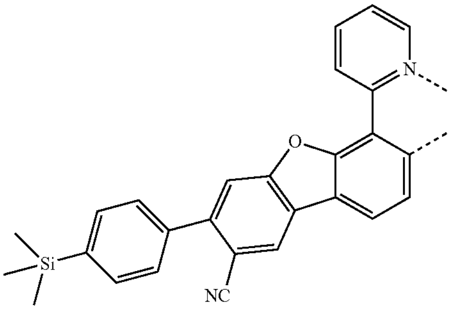
,
$L_{a52}$
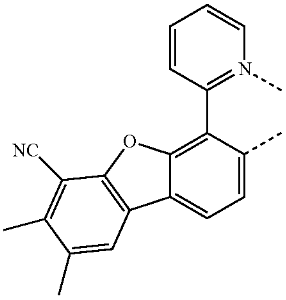
, -continued
$L_{a53}$
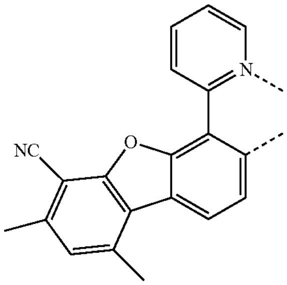
,
$L_{a54}$
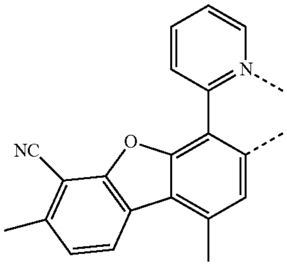
,
$L_{a55}$
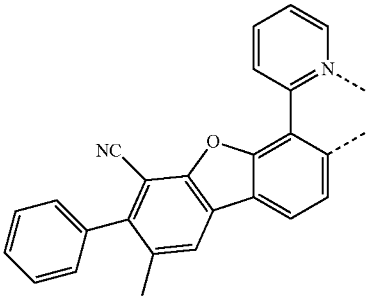
,
$L_{a56}$
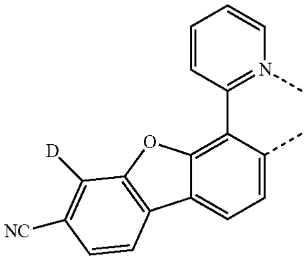
,
$L_{a57}$
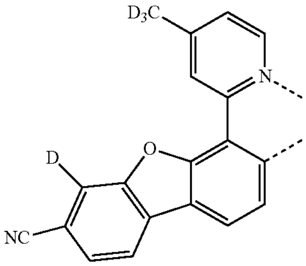
,
-continued
$L_{a58}$
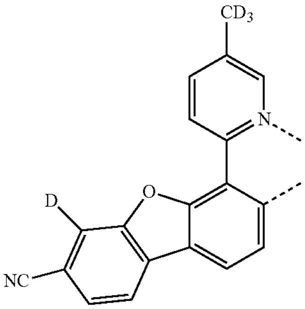
,
$L_{a59}$
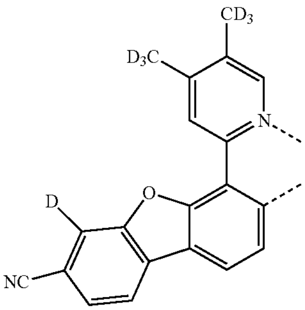
,
$L_{a60}$
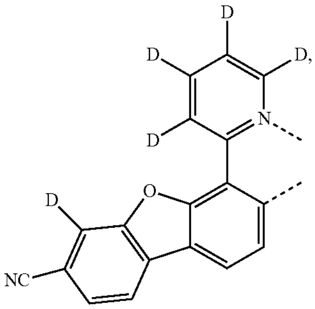
$L_{a61}$
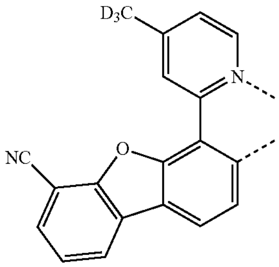
,
$L_{a62}$
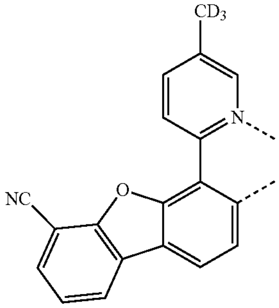
, -continued
$L_{a63}$
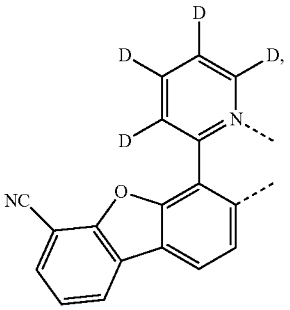
$L_{a64}$
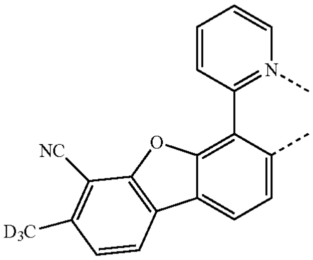
,
$L_{a65}$
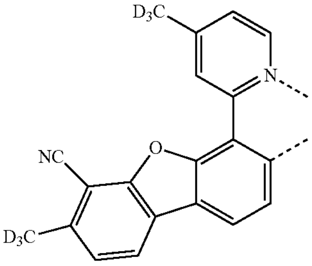
,
$L_{a66}$
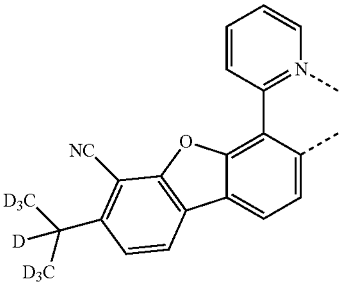
,
$L_{a67}$
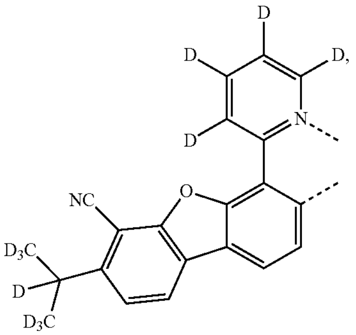
-continued
$L_{a68}$
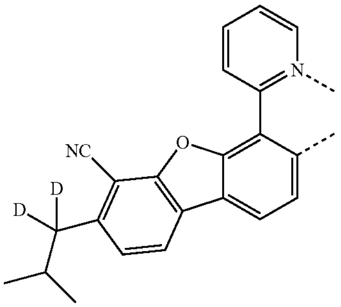
,
$L_{a69}$
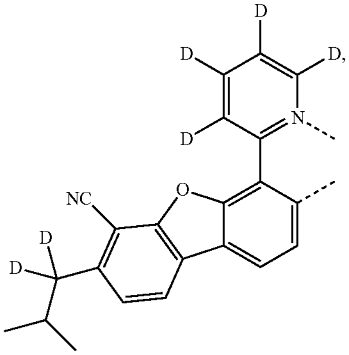
$L_{a70}$
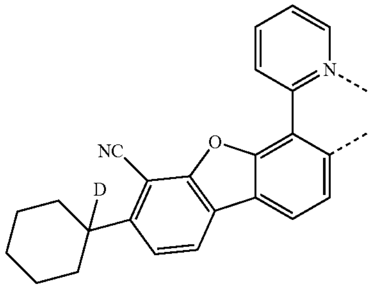
,
$L_{a71}$
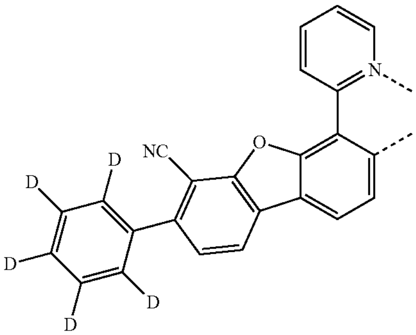
,
$L_{a72}$
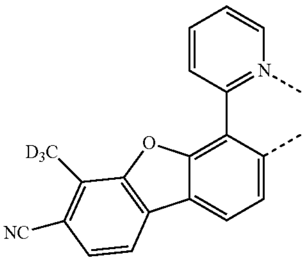
, -continued
$L_{a73}$
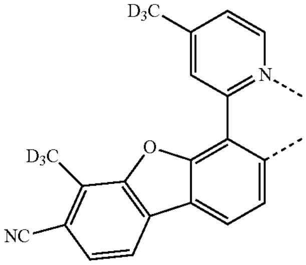
,
$L_{a74}$
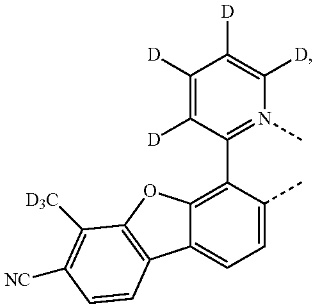
$L_{a75}$
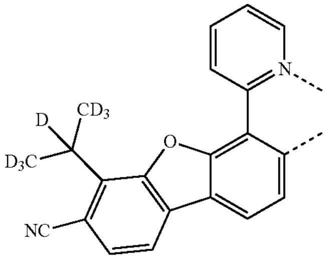
,
$L_{a76}$
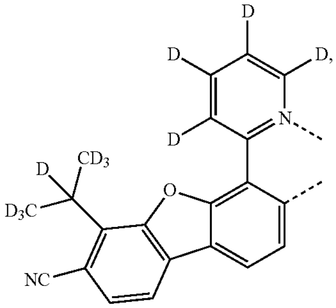
$L_{a77}$
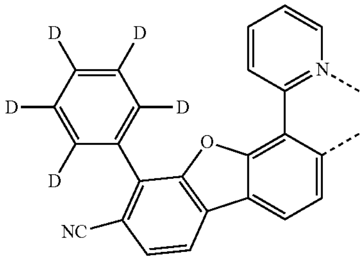
,
-continued
$L_{a78}$
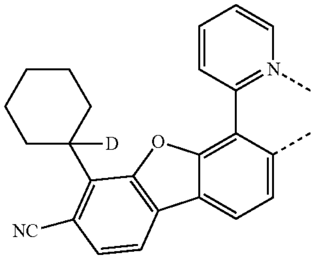
,
$L_{a79}$
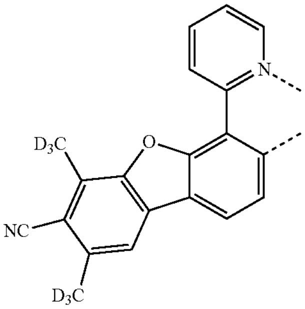
,
$L_{a80}$
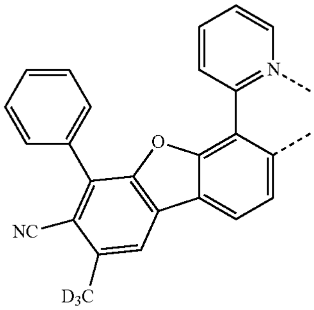
,
$L_{a81}$
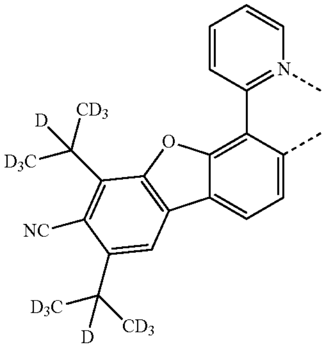
,
$L_{a82}$
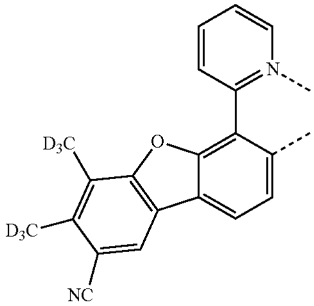
, -continued
La83
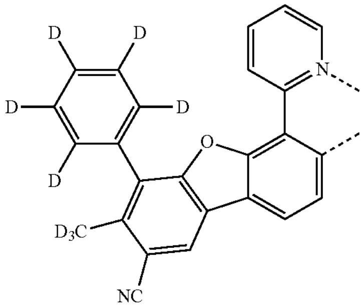
,
La84
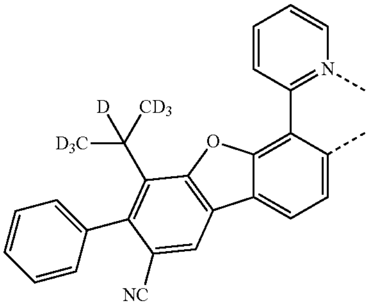
,
La85
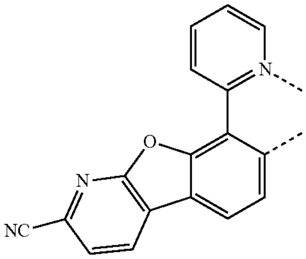
,
La86
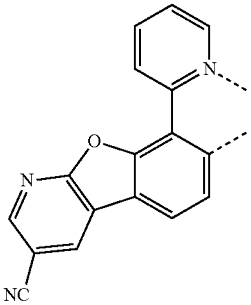
,
La87
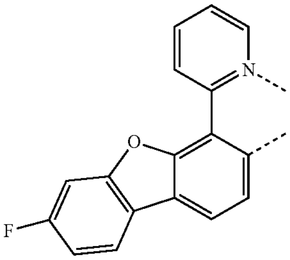
,
-continued
La88
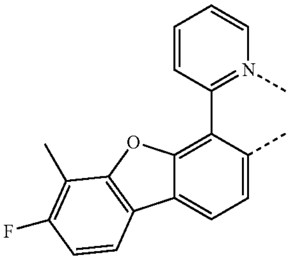
,
La89
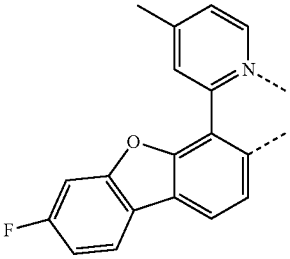
,
La90
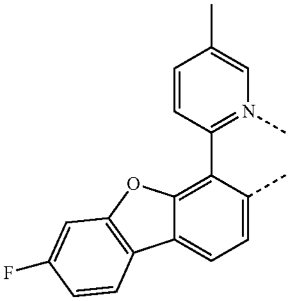
,
La91
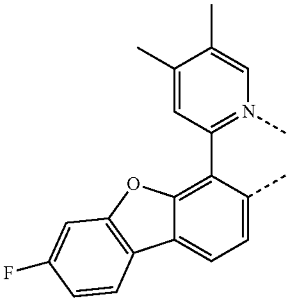
,
La92
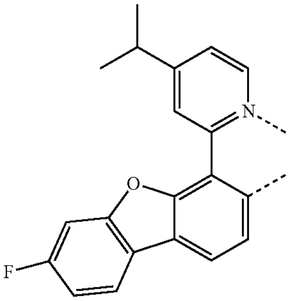
, -continued
$L_{a93}$
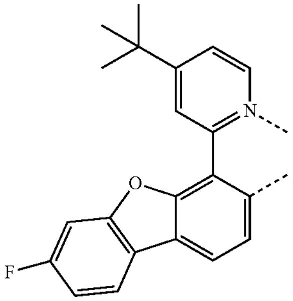
,
$L_{a94}$
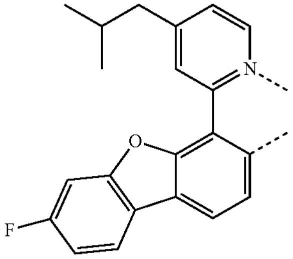
,
$L_{a95}$
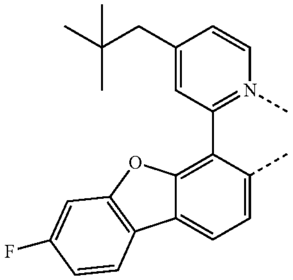
,
$L_{a96}$
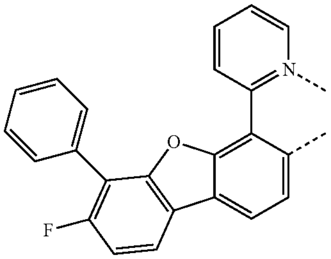
,
$L_{a97}$
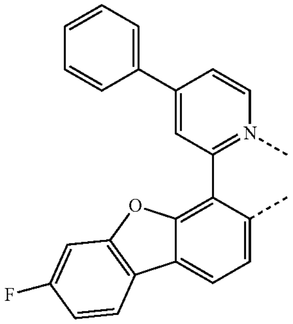
,
-continued
$L_{a98}$
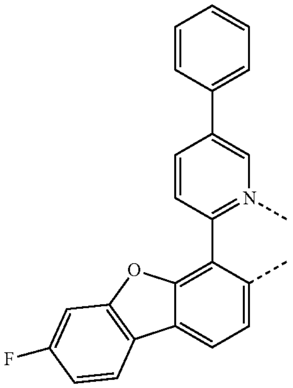
,
$L_{a99}$
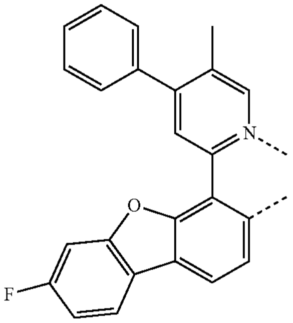
,
$L_{a100}$
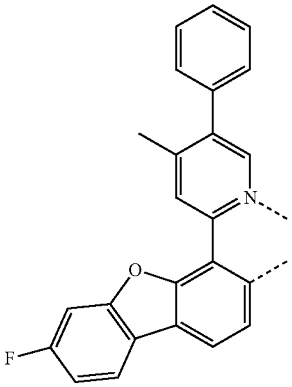
,
$L_{a101}$
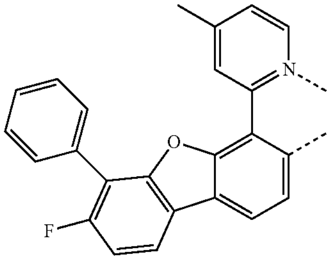
, -continued
$L_{a102}$
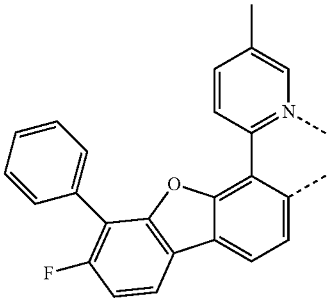
,
$L_{a103}$
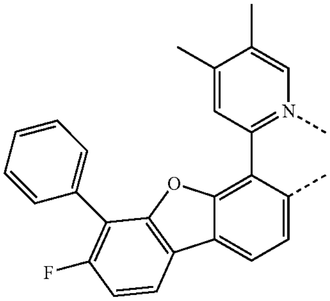
,
$L_{a104}$
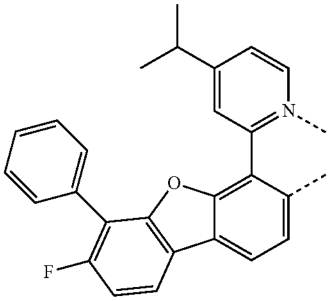
,
$L_{a105}$
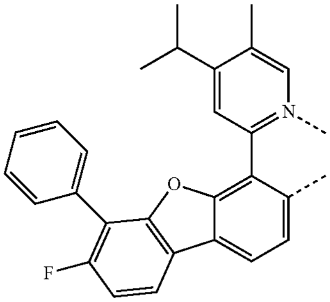
,
$L_{a106}$
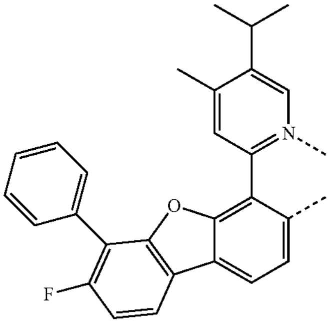
,
-continued
$L_{a107}$
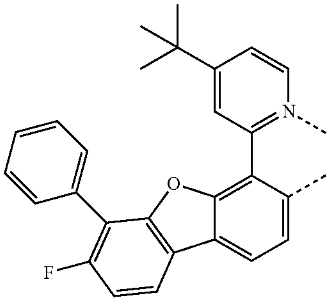
,
$L_{a108}$
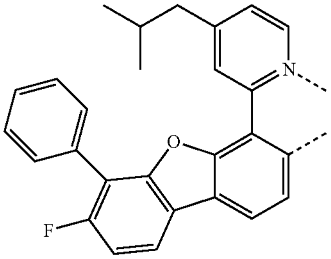
,
$L_{a109}$
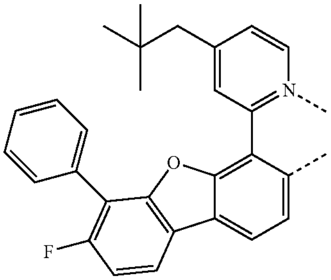
,
$L_{a110}$
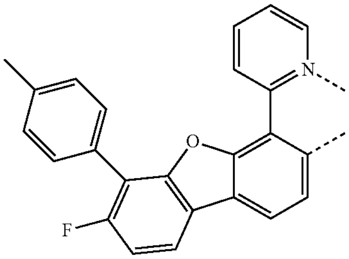
,
$L_{a111}$
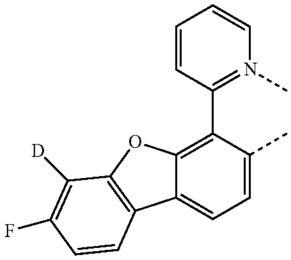
, -continued
$L_{a112}$
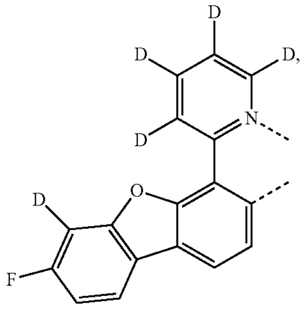
$L_{a113}$
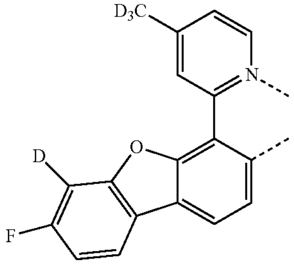
,
$L_{a114}$
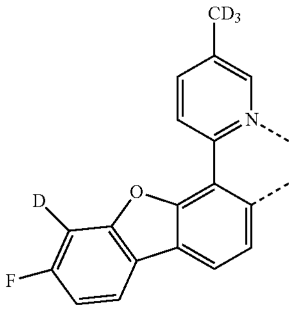
,
$L_{a115}$
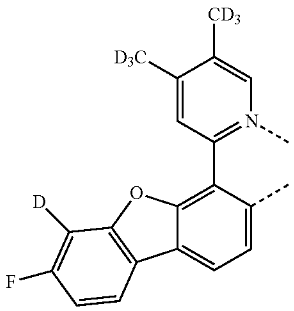
,
$L_{a116}$
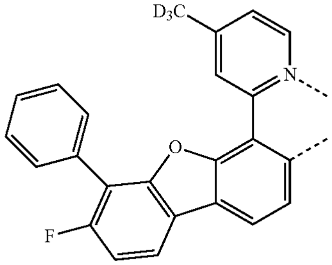
,
-continued
$L_{a117}$
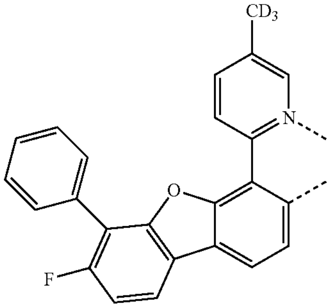
,
$L_{a118}$
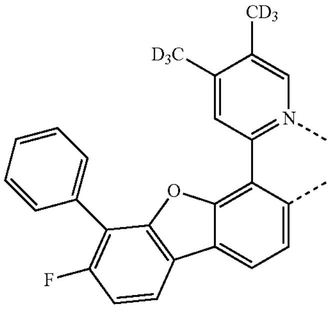
,
$L_{a119}$
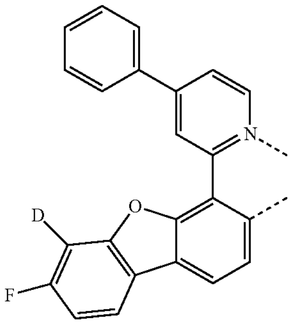
,
$L_{a120}$
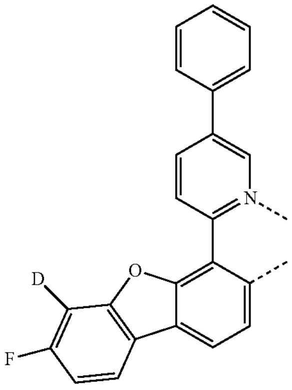
, -continued $L_{a121}$

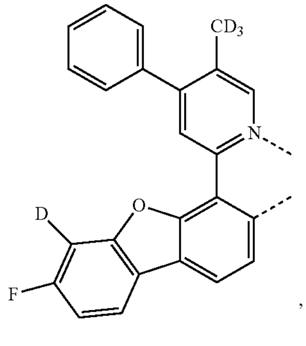

, $L_{a122}$

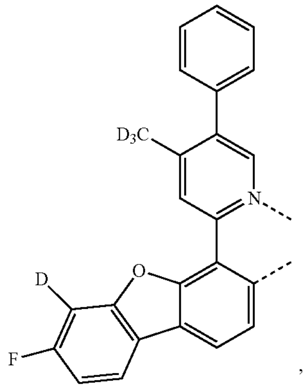

, $L_{a123}$

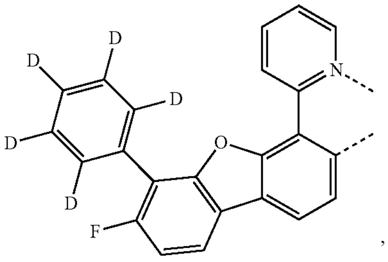

, $L_{a124}$

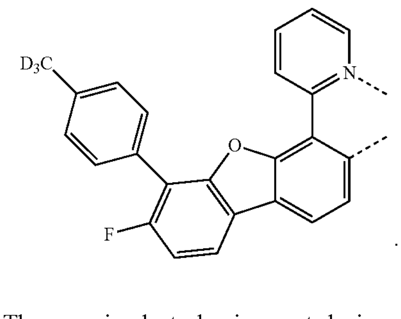

.

25. The organic electroluminescent device of claim 23, wherein the first metal complex has a structure represented by Formula 1b:

Formula 1b

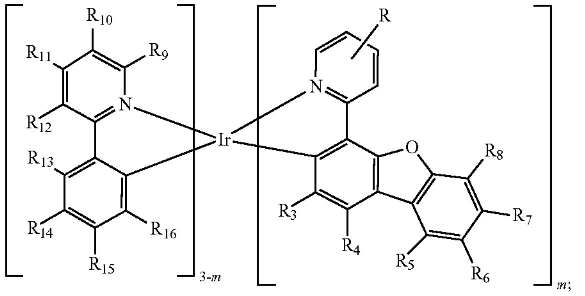

wherein m is 1, 2 or 3; when m is 2 or 3, a plurality of $L_a$ are identical or different; when m is 1, two $L_b$ are identical or different;

R represents, at each occurrence identically or differently, mono-substitution, multiple substitutions or non-substitution;

$R_3$ to $R_{16}$ and R are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $R_3$ to $R_8$ is cyano or fluorine;

adjacent substituents $R_3$ to $R_{16}$ and R can be optionally joined to form a ring.

26. The organic electroluminescent device of claim 25, wherein at least one of $R_3$ to $R_8$ is cyano or fluorine, and at least one of the rest of $R_3$ to $R_8$ and at least one of $R_9$ to $R_{16}$ are selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

27. The organic electroluminescent device of claim 25, wherein at least one or two of $R_{10}$, $R_{11}$ and $R_{15}$ are selected from the group consisting of: deuterium, fluorine, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

28. The organic electroluminescent device of claim 23, wherein the ligands $L_b$ and $L_c$ are, at each occurrence identically or differently, selected from the group consisting of the following:

$L_{b1}$

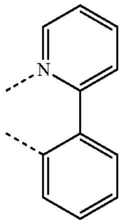

, $L_{b2}$

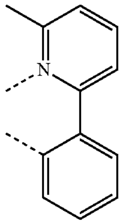

, $L_{b3}$

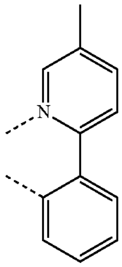

, $L_{b4}$

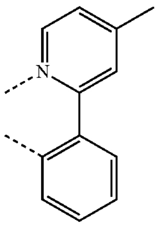

,

-continued $L_{b5}$

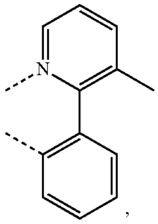

, $L_{b6}$

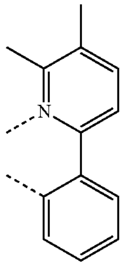

, $L_{b7}$

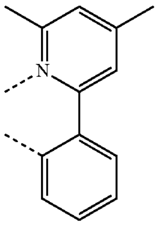

, $L_{b8}$

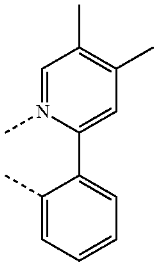

, $L_{b9}$

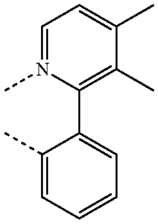

, $L_{b10}$

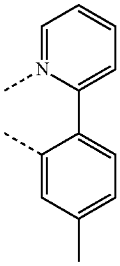

,

-continued
$L_{b11}$
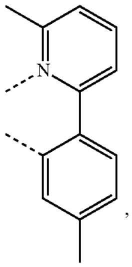
,
$L_{b12}$
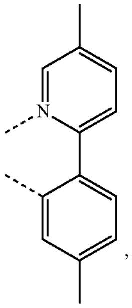
,
$L_{b13}$
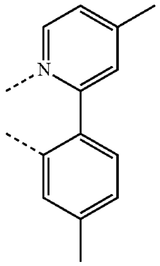
,
$L_{b14}$
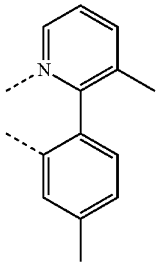
,
$L_{b15}$
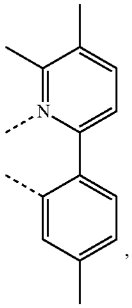
,
-continued
$L_{b16}$
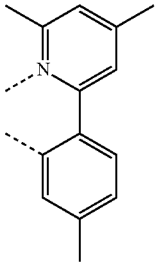
,
$L_{b17}$
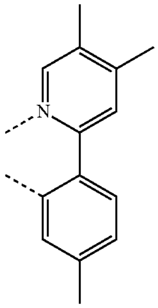
,
$L_{b18}$
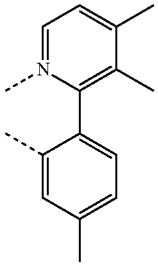
,
$L_{b19}$
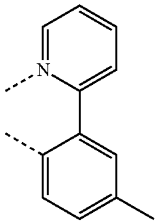
,
$L_{b29}$
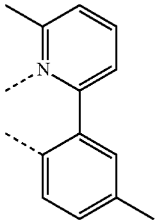
,
$L_{b21}$
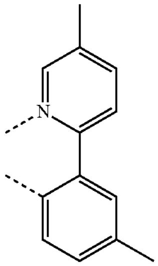
, -continued
$L_{b22}$
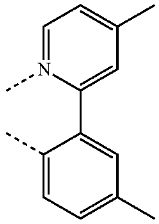
,
$L_{b23}$
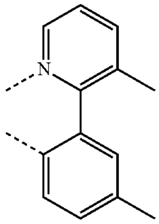
,
$L_{b24}$
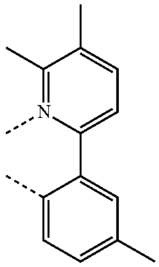
,
$L_{b25}$
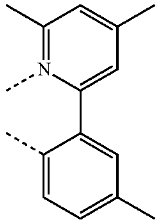
,
$L_{b26}$
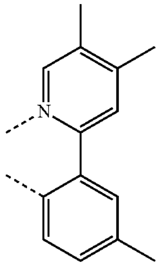
,
$L_{b27}$
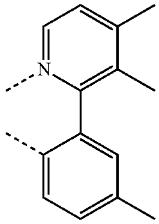
,
-continued
$L_{b28}$
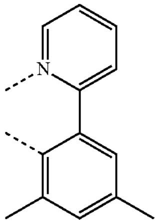
,
$L_{b29}$
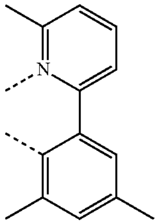
,
$L_{b30}$
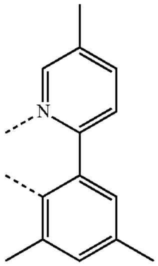
,
$L_{b31}$
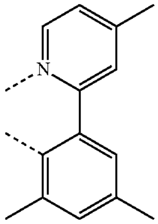
,
$L_{b32}$
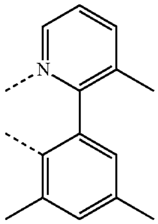
,
$L_{b33}$
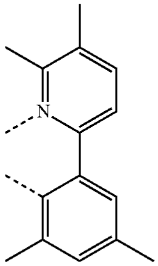
, -continued
$L_{b34}$
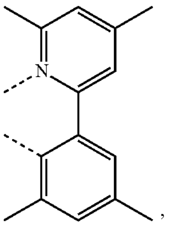
$L_{b35}$
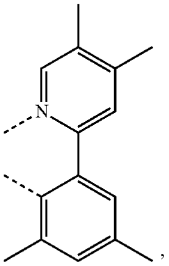
$L_{b36}$
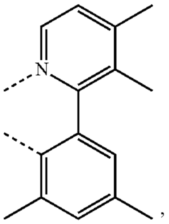
$L_{b37}$
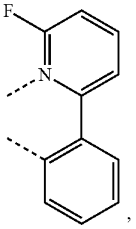
$L_{b38}$
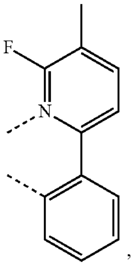
$L_{b39}$
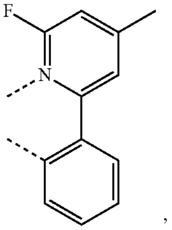
-continued
$L_{b40}$
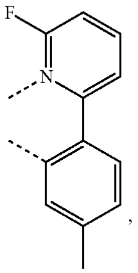
$L_{b41}$
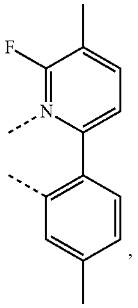
$L_{b42}$
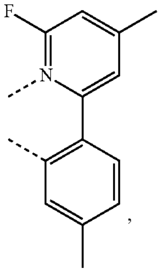
$L_{b43}$
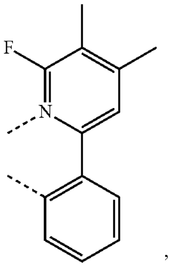
$L_{b44}$
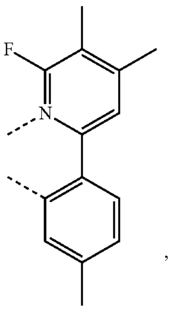

-continued
$L_{b45}$
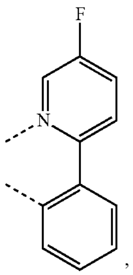
$L_{b46}$
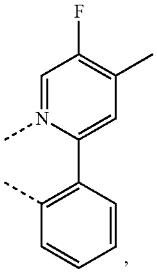
$L_{b47}$
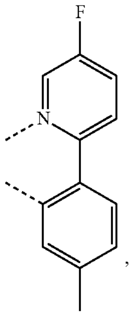
$L_{b48}$
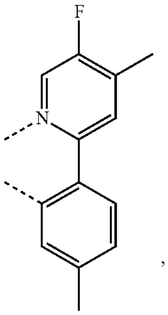
$L_{b49}$
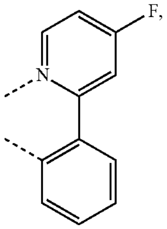
-continued
$L_{b50}$
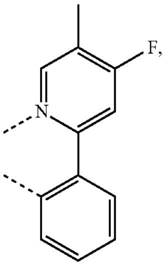
$L_{b51}$
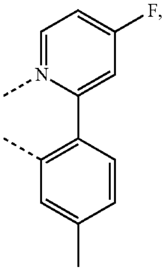
$L_{b52}$
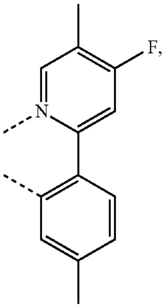
$L_{b53}$
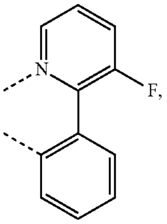
$L_{b54}$
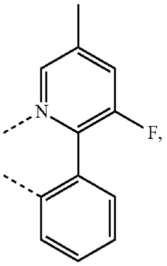
$L_{b55}$
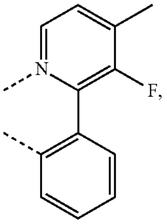

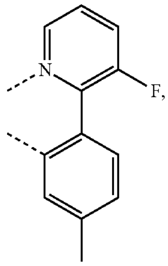
F,
$L_{b56}$
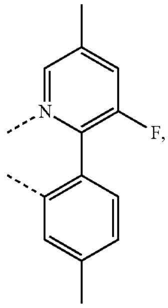
F,
$L_{b57}$
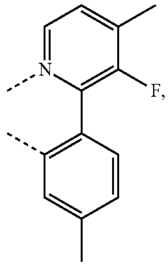
F,
$L_{b58}$
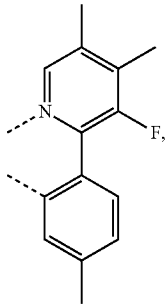
F,
$L_{b59}$
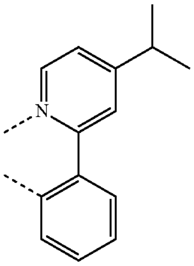
,
$L_{b60}$
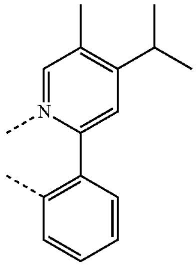
,
$L_{b61}$
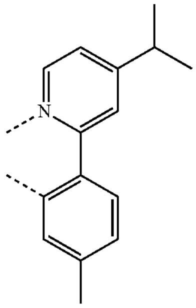
,
$L_{b62}$
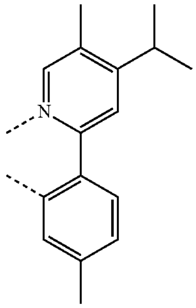
,
$L_{b63}$
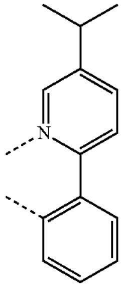
,
$L_{b64}$
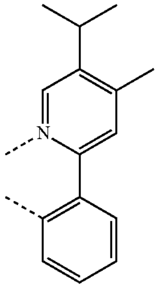
,
$L_{b65}$ -continued
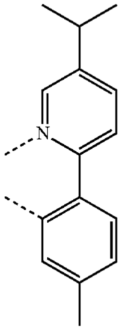
,
$L_{b66}$
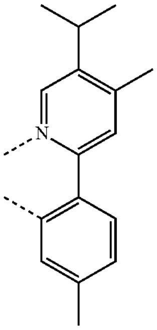
,
$L_{b67}$
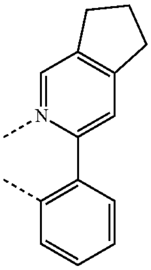
,
$L_{b68}$
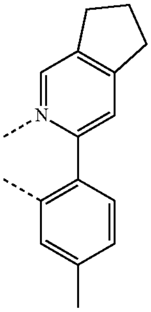
,
$L_{b69}$
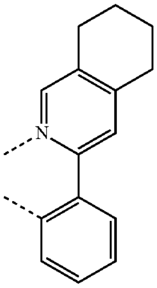
,
$L_{b70}$
-continued
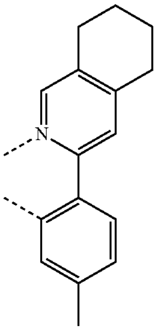
,
$L_{b71}$
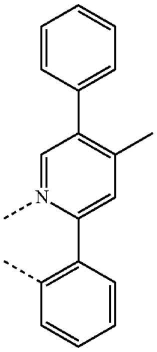
,
$L_{b72}$
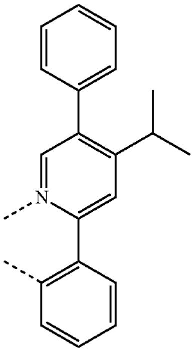
,
$L_{b73}$
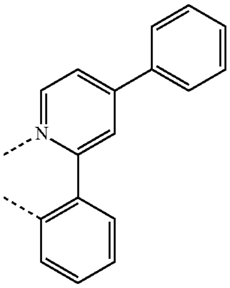
,
$L_{b74}$
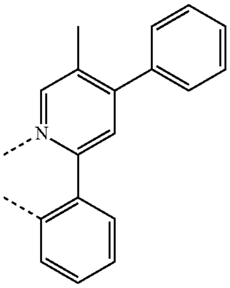
,
$L_{b75}$ -continued
$L_{b76}$
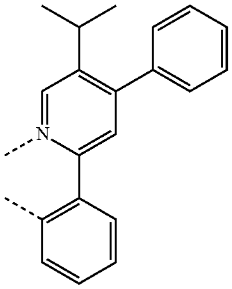
,
$L_{b77}$
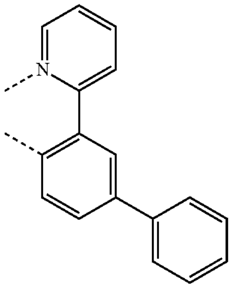
,
$L_{b78}$
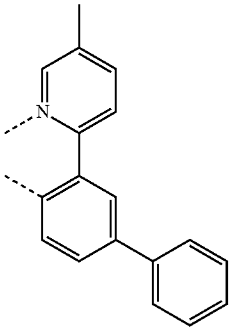
,
$L_{b79}$
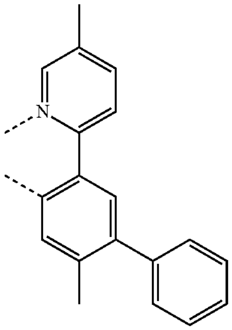
,
$L_{b80}$
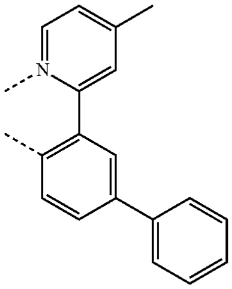
,
-continued
$L_{b81}$
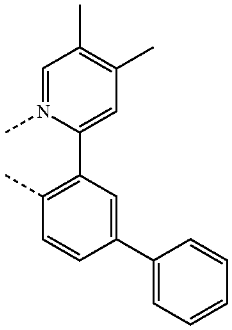
,
$L_{b82}$
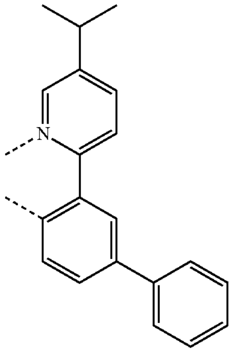
,
$L_{b83}$
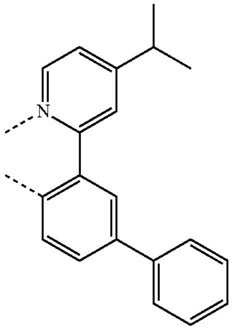
,
$L_{b84}$
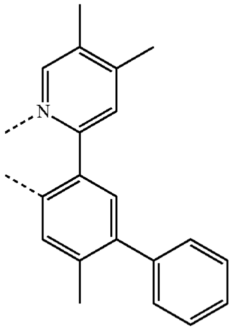
, -continued
$L_{b85}$
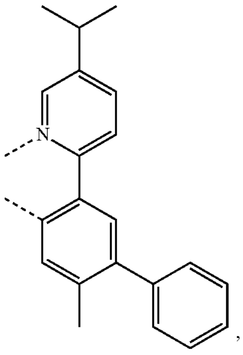
$L_{b86}$
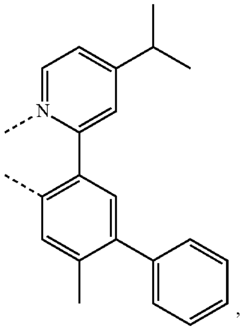
$L_{b87}$
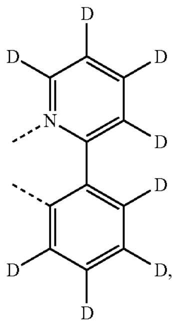
$L_{b88}$
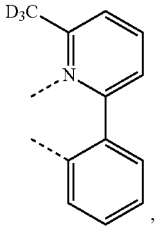
$L_{b89}$
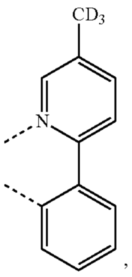
-continued
$L_{b90}$
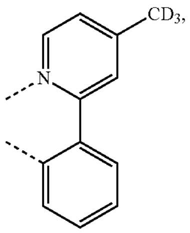
$L_{b91}$
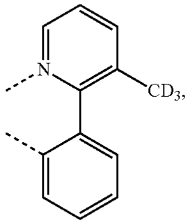
$L_{b92}$
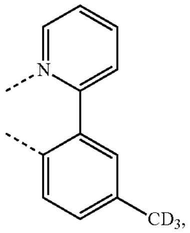
$L_{b93}$
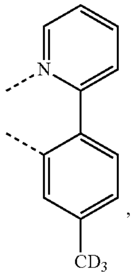
$L_{b94}$
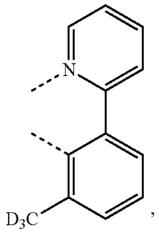
$L_{b95}$
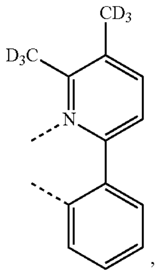

-continued
$L_{b96}$
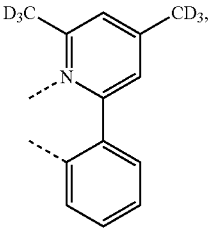
$L_{b97}$
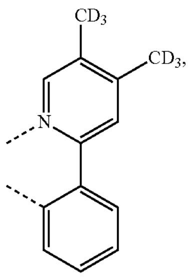
$L_{b98}$
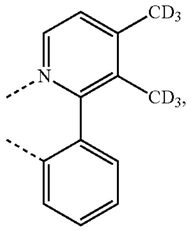
$L_{b99}$
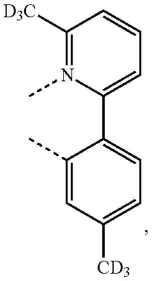
$L_{b100}$
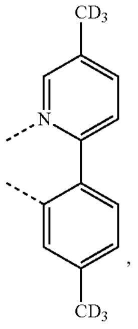
-continued
$L_{b101}$
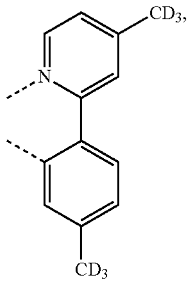
$L_{b102}$
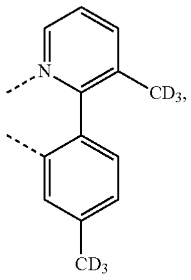
$L_{b103}$
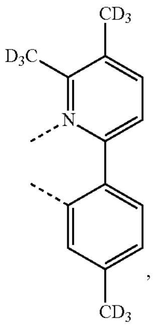
$L_{b104}$
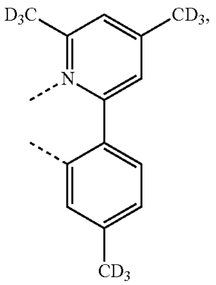
$L_{b105}$
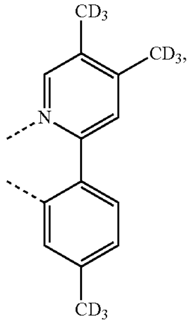

-continued
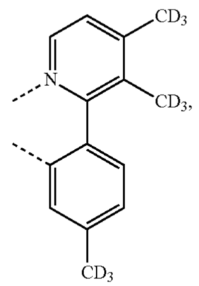
$L_{b106}$
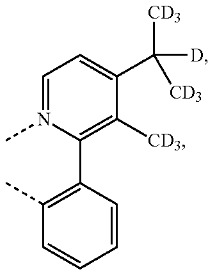
$L_{b107}$
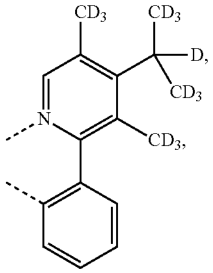
$L_{b108}$
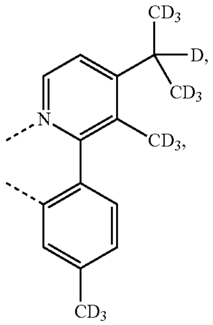
$L_{b109}$
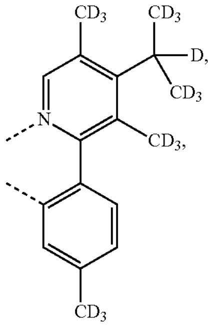
$L_{b110}$
-continued
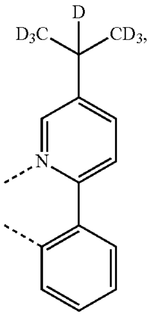
$L_{b111}$
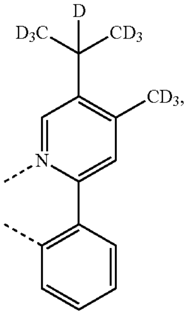
$L_{b112}$
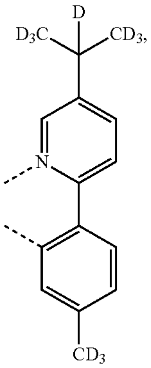
$L_{b113}$
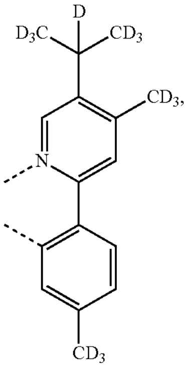
$L_{b114}$ -continued
$L_{b115}$
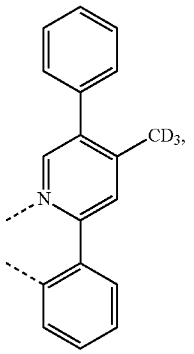
$L_{b116}$
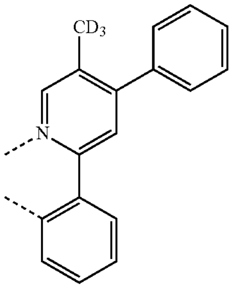
,
$L_{b117}$
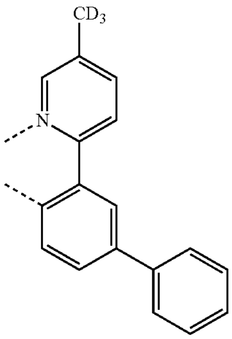
,
$L_{b118}$
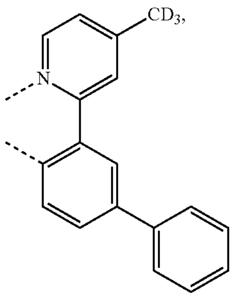
-continued
$L_{b119}$
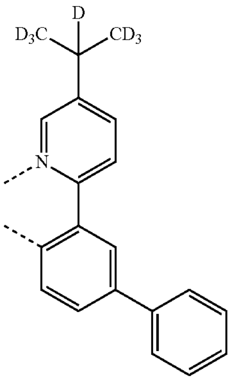
,
$L_{b120}$
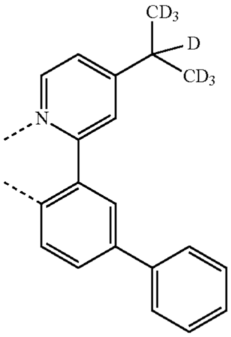
,
$L_{b121}$
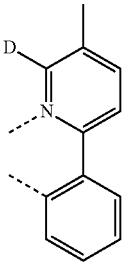
,
$L_{b122}$
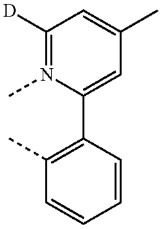
,
$L_{b123}$
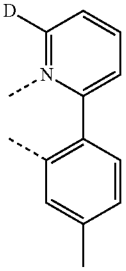
, -continued
$L_{b124}$
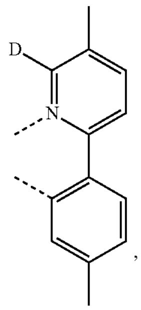
,
$L_{b125}$
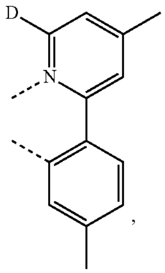
,
$L_{b126}$
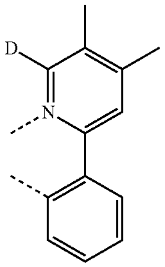
,
$L_{b127}$
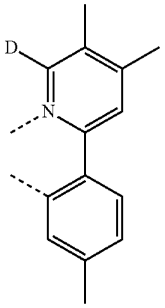
,
$L_{b128}$
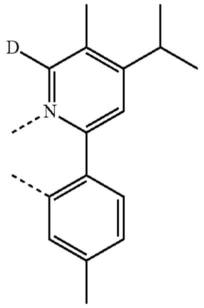
,
-continued
$L_{b129}$
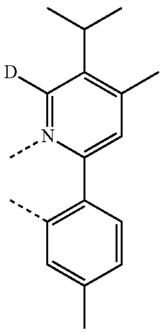
,
$L_{b130}$
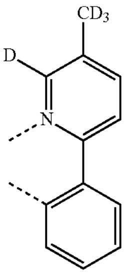
,
$L_{b131}$
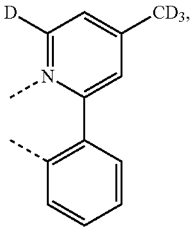
,
$L_{b132}$
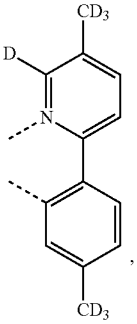
,
$L_{b133}$
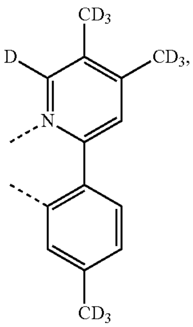
, -continued
$L_{b134}$
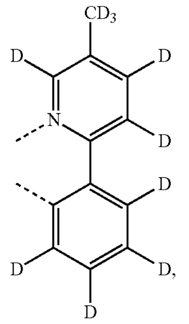
$L_{b135}$
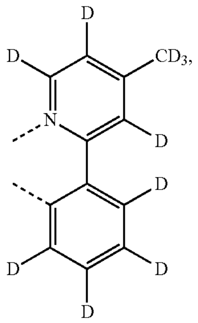
$L_{b136}$
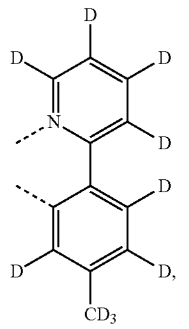
$L_{b137}$
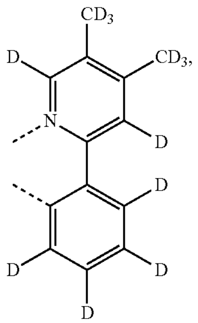
$L_{b138}$
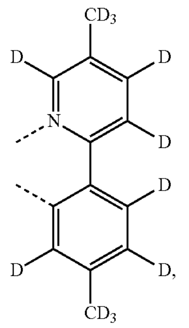
-continued
$L_{b139}$
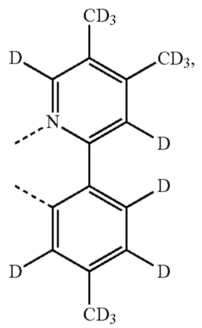
$L_{b140}$
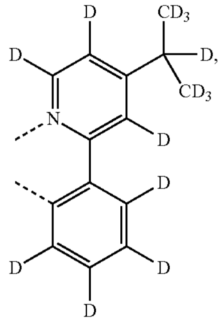
$L_{b141}$
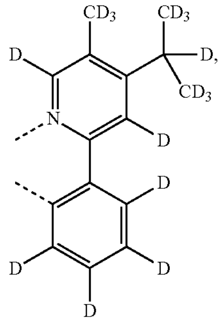
$L_{b142}$
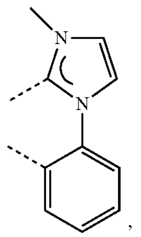
$L_{b143}$
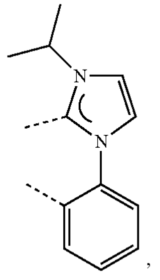

-continued
$L_{b144}$
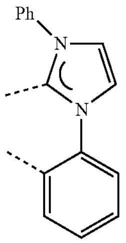,
$L_{b145}$
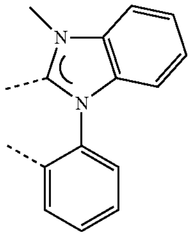,
$L_{b146}$
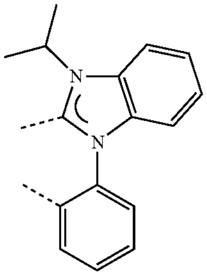,
$L_{b147}$
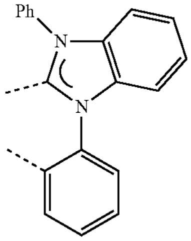,
$L_{b148}$
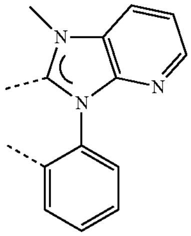,
$L_{b149}$
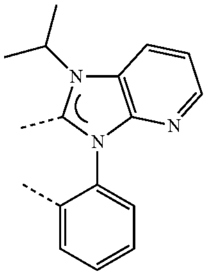,
-continued
$L_{b150}$
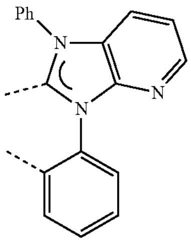,
$L_{b151}$
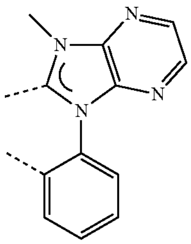,
$L_{b152}$
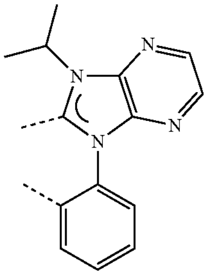,
$L_{b153}$
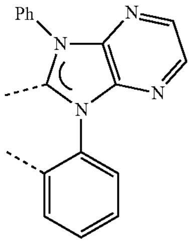,
$L_{b154}$
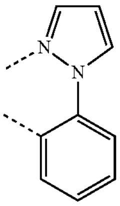,
$L_{b155}$
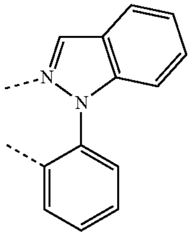, -continued
$L_{b156}$
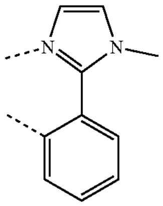
,
$L_{b157}$
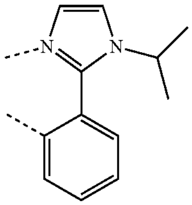
,
$L_{b158}$
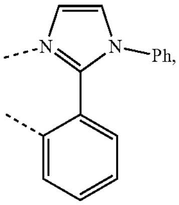
$L_{b159}$
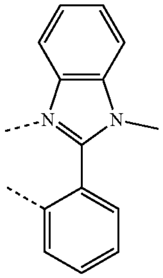
,
$L_{b160}$
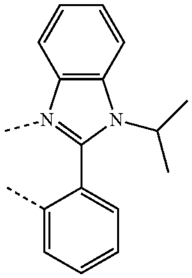
,
$L_{b161}$
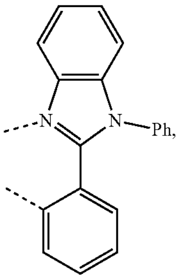
-continued
$L_{b162}$
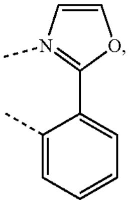
$L_{b163}$
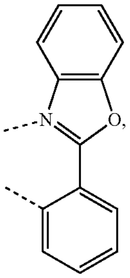
$L_{b164}$
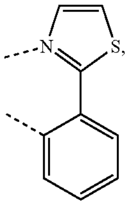
$L_{b165}$
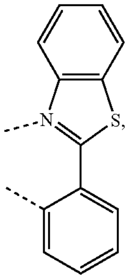
$L_{b166}$
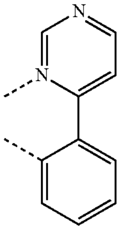
,
$L_{b167}$
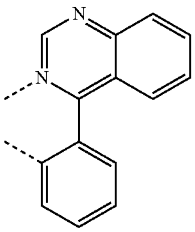
, L$_{b168}$
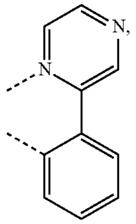
L$_{b169}$
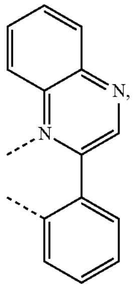
L$_{b170}$
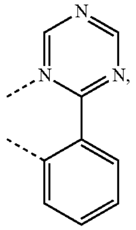
L$_{b171}$
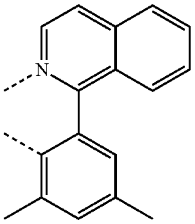
,
L$_{b172}$
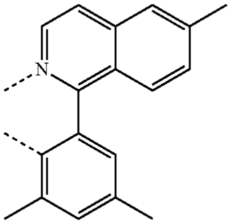
,
L$_{b173}$
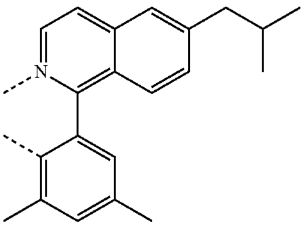
,
L$_{b174}$
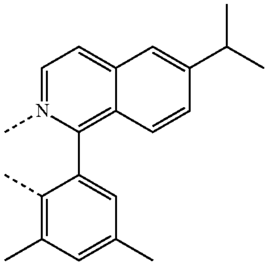
,
L$_{b175}$
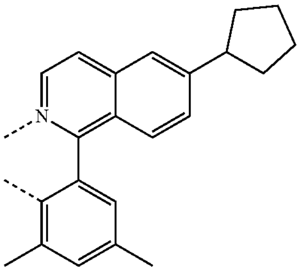
,
L$_{b176}$
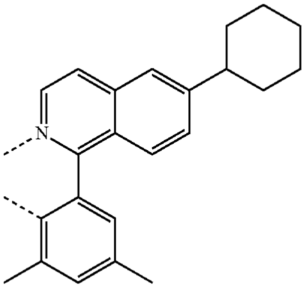
,
L$_{b177}$
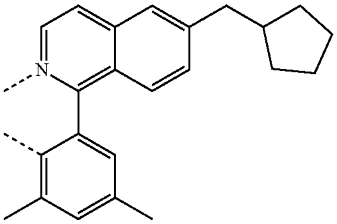
,
L$_{b178}$
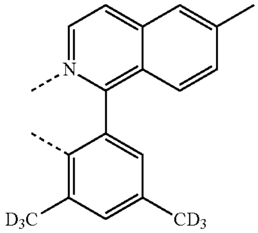
,
L$_{b179}$
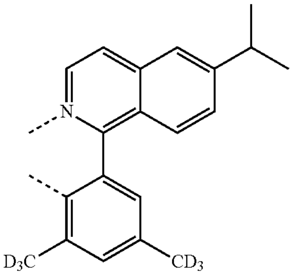
, -continued
$L_{b180}$
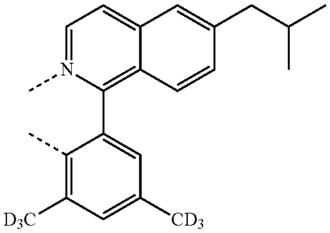
,
$L_{b181}$
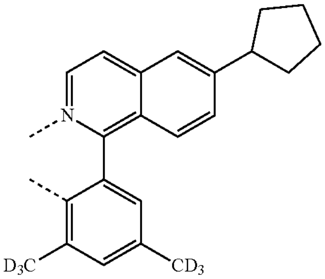
,
$L_{b182}$
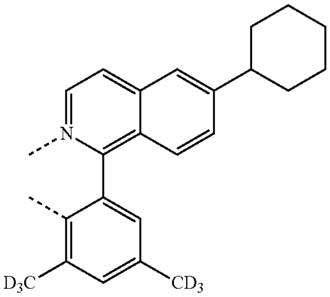
,
$L_{b183}$
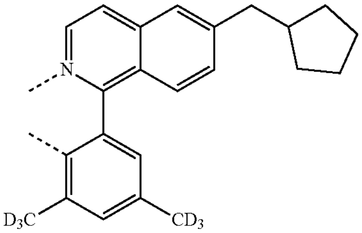
,
$L_{b184}$
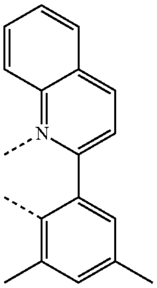
,
-continued
$L_{b185}$
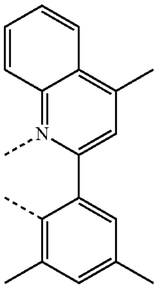
,
$L_{b186}$
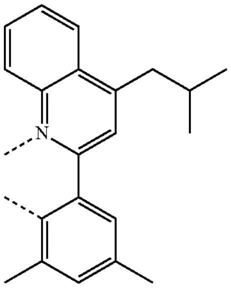
,
$L_{b187}$
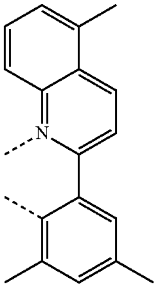
,
$L_{b188}$
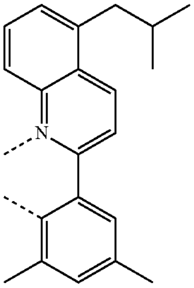
,
$L_{b189}$
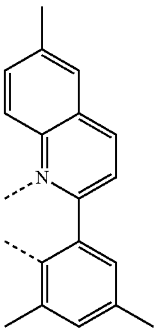
, $L_{b190}$
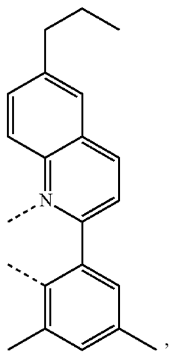
$L_{b191}$
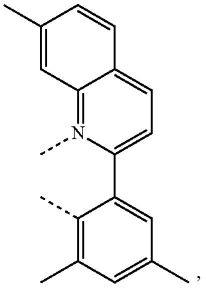
$L_{b192}$
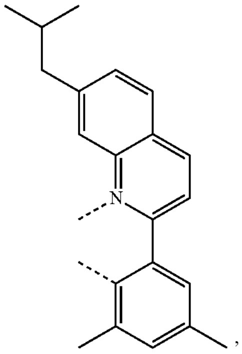
$L_{b193}$
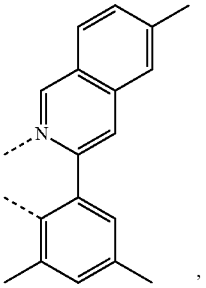
$L_{b194}$
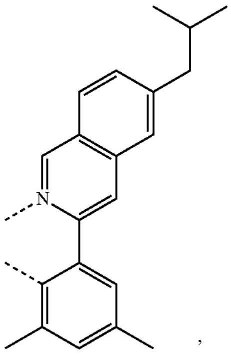
$L_{b195}$
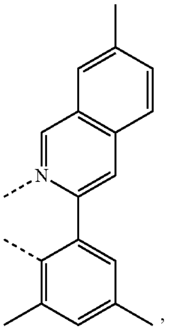
$L_{b196}$
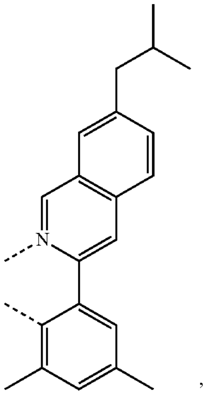
$L_{b197}$
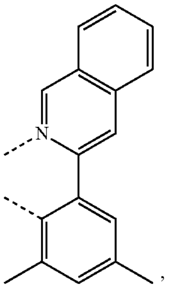

-continued
$L_{b198}$
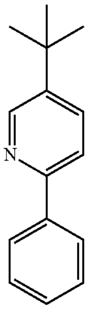,
$L_{b199}$
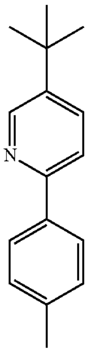,
$L_{b200}$
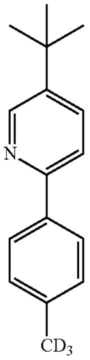,
$L_{b201}$
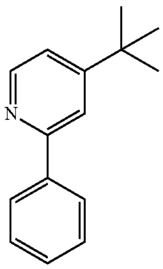,
$L_{b202}$
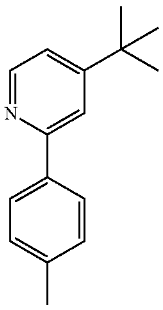,
-continued
$L_{b203}$
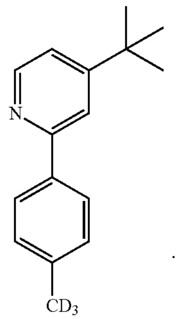.
29. The organic electroluminescent device of claim 23, wherein the ligands $L_b$ and $L_c$ are, at each occurrence identically or differently, selected from a structure represented by any one of the group consisting of the following:
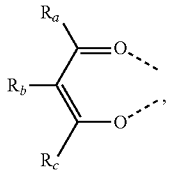, 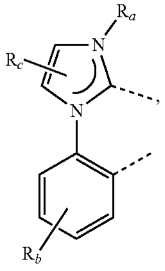, 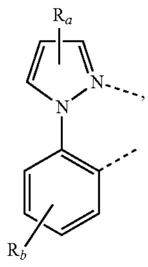, 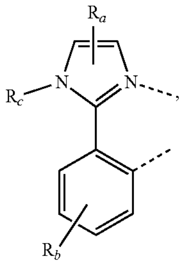, 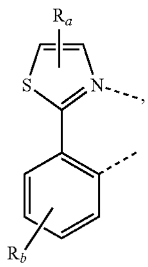, 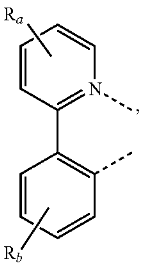, 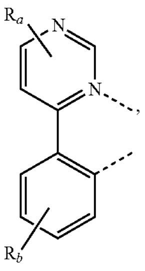, 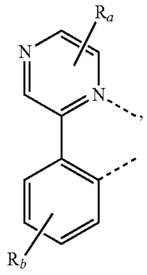, 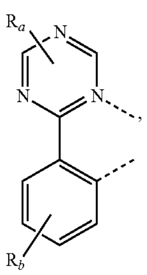, -continued

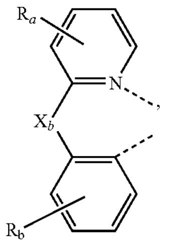

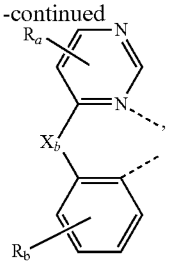

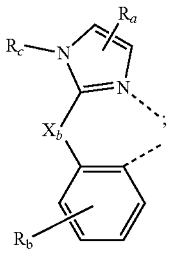

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{c2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

30. The organic electroluminescent device of claim 1, wherein the first metal complex is selected from the group consisting of the following:

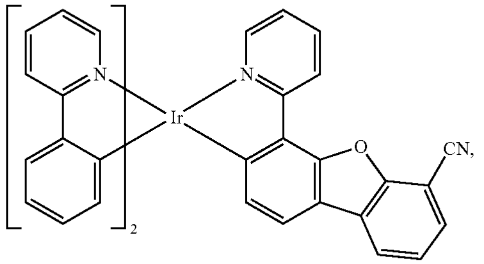

GD1

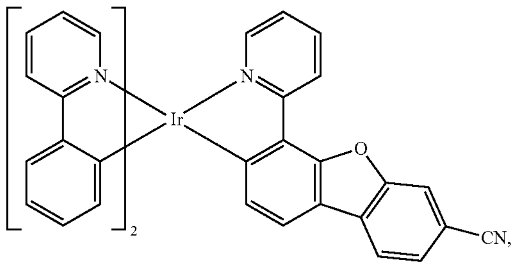

GD2

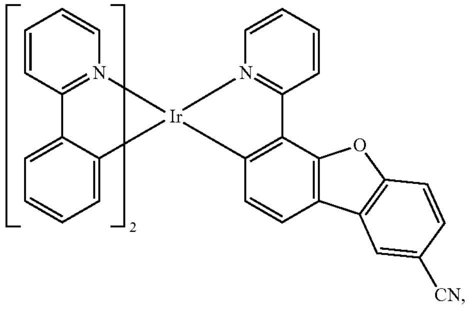

GD3

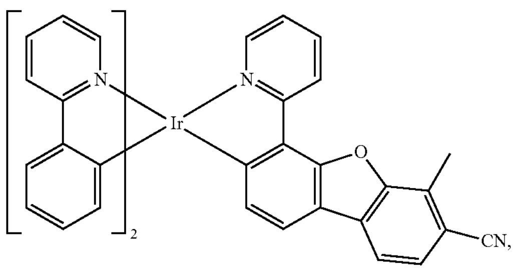

GD4

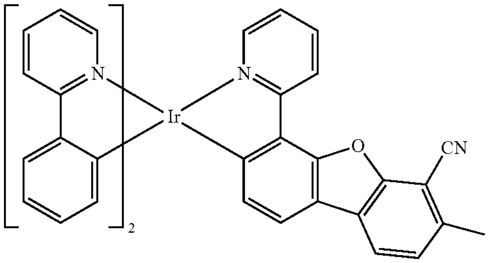

GD5

,

-continued
GD6
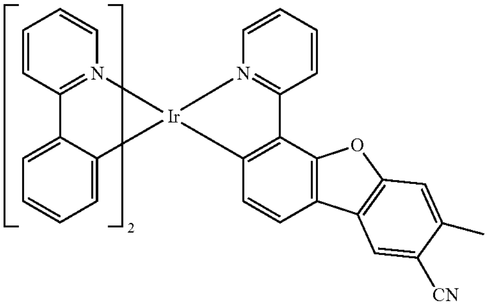
,
GD7
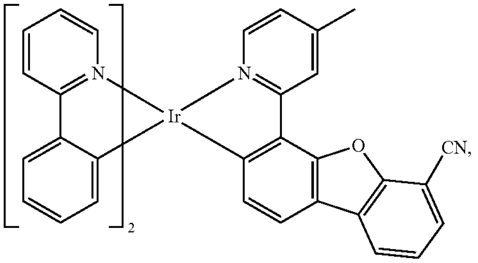
GD8
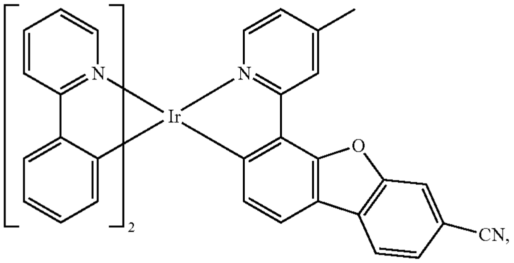
GD9
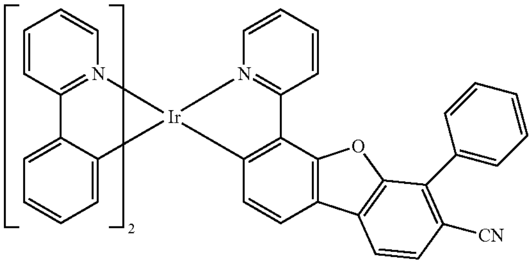
,
GD10
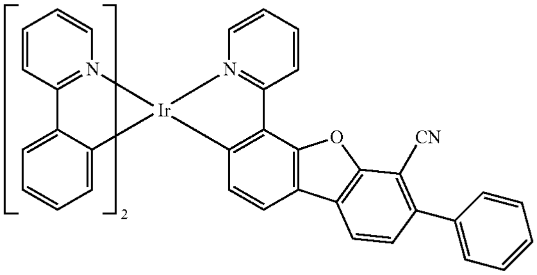
,
-continued
GD11
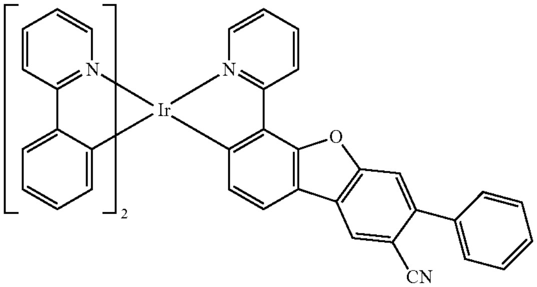
,
GD12
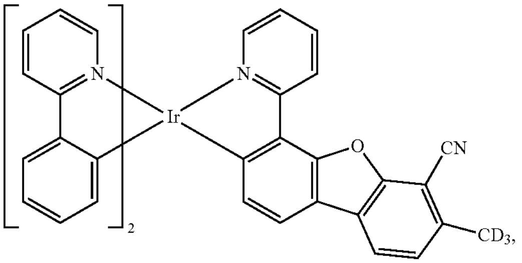
GD13
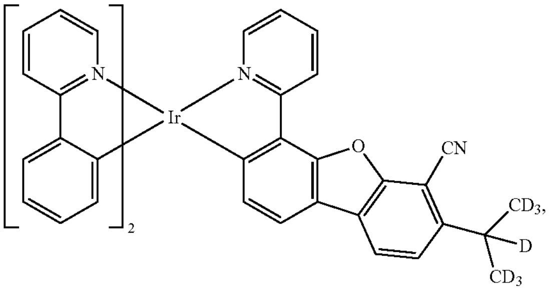
GD14
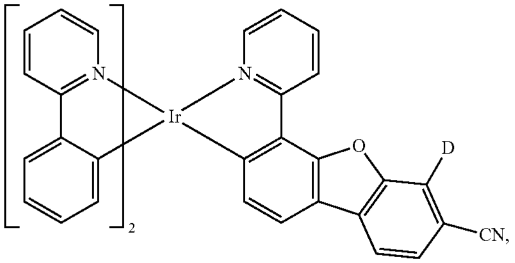
GD15
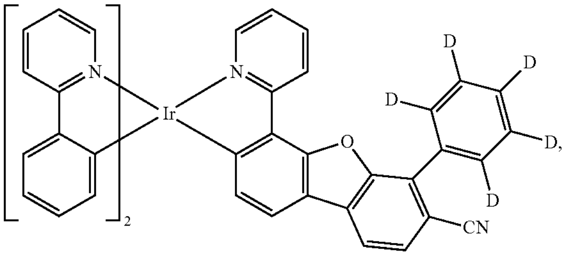

-continued
GD16
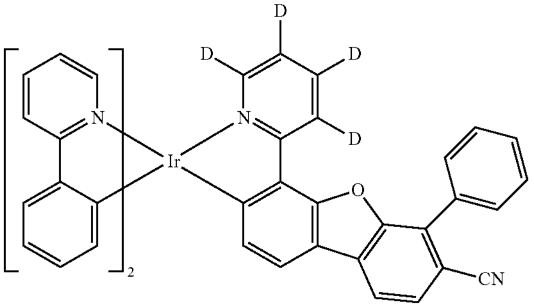
,
GD17
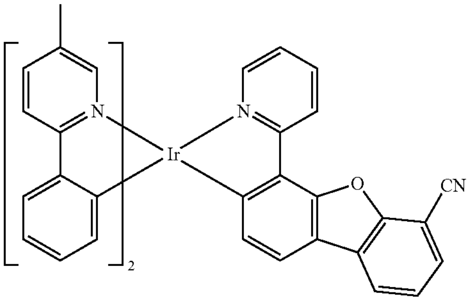
GD18
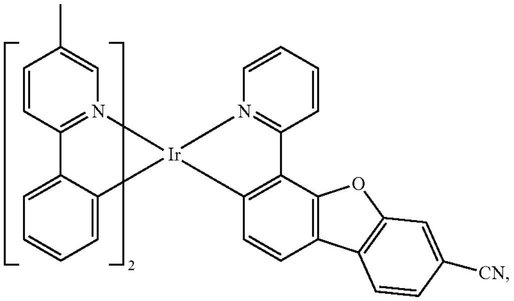
GD19
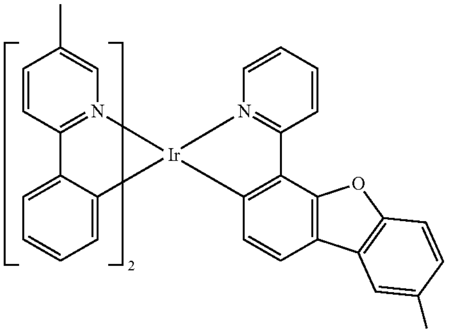
GD20
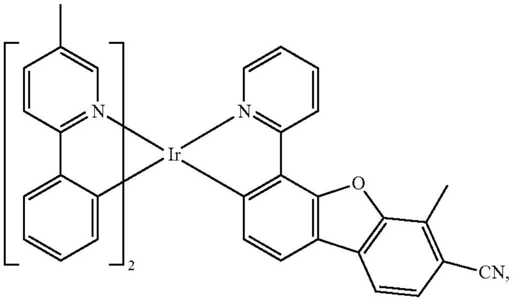
-continued
GD21
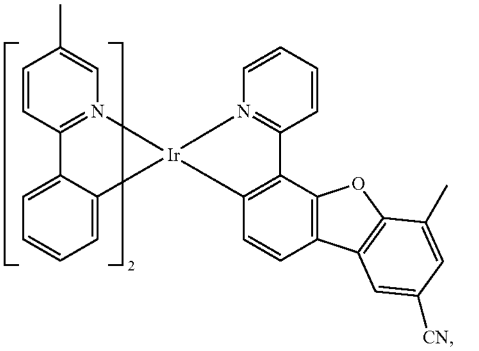
GD22
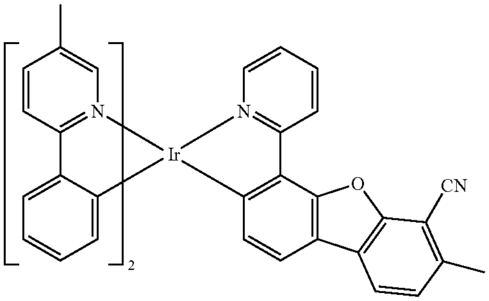
,
GD23
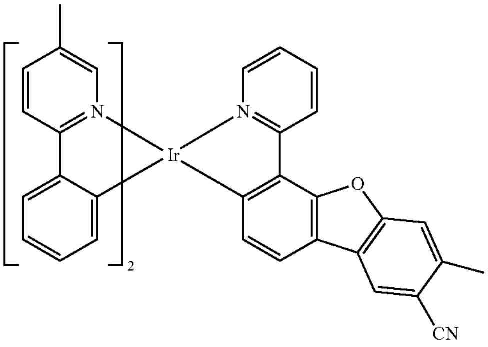
,
GD24
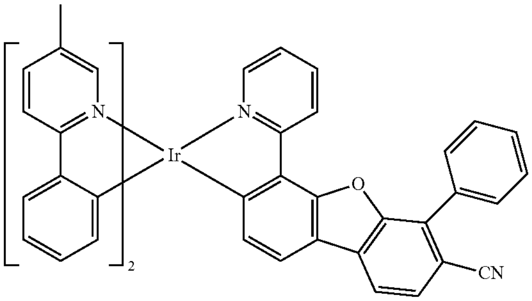
, -continued
GD25
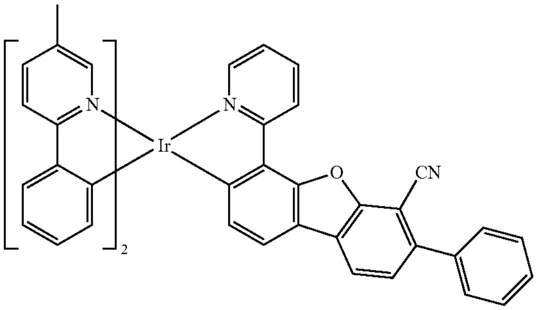
,
GD26
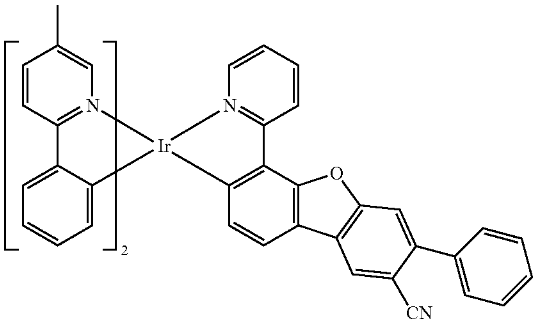
,
GD27
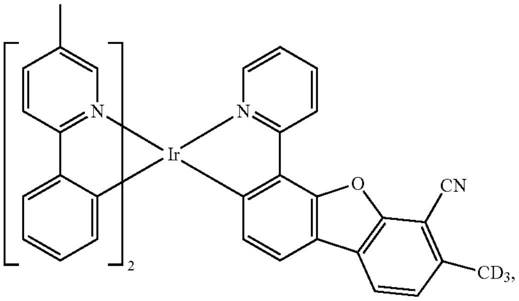
GD28
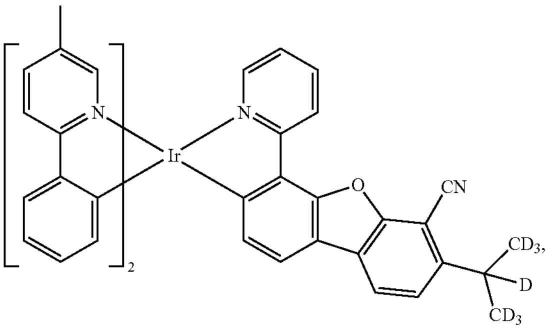
-continued
GD29
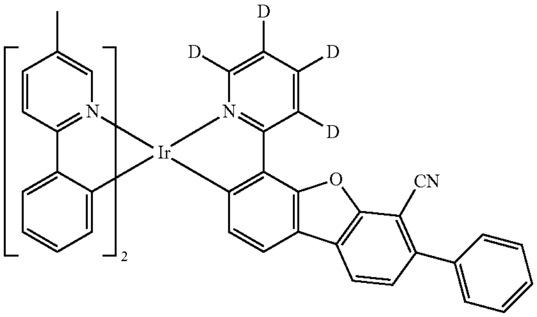
,
GD30
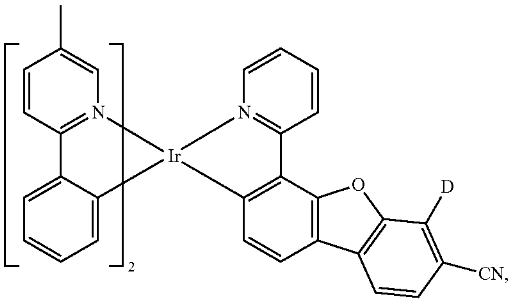
GD31
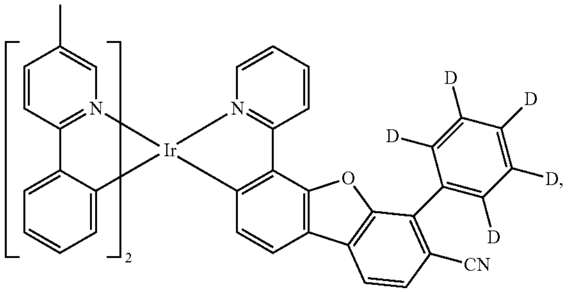
GD32
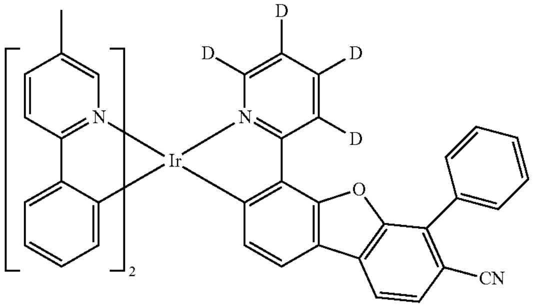
,
GD33
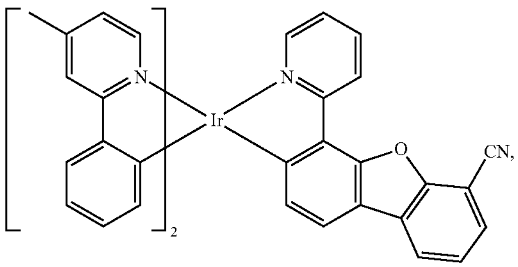

-continued
GD34
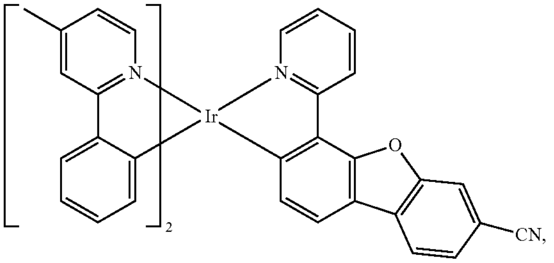
GD35
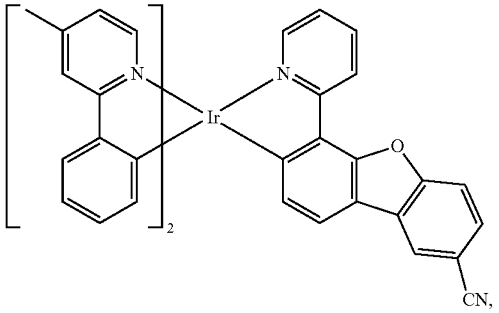
GD36
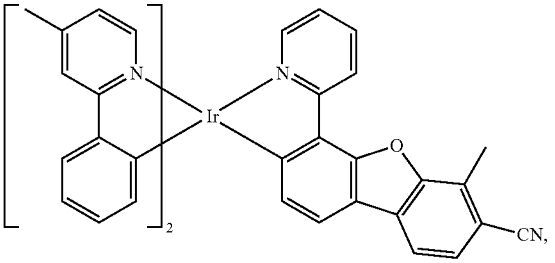
GD37
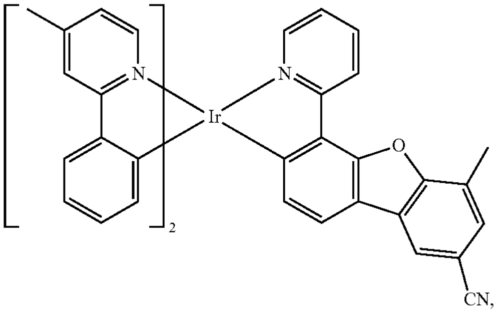
GD38
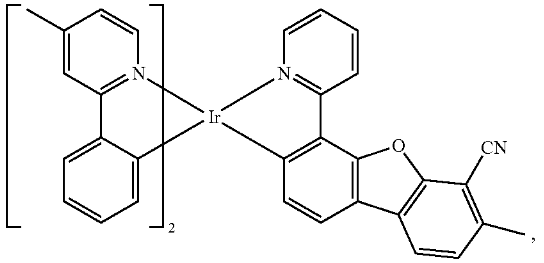
-continued
GD39
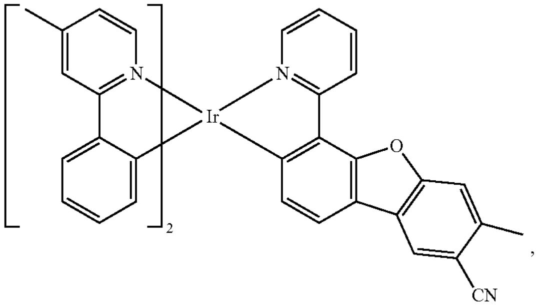
GD40
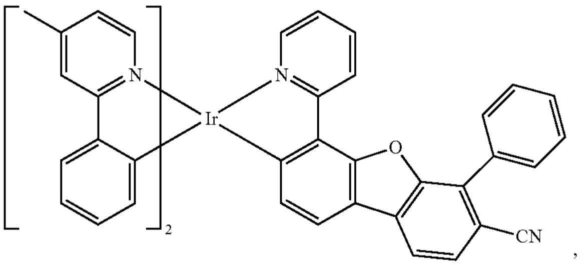
GD41
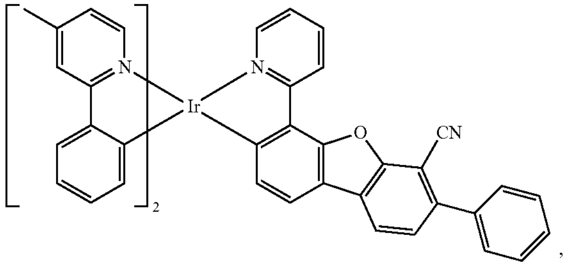
GD42
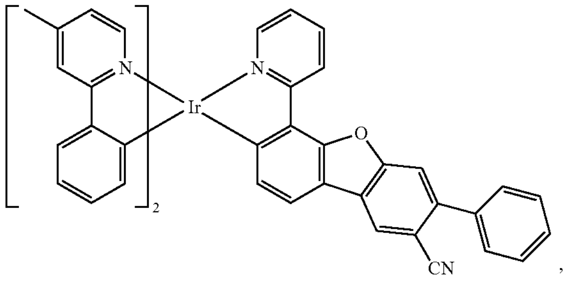
GD43
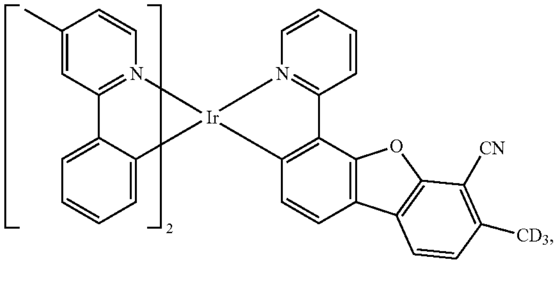

-continued
GD44
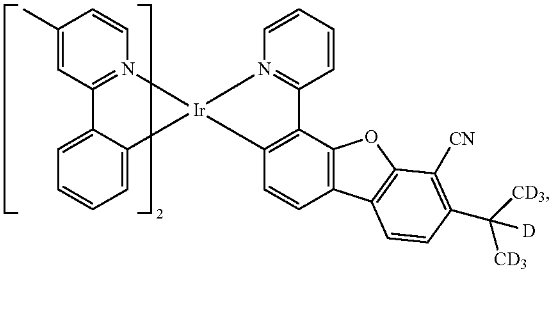
GD45
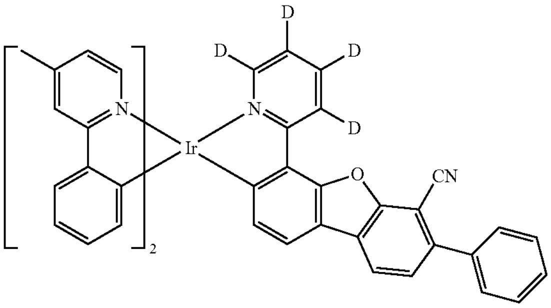
,
GD46
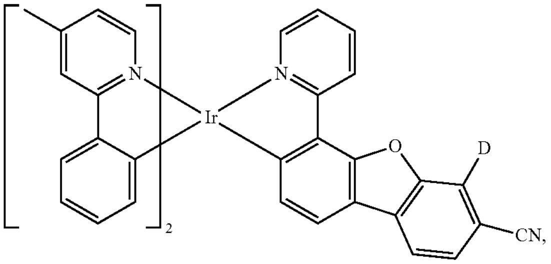
GD47
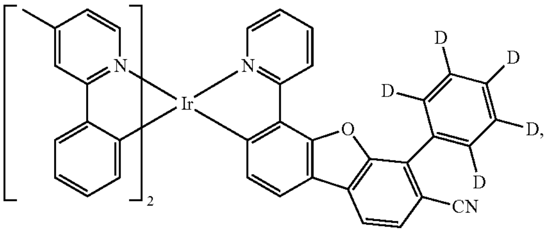
GD48
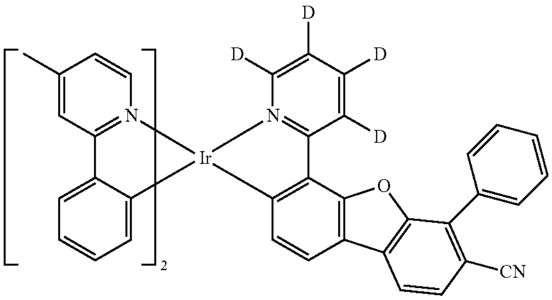
,
-continued
GD49
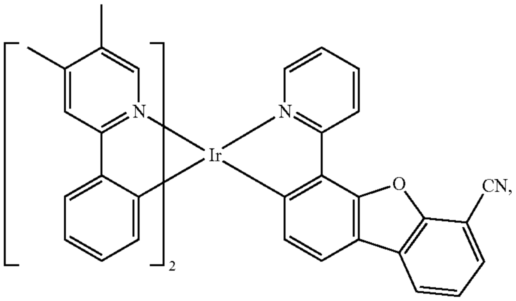
GD50
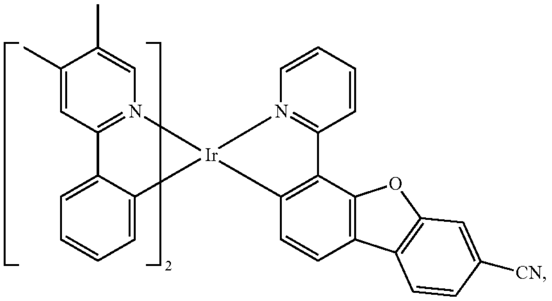
GD51
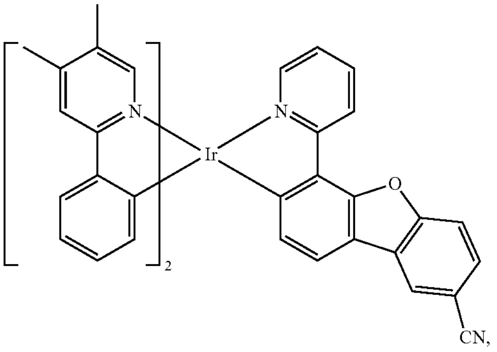
GD52
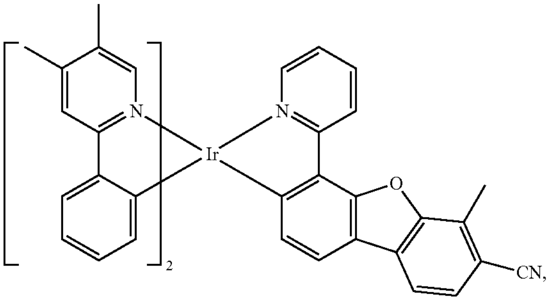

-continued
GD53
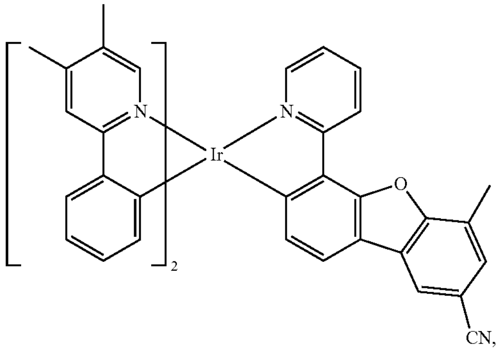
GD54
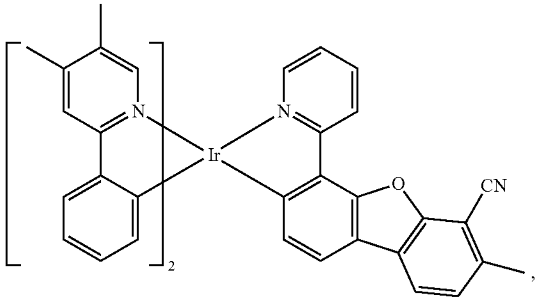
GD55
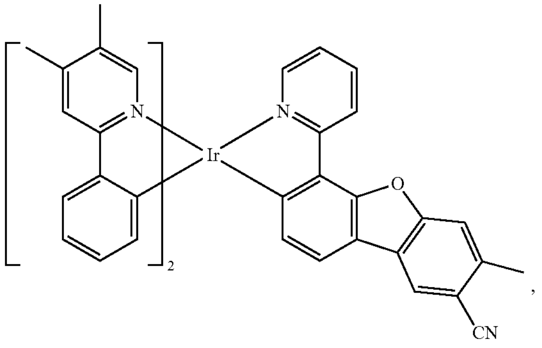
GD56
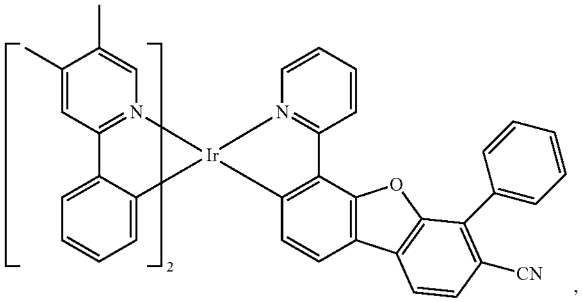
-continued
GD57
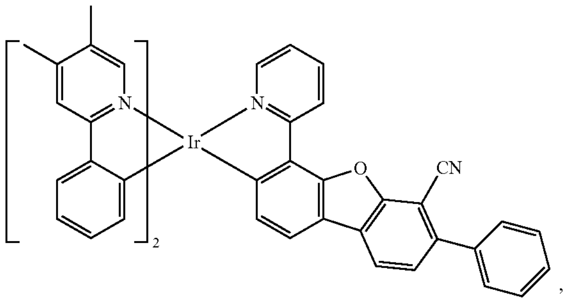
GD58
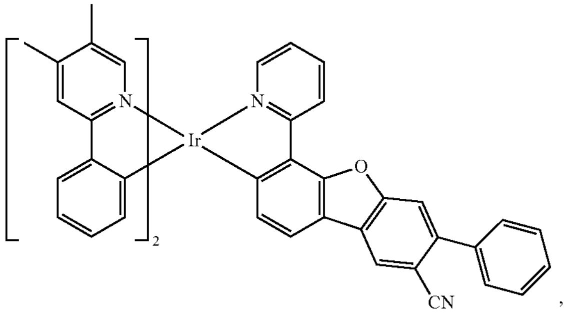
GD59
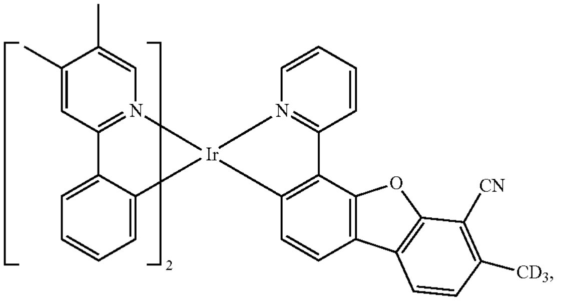
GD60
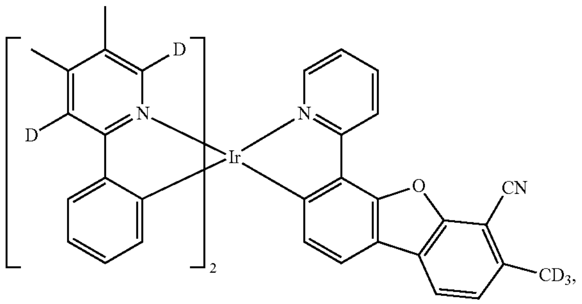
GD61
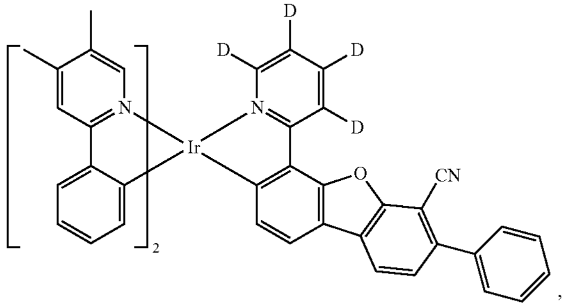

-continued
GD62
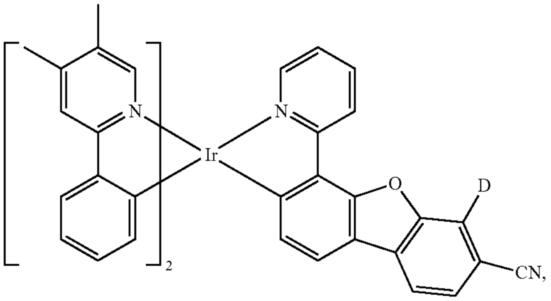
GD63
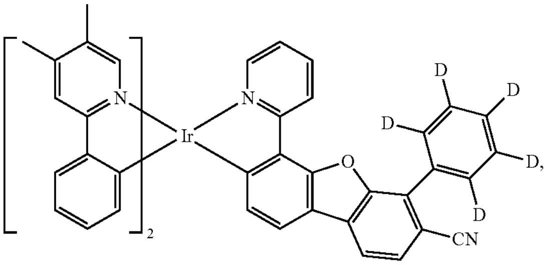
GD64
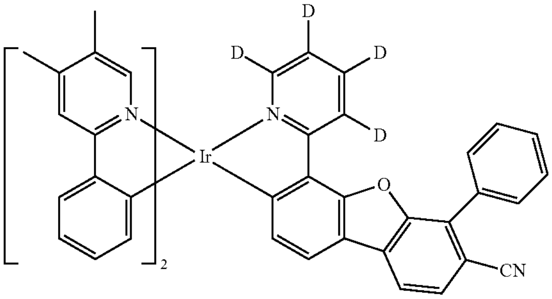
,
GD65
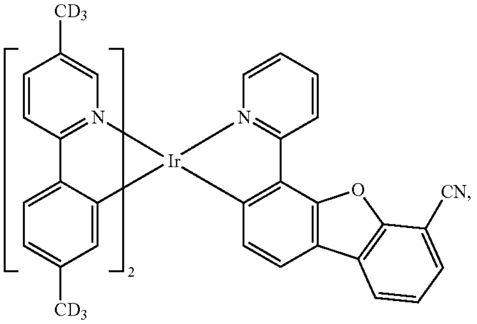
GD66
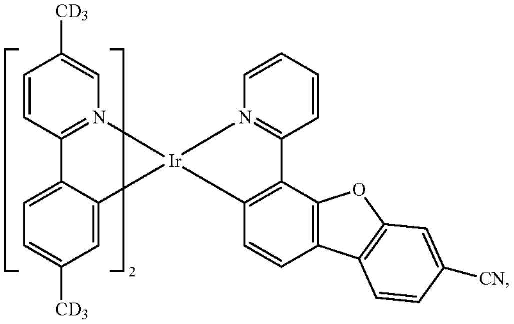
-continued
GD67
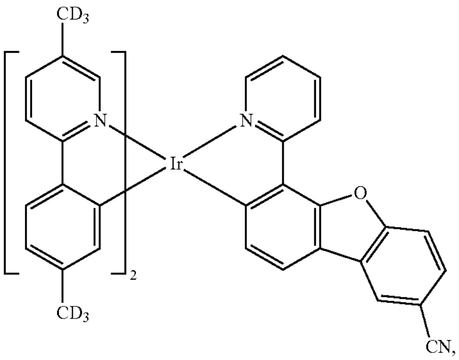
GD68
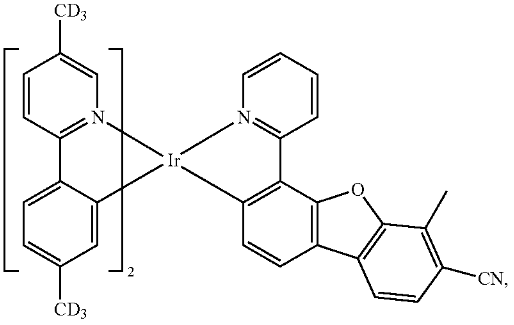
GD69
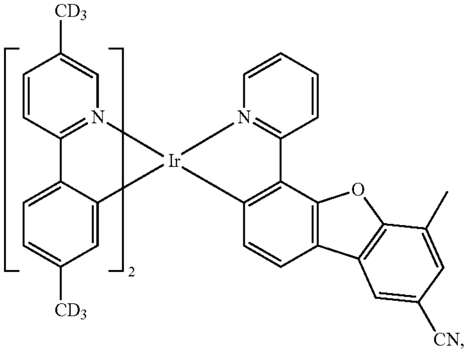
GD70
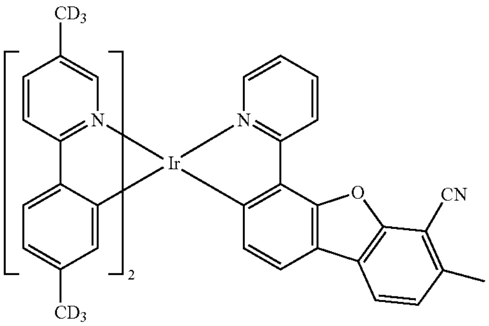
, -continued
GD71
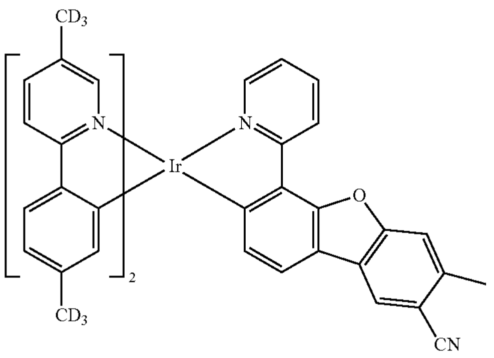
,
GD72
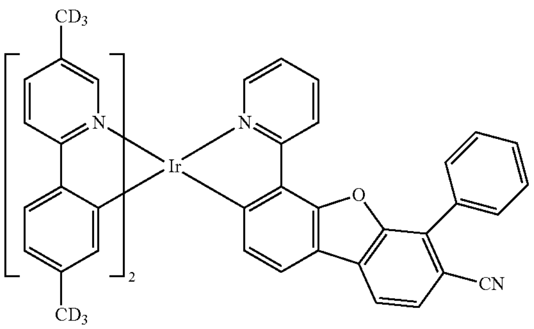
,
GD73
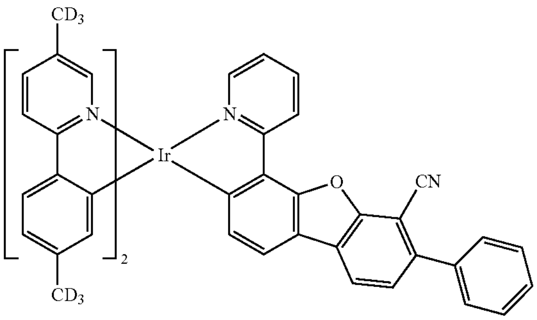
,
GD74
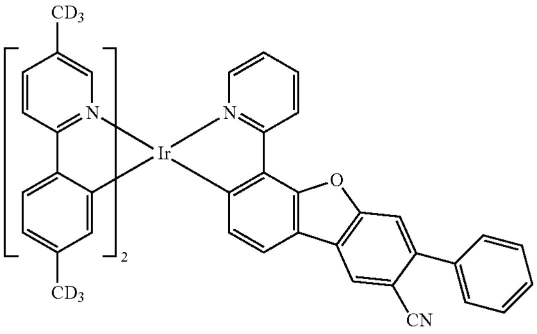
,
-continued
GD75
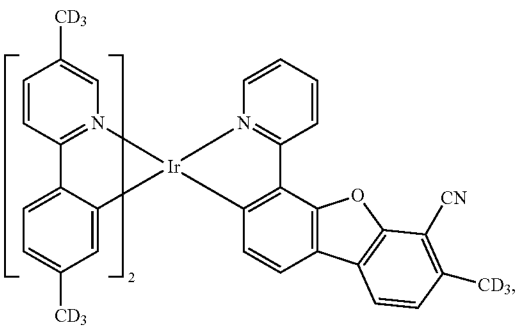
GD76
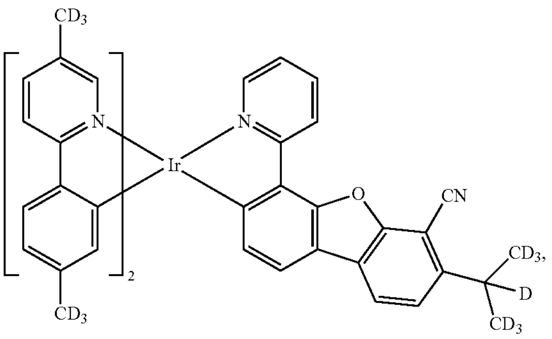
GD77
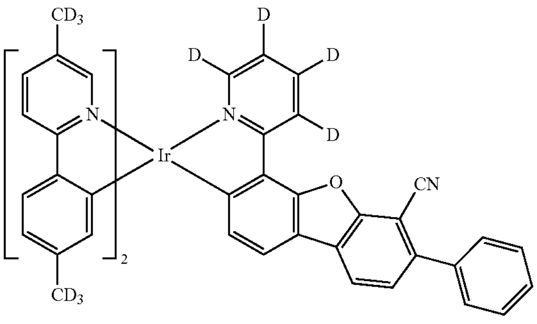
,
GD78
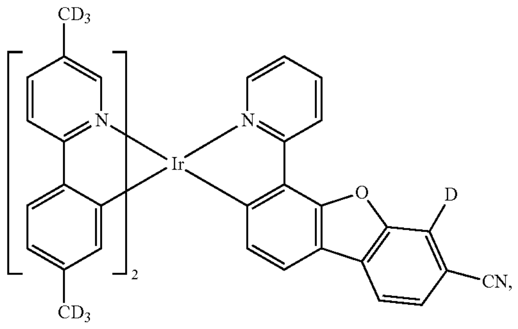

-continued
GD79
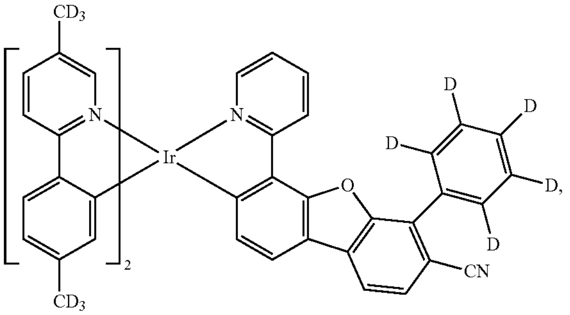
GD80
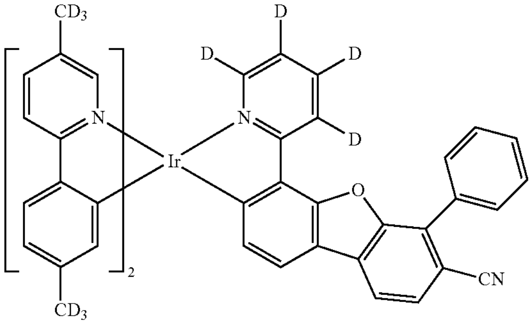
,
GD81
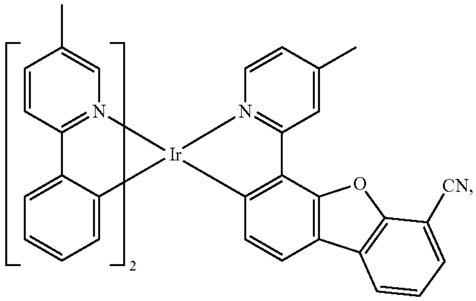
GD82
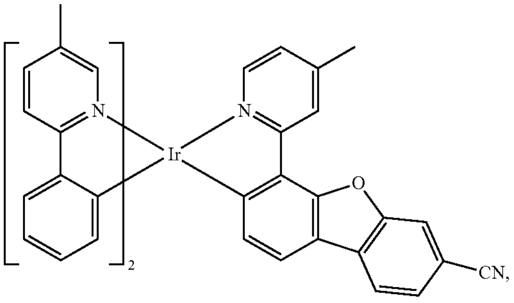
GD83
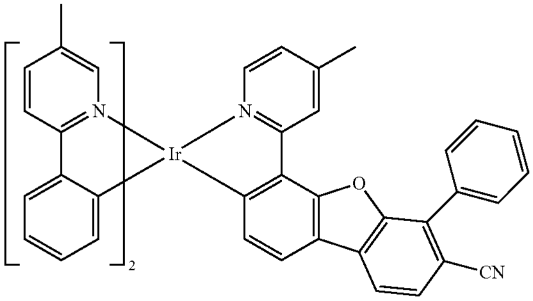
,
-continued
GD84
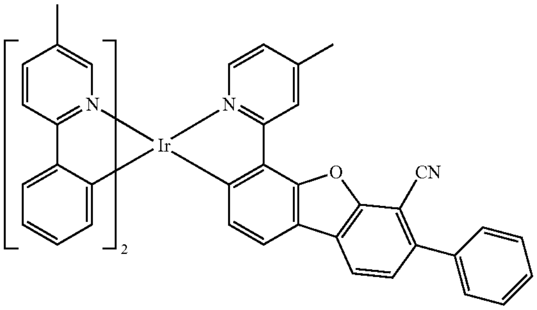
,
GD85
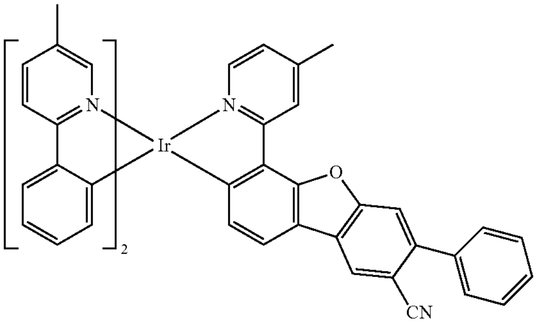
,
GD86
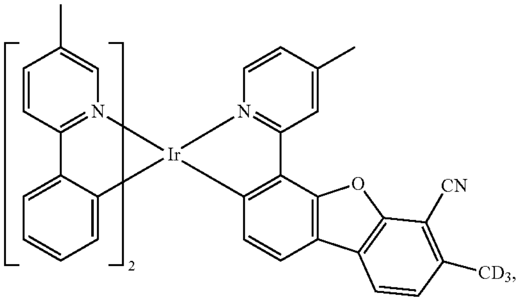
GD87
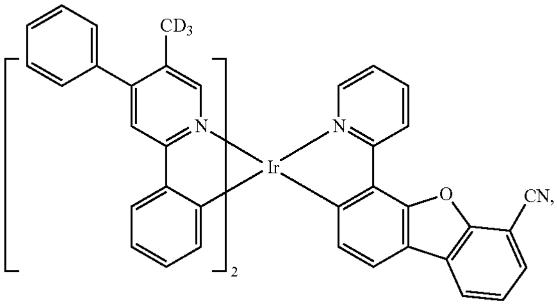
GD88
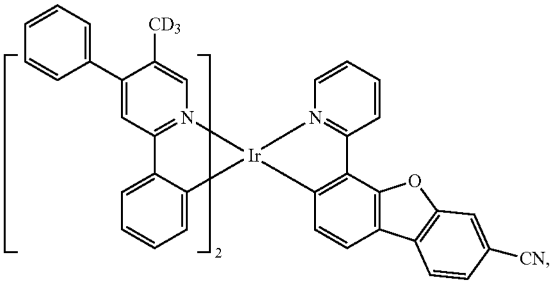

-continued
GD89
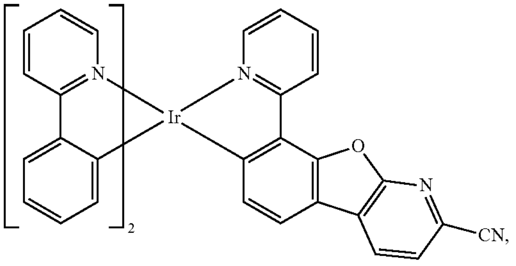
GD90
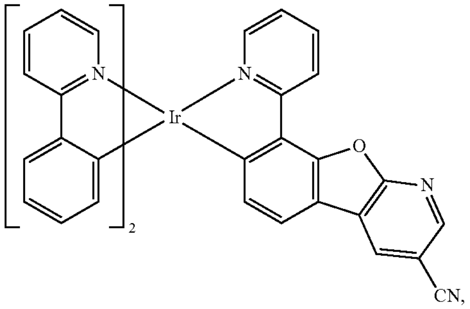
GD91
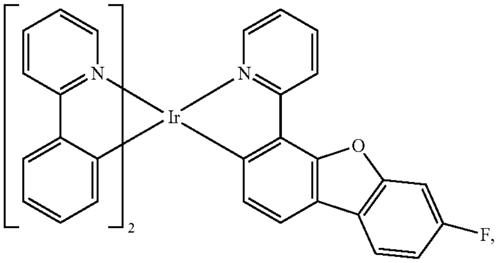
GD92
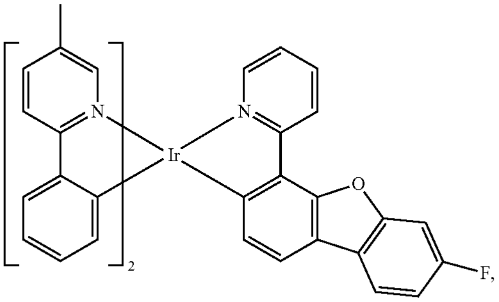
GD93
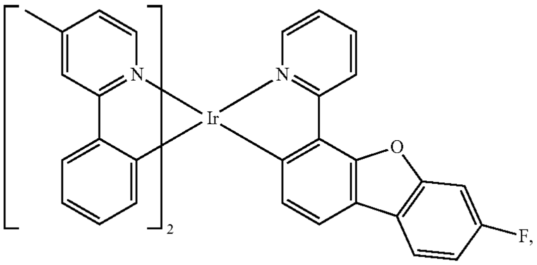
-continued
GD94
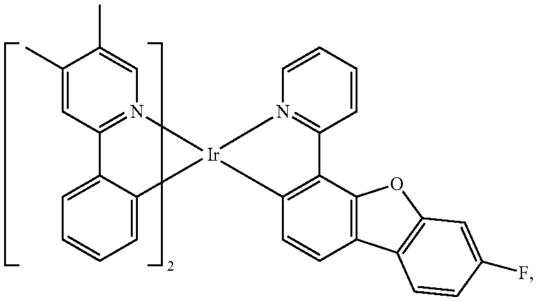
GD95
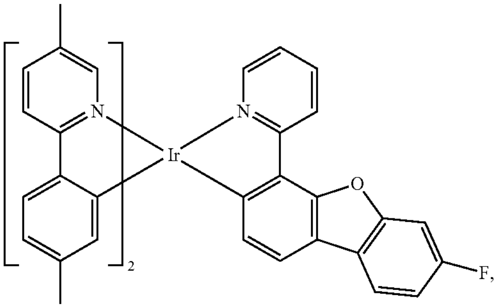
GD96
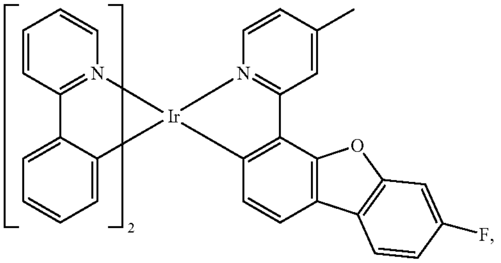
GD97
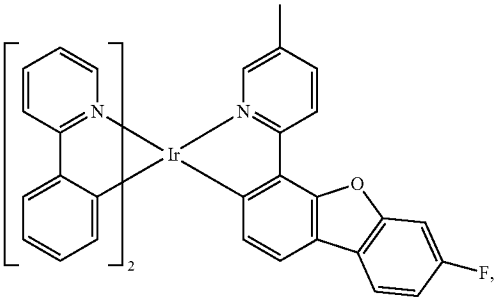
GD98
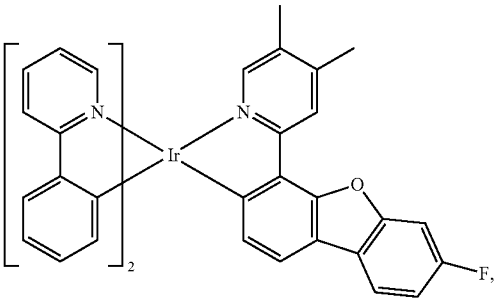

-continued
GD99
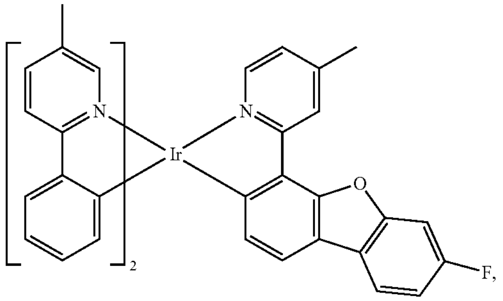
GD100
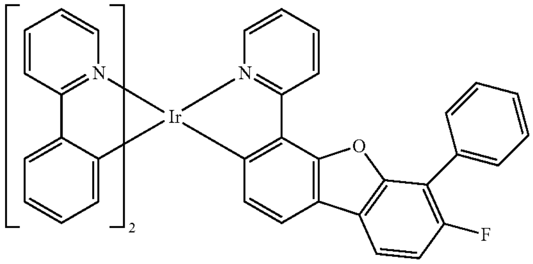
,
GD101
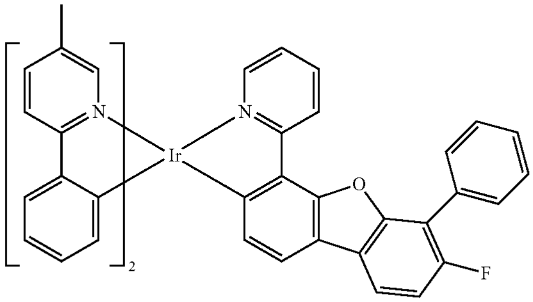
,
GD102
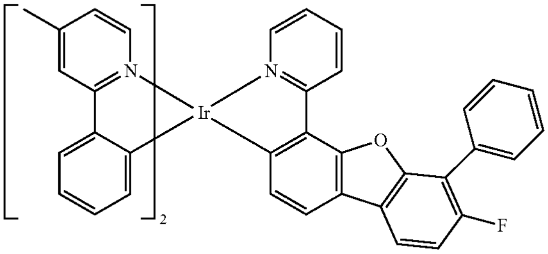
,
GD103
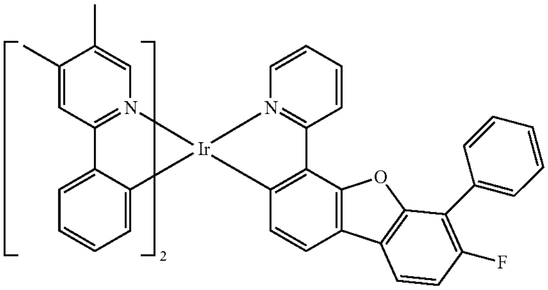
,
-continued
GD104
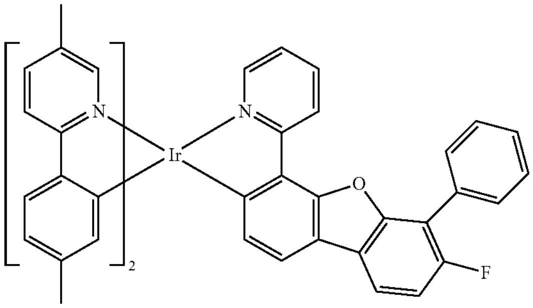
,
GD105
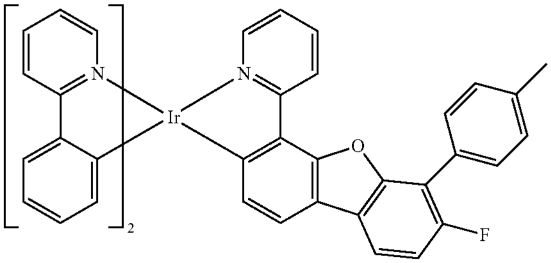
,
GD106
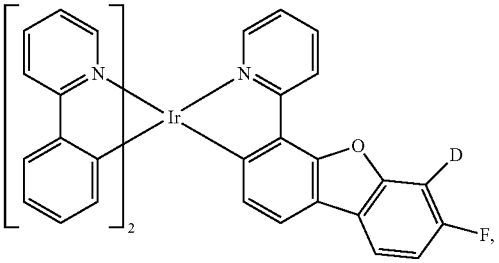
GD107
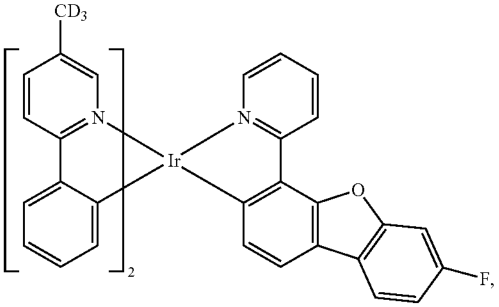
GD108
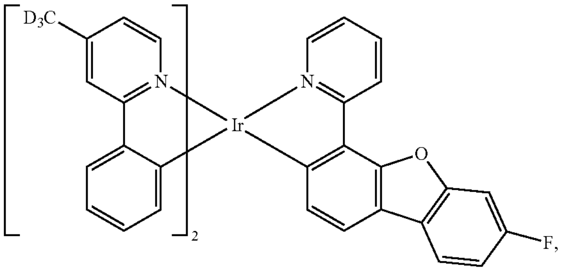

GD109
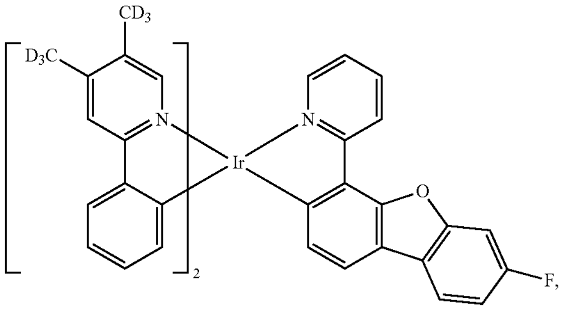
GD110
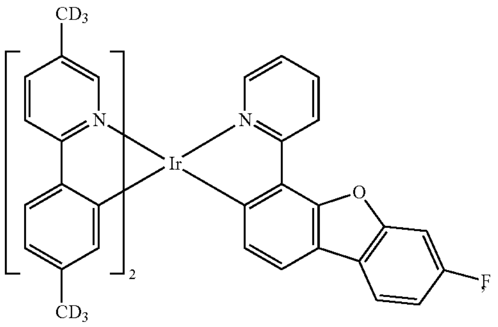
GD111
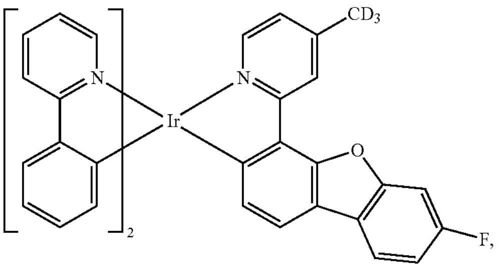
CD112
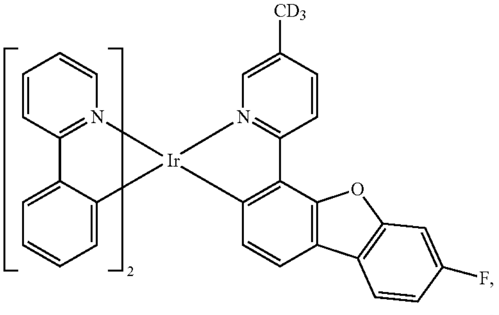
CD113
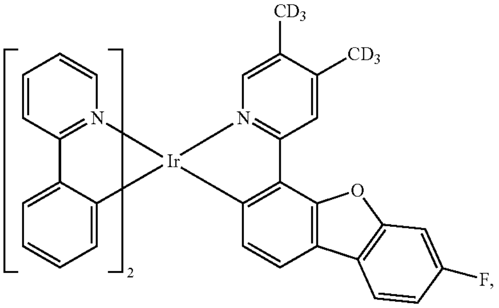
CD114
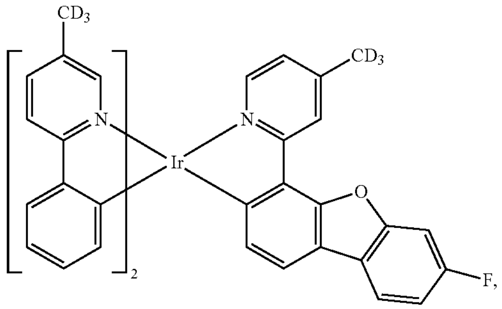
CD115
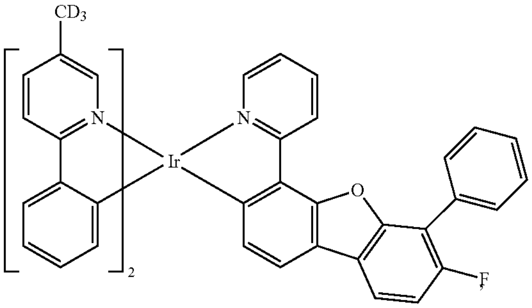
,
GD116
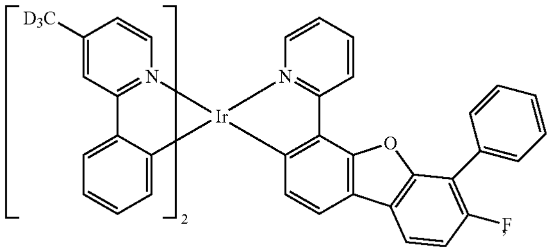
,
GD117
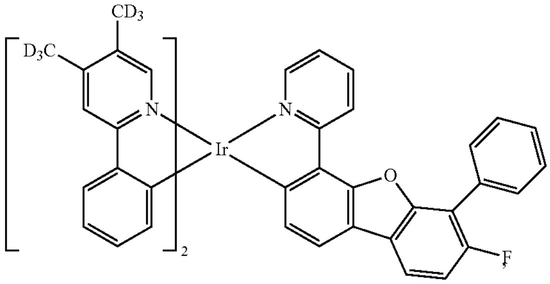
,
GD118
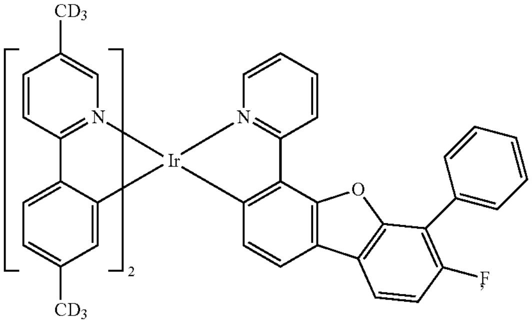
, -continued
GD119
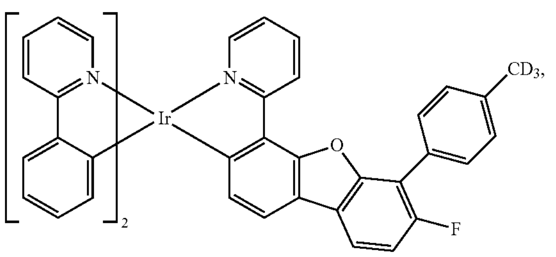
GD120
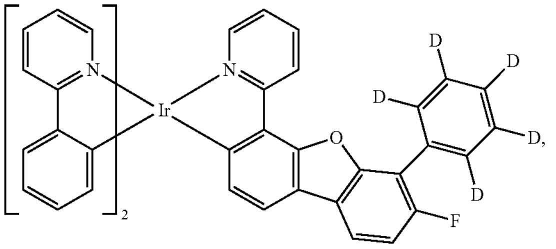
GD121
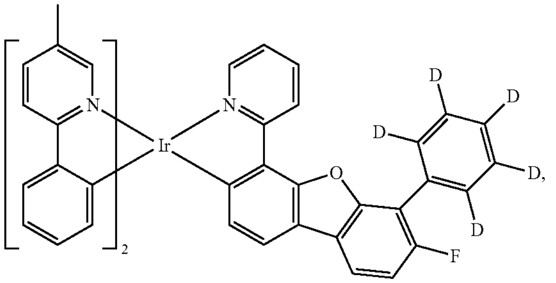
GD122
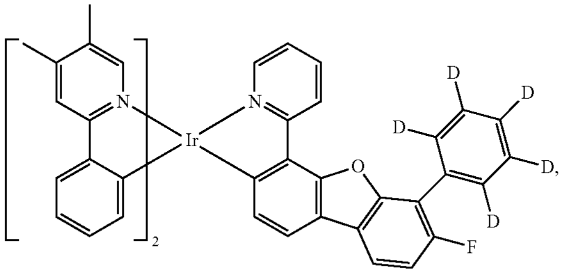
GD123
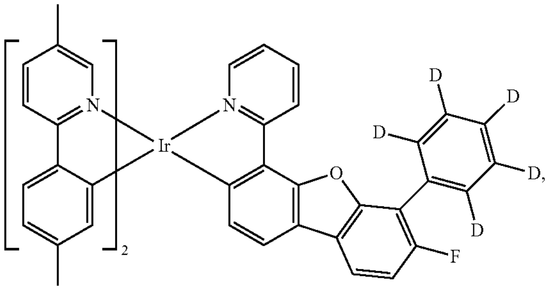
-continued
GD124
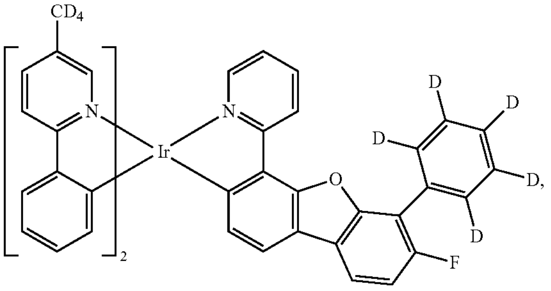
GD125
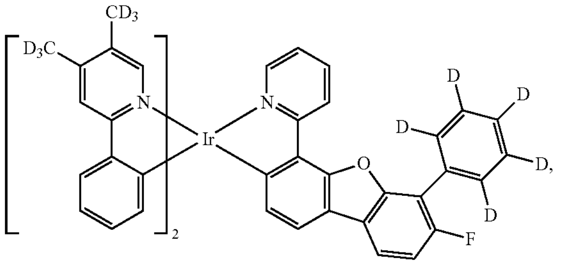
GD126
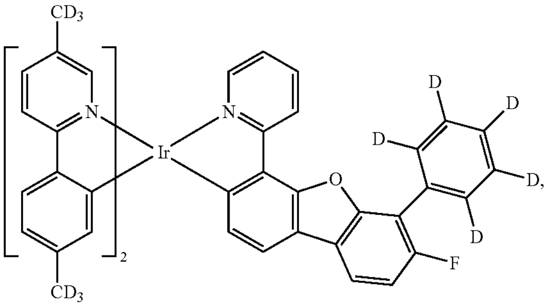
GD127
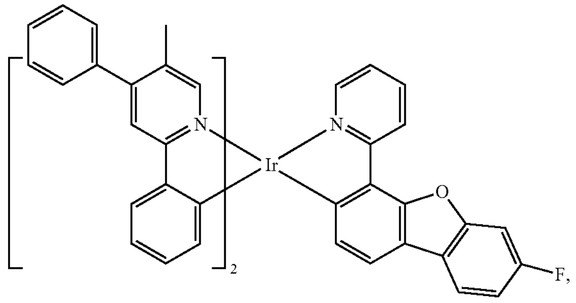

-continued

GD128

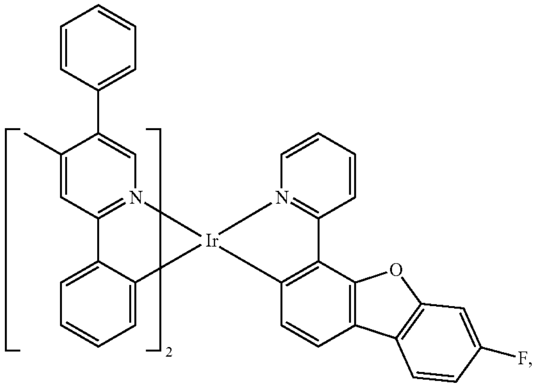

GD129

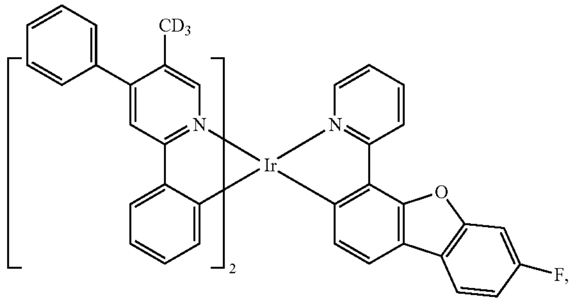

GD130

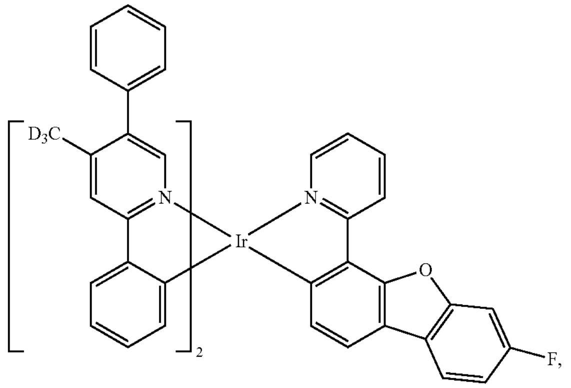

GD131

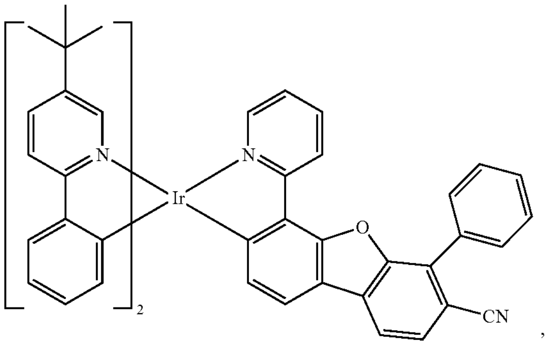

-continued

GD132

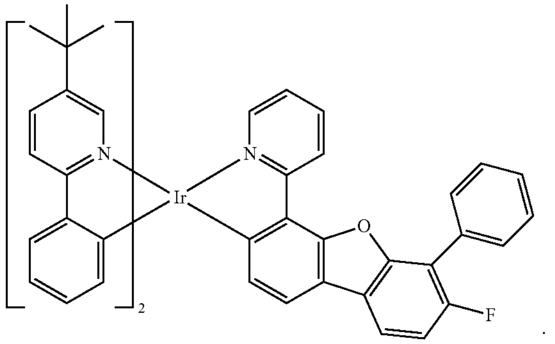

31. The organic electroluminescent device of claim 1, wherein the organic layer further contains a second compound, wherein the second compound comprises at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

32. The organic electroluminescent device of claim 31, wherein the second compound has a structure represented by Formula X:

Formula X

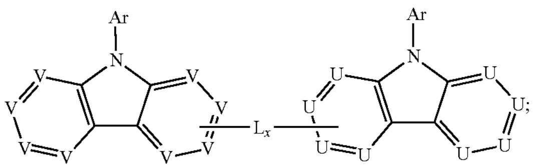

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof, V is, at each occurrence identically or differently, selected from C, $CR_v$ or N, and at least one of V is C and joined to the $L_x$;

U is, at each occurrence identically or differently, selected from C, $CR_u$ or N, and at least one of U is C and joined to the $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

Ar is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

33. The organic electroluminescent device of claim 32, wherein the V is, at each occurrence identically or differently, selected from C or $CR_v$, and U is, at each occurrence identically or differently, selected from C or $CR_u$, wherein $R_u$ and $R_v$ are, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

34. The organic electroluminescent device of claim 32, wherein the Ar is, at each occurrence identically or differently, selected from substituted or unsubstituted aryl having 6 to 24 carbon atoms, substituted or unsubstituted heteroaryl having 3 to 24 carbon atoms or a combination thereof.

35. The organic electroluminescent device of claim 32, wherein the $L_x$ is, at each occurrence identically or differently, selected from a single bond, substituted or unsubstituted arylene having 6 to 20 carbon atoms, substituted or unsubstituted heteroarylene having 3 to 20 carbon atoms or a combination thereof.

36. The organic electroluminescent device of claim 32, wherein the second compound has a structure represented by one of Formulas X-a to X-j:

X-a

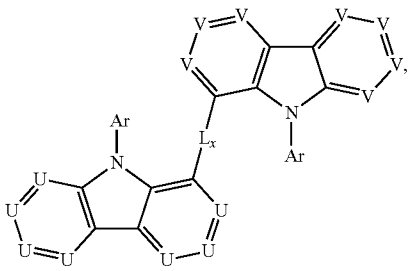

-continued

X-b

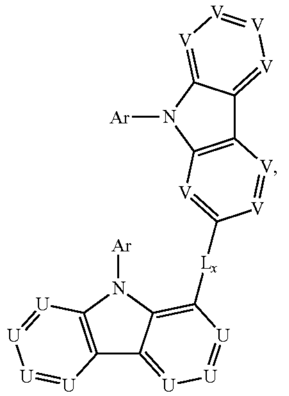

X-c

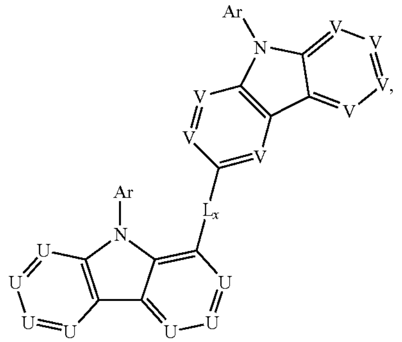

X-d

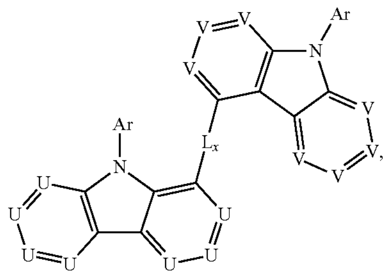

X-e

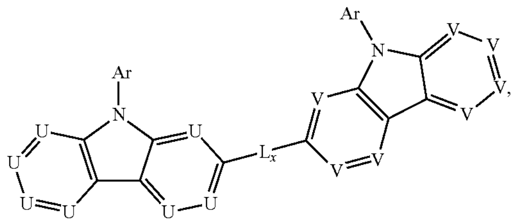

X-f

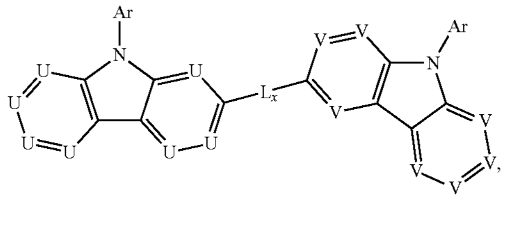

-continued

X-g

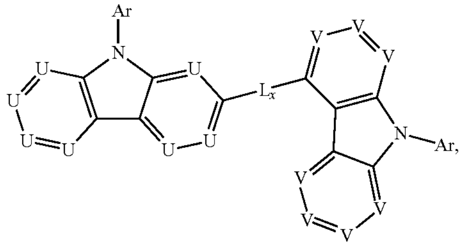

X-h

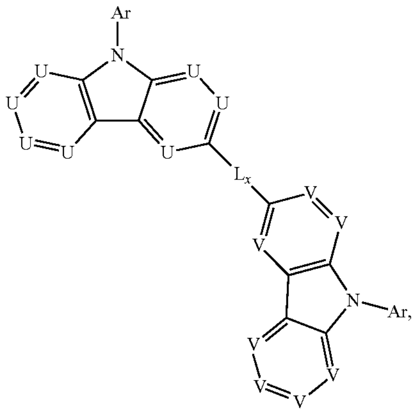

X-i

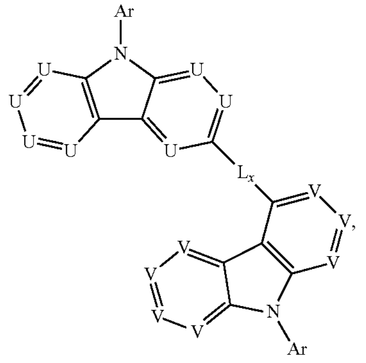

X-j

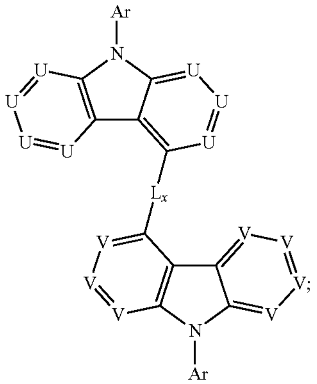

wherein in Formulas X-a to X-j, wherein, V, $L_x$, U and Ar are defined as defined in Formula X.

37. The organic electroluminescent device of claim 35, wherein the $L_x$ is, at each occurrence identically or differently, selected from a single bond, substituted or unsubstituted phenylene, substituted or unsubstituted biphenylene, substituted or unsubstituted carbazolylene, substituted or unsubstituted dibenzofuranylene or substituted or unsubstituted dibenzothienylene.

38. The organic electroluminescent device of claim 31, wherein the second compound is selected from the group consisting of the following:

X-1

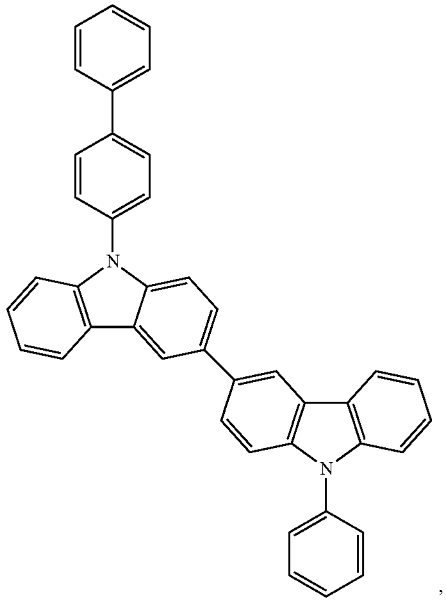

X-2

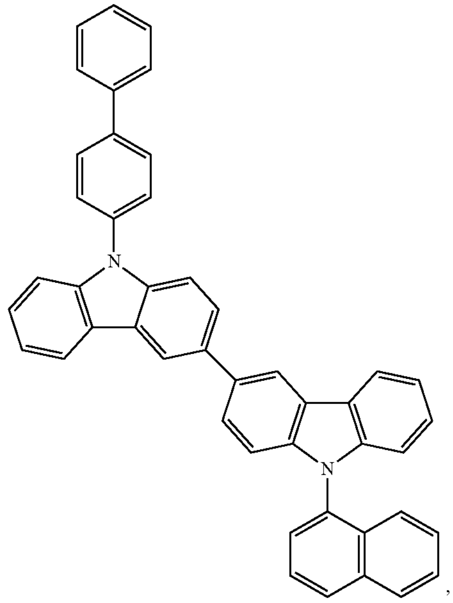

-continued
X-3
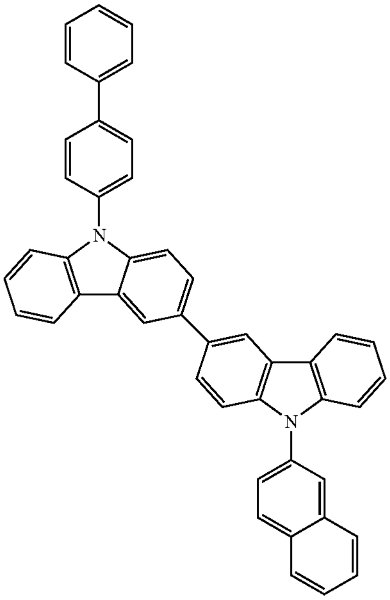
,
-continued
X-5
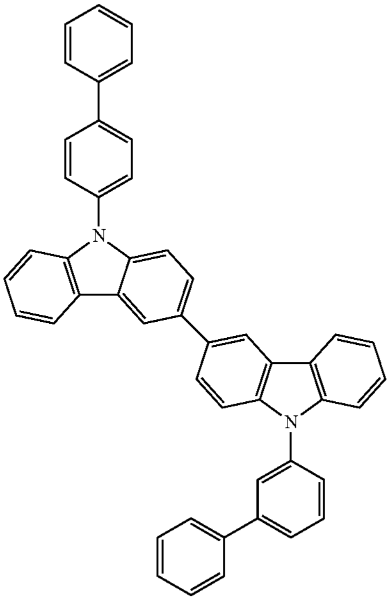
,
X-4
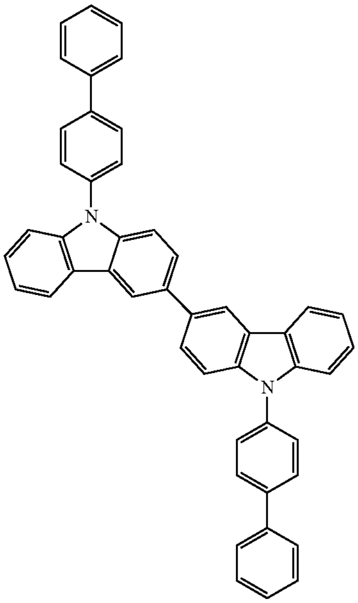
,
X-6
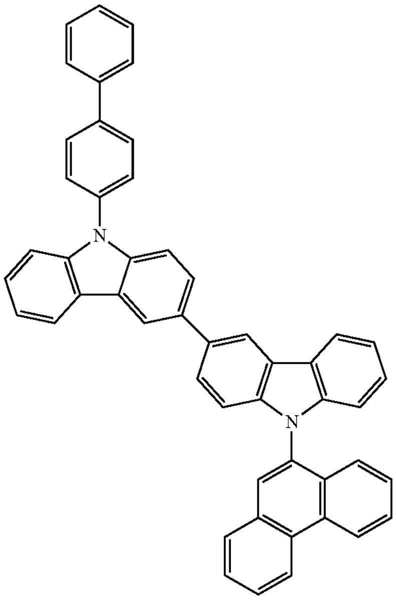
, -continued
X-7
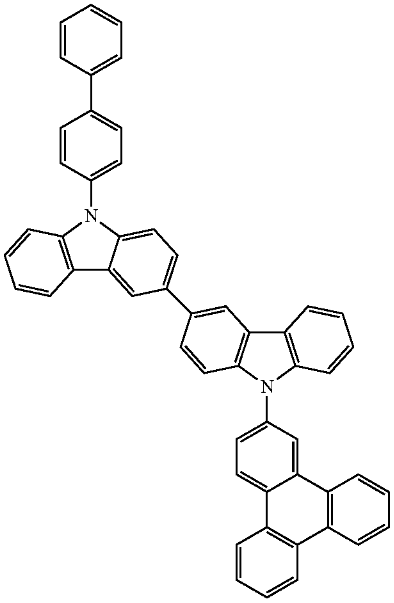
,
-continued
X-9
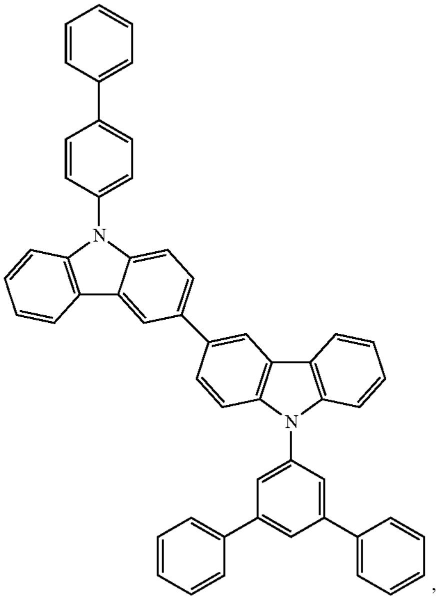
,
X-8
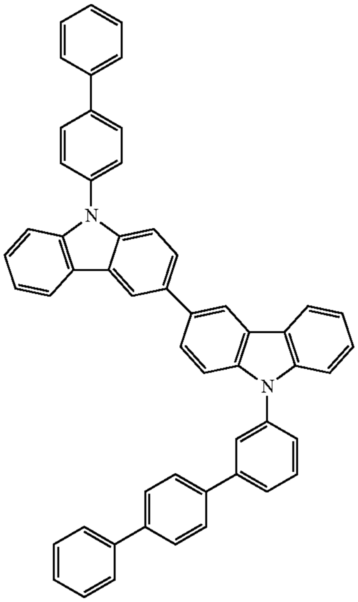
,
X-10
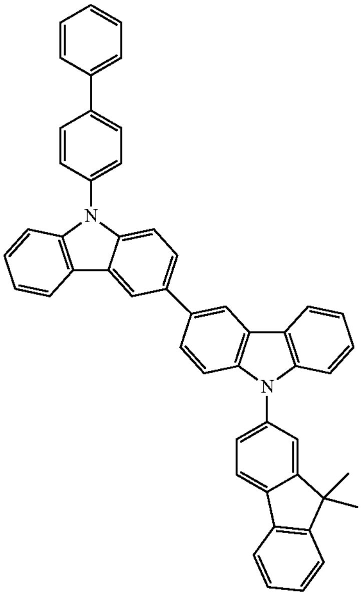
, -continued
X-11
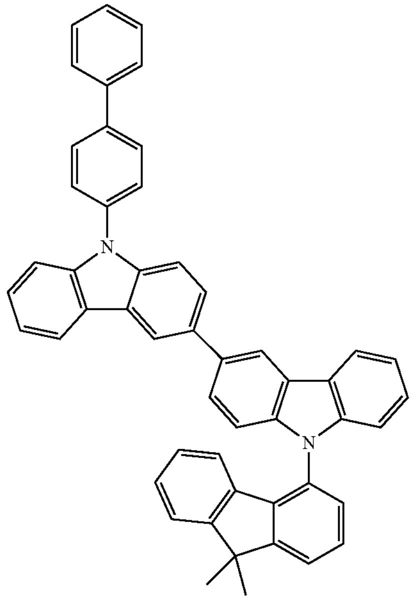
,
X-12
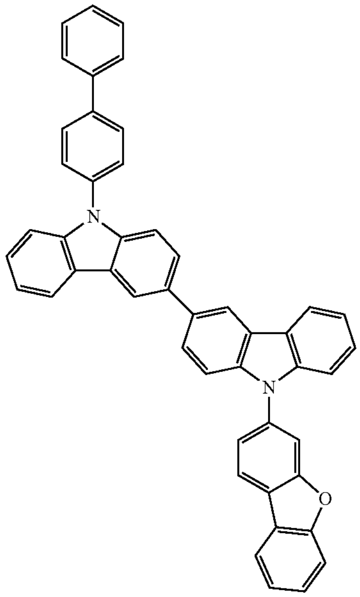
,
-continued
X-13
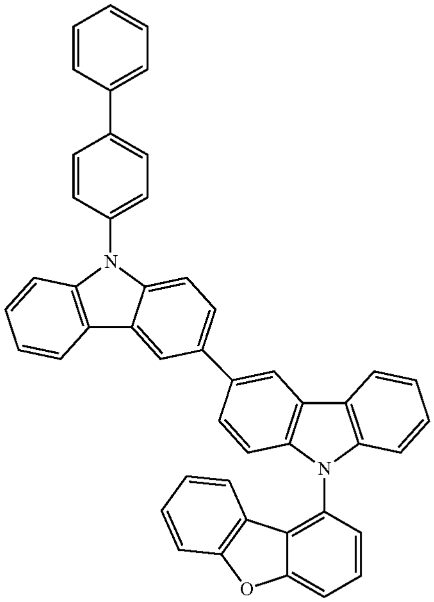
,
X-14
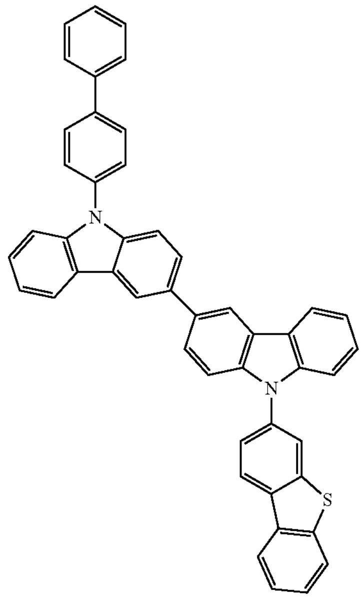
, -continued
X-15
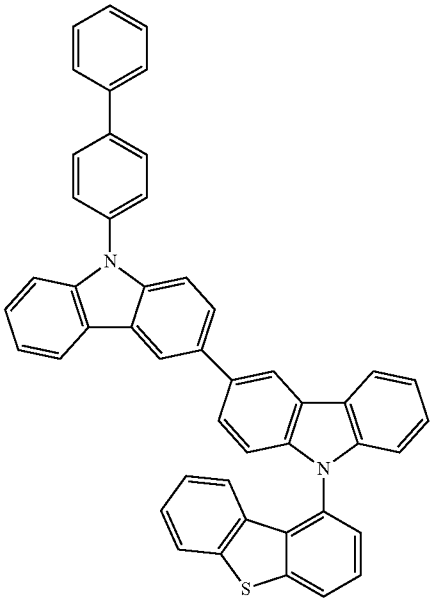
,
X-16
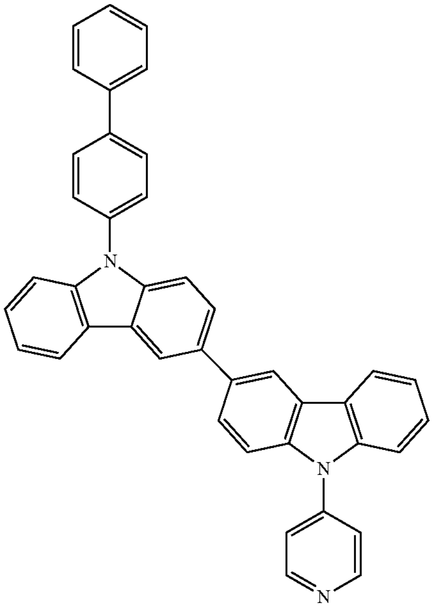
,
-continued
X-17
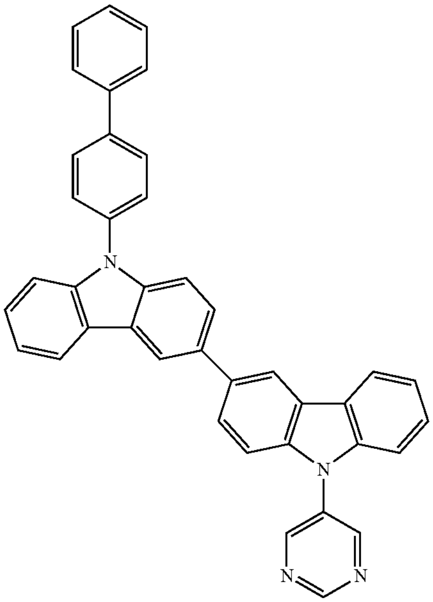
,
X-18
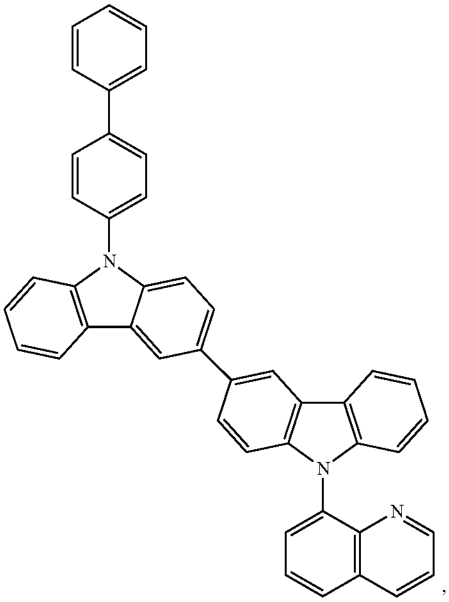
, -continued
X-19
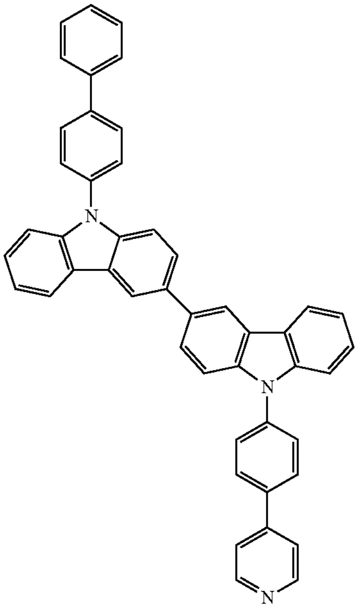
,
X-20
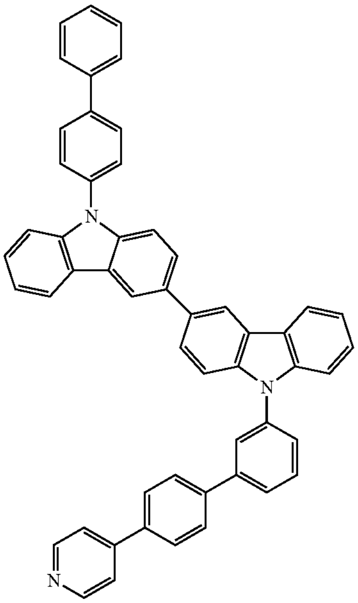
,
-continued
X-21
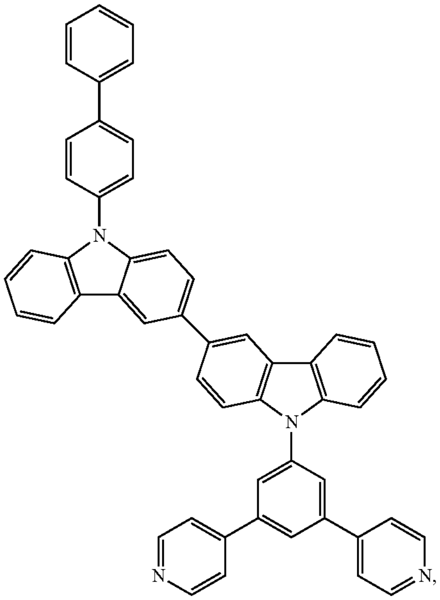
X-22
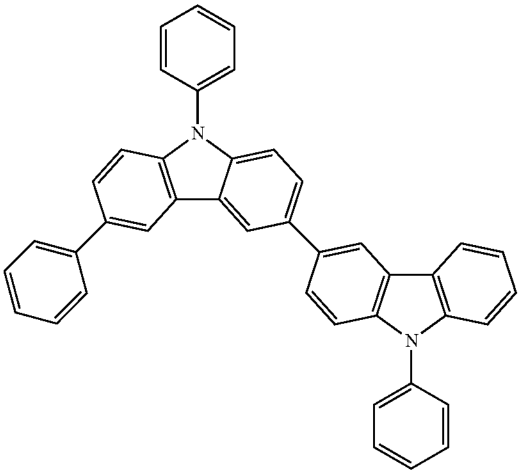
,
X-23
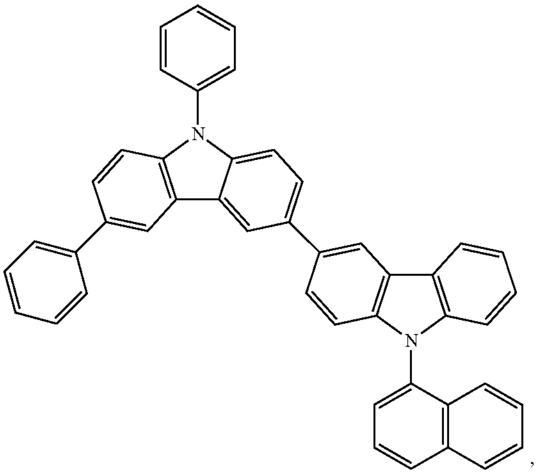
, -continued
X-24
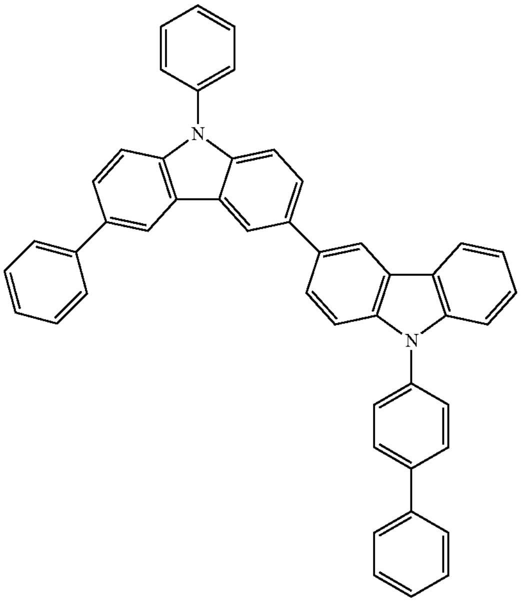
,
X-25
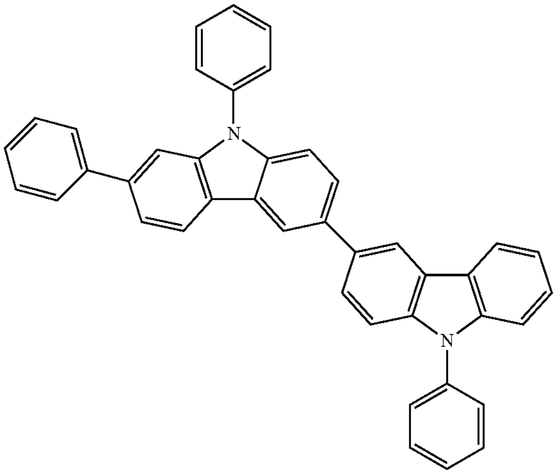
,
X-26
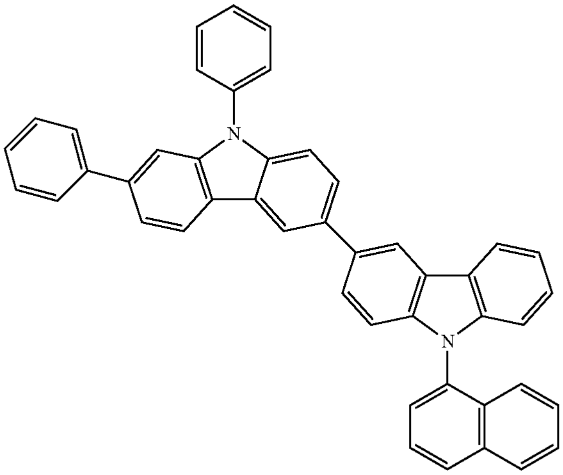
,
-continued
X-27
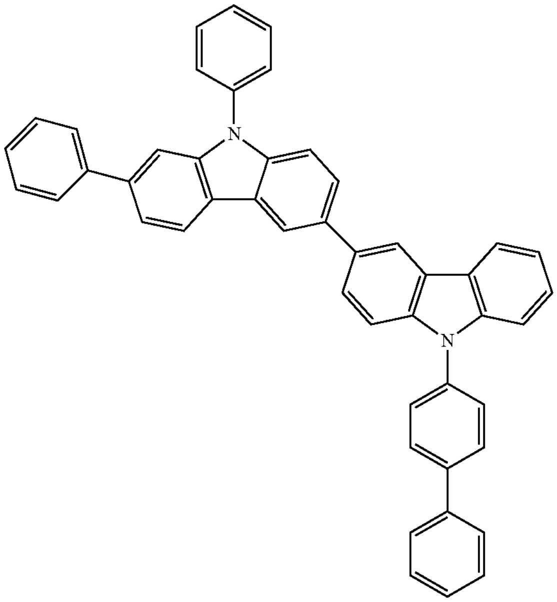
,
X-28
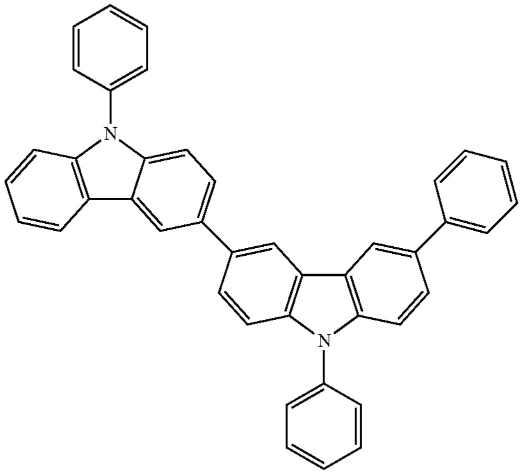
,
X-29
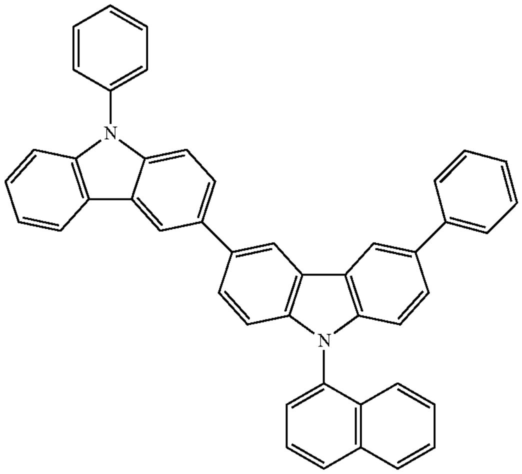
, -continued
X-30
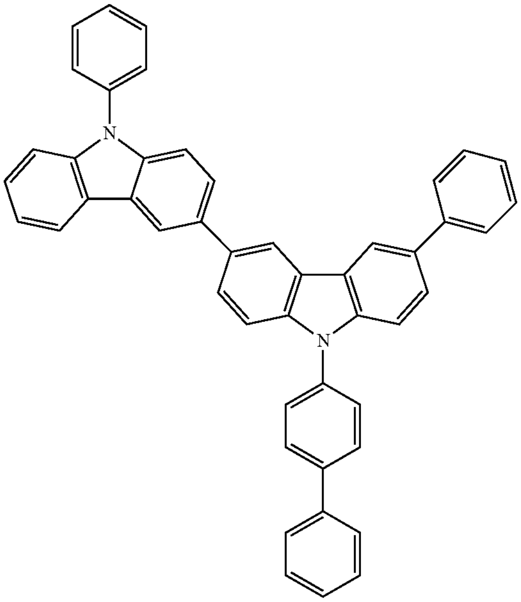
,
X-31
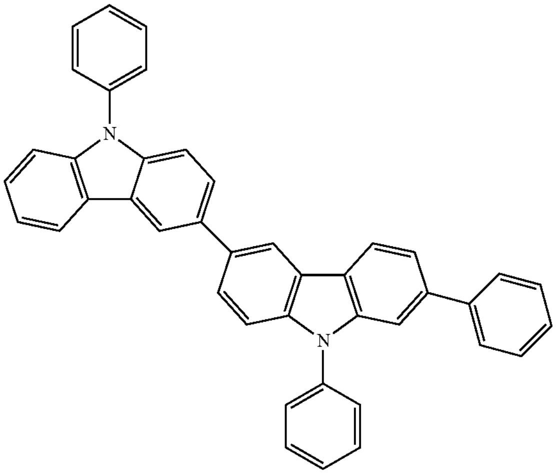
,
X-32
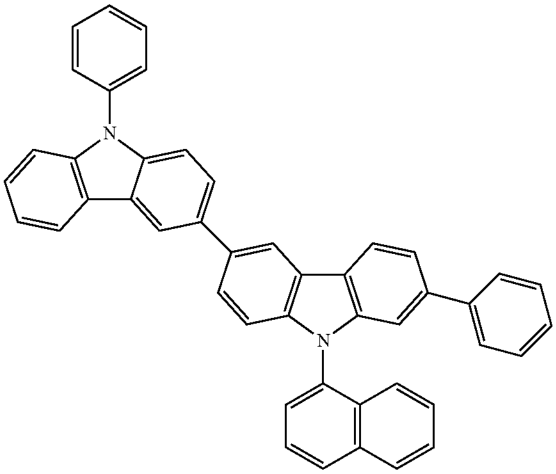
,
-continued
X-33
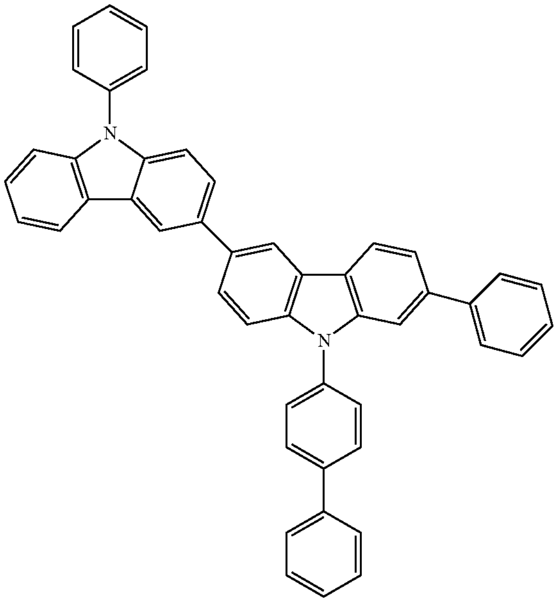
,
X-34
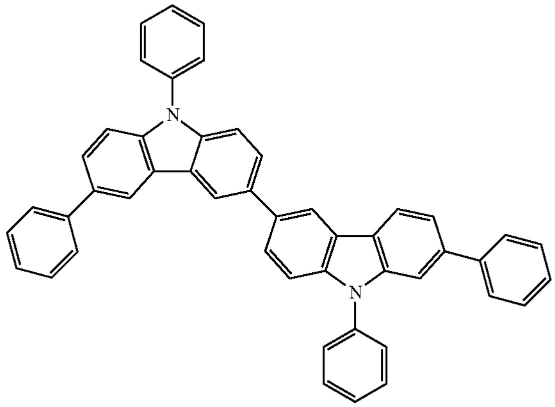
,
X-35
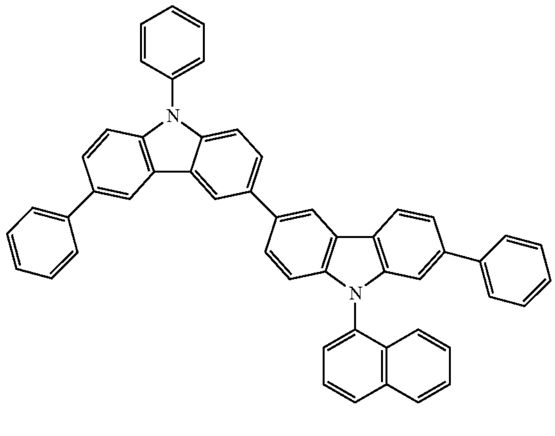
, -continued
X-36
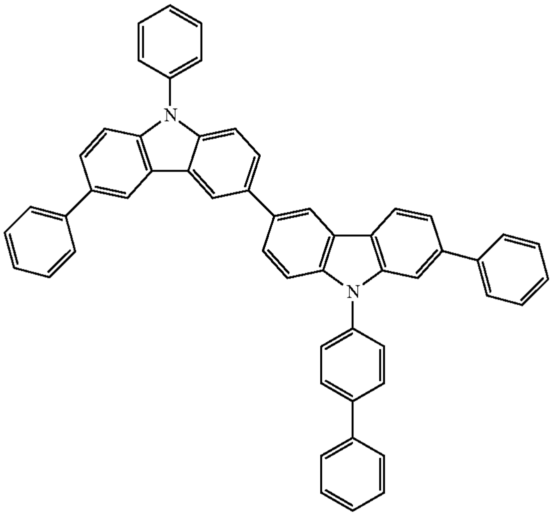
,
X-37
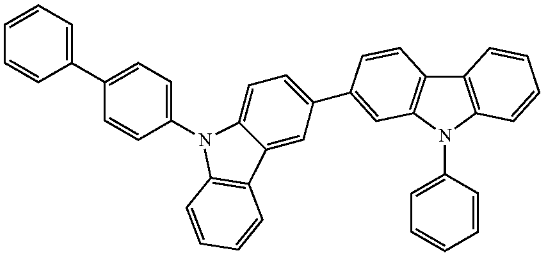
,
X-38
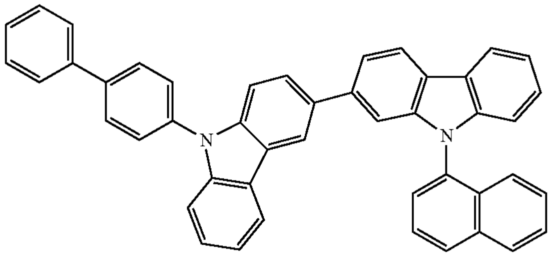
,
X-39
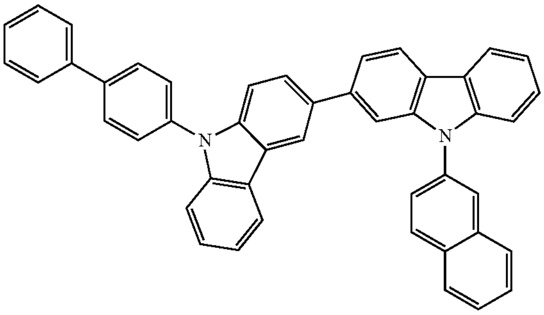
,
-continued
X-40
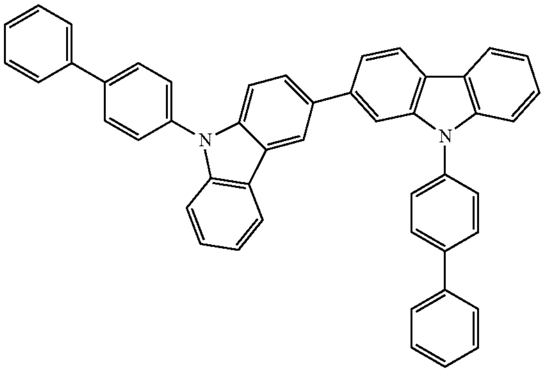
,
X-41
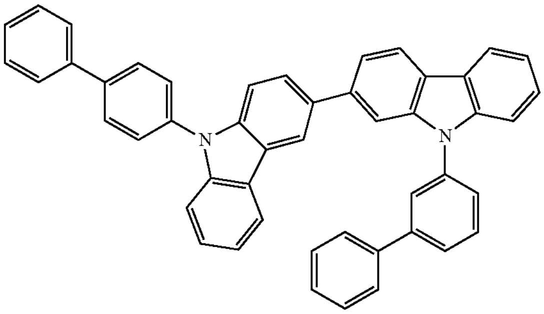
,
X-42
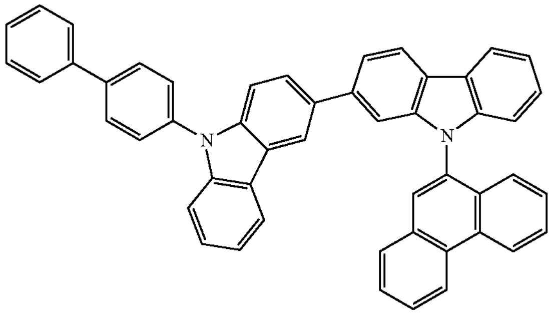
,
X-43
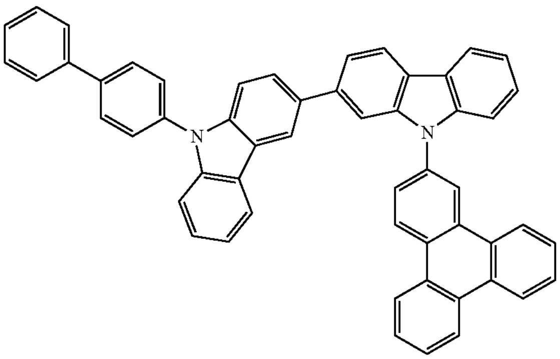
, -continued
X-44
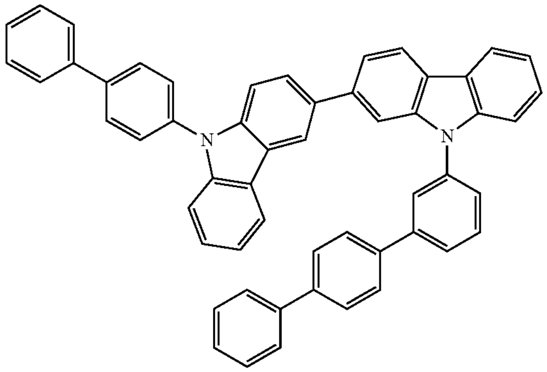
,
X-45
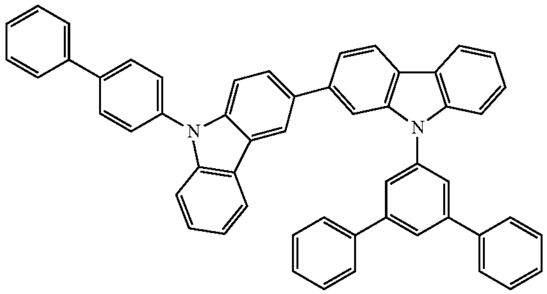
,
X-46
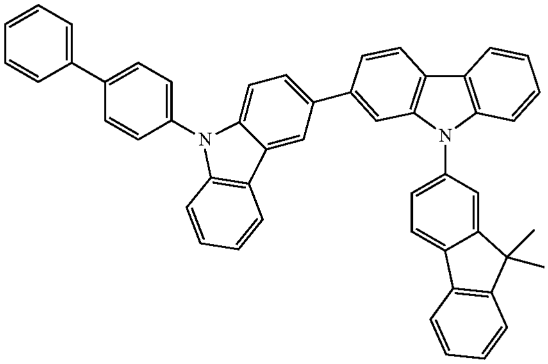
,
X-47
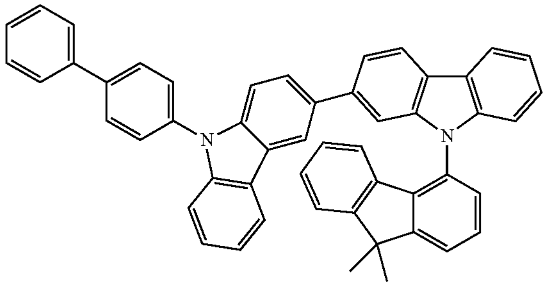
,
-continued
X-48
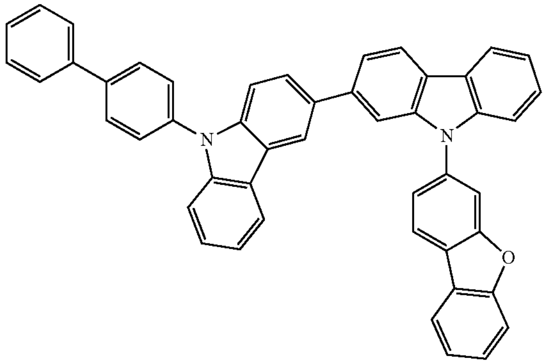
,
X-49
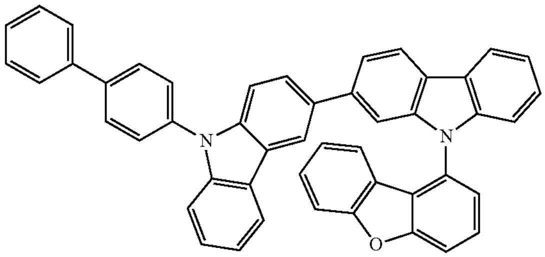
,
X-50
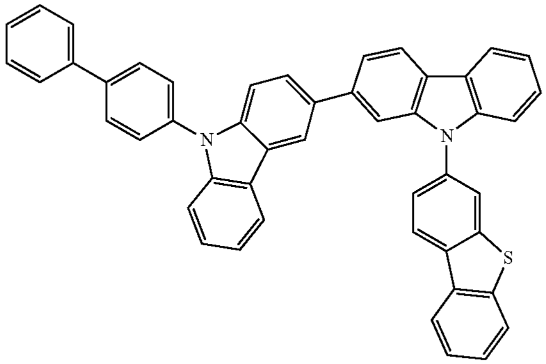
,
X-51
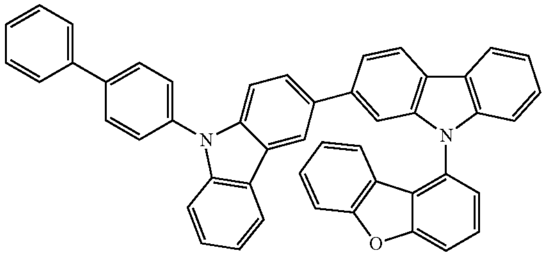
, -continued
X-52
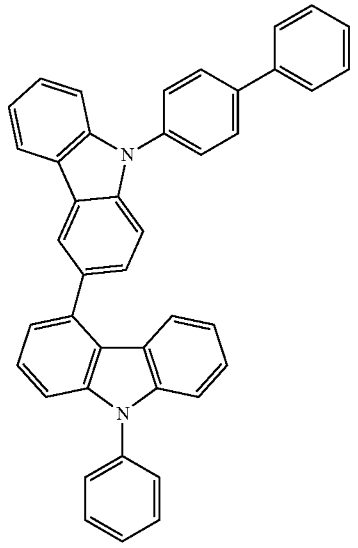
,
X-53
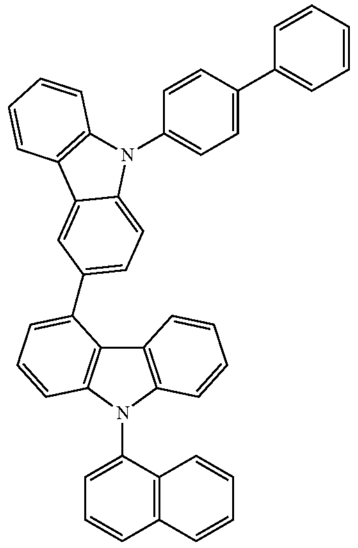
,
-continued
X-54
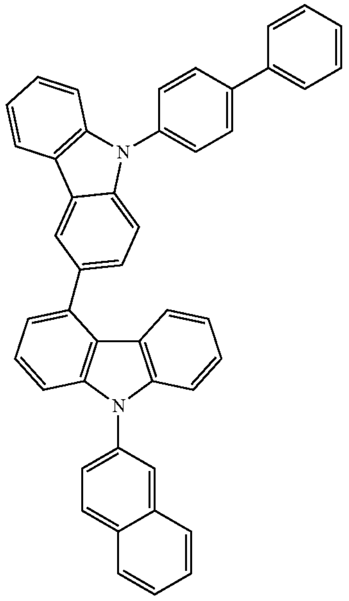
,
X-55
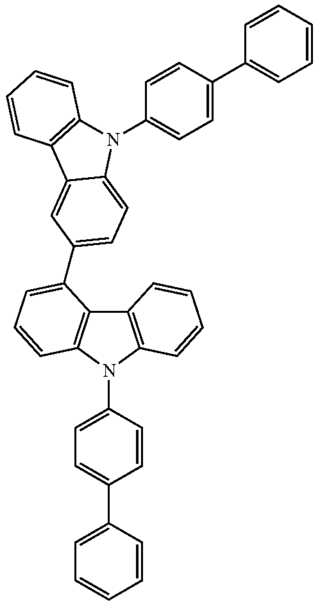
, -continued
X-56
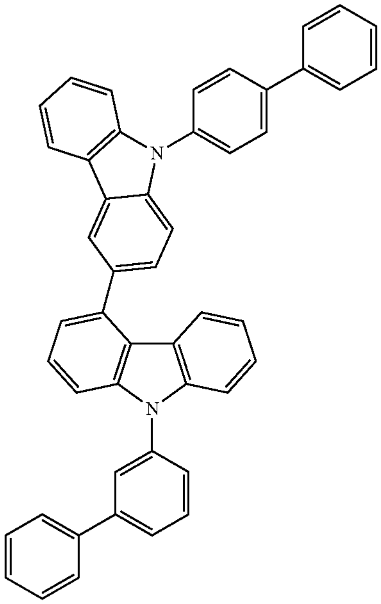
,
X-57
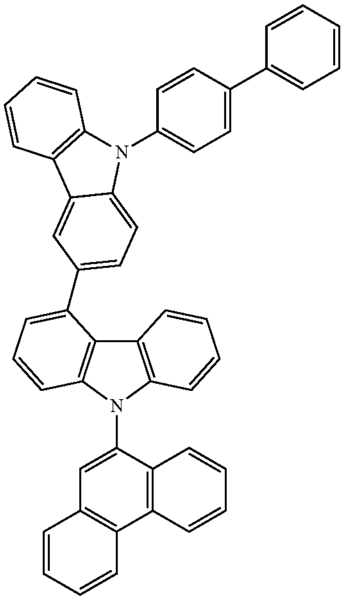
,
-continued
X-58
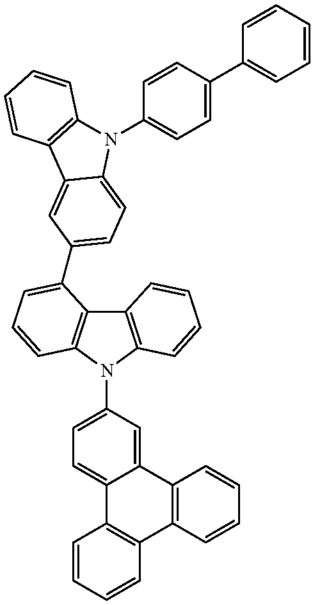
,
X-59
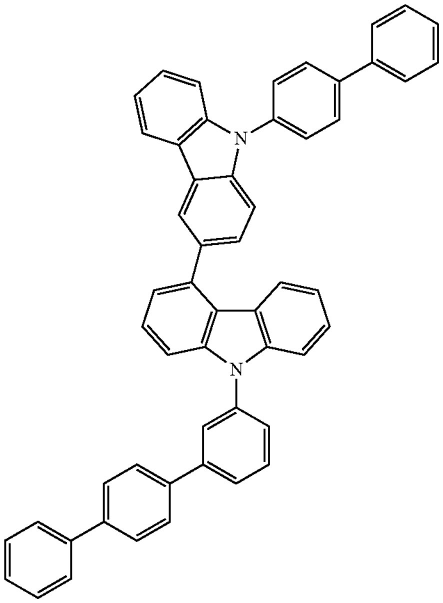
, -continued
X-60
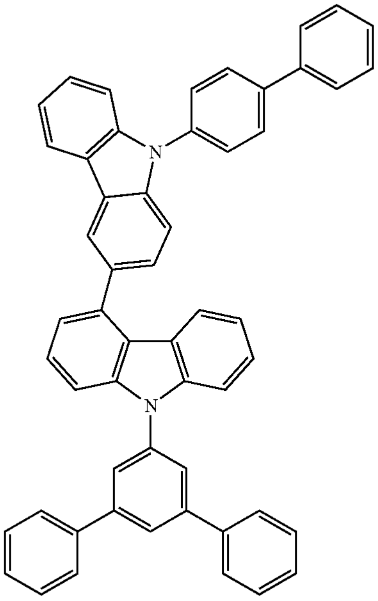
,
X-61
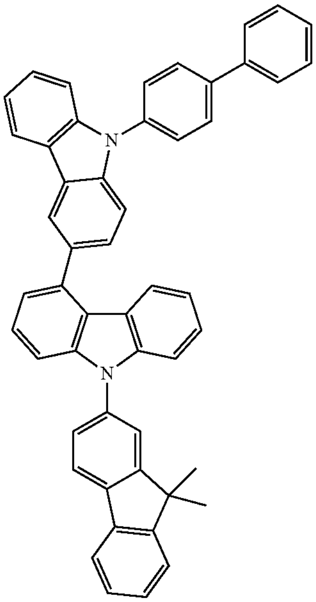
,
-continued
X-62
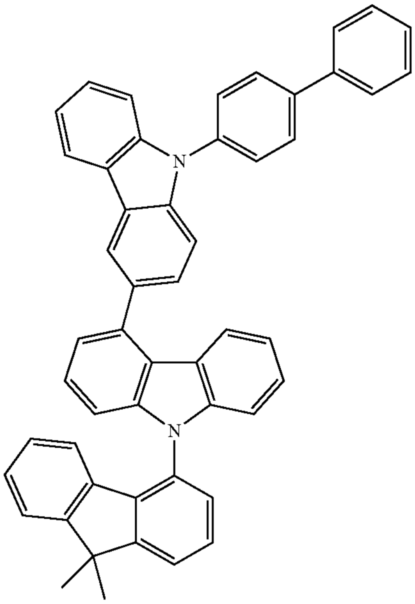
,
X-63
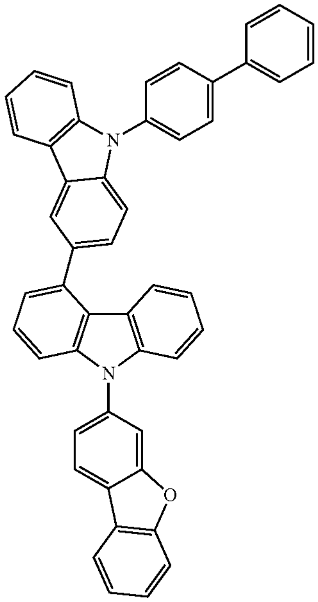
, -continued
X-64
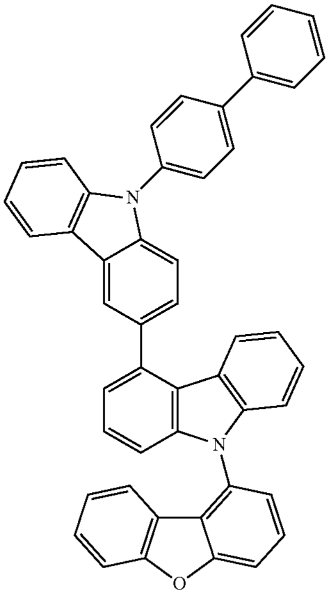
,
X-65
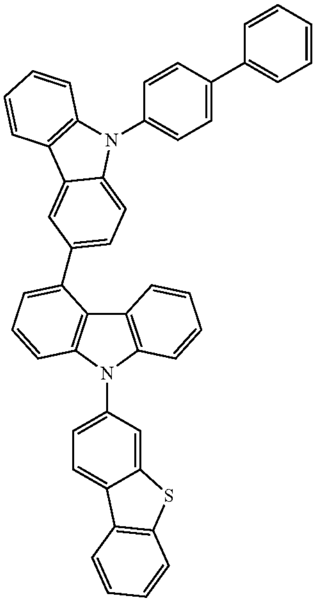
,
-continued
X-66
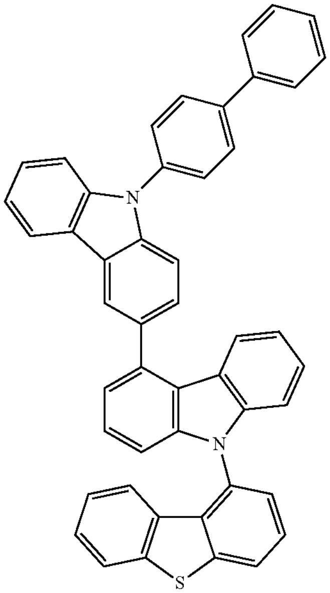
,
X-67
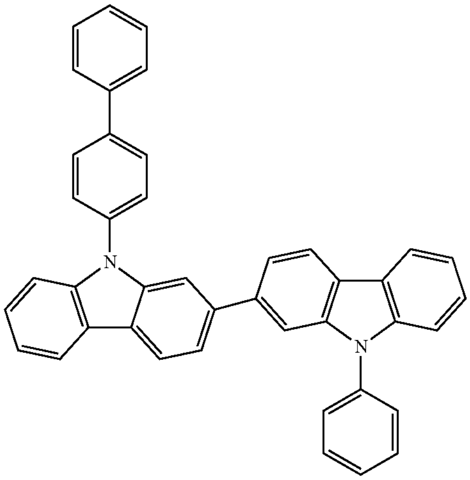
,
X-68
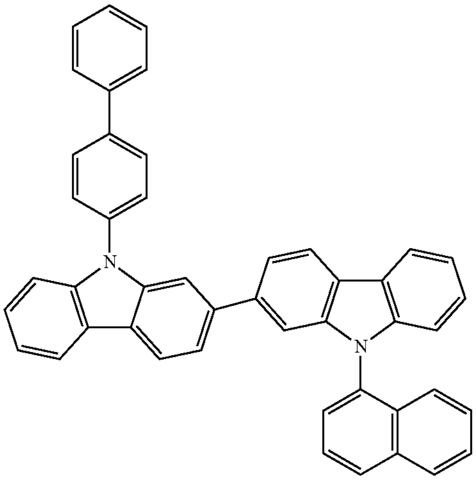
, -continued
X-69
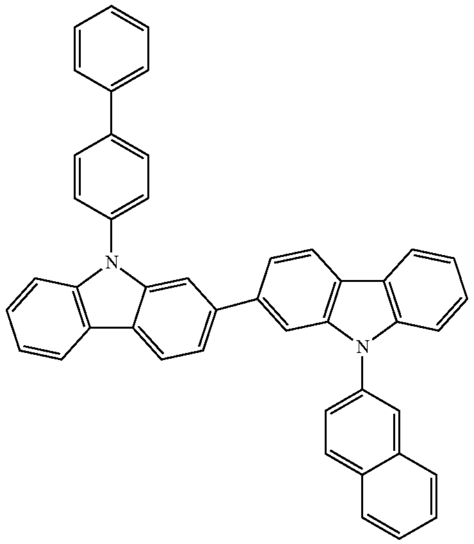
,
X-70
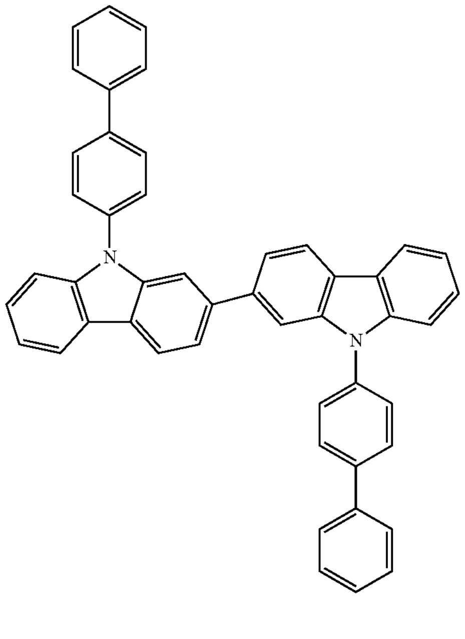
,
-continued
X-71
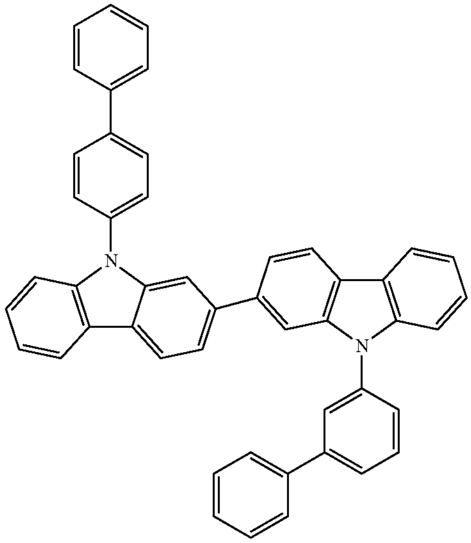
,
X-72
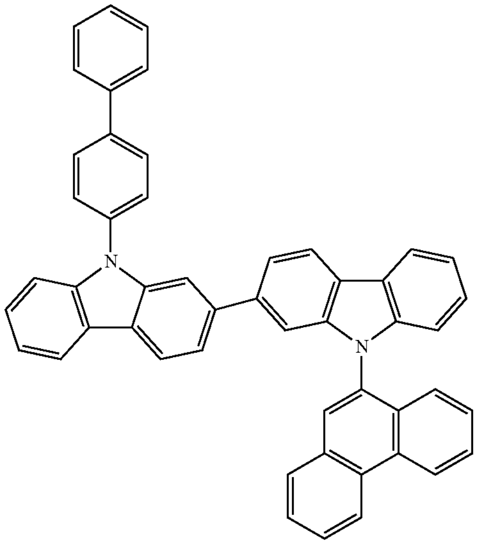
, -continued
X-73
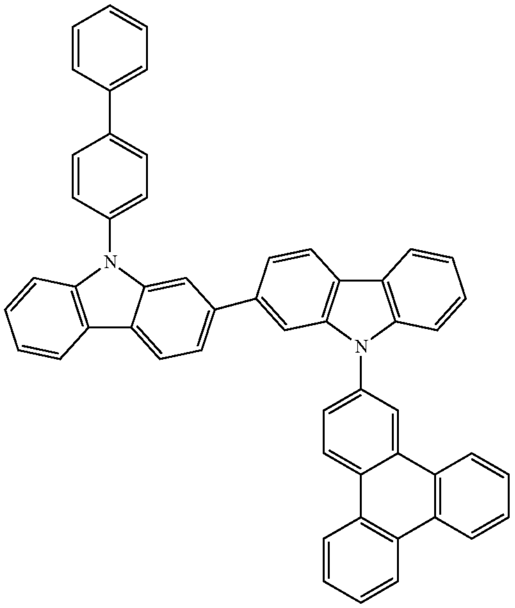
,
X-74
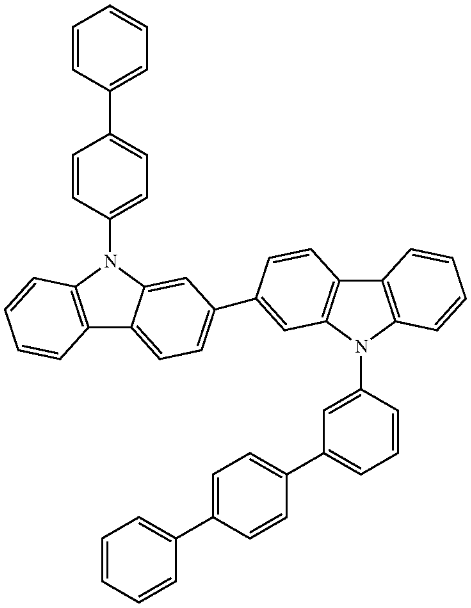
,
-continued
X-75
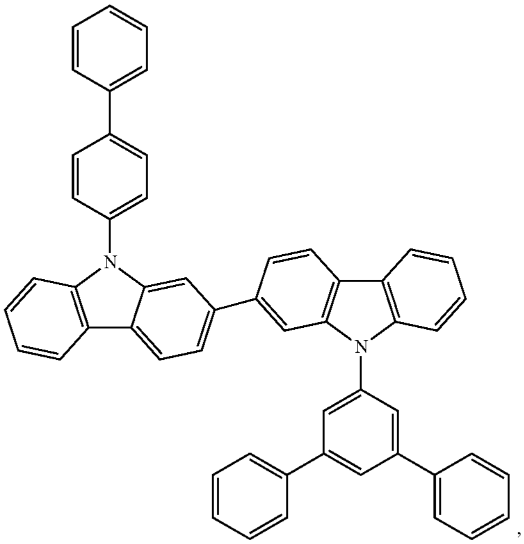
,
X-76
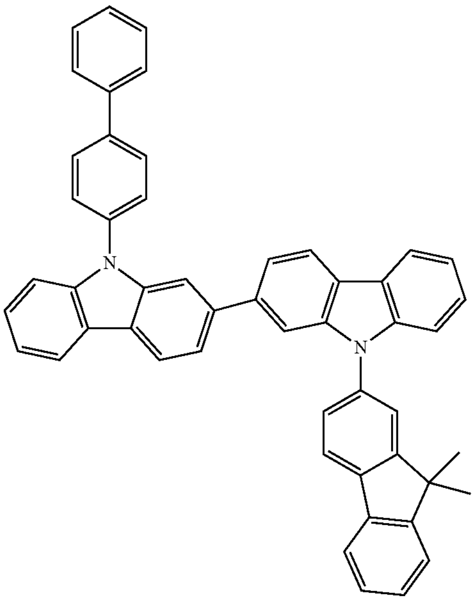
, -continued
X-77
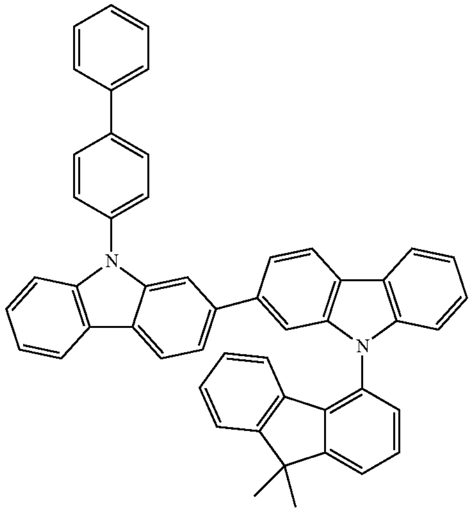
,
X-78
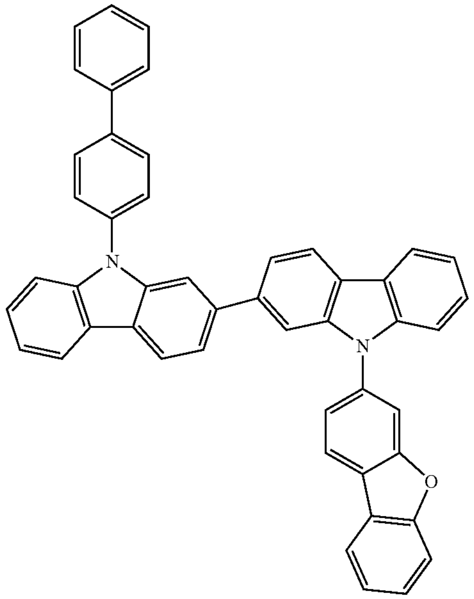
,
X-79
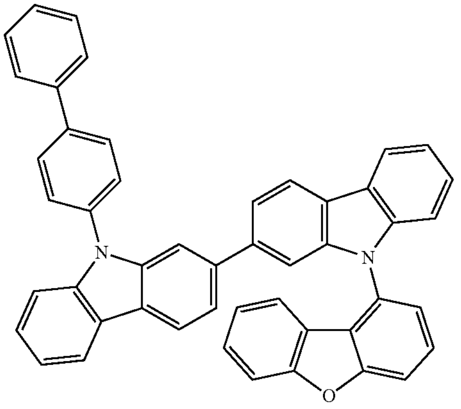
,
-continued
X-80
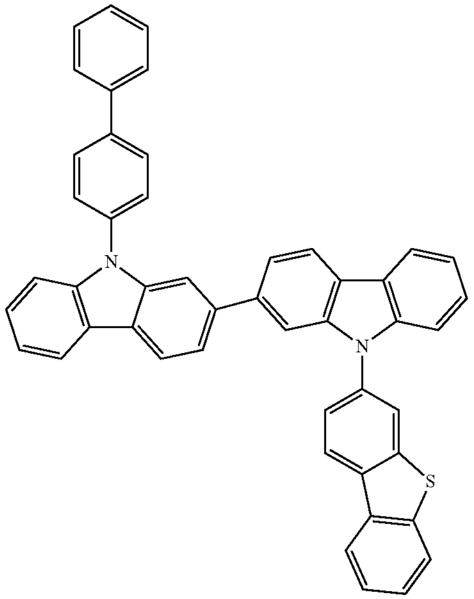
,
X-81
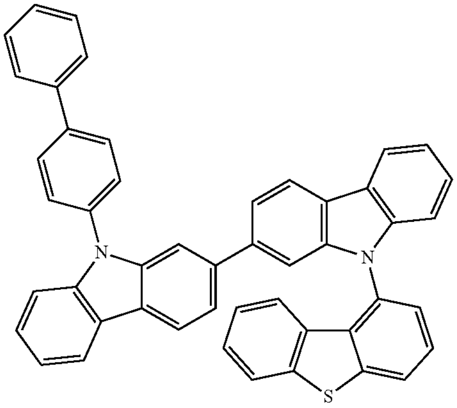
,
X-82
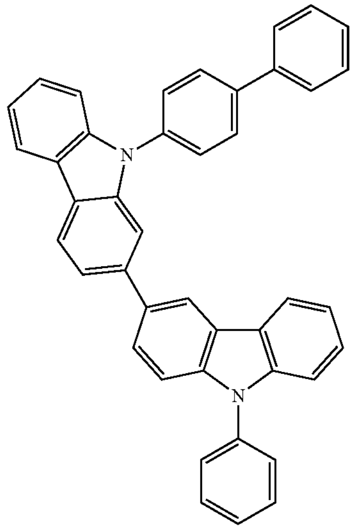
, -continued
X-83
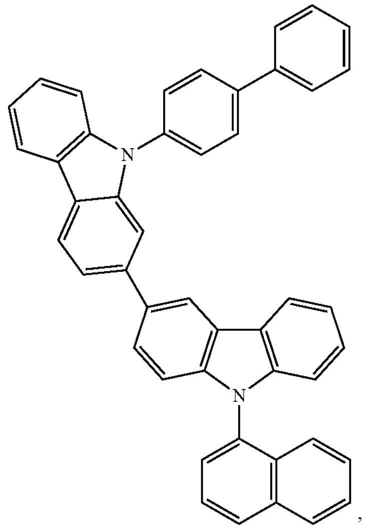
,
X-84
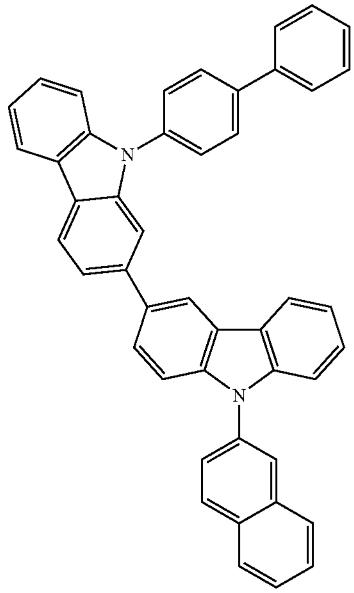
,
-continued
X-85
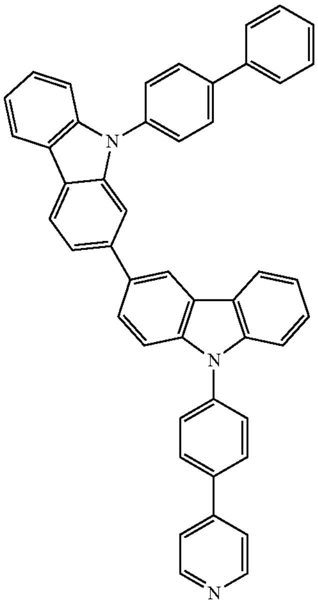
,
X-86
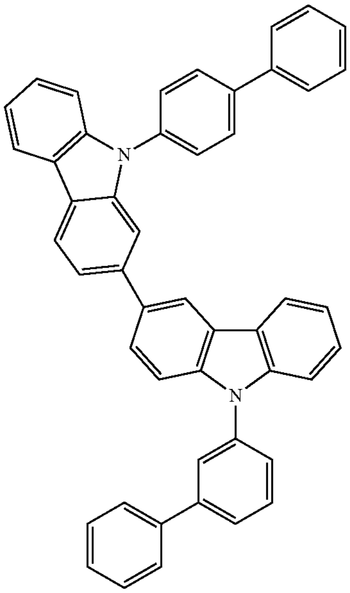
, -continued
X-87
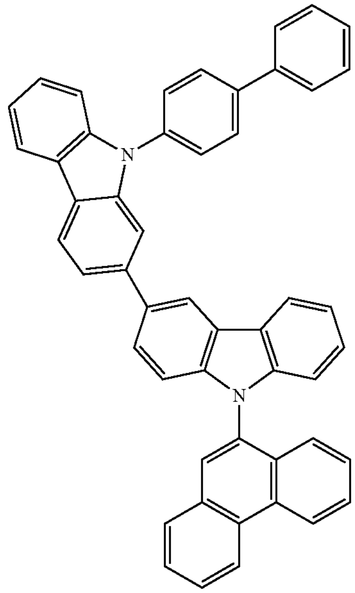
,
X-88
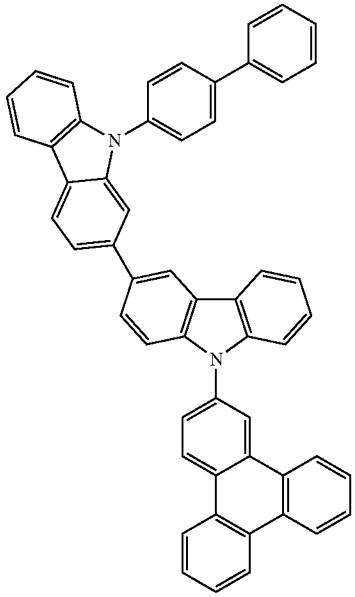
,
-continued
X-89
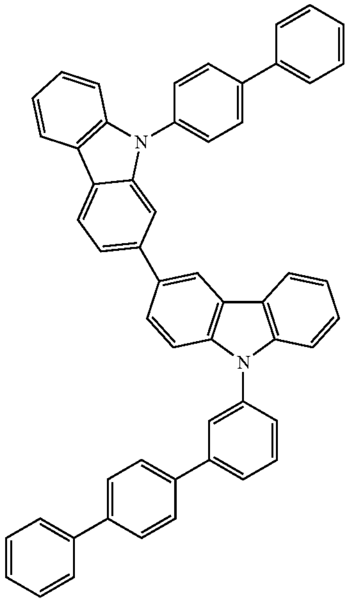
,
X-90
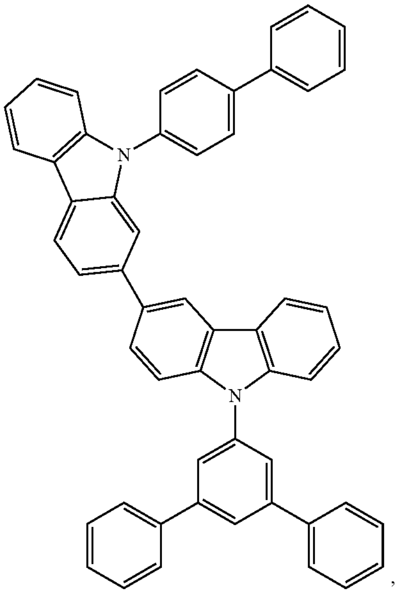
, -continued
X-91
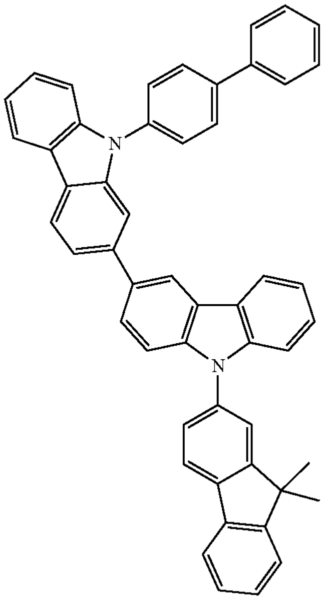
,
X-92
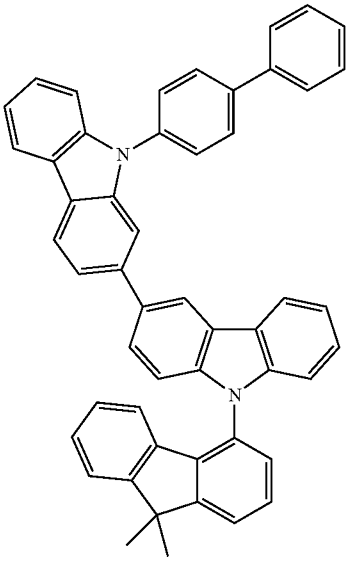
,
-continued
X-93
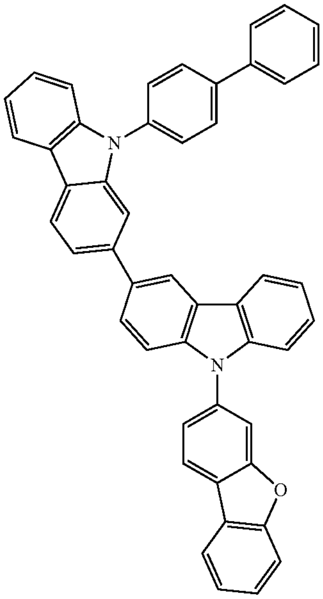
,
X-94
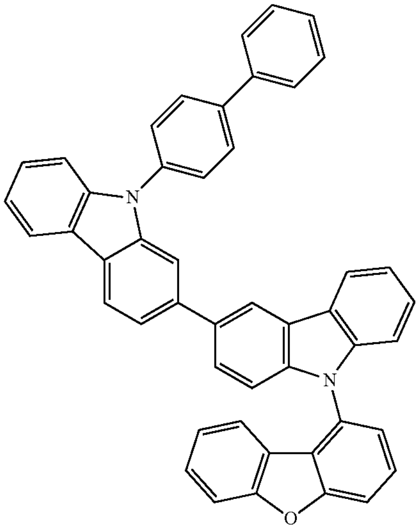
, -continued
X-95
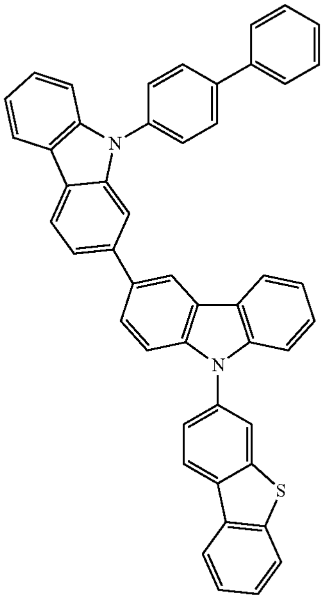
,
X-96
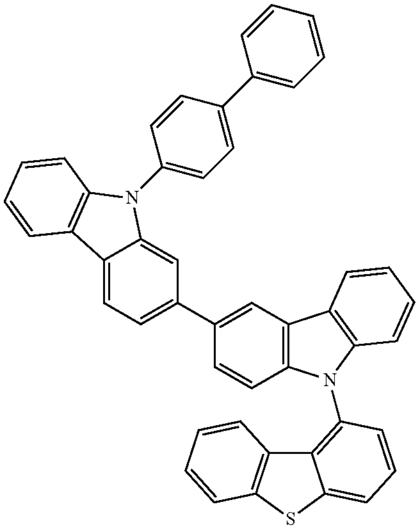
,
X-97
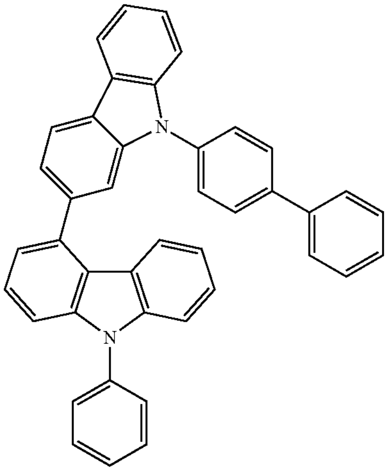
,
-continued
X-98
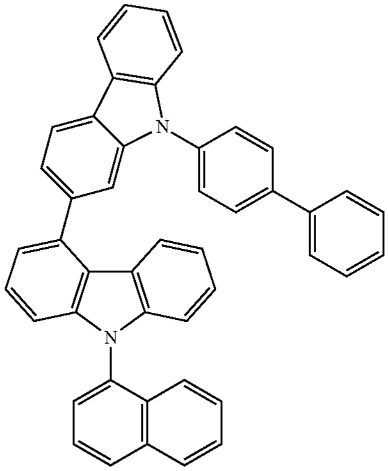
,
X-99
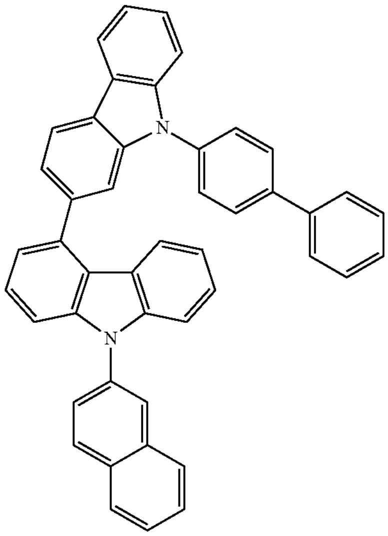
,
X-100
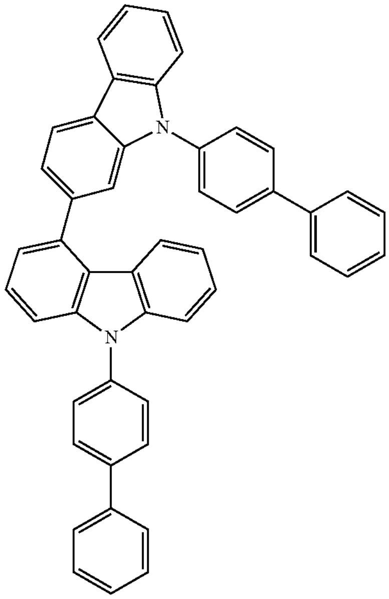
, -continued
X-101
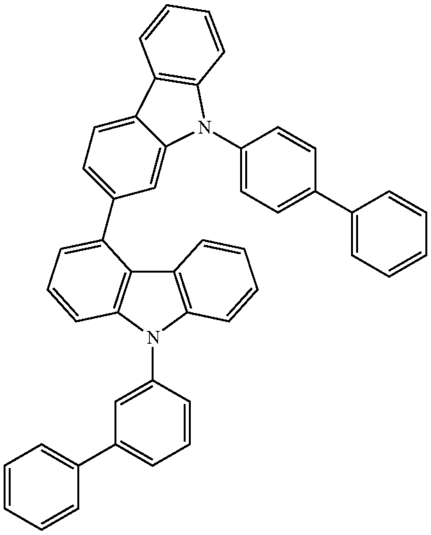
,
X-102
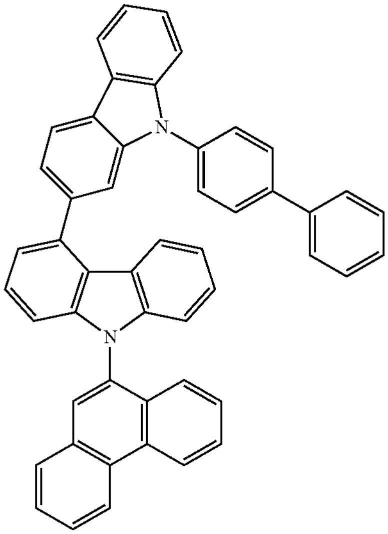
,
-continued
X-103
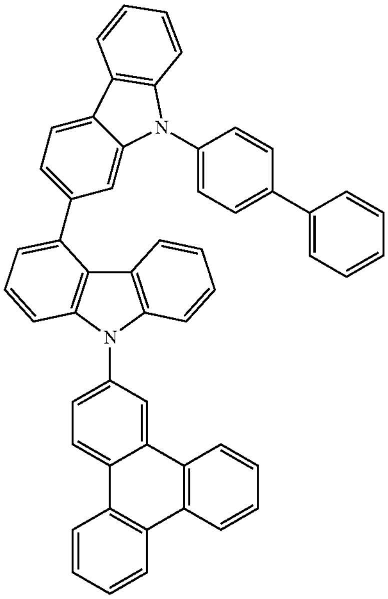
,
X-104
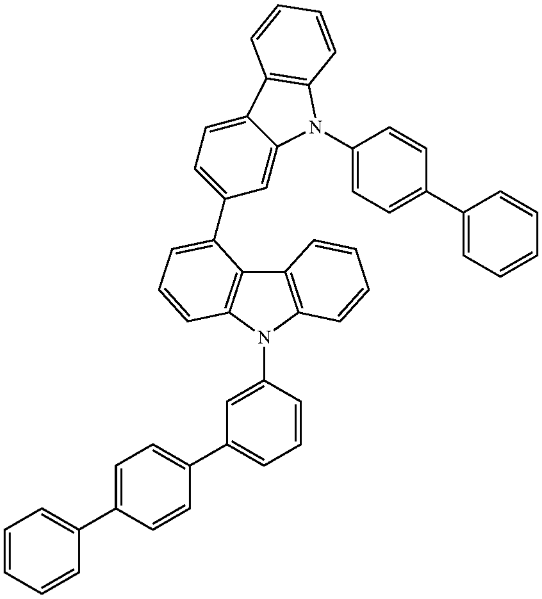
, -continued
X-105
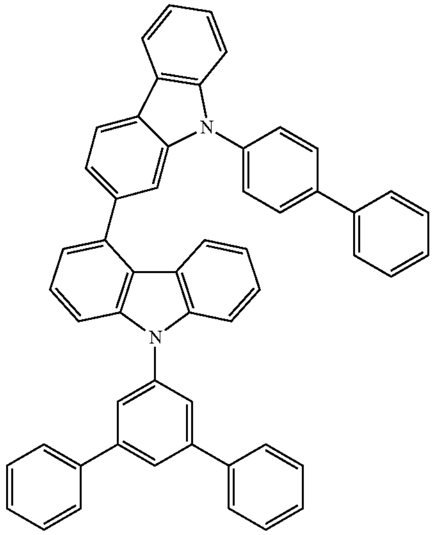
,
X-106
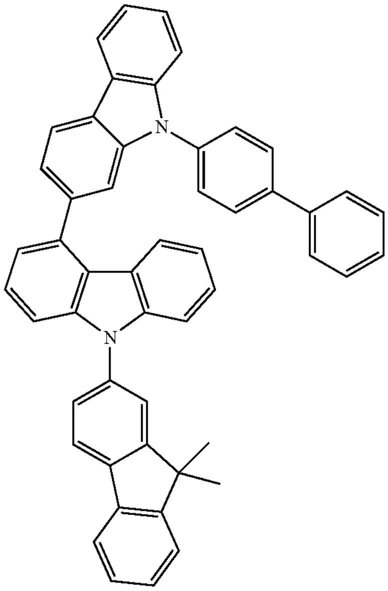
,
X-107
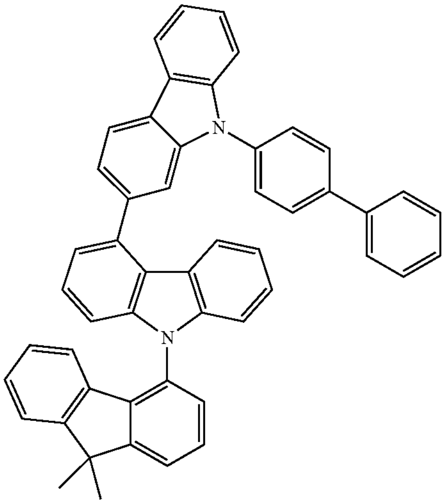
,
-continued
X-108
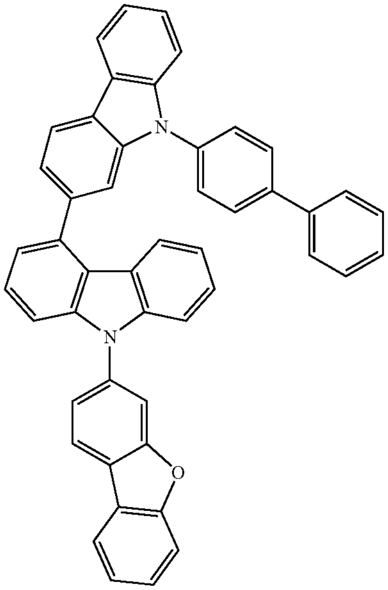
,
X-109
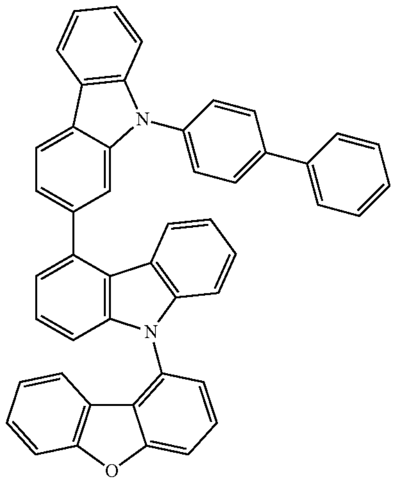
, -continued
X-110
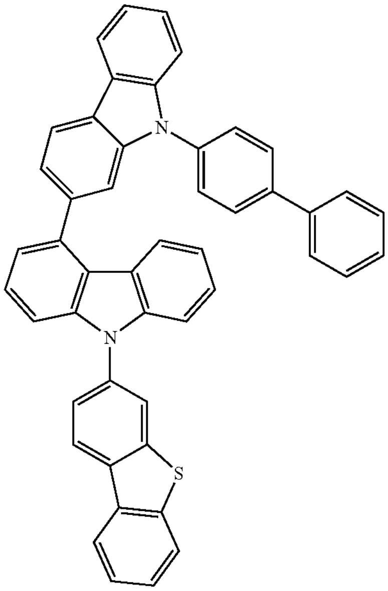
,
X-111
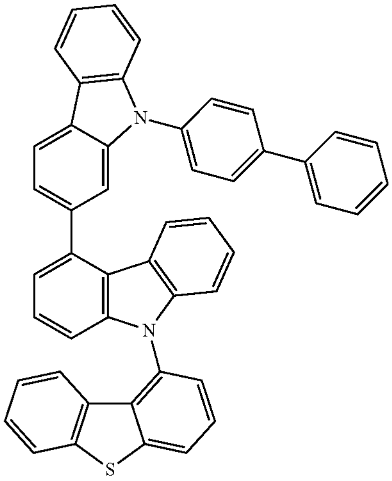
,
-continued
X-112
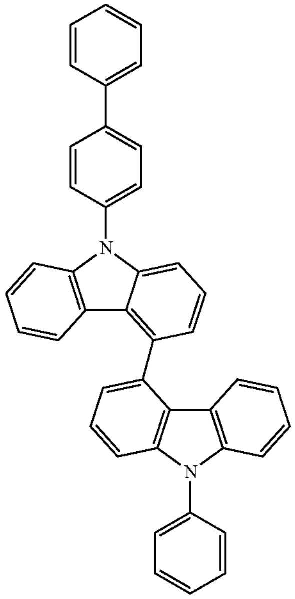
,
X-113
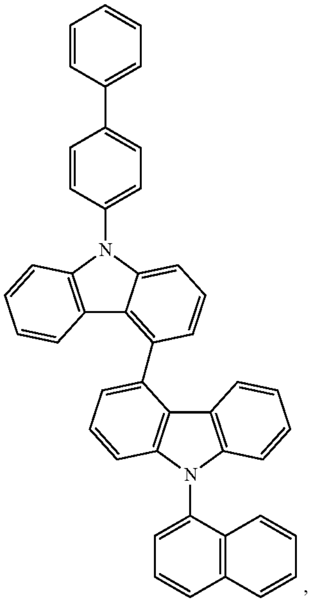
, -continued
X-114
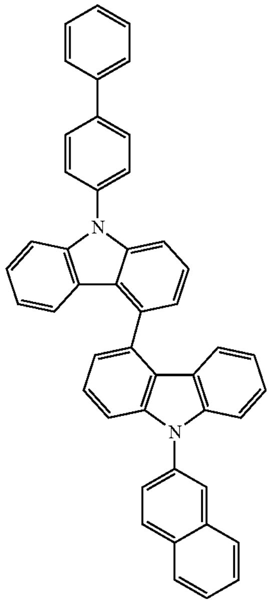
,
X-115
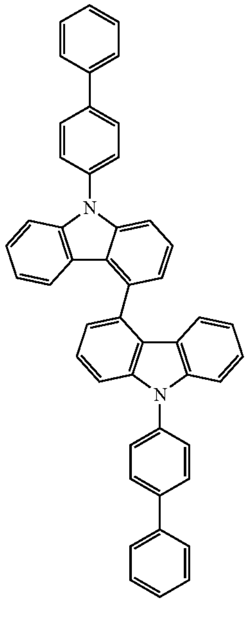
,
-continued
X-116
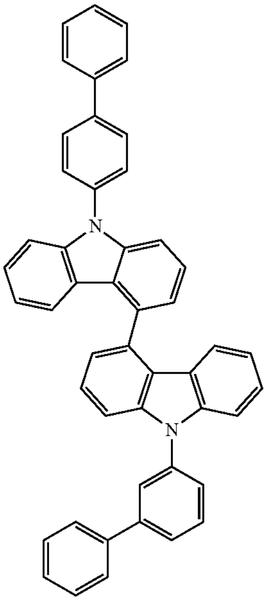
,
X-117
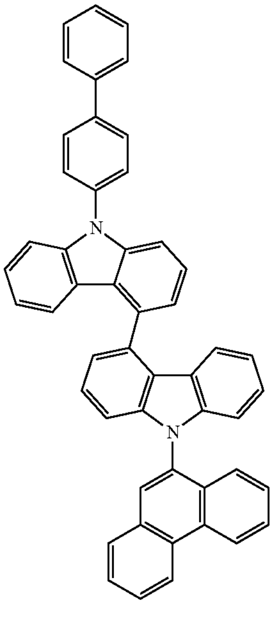
, -continued
X-118
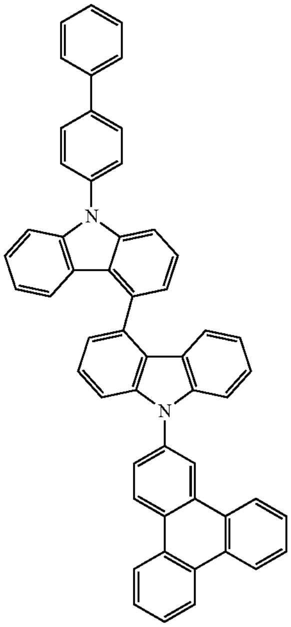
,
X-119
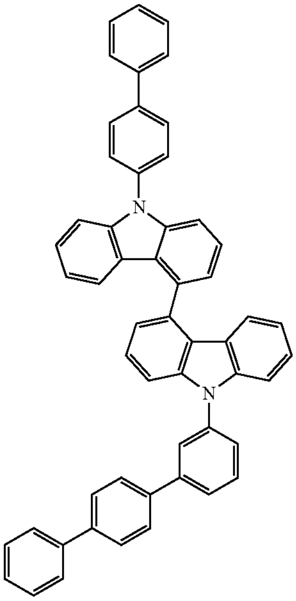
,
-continued
X-120
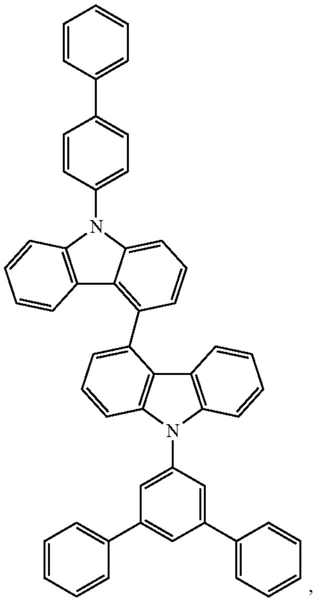
,
X-121
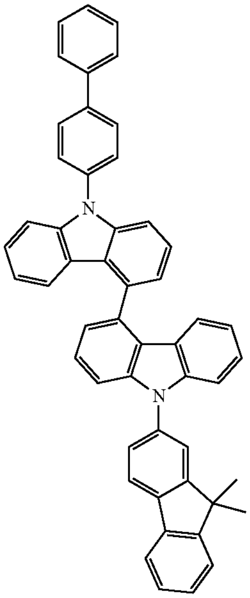
, -continued
X-122
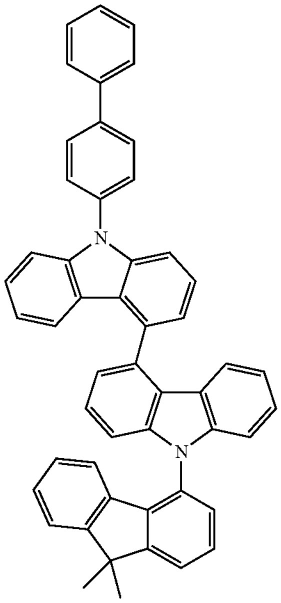
,
-continued
X-124
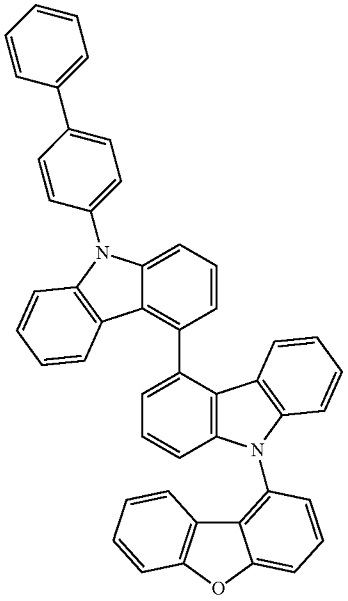
,
X-123
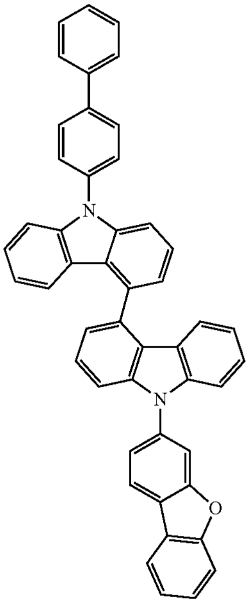
,
X-125
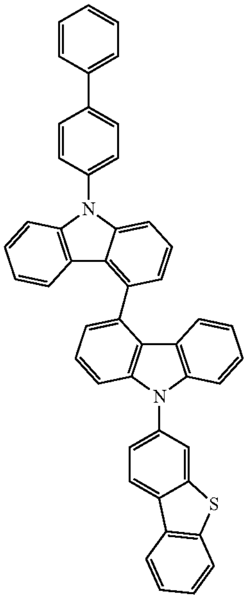
, -continued

X-126

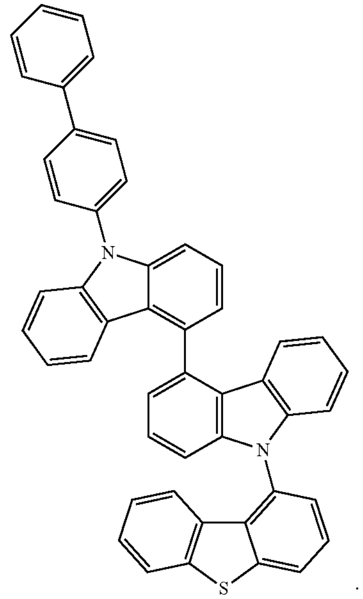

39. The organic electroluminescent device of claim 31, wherein the organic layer is a light-emitting layer, wherein the light-emitting layer contains the first metal complex, the first compound and the second compound, and the weight of the first metal complex accounts for 1% to 30% of the total weight of the light-emitting layer.

40. An electronic apparatus, comprising the organic electroluminescent device of claim 1.

41. The organic electroluminescent device of claim 1, $Z_4$ or $Z_5$ is $CR_z$, and the $R_z$ is substituted or unsubstituted aryl having 6 to 30 carbon atoms.

42. A compound composition containing a first metal complex and a first compound;

wherein the first metal complex contains a metal M and a ligand $L_a$ coordinated to the metal M, wherein the ligand $L_a$ has a structure represented by Formula 1:

Formula 1

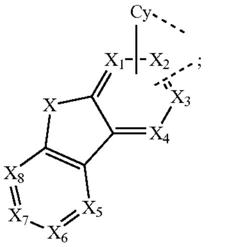

wherein the metal M is selected from a metal with a relative atomic mass greater than 40;

Cy is, at each occurrence identically or differently, selected from substituted or unsubstituted aryl having 5 to 24 ring atoms or substituted or unsubstituted heteroaryl having 5 to 24 ring atoms; and the Cy is joined to the metal M by a metal-carbon bond or a metal-nitrogen bond;

X is, at each occurrence identically or differently, selected from the group consisting of O, S, Se, $NR_1$, $CR_1R_1$ and $SiR_1R_1$; when two $R_1$ are present at the same time, the two $R_1$ are identical or different;

$X_1$ to $X_8$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

$R_x$ and $R_1$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one of $X_1$ to $X_8$ is $CR_x$, and the $R_x$ is cyano or fluorine;

adjacent substituents $R_1$, and/or $R_x$ can be optionally joined to form a ring;

wherein the first compound has a structure represented by Formula 2:

Formula 2

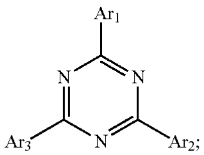

wherein $Ar_1$ has a structure represented by Formula A:

Formula A

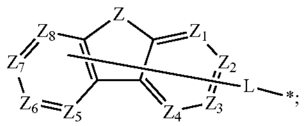

wherein

Z is, at each occurrence identically or differently, selected from the group consisting of O, S and Se;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Z_1$ to $Z_8$ are, at each occurrence identically or differently, selected from C, $CR_z$ or N, and at least one of $Z_1$ to $Z_8$ is C and joined to the L;

$R_z$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

at least one, at least two or at least three of Z1 to Z8 are selected from $CR_z$, and the $R_z$ is selected from substituted or unsubstituted aryl having 6 to 30 carbon atoms;

$Ar_2$ and $Ar_3$ are, at each occurrence identically or differently, selected from substituted or unsubstituted aryl having 6 to 30 carbon atoms, substituted or unsubstituted heteroaryl having 3 to 30 carbon atoms or a combination thereof;

"*" represents a position where Formula A is joined to Formula 2; and adjacent substituents $R_z$ can be optionally joined to form a ring.

* * * * *